US012327813B2

(12) United States Patent
Lin et al.

(10) Patent No.: US 12,327,813 B2
(45) Date of Patent: Jun. 10, 2025

(54) LOGIC DRIVE BASED ON MULTICHIP PACKAGE USING INTERCONNECTION BRIDGE

(71) Applicant: iCometrue Company Ltd., Zhubei (TW)

(72) Inventors: Mou-Shiung Lin, Hsinchu (TW); Jin-Yuan Lee, Miaoli County (TW)

(73) Assignee: iCometrue Company, Hsinchu County (TW)

(*) Notice: Subject to any disclaimer, the term of this patent is extended or adjusted under 35 U.S.C. 154(b) by 0 days.

(21) Appl. No.: 18/600,711

(22) Filed: Mar. 9, 2024

(65) Prior Publication Data

US 2024/0266322 A1 Aug. 8, 2024

Related U.S. Application Data

(63) Continuation of application No. 17/151,634, filed on Jan. 18, 2021, now Pat. No. 12,027,491, which is a
(Continued)

(51) Int. Cl.
*H01L 23/48* (2006.01)
*H01L 23/00* (2006.01)
(Continued)

(52) U.S. Cl.
CPC .......... *H01L 24/97* (2013.01); *H01L 23/5221* (2013.01); *H01L 23/5226* (2013.01);
(Continued)

(58) Field of Classification Search
CPC . H01L 24/97; H01L 23/5221; H01L 23/5226; H01L 23/53238; H01L 23/5383;
(Continued)

(56) References Cited

U.S. PATENT DOCUMENTS 4,870,302 A 9/1989 Freeman
5,272,368 A 12/1993 Turner et al.
(Continued)

FOREIGN PATENT DOCUMENTS

CN 103681367 3/2014
CN 104078453 10/2014
(Continued)

*Primary Examiner* — Shouxiang Hu

(57) ABSTRACT

A multi-chip package comprising: an interconnection substrate comprising an interconnection bridge embedded in the interconnection substrate, and an interconnection scheme comprising a first interconnection metal layer, a second interconnection metal layer over the first interconnection layer and the interconnection bridge, and a polymer layer between the first and second interconnection metal layers, wherein the interconnection bridge is embedded in the interconnection scheme and has sidewalls surrounded by the polymer layer; a semiconductor IC chip over the interconnection substrate and across over an edge of the interconnection bridge; a memory chip over the interconnection substrate and across over an edge of the interconnection bridge, wherein the interconnection bridge comprises a plurality of metal interconnects configured for a data bus coupling the semiconductor IC chip to the memory chip, wherein a bitwidth of the data bus between the semiconductor IC chip and the memory chip is greater than or equal to 512.

30 Claims, 55 Drawing Sheets

Related U.S. Application Data continuation of application No. 16/590,981, filed on Oct. 2, 2019, now Pat. No. 10,937,762.

(60) Provisional application No. 62/741,513, filed on Oct. 4, 2018.

(51) Int. Cl.

| | |
|---|---|
| ***H01L 23/522*** | (2006.01) |
| ***H01L 23/532*** | (2006.01) |
| ***H01L 23/538*** | (2006.01) |
| ***H01L 25/065*** | (2023.01) |
| ***H03K 19/17704*** | (2020.01) |
| ***H03K 19/17728*** | (2020.01) |
| ***H03K 19/17736*** | (2020.01) |
| ***H03K 19/1776*** | (2020.01) |

(52) U.S. Cl.
CPC .... *H01L 23/53238* (2013.01); *H01L 23/5383* (2013.01); *H01L 23/5386* (2013.01); *H01L 23/5389* (2013.01); *H01L 24/09* (2013.01); *H01L 24/17* (2013.01); *H01L 24/19* (2013.01); *H01L 24/20* (2013.01); *H01L 24/81* (2013.01); *H01L 25/0652* (2013.01); *H01L 25/0655* (2013.01); *H01L 25/0657* (2013.01); *H03K 19/17708* (2013.01); *H03K 19/17728* (2013.01); *H03K 19/17744* (2013.01); *H03K 19/1776* (2013.01)

(58) Field of Classification Search
CPC . H01L 23/5386; H01L 23/5389; H01L 24/09; H01L 24/17; H01L 24/19; H01L 24/20; H01L 24/81; H01L 25/0652; H01L 25/0655; H01L 25/0657; H01L 23/49816; H01L 23/5385; H01L 25/105; H01L 24/05; H01L 24/06; H01L 24/13; H01L 24/14; H01L 24/16; H01L 24/32; H01L 24/92; H01L 2224/0401; H01L 2224/0557; H01L 2224/0603; H01L 2224/06181; H01L 2224/13082; H01L 2224/131; H01L 2224/13147; H01L 2224/1403; H01L 2224/16145; H01L 2224/16227; H01L 2224/1703; H01L 2224/17181; H01L 2224/32145; H01L 2224/32225; H01L 2224/73204; H01L 2224/81204; H01L 2224/81447; H01L 2224/92125; H01L 2224/97; H01L 2225/1023; H01L 2225/1041; H01L 2225/1058; H01L 2924/15192; H01L 2924/15311; H01L 2924/1533; H01L 2924/18161; H03K 19/17708; H03K 19/17728; H03K 19/17744; H03K 19/1776
See application file for complete search history.

(56) References Cited

U.S. PATENT DOCUMENTS

| | | | |
|---|---|---|---|
| 5,587,603 | A | 12/1996 | Kowshik |
| 5,592,102 | A | 1/1997 | Lane et al. |
| 5,689,195 | A | 11/1997 | Cliff et al. |
| 5,796,662 | A | 8/1998 | Kalter et al. |
| 6,020,633 | A | 2/2000 | Erikson |
| 6,034,542 | A | 3/2000 | Ridgeway |
| 6,167,558 | A | 12/2000 | Trimberger |
| 6,356,478 | B1 | 3/2002 | McCollum |
| 6,388,466 | B1 | 5/2002 | Wittig et al. |
| 6,404,226 | B1 | 6/2002 | Schadt |
| 6,687,167 | B2 | 2/2004 | Guaitini et al. |
| 6,798,240 | B1 | 9/2004 | Pedersen |
| 6,812,086 | B2 | 11/2004 | Murthy et al. |
| 6,828,823 | B1 | 12/2004 | Tsui |
| 6,943,580 | B2 | 9/2005 | Lewis et al. |
| 6,998,872 | B1 | 2/2006 | Chirania et al. |
| 7,030,652 | B1 | 4/2006 | Lewis et al. |
| 7,061,271 | B1 | 6/2006 | Young et al. |
| 7,126,214 | B2 | 10/2006 | Huppenthal et al. |
| 7,190,190 | B1 | 3/2007 | Camarota et al. |
| 7,193,433 | B1 | 3/2007 | Young |
| 7,219,237 | B1 | 5/2007 | Trimberger |
| 7,366,306 | B1 | 4/2008 | Trimberger |
| 7,385,417 | B1 | 6/2008 | Agrawal et al. |
| 7,420,390 | B1 | 9/2008 | Hutton et al. |
| 7,550,994 | B1 | 6/2009 | Camarota |
| 7,598,555 | B1 | 10/2009 | Papworth Parkin |
| 7,653,891 | B1 | 1/2010 | Anderson et al. |
| 7,747,025 | B1 | 6/2010 | Trimberger |
| 7,853,799 | B1 | 12/2010 | Trimberger |
| 7,933,140 | B2 | 4/2011 | Wang et al. |
| 7,944,231 | B2 | 5/2011 | Javerliac |
| 7,948,266 | B2 | 5/2011 | Schmit et al. |
| 7,973,556 | B1 | 7/2011 | Noguera Serra et al. |
| 8,064,224 | B2 | 11/2011 | Mahajan et al. |
| 8,081,079 | B1 | 12/2011 | Camarota |
| 8,159,268 | B1 | 4/2012 | Madurawe |
| 8,243,527 | B2 | 8/2012 | Hung et al. |
| 8,354,297 | B2 | 1/2013 | Pagaila et al. |
| 8,378,407 | B2 | 2/2013 | Audzeyeu et al. |
| 8,531,032 | B2 | 9/2013 | Yu et al. |
| 8,546,955 | B1 | 10/2013 | Wu |
| 8,592,886 | B2 | 11/2013 | Hsu et al. |
| 8,709,865 | B2 | 4/2014 | Hu et al. |
| 8,742,579 | B2 | 6/2014 | Pagaila et al. |
| 8,786,060 | B2 | 7/2014 | Yen et al. |
| 8,796,137 | B2 | 8/2014 | Pagaila et al. |
| 8,866,292 | B2 | 10/2014 | Beer et al. |
| 8,872,349 | B2 | 10/2014 | Chiu et al. |
| 8,878,360 | B2 | 11/2014 | Meyer et al. |
| 8,883,561 | B2 | 11/2014 | Park et al. |
| 8,885,334 | B1 | 11/2014 | Baxter |
| 8,895,440 | B2 | 11/2014 | Choi et al. |
| 8,912,822 | B2 | 12/2014 | Yasuda |
| 8,916,421 | B2 | 12/2014 | Gong et al. |
| 8,941,230 | B2 | 1/2015 | Kyozuka et al. |
| 8,952,489 | B2 | 2/2015 | Elian et al. |
| 8,952,521 | B2 | 2/2015 | Wojnowski et al. |
| 8,987,918 | B2 | 3/2015 | Razdan et al. |
| 8,993,377 | B2 | 3/2015 | Koo et al. |
| 9,003,221 | B1 | 4/2015 | Abugharbieh et al. |
| 9,082,806 | B2 | 7/2015 | Lin et al. |
| 9,106,229 | B1 | 8/2015 | Hutton |
| 9,135,185 | B2 | 9/2015 | Loh et al. |
| 9,147,638 | B2 | 9/2015 | Liu et al. |
| 9,224,647 | B2 | 12/2015 | Koo et al. |
| 9,225,512 | B1 | 12/2015 | Trimberger |
| 9,252,127 | B1 | 2/2016 | Shen et al. |
| 9,263,370 | B2 | 2/2016 | Shenoy et al. |
| 9,281,292 | B2 | 3/2016 | Hu et al. |
| 9,324,672 | B2 | 4/2016 | Pagaila et al. |
| 9,331,060 | B2 | 5/2016 | Otremba et al. |
| 9,343,442 | B2 | 5/2016 | Chen et al. |
| 9,349,703 | B2 | 5/2016 | Chiu et al. |
| 9,349,713 | B2 | 5/2016 | Kim et al. |
| 9,362,187 | B2 | 6/2016 | Ossimitz |
| 9,368,458 | B2 | 6/2016 | Wu et al. |
| 9,385,006 | B2 | 7/2016 | Lin |
| 9,385,009 | B2 | 7/2016 | Lin et al. |
| 9,385,105 | B2 | 7/2016 | Meyer et al. |
| 9,396,998 | B2 | 7/2016 | Kurita et al. |
| 9,397,050 | B2 | 7/2016 | Shin et al. |
| 9,406,619 | B2 | 8/2016 | Pagaila et al. |
| 9,406,658 | B2 | 8/2016 | Lee et al. |
| 9,437,260 | B2 | 9/2016 | Prenat et al. |
| 9,449,930 | B2 | 9/2016 | Kim et al. |
| 9,455,218 | B2 | 9/2016 | Ooi et al. |
| 9,508,626 | B2 | 11/2016 | Pagaila et al. |
| 9,524,955 | B2 | 12/2016 | Huang et al. |
| 9,543,276 | B2 | 1/2017 | Jee et al. |

(56) References Cited

U.S. PATENT DOCUMENTS 9,583,431 B1 2/2017 Rahman
9,593,009 B2 3/2017 Fuergut et al.
9,601,471 B2 3/2017 Zhai et al.
9,607,967 B1 3/2017 Shih
9,627,365 B1 4/2017 Yu et al.
9,640,259 B2 5/2017 Li et al.
9,679,863 B2 6/2017 Lin et al.
9,704,843 B2 7/2017 Kilger et al.
9,722,584 B1 8/2017 Chang et al.
9,735,113 B2 8/2017 Chi et al.
9,763,329 B1 9/2017 Mason
9,773,757 B2 9/2017 Yu et al.
9,806,058 B2 10/2017 Wei et al.
9,812,337 B2 11/2017 Chen et al.
9,818,720 B2 11/2017 Wei et al.
9,831,148 B2 11/2017 Yu et al.
9,859,896 B1 1/2018 Gaide et al.
9,881,850 B2 1/2018 Yu et al.
9,887,206 B2 2/2018 Su et al.
9,893,732 B1 2/2018 Lewis
9,899,248 B2 2/2018 Yu et al.
9,899,355 B2 2/2018 Yuan et al.
9,935,113 B2 4/2018 Wu et al.
9,966,325 B2 5/2018 Beyne
9,997,464 B2 6/2018 Hsieh et al.
10,015,916 B1 7/2018 Karp
10,026,681 B2 7/2018 Ko et al.
10,033,383 B1 7/2018 Richter et al.
10,037,963 B2 7/2018 Chen et al.
10,038,647 B1 7/2018 Lesea
10,043,768 B2 8/2018 Meyer et al.
10,056,351 B2 8/2018 Yu et al.
10,056,907 B1 8/2018 Asnaashari
10,062,648 B2 8/2018 Hsieh et al.
10,062,651 B2 8/2018 Liang et al.
10,079,243 B2 9/2018 Ramkumar
10,109,559 B2 10/2018 Lin et al.
10,109,588 B2 10/2018 Jeong et al.
10,109,617 B2 11/2018 Sugiyama et al.
10,153,222 B2 12/2018 Yu et al.
10,153,239 B2 12/2018 Wang et al.
10,157,828 B2 12/2018 Hsu et al.
10,157,849 B2 12/2018 Huang et al.
10,162,139 B1 12/2018 Wang et al.
10,163,798 B1 12/2018 Alur et al.
10,163,802 B2 12/2018 Lin et al.
10,177,188 B2 1/2019 Kang et al.
10,204,684 B2 2/2019 Widjaja
10,211,070 B2 2/2019 Lee et al.
10,211,182 B2 2/2019 Meyer et al.
10,256,219 B2 4/2019 Chew
10,276,382 B2 4/2019 Hunt et al.
10,290,611 B2 5/2019 Yu et al.
10,325,882 B2 6/2019 Kang et al.
10,333,623 B1 6/2019 Liao et al.
10,340,249 B1 7/2019 Yu et al.
10,347,606 B2 7/2019 Yu et al.
10,373,885 B2 8/2019 Yu et al.
10,419,001 B2 9/2019 Jo et al.
10,431,536 B2 10/2019 Kim et al.
10,447,274 B2 10/2019 Lee et al.
10,476,505 B2 11/2019 Ngai
10,490,521 B2 11/2019 Hu et al.
10,490,540 B2 11/2019 Yu et al.
10,504,835 B1 12/2019 Wang et al.
10,510,634 B2 12/2019 Lin et al.
10,510,650 B2 12/2019 Yu et al.
10,522,449 B2 12/2019 Chen et al.
10,541,227 B2 1/2020 Yeh et al.
10,541,228 B2 1/2020 Chen et al.
10,622,321 B2 4/2020 Yu et al.
10,741,537 B2 8/2020 Lu et al.
10,784,248 B2 9/2020 Yu et al.
10,797,031 B2 10/2020 Liao et al.
10,867,965 B2 12/2020 Shih et al.
10,892,011 B2 1/2021 Lin et al.
10,892,291 B2 1/2021 Chhun et al.
10,943,869 B2 3/2021 Zhai et al.
11,056,463 B2 7/2021 Takahashi et al.
11,063,017 B2 * 7/2021 Delacruz ............. H01L 23/5383
11,114,408 B2 9/2021 Shen et al.
11,211,334 B2 12/2021 Lin et al.
11,217,368 B2 1/2022 Choa et al.
11,276,661 B2 3/2022 Fang
11,282,776 B2 * 3/2022 Gandhi ............. H01L 23/49822
2001/0045844 A1 11/2001 New et al.
2001/0051426 A1 12/2001 Pozder et al.
2002/0092307 A1 7/2002 Ghoshal
2003/0122578 A1 7/2003 Masui et al.
2004/0041584 A1 3/2004 Sunaga et al.
2004/0145850 A1 7/2004 Fukumoto et al.
2004/0222817 A1 11/2004 Madurawe
2005/0046002 A1 3/2005 Lee et al.
2005/0185457 A1 8/2005 Kim et al.
2005/0218929 A1 10/2005 Wang et al.
2006/0138509 A1 6/2006 Lee et al.
2007/0037379 A1 2/2007 Enquist et al.
2007/0164279 A1 7/2007 Lin et al.
2007/0166912 A1 7/2007 Fenigstein et al.
2007/0279987 A1 12/2007 Fang et al.
2009/0114971 A1 5/2009 Cai et al.
2009/0243650 A1 10/2009 Madurawe
2009/0243652 A1 10/2009 Dorairaj et al.
2009/0267238 A1 10/2009 Joseph
2010/0039136 A1 2/2010 Chua-Eoan et al.
2010/0133704 A1 6/2010 Marimuthu et al.
2010/0157669 A1 6/2010 Audzeyeu
2010/0283085 A1 11/2010 Bemanian
2011/0026232 A1 2/2011 Lin et al.
2011/0221470 A1 9/2011 Javerliac et al.
2012/0193785 A1 8/2012 Lin et al.
2012/0217549 A1 8/2012 Widjaja
2012/0319248 A1 * 12/2012 Rahman ................ H01L 23/562
716/112
2013/0082399 A1 4/2013 Kim et al.
2013/0214432 A1 * 8/2013 Wu ......................... H01L 24/17
257/782
2013/0257477 A1 10/2013 Yasuda et al.
2013/0285253 A1 10/2013 Aoki et al.
2014/0017882 A1 1/2014 Lei
2014/0070380 A1 3/2014 Chiu et al.
2014/0070403 A1 3/2014 Pan et al.
2014/0131858 A1 5/2014 Pan et al.
2014/0183731 A1 7/2014 Lin et al.
2014/0185264 A1 7/2014 Chen et al.
2014/0203412 A1 7/2014 Wang et al.
2014/0210097 A1 7/2014 Chen
2014/0254232 A1 9/2014 Wu
2014/0302659 A1 10/2014 Phatak
2014/0339692 A1 11/2014 Kim et al.
2015/0008957 A1 1/2015 Olgiati et al.
2015/0014844 A1 1/2015 Wu et al.
2015/0085560 A1 3/2015 Candelier et al.
2015/0116965 A1 4/2015 Kim et al.
2015/0227662 A1 8/2015 Lepercq
2015/0287672 A1 10/2015 Yazdani
2015/0327367 A1 11/2015 Shen
2016/0079205 A1 3/2016 Lin et al.
2016/0118390 A1 4/2016 Liaw
2016/0133571 A1 5/2016 Lee et al.
2016/0141228 A1 5/2016 Leobandung
2016/0173101 A1 6/2016 Gao et al.
2016/0190113 A1 6/2016 Sharan et al.
2016/0217835 A1 7/2016 Blott et al.
2016/0351626 A1 12/2016 McCollum
2016/0372449 A1 12/2016 Rusu et al.
2017/0071552 A1 3/2017 Harpe et al.
2017/0117263 A1 4/2017 Yeh et al.
2017/0301650 A1 10/2017 Yu
2017/0358557 A1 12/2017 Chen et al.
2018/0053730 A1 2/2018 Shao
2018/0061742 A1 3/2018 Ananiev
2018/0068937 A1 3/2018 Marimuthu et al.
2018/0076179 A1 3/2018 Hsu et al.

(56) References Cited

U.S. PATENT DOCUMENTS

| | | | |
|---|---|---|---|
| 2018/0102776 | A1 | 4/2018 | Chandrasekar et al. |
| 2018/0150667 | A1 | 5/2018 | Yu et al. |
| 2018/0151477 | A1 | 5/2018 | Yu et al. |
| 2018/0151501 | A1 | 5/2018 | Yu et al. |
| 2018/0158746 | A1 | 6/2018 | Lin |
| 2018/0165396 | A1 | 6/2018 | Lin et al. |
| 2018/0174865 | A1 | 6/2018 | Yu et al. |
| 2018/0204810 | A1 | 7/2018 | Yu et al. |
| 2018/0204828 | A1 | 7/2018 | Yu et al. |
| 2018/0210799 | A1 | 7/2018 | Gao |
| 2018/0226349 | A1 | 8/2018 | Yu et al. |
| 2018/0226371 | A1 | 8/2018 | Enquist |
| 2018/0247905 | A1 | 8/2018 | Yu et al. |
| 2018/0269188 | A1 | 9/2018 | Yu et al. |
| 2018/0275193 | A1 | 9/2018 | Rouge et al. |
| 2018/0284186 | A1 | 10/2018 | Chadha |
| 2018/0286776 | A1 | 10/2018 | Yu et al. |
| 2018/0301351 | A1 | 10/2018 | Yu et al. |
| 2018/0301376 | A1 | 10/2018 | Shih et al. |
| 2018/0350629 | A1 | 12/2018 | Liu et al. |
| 2018/0350763 | A1 | 12/2018 | Yu et al. |
| 2018/0358312 | A1 | 12/2018 | Yu et al. |
| 2018/0374824 | A1 | 12/2018 | Yu et al. |
| 2019/0013276 | A1 | 1/2019 | Lee et al. |
| 2019/0019756 | A1 | 1/2019 | Yu et al. |
| 2019/0020343 | A1 | 1/2019 | Lin et al. |
| 2019/0051641 | A1 | 2/2019 | Lin et al. |
| 2019/0057931 | A1 | 2/2019 | Hsu et al. |
| 2019/0057932 | A1 | 2/2019 | Wu et al. |
| 2019/0067152 | A1 | 2/2019 | Wuu et al. |
| 2019/0097304 | A1 | 3/2019 | Hsiao et al. |
| 2019/0129817 | A1 | 5/2019 | Zhuo |
| 2019/0164834 | A1 | 5/2019 | Or-Bach et al. |
| 2019/0221547 | A1 | 7/2019 | Drab et al. |
| 2019/0238134 | A1 | 8/2019 | Lin et al. |
| 2019/0238135 | A1 | 8/2019 | Lin et al. |
| 2019/0245543 | A1 | 8/2019 | Lin et al. |
| 2019/0253056 | A1 | 8/2019 | Lin et al. |
| 2019/0304803 | A1 | 10/2019 | Hu et al. |
| 2019/0333871 | A1 | 10/2019 | Chen et al. |
| 2019/0347790 | A1 | 11/2019 | Lin et al. |
| 2019/0363715 | A1 | 11/2019 | Lin et al. |
| 2019/0371763 | A1 | 12/2019 | Agarwal et al. |
| 2019/0372574 | A1 | 12/2019 | Lin et al. |
| 2020/0006274 | A1 | 1/2020 | Chiang et al. |
| 2020/0058617 | A1 | 2/2020 | Wu et al. |
| 2020/0058626 | A1 | 2/2020 | Tai et al. |
| 2020/0082885 | A1 | 3/2020 | Lin et al. |
| 2020/0111734 | A1 | 4/2020 | Lin et al. |
| 2020/0144224 | A1 | 5/2020 | Lin et al. |
| 2020/0161242 | A1 | 5/2020 | Lin et al. |
| 2020/0243422 | A1 | 7/2020 | Kim et al. |
| 2020/0373215 | A1 | 11/2020 | Wu et al. |
| 2020/0395350 | A1 | 12/2020 | Wu et al. |
| 2021/0005592 | A1 | 1/2021 | Lin et al. |
| 2021/0043557 | A1 | 2/2021 | Lin et al. |
| 2021/0050300 | A1 | 2/2021 | Lin et al. |
| 2021/0090983 | A1 | 3/2021 | Lin et al. |
| 2021/0159180 | A1 | 5/2021 | Zhai et al. |
| 2021/0217702 | A1 | 7/2021 | Dabral et al. |
| 2021/0232744 | A1 | 7/2021 | Lin et al. |
| 2022/0013504 | A1 | 1/2022 | Dabral et al. |
| 2022/0020729 | A1 | 1/2022 | Gao et al. |
| 2023/0352439 | A1 | 11/2023 | Chen et al. |

FOREIGN PATENT DOCUMENTS

| | | |
|---|---|---|
| CN | 104282650 | 1/2015 |
| CN | 105745752 | 7/2016 |
| CN | 104064556 | 4/2019 |
| TW | 200623398 | 7/2006 |
| TW | 201413842 | 4/2014 |
| WO | WO00/36748 | 6/2000 |
| WO | WO2005010976 | 2/2005 |
| WO | WO2016160063 | 10/2016 |
| WO | WO2018004092 | 1/2018 |

* cited by examiner

341

| Input | | | | Output | | | | |
|---|---|---|---|---|---|---|---|---|
| A1 | A0 | x A3 | A2 | Dout C3 | C2 | C1 | C0 | |
| 0 | 0 | 0 | 0 | 0 | 0 | 0 | 0 | D0 |
| 0 | 0 | 0 | 1 | 0 | 0 | 0 | 0 | D1 |
| 0 | 0 | 1 | 0 | 0 | 0 | 0 | 0 | D2 |
| 0 | 0 | 1 | 1 | 0 | 0 | 0 | 0 | D3 |
| 0 | 1 | 0 | 0 | 0 | 0 | 0 | 0 | D4 |
| 0 | 1 | 0 | 1 | 0 | 0 | 0 | 1 | D5 |
| 0 | 1 | 1 | 0 | 0 | 0 | 1 | 0 | D6 |
| 0 | 1 | 1 | 1 | 0 | 0 | 1 | 1 | D7 |
| 1 | 0 | 0 | 0 | 0 | 0 | 0 | 0 | D8 |
| 1 | 0 | 0 | 1 | 0 | 0 | 1 | 0 | D9 |
| 1 | 0 | 1 | 0 | 0 | 1 | 0 | 0 | D10 |
| 1 | 0 | 1 | 1 | 0 | 1 | 1 | 0 | D11 |
| 1 | 1 | 0 | 0 | 0 | 0 | 0 | 0 | D12 |
| 1 | 1 | 0 | 1 | 0 | 0 | 1 | 1 | D13 |
| 1 | 1 | 1 | 0 | 0 | 1 | 1 | 0 | D14 |
| 1 | 1 | 1 | 1 | 1 | 0 | 0 | 1 | D15 |

300

300

Before reconfiguration

| $IU_{(n-1)}$ | $CPM_{(n-1)}$ | $LS_{(n-1)}$ | $DIM_{(n-1)}$ |
|---|---|---|---|
| $IU_{(n-1)a}$ | $CPM_{(a,1,1)}$ | $LS_{(n-1)a}$ | $DIM_{(a,1,1')}$<br>$DIM_{(a,2,2')}$ |
| $IU_{(n-1)b}$ | $CPM_{(b,2,2)}$<br>$CPM_{(b,3,3)}$ | $LS_{(n-1)b}$ | $DIM_{(b,3,3')}$<br>$DIM_{(b,4,4')}$ |
| $IU_{(n-1)c}$ | $CPM_{(c,4,4)}$ | $LS_{(n-1)c}$ | $DIM_{(c,5,5')}$<br>$DIM_{(c,6,6')}$<br>$DIM_{(c,7,6')}$ |

After reconfiguration

| $IUC_n$ | $CPMC_n$ | $LSC_n$ | $DIMC_n$ |
|---|---|---|---|
| $IUC_{ne}$ | $CPMC_{(e,1,1)}$ | $LSC_{ne}$ | $DIMC_{(e,1,1')}$<br>$DIMC_{(e,2,2')}$ |
| $IUC_{nf}$ | $CPMC_{(f,2,4)}$<br>$CPMC_{(f,3,5)}$ | $LSC_{nf}$ | $DIMC_{(f,3,8')}$<br>$DIMC_{(f,4,9')}$<br>$DIMC_{(f,5,10')}$ |
| $IUC_{ng}$ | $CPMC_{(g,4,2)}$<br>$CPMC_{(g,5,5)}$ | $LSC_{ng}$ | $DIMC_{(g,6,11')}$<br>$DIMC_{(g,8,5')}$ |
| $IUC_{nh}$ | $CPMC_{(h,6,6)}$ | $LSC_{nh}$ | $DIMC_{(h,7,7')}$<br>$DIMC_{(h,9,6')}$ |

Fig. 28

LOGIC DRIVE BASED ON MULTICHIP PACKAGE USING INTERCONNECTION BRIDGE

PRIORITY CLAIM

This application is a continuation of application Ser. Nos. 17/151,634, 17/151,634, filed Jan. 18, 2021, now U.S. Pat. No. 12,027,491, which is a continuation of application Ser. No. 16/590,981, filed Oct. 2, 2019, now U.S. Pat. No. 10,937,762, which claims priority benefits from U.S. provisional application No. 62/741,513, filed on Oct. 4, 2018 and entitled "LOGIC DRIVE BASED ON STANDARDIZED COMMODITY PROGRAMMABLE LOGIC SEMICONDUCTOR IC CHIPS". The present application incorporates the foregoing disclosures herein by reference.

FIELD OF THE DISCLOSURE

The present invention relates to a logic package, logic package drive, logic device, logic module, logic drive, logic disk, logic disk drive, logic solid-state disk, logic solid-state drive. Field Programmable Gate Array (FPGA) logic disk. FPGA logic drive, or programmable logic drive (to be abbreviated as "logic drive" below, that is when "logic drive" is mentioned below, it means and reads as "logic package, logic package drive, logic device, logic module, logic drive, logic disk, logic disk drive, logic solid-state disk, logic solid-state drive. FPGA logic disk. FPGA logic drive, or programmable logic drive") comprising plural programmable logic semiconductor IC chips such as FPGA IC chips, and one or plural non-volatile IC chips for field programming purposes, and more particularly to a standardized commodity logic drive formed by using plural standardized commodity FPGA IC chips and one or plural non-volatile IC chip or chips, and to be used for different specific applications when field programmed or user programmed.

BRIEF DESCRIPTION OF THE RELATED ART

The Field Programmable Gate Array (FPGA) semiconductor integrated circuit (IC) has been used for development of new or innovated applications, or for small volume applications or business demands. When an application or business demand expands to a certain volume and extend to a certain time period, the semiconductor IC suppliers may usually implement the application in an Application Specific IC (ASIC) chip, or a Customer-Owned Tooling (COT) IC chip. The switch from the FPGA design to the ASIC or COT design is because the current FPGA IC chip, for a given application and compared with an ASIC or COT chip, (1) has a larger semiconductor chip size, lower fabrication yield, and higher fabrication cost, (2) consumes more power, (3) gives lower performance. When the semiconductor technology nodes or generations migrate, following the Moore's Law, to advanced nodes or generations (for example below 20 nm or 10 nm), the Non-Recurring Engineering (NRE) cost for designing an ASIC or COT chip increases greatly (more than US $10M or even exceeding US $20M, US $50M, US $100M or US $200M), as seen in FIG. 32. The cost of a photo mask set for an ASIC or COT chip at the 16 nm technology node or generation may be over US $5M. US $10M or US $20M. The high NRE cost in implementing the innovation or application using the advanced IC technology nodes or generations slows down or even stops the innovation or application using advanced and useful semiconductor technology nodes or generations. A new approach or technology is needed to inspire the continuing innovation and to lower down the barrier for implementing the innovation in the semiconductor IC chips.

SUMMARY OF THE DISCLOSURE

One aspect of the disclosure provides a standardized commodity logic drive in a multi-chip package comprising a plurality of standardized commodity FPGA IC chips and one or a plurality of non-volatile memory IC chips for use in different applications requiring logic, computing and/or processing functions by field programming. Uses of the standardized commodity logic drive is analogues to uses of a standardized commodity data storage solid-state disk (drive), data storage hard disk (drive), data storage floppy disk, Universal Serial Bus (USB) flash drive, USB drive, USB stick, flash-disk, or USB memory, and differs in that the latter has memory functions for data storage, while the former has logic functions for processing and/or computing. Uses of the standardized commodity FPGA IC chips is analogues to uses of a standardized commodity data storage memory IC chips, for example, standard commodity DRAM chips or standard commodity NAND flash chips, and differs in that the latter has memory functions for data storage, while the former has logic functions for processing and/or computing.

Another aspect of the disclosure provides a method to reduce Non-Recurring Engineering (NRE) expenses for implementing an innovation and/or an application in semiconductor IC chips by using the standardized commodity logic drive comprising a plurality of standardized commodity FPGA IC chips. A person, user, or developer with an innovation and/or an application concept or idea needs to purchase the standardized commodity logic drive and develops or writes software codes or programs to load into the standardized commodity logic drive to implement his/her innovation and/or application concept or idea; wherein said innovation and/or application (maybe abbreviated as innovation) comprises (i) innovative algorithms and/or architectures of computing, processing, learning and/or inferencing, and/or (ii) innovative and/or specific applications. Compared to the implementation by developing a logic ASIC or COT IC chip, the NRE cost may be reduced by a factor of equal to or larger than 2, 5, 10, 30, 50 or 100 using the disclosed standardized commodity logic drive. For advanced semiconductor technology nodes or generations (for example more advanced than or below 20 nm or 10 nm), the NRE cost for designing an ASIC or COT chip increases greatly, more than US $10M or even exceeding US $20M, US $50M, US $100M, or US $200M, as seen in FIG. 32. The cost of a photo mask set for an ASIC or COT chip at the 16 nm technology node or generation may be over US $5M, US $10M, or US $20M. Implementing the same or similar innovation and/or application using the logic drive may reduce the NRE cost down to smaller than US $10M or even less than US $5M, US $3M, US $2M or US $1M. The aspect of the disclosure inspires the innovation and lowers the barrier for implementing the innovation in IC chips designed and fabricated using an advanced IC technology node or generation, for example, a technology node or generation more advanced than or below 20 nm or 10 nm.

Another aspect of the disclosure provides again a "public innovation platform" for innovators to easily and cheaply implement or realize their innovation (algorithms, architectures and/or applications) in semiconductor IC chips using advanced IC technology nodes more advanced than 20 nm, and for example, using a technology node of 16 nm, 10 nm, 7 nm, 5 nm or 3 nm by using logic drives: wherein said innovation comprises (i) innovative algorithms or architectures of computing, processing, learning and/or inferencing, and/or (ii) innovative and/or specific applications. In early days of 1990's, innovators could implement their innovation (algorithms, architectures and/or applications) by designing IC chips and fabricate their designed IC chips in a semiconductor foundry fab using technology nodes at 1 μm, 0.8 μm, 0.5 μm, 0.35 μm, 0.18 μm or 0.13 μm, at a cost of about several hundred thousands of US dollars. The IC foundry fab was then the "public innovation platform". However, when IC technology nodes migrate to a technology node more advanced than 20 nm, and for example to the technology nodes of 16 nm, 10 nm, 7 nm, 5 nm or 3 nm, only a few giant system or IC design companies, not the public innovators, can afford to use the semiconductor IC manufacturing foundry fab. It costs about or over 10 million US dollars to develop and implement an IC chip using these advanced technology nodes. The semiconductor IC manufacturing foundry fab is now not the "public innovation platform" anymore, it becomes a "club innovation platform" for club innovators. The disclosed logic drives, comprising standard commodity FPGA IC chips, provides public innovators the "public innovation platform" back to semiconductor IC industry again just as in 1990's, as illustrated in FIG. 32. The innovators can implement or realize their innovation (algorithms, architectures and/or applications) by using the standard commodity of logic drives and writing software programs using common programing languages, for example, C, Java, C++, C#, Scala, Swift, Matlab, Assembly Language, Paseal, Python, Visual Basic, PL/SQL or JavaScript languages, at cost of less than 500K or 300K US dollars. The innovators can use their own commodity logic drives or they can rent logic drives in data centers or clouds through networks.

Another aspect of the disclosure provides an innovation platform for an innovator, comprising (i) multiple logic drives in a data center or a cloud, wherein multiple logic drives comprise multiple standard commodity FPGA IC chips fabricated using a semiconductor IC process technology node more advanced than 20 nm or 10 nm technology node: (ii) an innovator's device; and (iii) multiple users' devices. The innovator's device and the multiple users' devices are communicating with the multiple logic drives in the data center or the cloud through an internet or a network, wherein the innovator develops and writes software programs to implement his innovation (algorithms, architectures and/or applications) in a common programing language to program, through the internet or the network, the multiple logic drives in the data center or the cloud, wherein the common programing language comprises Java, C++, C#, Scala, Swift, Matlab, Assembly Language, Paseal, Python, Visual Basic, PL/SQL or JavaScript language. After programming the logic drives, the innovator or the multiple users may use the programed logic drives for his or their innovations (algorithms, architectures and/or applications) through the internet or the network: wherein said innovations comprise (i) innovative algorithms or architectures of computing, processing, learning and/or inferencing, and/or (ii) innovative and/or specific applications.

Another aspect of the disclosure provides a logic drive with high programmability and high efficiency using a multi-chip package comprising a plurality of FPGA IC chip, CPU chip, GPU chip, TPU chip and ASIC chip. The programmability of semiconductor IC chips decreases, in order, from FPGA IC chip, CPU chip, GPU chip, TPU chip to ASIC chip, while the efficiency of semiconductor IC chips increases, in order, from FPGA IC chip, CPU chip, GPU chip, TPU chip to ASIC chip, as illustrated in FIG. 31. The disclosed logic drive provides FPGA IC chips to improve the programmability of high efficient semiconductor IC chips, such as ASIC chip, TPU chip, GPU chip and CPU chip.

Another aspect of the disclosure provides a method to change the current logic ASIC or COT IC chip business into a commodity logic IC chip business, like the current commodity DRAM, or commodity flash memory IC chip business, by using the standardized commodity logic drive. Since the performance, power consumption, and engineering and manufacturing costs of the standardized commodity logic drive may be better or equal to that of the ASIC or COT IC chip for a same innovation (algorithms, architectures and/or applications), the standardized commodity logic drive may be used as an alternative for designing an ASIC or COT IC chip. The current logic ASIC or COT IC chip design, manufacturing and/or product companies (including fabless IC design and product companies, or IC foundry or contracted manufacturers (may be product-less), and/or vertically-integrated IC design, manufacturing and product (IDM) companies) may become companies like the current commodity DRAM, or flash memory IC chip design, manufacturing, and/or product companies: or like the current DRAM module design, manufacturing, and/or product companies: or like the current flash memory module, flash USB stick or drive, or flash solid-state drive or disk drive design, manufacturing, and/or product companies. The current logic ASIC or COT IC chip design and/or manufacturing companies (including fabless IC design and product companies. IC foundry or contracted manufacturers (may be productless), vertically-integrated IC design, manufacturing and product companies) may become companies in the following business models: (1) designing, manufacturing, and/or selling the standard commodity FPGA IC chips; and/or (2) designing, manufacturing, and/or selling the standard commodity logic drives. The business model is similar to the current commodity DRAM or flash memory chip and module business. A person, user, customer, or software developer, or algorithm/architecture/application developer may purchase the standardized commodity logic drive and write software codes to program them for his/her desired algorithms, architectures and/or applications, for example, in algorithms, architectures and/or applications of Artificial Intelligence (AI), machine learning, deep learning, big data, Internet Of Things (IoT), industry computers, Virtual Reality (VR), Augmented Reality (AR), self-drive or driver-less car, Graphic Processing (GP), Digital Signal Processing (DSP), Micro Controlling (MC), and/or Central Processing (CP), The logic drive may be programed to perform functions like a graphic chip, or a baseband chip, or an Ethernet chip, or a wireless (for example, 802.11ac) chip, or an AI chip. The logic drive may be alternatively programmed to perform functions of all or any combinations of functions of Artificial Intelligence (AI), machine learning, deep learning, big data. Internet Of Things (IOT), industry computers. Virtual Reality (VR). Augmented Reality (AR), car electronics, Graphic Processing (GP), Digital Signal Processing (DSP), Micro Controlling (MC), and/or Central Processing (CP). The logic drive may be field programmed as an accelerator for, for example, the AI functions, in the user-end, data center or cloud, in the algorithms, architectures and/or applications of training and/or inferring of the AI functions.

Another aspect of the disclosure provides a method to change the current logic ASIC or COT IC chip hardware business into a software business by using the standardized commodity logic drive. Since the performance, power consumption, and engineering and manufacturing costs of the standardized commodity logic drive may be better or equal to that of the ASIC or COT IC chip for a same innovation (algorithms, architectures and/or applications), the standardized commodity logic drive may be used as an alternative for designing an ASIC or COT IC chip. The current ASIC or COT IC chip design companies or suppliers may become software developers or suppliers: they may adapt the following business models: (1) become software companies to develop and sell software for their innovation (algorithms, architectures and/or applications), and let their customers or users to install software in the customers' or users' own standard commodity logic drive; and/or (2) still hardware companies by selling hardware without performing ASIC or COT IC chip design and/or production. In the case (2), they may install their in-house developed software for the innovation (algorithms, architectures and/or applications) in the purchased standard commodity logic drive; and sell the program-installed logic drive to their customers or users. In both cases (1) and (2), either the customers/users or developers/companies may write software codes into the standard commodity logic drive (that is, loading the software codes in the standardized commodity logic drive) for their desired algorithms, architectures and/or applications, for example, in algorithms, architectures and/or applications of Artificial Intelligence (AI), machine learning, deep learning, big data. Internet Of Things (IOT), industry computers, car electronics. Virtual Reality (VR). Augmented Reality (AR). Graphic Processing. Digital Signal Processing, micro controlling, and/or Central Processing. The logic drive may be programed to perform functions like a graphic chip, or a baseband chip, or an Ethernet chip, or a wireless (for example, 802.11ac) chip, or an AI chip. The logic drive may be alternatively programmed to perform functions of all or any combinations of functions of Artificial Intelligence (AI), machine learning, deep learning, big data. Internet Of Things (IOT), industry computers, car electronics, Virtual Reality (VR), Augmented Reality (AR), car electronics, Graphic Processing (GP), Digital Signal Processing (DSP), Micro Controlling (MC), and/or Central Processing (CP).

Another aspect of the disclosure provides a standard commodity FPGA IC chip for use in the standard commodity logic drive. The standard commodity FPGA IC chip is designed, implemented and fabricated using an advanced semiconductor technology node or generation, for example more advanced than, or below 20 nm or 10 nm: with a chip size and manufacturing yield optimized with the minimum manufacturing cost for the used semiconductor technology node or generation. The standard commodity FPGA IC chip may have an area between 400 $mm^2$ and 9 $mm^2$, 225 $mm^2$ and 9 $mm^2$, 144 $mm^2$ and 16 $mm^2$, 100 $mm^2$ and 16 $mm^2$, 75 $mm^2$ and 16 $mm^2$, or 50 $mm^2$ and 16 $mm^2$. Transistors used in the advanced semiconductor technology node or generation may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET. The standard commodity FPGA IC chip may only communicate directly with other chips in or of the logic drive only: its I/O circuits may require only small I/O drivers or receivers, and small or none Electrostatic Discharge (ESD) devices. The driving capability, loading, output capacitance, or input capacitance of I/O drivers or receivers, or I/O circuits may be between 0.05 pF and 2 pF or 0.1 pF and 1 pF: or smaller than 2 pF or 1 pF. The size of the ESD device may be between 0.05 pF and 2 pF or 0.05 pF and 1 pF: or smaller than 2 pF, 1 pF or 0.5 pF. For example, a bi-directional (or tri-state) I/O pad or circuit may comprise an ESD circuit, a receiver, and a driver, and has an input capacitance or output capacitance between 0.05 pF and 2 pF or 0.1 pF and 1 pF: or smaller than 2 pF or 1 pF. All or most control and/or Input/Output (I/O) circuits or units (for example, the off-logic-drive I/O circuits, i.e., large I/O circuits, communicating with circuits or components external or outside of the logic drive) are outside of, or not included in the standard commodity FPGA IC chip, but are included in another dedicated control chip, dedicated I/O chip, or dedicated control and I/O chip, packaged in the same logic drive. None or minimal area of the standard commodity FPGA IC chip is used for the control or I/O circuits, for example, less than 15%, 10%, 5%, 2%, 1%, 0.5% or 0.1% area is used for the control or IO circuits: or, none or minimal transistors of the standard commodity FPGA IC chip are used for the control or I/O circuits, for example, less than 15%, 10%, 5%, 2%, 1%, 0.5% or 0.1% of the total number of transistors are used for the control or I/O circuits; or all or most area of the standard commodity FPGA IC chip is used for (i) logic blocks comprising logic gate arrays, computing units or operators, and/or Look-Up-Tables (LUTs) and multiplexers, and/or (ii) programmable interconnection. For example, greater than 85%, 90%, 95%, 98%, 99%, 99.5% or 99.9% area is used for logic blocks, and/or programmable interconnection: or, all or most transistors of the standard commodity FPGA IC chip are used for logic blocks, and/or programmable interconnection, for example, greater than 85%, 90%, 95%, 98%, 99%, 99.5% or 99.9% of the total number of transistors are used for logic blocks, and/or programmable interconnection. The area of the standard commodity FPGA IC chip is measured without the seal ring and the dicing area of the chip; that means the area is only including an area upto the inner boundary of the seal ring.

Another aspect of the disclosure provides a standard commodity FPGA IC chip for use in the standard commodity logic drive. The standard commodity FPGA chip comprises logic blocks. The logic block comprises: (A), logic cells comprising (i) logic gate arrays comprising Boolean logic operators, for example, NAND, NOR, AND, and/or OR circuits; and/or (ii) Look-Up-Tables (LUTs) and multiplexers, (B), computing and processing units comprising, for examples, adder, multiplication, and/or division circuits, registers, and/or multiplexers. The Boolean operators, the functions of logic gates, or computing, operations or processes may be carried out using the programmable wires or lines (the programmable metal interconnection wires or lines) on the FPGA IC chip: while certain Boolean operators, logic gates, or certain computing, operations or processes may be carried out using the fixed wires or lines (the metal interconnection wires or lines) on the FPGA IC chip. For example, the adder and/or multiplier may be designed and implemented by the fixed wires or lines (the fixed metal interconnection wires or lines) on the FPGA IC chip, for interconnecting logic circuits of the adder and/or multiplier. Alternatively, the Boolean operators, the functions of logic gates, or computing, operations or processes may be carried out using, for example. Look-Up-Tables (LUTs) and/or multiplexers. The LUTs store or memorize the processing or computing results of logic gates or cells, computing results of calculations, decisions of decision-making processes, or results of operations, events or activities. The LUTs may store or memorize data or information of results in, for example, SRAM cells. The SRAM cells may be distributed over all locations in the FPGA chip, and are nearby or close to their corresponding multiplexers in the logic blocks. Alternatively, the SRAM cells may be located in a SRAM array, in a certain area or location of the FPGA chip: wherein the SRAM cell array aggregates or comprises multiple of the SRAM cells of LUTs for the selection multiplexers in logic blocks in the distributed locations. Alternatively, the SRAM cells may be located in one of multiple SRAM arrays, in multiple certain areas of the FPGA chip: each of the SRAM arrays aggregates or comprises multiple of the SRAM cells of LUTs for the selection multiplexers in logic blocks in the distributed locations. The data stored or latched in each of SRAM cells are input to the multiplexer for selection.

The programmable interconnections of the standard commodity FPGA chip comprise cross-point switches in the middle of interconnection metal lines or traces. For example, n metal lines or traces are connected to the input terminals of the cross-point switches, and m metal lines or traces are connected to the output terminals of the cross-point switches, and the cross-point switches are located between the n metal lines or traces and the m metal lines and traces. The cross-point switches are designed such that each of the n metal lines or traces may be programed to connect to anyone of the m metal lines or traces. Since the standard commodity FPGA IC chip comprises mainly the regular and repeated gate arrays or blocks. LUTs and multiplexers, or programmable interconnection, just like standard commodity DRAM, or NAND flash IC chips, the manufacturing yield may be very high, for example, greater than 80%, 90% or 95% for a chip area greater than, for example, 50 $mm^2$.

Alternatively, the cross-point switches may comprise, for example, multiplexers and switch buffers. The multiplexer selects one of the n inputting data from the n inputting metal lines based on the data stored in the 5T or 6T SRAM cells; and outputs the selected one of inputs to a switch buffer. The switch buffer passes or does not pass the output data from the multiplexer to one metal line connected to the output of the switch buffer based on the data stored in the 5T or 6T SRAM cells.

Another aspect of the disclosure provides the standard commodity logic drive in a multi-chip package comprising a plurality of standard commodity FPGA IC chips and one or a plurality of non-volatile memory IC chips, for use in different applications requiring logic, computing and/or processing functions by field programming, wherein the plurality of standard commodity FPGA IC chips, each is in a bare-die format or in a single-chip or multi-chip package. Each of the plurality of standard commodity FPGA IC chips may have standard common features or specifications: (1) logic blocks including (i) system gates with the count greater than or equal to 2M, 10M, 20M, 50M or 100M, (ii) logic cells or elements with the count greater than or equal to 64K, 128K, 512K, 1M, 4M or 8M, (iii) hard macros, for example DSP slices, microcontroller macros, multiplexer macros, fixed-wired adders, and/or fixed-wired multipliers and/or (iv) blocks of memory with the bit count equal to or greater than 1M, 10M, 50M, 100M, 200M or 500M bits: (2) the number of inputs to each of the logic blocks or operators: the number of inputs to each of the logic block or operator may be greater or equal to 4, 8, 16, 32, 64, 128, or 256: (3) the power supply voltage: the voltage may be between 0.1V and 2.5V, 0.1V and 2V, 0.1V and 1.5V, or 0.1V and 1V: (4) the I/O pads, in terms of layout, location, number and function. Since the FPGA chips are standard commodity IC chips, the number of FPGA chip designs or products is reduced to a small number, therefore, the expensive photo masks or mask sets for fabricating the FPGA chips using advanced semiconductor nodes or generations are reduced to a few mask sets. For example, reduced down to between 3 and 20 mask sets. 3 and 10 mask sets, or 3 and 5 mask sets for a specific technology node or generation. The NRE and production expenses are therefore greatly reduced. With the few designs and products, the manufacturing processes may be tuned or optimized for the few chip designs or products, and resulting in very high manufacturing chip yields. This is similar to the current advanced standard commodity DRAM or NAND flash memory design and production. Furthermore, the chip inventory management becomes easy, efficient and effective; therefore, resulting in a shorter FPGA chip delivery time and becoming very cost-effective.

Another aspect of the disclosure provides the standard commodity logic drive in a multi-chip package comprising the plurality of standard commodity FPGA IC chips, for use in different algorithms, architectures and/or applications requiring logic, computing and/or processing functions by field programming, wherein the plurality of standard commodity FPGA IC chips, each is in a bare-die format or in a single-chip or multi-chip package. Each of the plurality of standard commodity FPGA IC chips may have standard common features or specifications as described and specified above. Similar to the standard DRAM IC chips for use in a DRAM module, the standard commodity FPGA IC chips in the logic drive, each chip may further comprise some additional I/O pins or pads, for example: (1) one chip enable pin or pad, (2) two or more input selection pins or pads and/or (3) two or more output selection pins or pads. Each of the plural standard commodity FPGA IC chips may comprise, for example, 4 I/O ports, and each I/O port may comprise 64 bi-directional I/O circuits. The above additional I/O pins or pads are used to select one I/O port from the above 4 I/O ports for each of the standard commodity FPGA IC chips.

Another aspect of the disclosure provides the standard commodity logic drive in a multi-chip package comprising the plurality of standard commodity FPGA IC chips and one or a plurality of non-volatile memory IC chips, for use in different applications requiring logic, computing and/or processing functions by field programming, wherein the plurality of standard commodity FPGA IC chips, each is in a bare-die format or in a single-chip or multi-chip package. Each of the plurality of standard commodity FPGA IC chips may have standard common features or specifications as described and specified above. Each of the plural standard commodity FPGA IC chip may comprise multiple logic blocks, wherein each logic block may comprise, for example, (1) 1 to 16 of 8-by-8 adders, (2) 1 to 16 of 8-by-8 multipliers. (3) 256 to 2K of logic cells, wherein each logic cell comprises 1 register and 1 to 4 of LUTs (Look-Up-Tables), wherein each LUT comprises 4 to 256 bits of data or information. The above 1 to 16 of 8-by-8 adders and/or 1 to 16 of 8-by-8 multipliers may be designed and formed by fixed metal wires or lines (metal interconnection wires or lines) on each of the FPGA IC chips.

Another aspect of the disclosure provides the standard commodity logic drive in a multi-chip package comprising a plurality of standard commodity FPGA IC chips and one or a plurality of non-volatile memory IC chips, for use in different algorithms, architectures and/or applications requiring logic, computing and/or processing functions by field programming, wherein the plurality of standard commodity FPGA IC chips, each is in a bare-die format or in a single-chip or multi-chip package format. The standard commodity logic drive may have standard common features, counts or specifications: (1) logic blocks including (i) system gates with the count greater than or equal to 8M, 40M, 80M, 200M or 400M, (ii) logic cells or elements with the count greater than or equal to 256K, 512K, 2M, 4M, 16M or 32M, (iii) hard macros, for example DSP slices, microcontroller macros, multiplexer macros, fixed-wired adders, and/or fixed-wired multipliers and/or (iv) blocks of memory with the bit count equal to or greater than 4M, 40M, 200M, 400M, 800M or 2G bits: (2) the power supply voltage: the voltage may be between 0.1V and 12V, 0.1V and 7V, 0.1V and 3V, 0.1V and 2V, 0.1V and 1.5V, or 0.1V and 1V: (3) the I/O pads in the multi-chip package of the standard commodity logic drive, in terms of layout, location, number and function: wherein the logic drive may comprise the I/O pads, metal pillars or bumps connecting or coupling to one or a plurality of (2, 3, 4, or more than 4) Universal Serial Bus (USB) ports, one or a plurality of IEEE 1394 ports, one or a plurality of Ethernet ports, one or a plurality of audio ports or serial ports, for example, RS-232 or COM (communication) ports, wireless transceiver I/Os, and/or Bluetooth transceiver I/Os, and etc. The logic drive may also comprise the I/O pads, metal pillars or bumps connecting or coupling to Serial Advanced Technology Attachment (SATA) ports, or Peripheral Components Interconnect express (PCIe) ports for communicating, connecting or coupling with the memory device or drive. Since the logic drives are standard commodity products, the product inventory management becomes easy, efficient and effective, therefore resulting in a shorter logic drive delivery time and becoming cost-effective.

Another aspect of the disclosure provides the standard commodity logic drive in a multi-chip package further comprising a dedicated control chip, a dedicated I/O chip, and/or a dedicated control and I/O chip.

The dedicated control chip, the dedicated I/O chip, and/or the dedicated control and I/O chip are/is designed, implemented and fabricated using varieties of semiconductor technology nodes or generations, including old or matured technology nodes or generations, for example, a semiconductor node or generation less advanced than or equal to, or above or equal to 20 nm, 30 nm, 40 nm, 50 nm, 90 nm, 130 nm, 250 nm, 350 nm, or 500 nm. The semiconductor technology node or generation used in the dedicated control chip, the dedicated I/O chip, and/or the dedicated control and I/O chip is 1, 2, 3, 4, 5 or greater than 5 nodes or generations older, more matured or less advanced than that used in the standard commodity FPGA IC chips packaged in the same logic drive. Transistors used in the dedicated control chip, the dedicated I/O chip, and/or the dedicated control and I/O chip may be a Fully Depleted Silicon-on-insulator (FDSOI) MOSFET, a Partially Depleted Silicon-on-insulator (PDSOI) MOSFET or a conventional MOSFET. Transistors used in the dedicated control chip, the dedicated I/O chip, and/or the dedicated control and I/O chip may be different from that used in the standard commodity FPGA IC chips packaged in the same logic drive: for example, the dedicated control chip, the dedicated I/O chip, and/or the dedicated control and I/O chip may use the conventional MOSFET, while the standard commodity FPGA IC chips packaged in the same logic drive may use the FINFET: or the dedicated control chip, the dedicated I/O chip, and/or the dedicated control and I/O chip may use the Fully Depleted Silicon-on-insulator (FDSOI) MOSFET, while the standard commodity FPGA IC chips packaged in the same logic drive may use the FINFET. The power supply voltage used in the dedicated control chip, the dedicated I/O chip, and/or the dedicated control and I/O chip may be greater than or equal to 1.5V, 2.0 V, 2.5V, 3 V, 3.5V, 4V, or 5V, while the power supply voltage used in the standard commodity FPGA IC chips packaged in the same logic drive may be smaller than or equal to 2.5V, 2V, 1.8V, 1.5V, or 1 V, The power supply voltage used in the dedicated control chip, the dedicated I/O chip, and/or the dedicated control and I/O chip may be different from that used in the standard commodity FPGA IC chips packaged in the same logic drive; for example, the dedicated control chip, the dedicated I/O chip, and/or the dedicated control and I/O chip may use a power supply of 4V, while the standard commodity FPGA IC chips packaged in the same logic drive may use a power supply voltage of 1.5V; or the dedicated control chip, the dedicated I/O chip, and/or the dedicated control and I/O chip may use a power supply of 2.5V, while the standard commodity FPGA IC chips packaged in the same logic drive may use a power supply of 0.75V. The gate oxide (physical) thickness of the Field-Effect-Transistors (FETs) may be thicker than or equal to 5 nm, 6 nm, 7.5 nm, 10 nm, 12.5 nm, or 15 nm, while the gate oxide (physical) thickness of FETs used in the standard commodity FPGA IC chips packaged in the same logic drive may be thinner than 4.5 nm, 4 nm, 3 nm or 2 nm. The gate oxide (physical) thickness of FETs used in the dedicated control chip, the dedicated I/O chip, and/or the dedicated control and I/O chip may be different from that used in the standard commodity FPGA IC chips packaged in the same logic drive: for example, the dedicated control chip, the dedicated I/O chip, and/or the dedicated control and I/O chip may use a gate oxide (physical) thickness of FETs of 10 nm, while the standard commodity FPGA IC chips packaged in the same logic drive may use a gate oxide (physical) thickness of FETs of 3 nm; or the dedicated control chip, the dedicated I/O chip, and/or the dedicated control and I/O chip may use a gate oxide (physical) thickness of FETs of 7.5 nm, while the standard commodity FPGA IC chips packaged in the same logic drive may use a gate oxide (physical) thickness of FETs of 2 nm. The dedicated control chip, the dedicated I/O chip, and/or the dedicated control and I/O chip provide inputs and outputs, and ESD protection for the logic drive. The dedicated control chip, the dedicated I/O chip, and/or the dedicated control and I/O chip provide (i) large drivers or receivers, or I/O circuits for communicating with external or outside (of the logic drive), and (ii) small drivers or receivers, or I/O circuits for communicating with chips in or of the logic drive. The large drivers or receivers, or I/O circuits for communicating with external or outside (of the logic drive) have driving capability: loading, output capacitance or input capacitance lager or bigger than that of the small drivers or receivers, or I/O circuits for communicating with chips in or of the logic drive. The driving capability, loading, output capacitance, or input capacitance of the large I/O drivers or receivers, or I/O circuits for communicating with external or outside (of the logic drive) may be between 2 pF and 100 pF, 2 pF and 50 pF, 2 pF and 30 pF, 2 pF and 20 pF, 2 pF and 15 pF, 2 pF and 10 pF, or 2 pF and 5 pF: or larger than 2 pF, 3 pF, 5 pF, 10 pF, 15 pF or 20 pF. The driving capability, loading, output capacitance, or input capacitance of the small I/O drivers or receivers, or I/O circuits for communicating with chips in or of the logic drive may be between 0.05 pF and 2 pF or 0.1 pF and 1 pF: or smaller than 2 pF or 1 pF. The size of ESD protection device on the dedicated I/O chip is larger than that on other standard commodity FPGA IC chips in the same logic drive. The size of the ESD device in the large I/O circuits may be between 0.5 pF and 20 pF, 0.5 pF and 15 pF, 0.5 pF and 10 pF, 0.5 pF and 5 pF or 0.5 pF and 2 pF: or larger than 0.5 pF, 1 pF, 2 pF, 3 pF, 5 pF or 10 pF. For example, a bi-directional (or tri-state) I/O pad or circuit may be used for the large I/O drivers or receivers, or I/O circuits for communicating with external or outside (of the logic drive), and may comprise an ESD circuit, a receiver, and a driver, and may have an input capacitance or output capacitance between 2 pF and 100 pF, 2 pF and 50 pF, 2 pF and 30 pF, 2 pF and 20 pF, 2 pF and 15 pF, 2 pF and 10 pF, or 2 pF and 5 pF: or larger than 2 pF, 3 pF, 5 pF, 10 pF, 15 pF or 20 pF. For example, a bi-directional (or tri-state) I/O pad or circuit may be used for the small I/O drivers or receivers, or I/O circuits for communicating with chips in or of the logic drive, and may comprise an ESD circuit, a receiver, and a driver, and may have an input capacitance or output capacitance between 0.05 pF and 2 pF or 0.1 pF and 1 pF: or smaller than 2 pF or 1 pF.

The dedicated I/O chip (or chips) in the multi-chip package of the standard commodity logic drive may comprise I/O circuits or pads (or micro copper pillars or bumps) for connecting or coupling to one or a plurality of (2, 3, 4, or more than 4) Universal Serial Bus (USB) ports, one or a plurality of IEEE 1394 ports, one or a plurality of Ethernet ports, one or a plurality of audio ports or serial ports, for example, RS-232 or COM (communication) ports, wireless transceiver I/Os, and/or Bluetooth transceiver I/Os, and etc. The dedicated I/O chip may also comprise I/O circuits or pads (or micro copper pillars or bumps) for connecting or coupling to Serial Advanced Technology Attachment (SATA) ports, or Peripheral Components Interconnect express (PCIe) ports for communicating, connecting or coupling with the memory drive.

Another aspect of the disclosure provides the standard commodity logic drive in a multi-chip package comprising a plurality of standard commodity FPGA IC chips and one or a plurality of non-volatile IC chips, for use in different applications requiring logic, computing and/or processing functions by field programming: wherein the one or the plurality of non-volatile memory IC chips comprises a NAND flash chip or chips, in a bare-die format or in a multi-chip flash package format. Each of the one or the plurality of NAND flash chips may has a standard memory density, capacity or size of greater than or equal to 64 Mb, 512 Mb, 1 Gb, 4 Gb, 16 Gb, 64 Gb, 128 Gb, 256 Gb, or 512 Gb, wherein “b” is bits. The NAND flash chip may be designed and fabricated using advanced NAND flash technology nodes or generations, for example, more advanced than or equal to 45 nm, 28 nm, 20 nm, 16 nm, and/or 10 nm, wherein the advanced NAND flash technology may comprise Single Level Cells (SLC) or multiple level cells (MLC) (for example, Double Level Cells DLC, or triple Level cells TLC), and in a 2D-NAND or a 3D NAND structure. The 3D NAND structures may comprise multiple stacked layers or levels of NAND cells, for example, greater than or equal to 4, 8, 16, 32 stacked layers or levels of NAND cells.

Another aspect of the disclosure provides the standard commodity logic drive in a multi-chip package comprising the plurality of standard commodity FPGA IC chips, the dedicated I/O chip, the dedicated control chip and the one or a plurality of non-volatile memory IC chips, for use in different applications requiring logic, computing and/or processing functions by field programming. The communication between the chips of the logic drive and the communication between each chip of the logic drive and the external or outside (of the logic drive) are described as follows: (1) the dedicated I/O chip communicates directly with the other chip or chips of the logic drive, and also communicates directly with the external or outside (circuits) (of the logic drive). The dedicated I/O chip comprises two types of I/O circuits: one type having large driving capability, loading, output capacitance or input capacitance for communicating directly with the external or outside of the logic drive, and the other type having small driving capability, loading, output capacitance or input capacitance for communicating directly with the other chip or chips of the logic drive; (2) each of the plurality of FPGA IC chips only communicates directly with the other chip or chips of the logic drive, but does not communicate directly and/or does not communicate with the external or outside (of the logic drive); wherein an I/O circuit of one of the plurality of FPGA IC chips may communicate indirectly with the external or outside (of the logic drive) by going through an I/O circuit of the dedicated I/O chip; wherein the driving capability, loading, output capacitance or input capacitance of the I/O circuit of the dedicated I/O chip is significantly larger or bigger than that of the I/O circuit of the one of the plurality of FPGA IC chips, wherein the I/O circuit (for example, the input or output capacitance is smaller than 2 pF) of the one of the plurality of FPGA IC chips is connected or coupled to the large or big I/O circuit (for example, the input or output capacitance is larger than 2 pF) of the dedicated I/O chip for communicating with the external or outside circuits of the logic drive; (3) the dedicated control chip only communicates directly with the other chip or chips of the logic drive, but does not communicate directly and/or does not communicate with the external or outside (of the logic drive); wherein an I/O circuit of the dedicated control chip may communicate indirectly with the external or outside (of the logic drive) by going through an I/O circuit of the dedicated I/O chip; wherein the driving capability, loading, output capacitance or input capacitance of the I/O circuit of the dedicated I/O chip is significantly larger or bigger than that of the I/O circuit of the dedicated control chip. Alternatively, wherein the dedicated control chip may communicate directly with the other chip or chips of the logic drive, and may also communicate directly with the external or outside (of the logic drive), wherein the dedicated control chip comprises both small and large I/O circuits for these two types of communication, respectively; (4) each of the one or a plurality of non-volatile memory IC chips only communicates directly with the other chip or chips of the logic drive, but does not communicates directly and/or does not communicate with the external or outside (of the logic drive); wherein an I/O circuit of the one or a plurality of non-volatile memory IC chips may communicate indirectly with the external or outside (of the logic drive) by going through an I/O circuit of the dedicated I/O chip; wherein the driving capability, loading, output capacitance or input capacitance of the I/O circuit of the dedicated I/O chip is significantly larger or bigger than that of the I/O circuit of the one or a plurality of non-volatile memory IC chips. Alternatively, wherein the one or a plurality of non-volatile memory IC chips may communicate directly with the other chip or chips of the logic drive, and may also communicate directly with the external or outside (of the logic drive), wherein the one or a plurality of non-volatile memory IC chips comprises both small and large I/O circuits for these two types of communication, respectively: In the above. “Object X communicates directly with Object Y” means the Object X (for example, a first chip of the logic drive) communicates or couples electrically and directly with the Object Y without going through or passing through any other chip or chips of the logic drive. In the above. “Object X does not communicate directly with Object Y” means the Object X (for example, a first chip of or in the logic drive) may communicate or couple electrically but indirectly with the Object Y by going through or passing through any other chip or chips of the logic drive. "Object X does not communicate with Object Y" means the Object X (for example, a first chip of the logic drive) does not communicate or couple electrically and directly; and does not communicate or couple electrically and indirectly with the Object Y.

Another aspect of the disclosure provides a logic drive in a multi-chip package format further comprising an Innovated ASIC or COT (abbreviated as IAC below) chip for Intellectual Property (IP) circuits. Application Specific (AS) circuits, analog circuits, mixed-mode signal circuits. Radio-Frequency (RF) circuits, and/or transmitter, receiver, transceiver circuits, etc. The IAC chip is designed, implemented and fabricated using varieties of semiconductor technology nodes or generations, including old or matured technology nodes or generations, for example, less advanced than or equal to, or above or equal to 20 nm, 30 nm, 40 nm, 50 nm. 90 nm, 130 nm, 250 nm, 350 nm or 500 nm. The semiconductor technology node or generation used in the IAC chip is 1, 2, 3, 4, 5 or greater than 5 nodes or generations older, more matured or less advanced than that used in the standard commodity FPGA IC chips packaged in the same logic drive. Transistors used in the IAC chip may be a FINFET, a Fully Depleted Silicon-on-insulator (FDSOI) MOSFET, a Partially Depleted Silicon-On-Insulator (PDSOI) MOSFET or a conventional MOSFET. Transistors used in the IAC chip may be different from that used in the standard commodity FPGA IC chips packaged in the same logic drive: for example, the IAC chip may use the conventional MOSFET, while the standard commodity FPGA IC chips packaged in the same logic drive may use the FINFET: or the IAC chip may use the Fully Depleted Silicon-on-insulator (FDSOI) MOSFET, while the standard commodity FPGA IC chips packaged in the same logic drive may use the FINFET. Since the IAC chip in this aspect of disclosure may be designed and fabricated using older or less advanced technology nodes or generations, for example, less advanced than or equal to, or more mature than. 20 nm or 30 nm, and for example using the technology node of 22 nm, 28 nm, 40 nm, 90 nm, 130 nm, 180 nm, 250 nm, 350 nm, or 500 nm, its NRE cost is cheaper than or less than that of the current or conventional ASIC or COT chip designed and fabricated using an advanced IC technology node or generation, for example, more advanced than or below 20 nm or 10 nm, and for example using the technology node of 16 nm, 14 nm, 12 nm, 10 nm, 7 nm, 5 nm or 3 nm. The NRE cost for designing a current or conventional ASIC or COT chip using an advanced IC technology node or generation, for example, more advanced than or below 20 nm or 10 nm, may be more than US $10M or even exceeding US $20M, US $50M. US $100M, or US $200M. The cost of a photo mask set for an ASIC or COT chip at the 16 nm technology node or generation is over US $5M, US $10M, or US $20M. Implementing the same or similar innovation and/or application using the logic drive including the IAC chip designed and fabricated using older or less advanced technology nodes or generations may reduce NRE cost down to less than US $10M, US $7M, US $5M, US $3M or US $1M. Compared to the implementation by developing the current conventional logic ASIC or COT IC chip, the NRE cost of developing the IAC chip for the same or similar innovation and/or application may be reduced by a factor of larger than 2, 5, 10, 20, or 30. The innovators therefor can cheaperly and easily implement their innovation by (i) designing the IAC chip using older and more mature technology nodes, for example, 40 nm or more mature than or equal to 20 nm; and (ii) using standard commodity FPGA IC chips packaged in a same logic drive, wherein the standard commodity FPGA IC chips are fabricated using advanced technology nodes, for example, 7 nm node, more advanced than 20 nm or more advanced than 7 nm.

Another aspect of the disclosure provides a method to change the logic ASIC or COT IC chip hardware business into a mainly software business by using the logic drive. Since the performance, power consumption and engineering and manufacturing costs of the logic drive may be better or equal to the current conventional ASIC or COT IC chip for a same or similar innovation or application, the current ASIC or COT IC chip design companies or suppliers may become mainly software developers, while only designing the IAC chip, as described above, using older or less advanced semiconductor technology nodes or generations. In this aspect of disclosure, they may (1) design and own the IAC chip: (2) purchase from a third party the standard commodity FPGA chips and standard commodity non-volatile memory chips in the bare-die or packaged format: (3) design and fabricate (may outsource the manufacturing to a third party of the manufacturing provider) the logic drive including their own IAC, and the purchased third party's standard commodity FPGA chips and standard commodity non-volatile memory chips: (3) install in-house developed software for the innovation or application in the non-volatile memory IC chip or chips in the logic drive; and/or (4) sell the program-installed logic drive to their customers. In this case, they still sell hardware without performing the expensive ASIC or COT IC chip design and production using advanced semiconductor technology nodes, for example, nodes or generations more advanced than or below 20 nm or 10 nm. They may write software codes to program the logic drive comprising the plurality of standard commodity FPGA chips for their desired applications, for example, in applications of Artificial Intelligence (AI), machine learning, deep learning, big data. Internet Of Things (IOT), industry computing. Virtual Reality (VR), Augmented Reality (AR), car electronics. Graphic Processing (GP). Digital Signal Processing (DSP), Micro Controlling (MC), and/or Central Processing (CP).

Another aspect of the disclosure provides the logic drive in a multi-chip package comprising a plurality of standard commodity FPGA IC chips and one or a plurality of non-volatile IC chips, further comprising processing and/or computing IC chips, for example, one or a plurality of Central Processing Unit (CPU) chips, one or a plurality of Graphic Processing Unit (GPU) chips, one or a plurality of Digital Signal Processing (DSP) chips, one or a plurality of Tensor Processing Unit (TPU) chips, and/or one or a plurality of Application Processing Unit (APU) chips. The logic drive may comprise one or a plurality of the above processing and/or computing IC chips, and one or a plurality of high speed, wide bit-width and high bandwidth memory (HBM) chips, for example, high bandwidth cache SRAM chips or DRAM IC chips, for high speed parallel processing and/or computing. For example, the logic drive may comprise one or a plurality of GPU chips, for example 1, 2, 3, 4 or more than 4 GPU chips, and one or a plurality of high speed, wide bit-width and high bandwidth cache SRAM chips or DRAM IC chips. The communication between one of the one or the plurality of GPU chips and one of the one or the plurality of SRAM or DRAM IC chips may be with data bit-width of equal or greater than 64, 128, 256, 512, 1024, 2048, 4096, 8K, or 16K. For another example, the logic drive may comprise one or a plurality of TPU chips, for example 1, 2, 3, 4 or more than 4 TPU chips, and one or a plurality of high speed, wide bit-width and high bandwidth cache SRAM chips or DRAM IC chips. The communication between one of the one or the plurality of TPU chips and one of the one or the plurality of SRAM or DRAM IC chips may be with data bit-width of equal or greater than 64, 128, 256, 512, 1024, 2048, 4096, 8K, or 16K.

The communication, connection, or coupling between one of the one or the plurality of logic, processing and/or computing chips (for example, FPGA, CPU, GPU, DSP, APU, TPU, and/or ASIC chips) and one of the one or the plurality of high speed, wide bit-width and high bandwidth SRAM. DRAM or NVM RAM (for example, MRAM, RRAM) chips, through the metal interconnection lines, traces and metal vias of First Interconnection Scheme of Interconnection Bridge (FISIB) and/or Second Interconnection Scheme of Interconnection Bridge (SISIB) of the embedded Fineline Interconnection Bridges (FIBs). (to be described and specified in below), may be the same or similar as that between internal circuits in a same chip. The interconnection metal lines or traces of the FIBs are used for high speed, high bandwidth and high data bitwidth communication between two chips of the logic drive. Alternatively, the communication, connection, or coupling between one of the one or the plurality of logic, processing and/or computing chips (for example, FPGA, CPU, GPU, DSP, APU, TPU, and/or ASIC chips) and one of the one or the plurality of high speed, wide bit-width and high bandwidth SRAM. DRAM or NVM RAM chips, through the metal interconnection lines, traces and metal vias of FISIB and/or SISIB of the embedded FIBs, may be using small I/O drivers and/or receivers on both the logic, processing and/or computing chip and the SRAM, DRAM or NVM RAM chip. The driving capability, loading, output capacitance, or input capacitance of the small I/O drivers or receivers, or I/O circuits may be between 0.05 pF and 2 pF, or 0.1 pF and 1 pF; or smaller than 2 pF, or 1 pF. For example, a bi-directional (or tri-state) I/O pad or circuit may be used for the small I/O drivers or receivers, or I/O circuits for communicating between the high speed, wide bit-width and high bandwidth logic and memory chips in the logic drive, and may comprise an ESD circuit, a receiver, and a driver, and may have an input capacitance or output capacitance between 0.05 pF and 2 pF, or 0.1 pF and 1 pF; or smaller than 2 pF, 1 pF, or 0.5 pF.

The processing and/or computing IC chip or chips in the logic drive provide fixed-metal-line (non-field-programmable) interconnects for (non-field-programmable) functions, processors and operations. The standard commodity FPGA IC chips provide (1) programmable-metal-line (field-programmable) interconnects for (field-programmable) logic functions, processors and operations and (2) fixed-metal-line (non-field-programmable) interconnects for (non-field-programmable) logic functions, processors and operations. Once the programmable-metal-line interconnects in or of the FPGA IC chips are programmed, the programmed interconnects together with the fixed interconnects in or of the FPGA chips provide some specific functions for some given applications. The operational FPGA chips may operate together with the processing and/or computing IC chip or chips in the same logic drive to provide powerful functions and operations in applications, for example, Artificial Intelligence (AI), machine learning, deep learning, big data. Internet Of Things (IOT), industry computing, Virtual Reality (VR), Augmented Reality (AR), driverless car electronics, Graphic Processing (GP), Digital Signal Processing (DSP), Micro Controlling (MC), and/or Central Processing (CP).

Another aspect of the disclosure provides the standard commodity FPGA IC chip for use in the logic drive. The standard commodity FPGA chip is designed, implemented and fabricated using an advanced semiconductor technology node or generation, for example more advanced than or below 20 nm or 10 nm. The standard commodity FPGA IC chips comprises (1) a layer comprising transistors in or on a silicon substrate, (2) a First Interconnection Scheme in, on or of the Chip (FISC) over the silicon substrate and on or over the layer comprising transistors, (3) a passivation layer on or over the whole wafer and on or over the FISC structure, (4) a Second Interconnection Scheme in, on or of the Chip (SISC) on or over the FISC structure and (5) multiple micro copper pillars or bumps with solder caps on or over the SISC.

Another aspect of the disclosure provides an Interconnection Substrate (IS) for flip-chip assembly or packaging in forming the multi-chip package of the logic drive. The multi-chip package is based on multiple-Chips-On-an-Interconnection-Substrate (COIS) flip-chip packaging method. The Interconnection Substrate (IS) in the COIS multi-chip package comprises: (1) Fineline Interconnection Bridges (FIB) with high density interconnects, metal vias and fine pitch metal pads for fan-out and interconnection between IC chips flip-chip-assembled, bonded or packaged on or over the IS, (2) The Printed Circuit Board, for example, Ball-Grid-Array substrates (BGA), with lower density interconnects, metal vias and coarse metal pads, wherein the FIBs are embedded in the PCBs or BGAs. The IC chips or packages to be flip-chip assembled, bonded or packaged, to the IS include the chips or packages mentioned, described and specified above: the standard commodity FPGA chips, the non-volatile chips or packages, the dedicated control chip, the dedicated I/O chip, the dedicated control and I/O chip. IAC chip, and/or processing and/or computing IC chip, for example CPU, GPU, DSP, TPU, or APU chip. The Fineline Interconnection Bridges (FIB) for use in embedding in PCBs or BGAs comprises: (1) a silicon substrate; (2) a First Interconnection Scheme on or of the Interconnection Bridge (FISIB) on or over the silicon substrate; (3) a Second Interconnection Scheme of the Interconnection Bridge (SISIB) on or over the FISIB structure; (4) micro copper pads, pillars or bumps on or over the SISIB.

Another aspect of the disclosure provides a method for forming the Interconnection Substrate (IS) for use in the COIS multi-chip package. The Interconnect Substrate (IS) is a Printing Circuit Board, for example, a BGA, based on the process steps of forming printing circuit boards. One or a plurality of Fineline Interconnection Bridges (FIBs) specified and described above are embedded in an IS in processes of forming the IS. The IS comprises: (1) a base structure, for example, a 5-2-5 BGA, two metal layers of the hard core, and five build-up layers on each side of the hard core with a an openings, dips or holes therein: (2) the FIB embedded or housed in the openings, dips or holes in the base structure; (3) multiple metal interconnection layers on or over the base structure and the FIBs: (4) a plurality of copper pads, pillars or bumps on or over a top surface of the top-most interconnection metal layer of IS: (5) a plurality of copper pads on or under a bottom surface of the bottom-most interconnection metal layer of IS.

Another aspect of the disclosure provides a method for forming the logic drive in a COIS multi-chip package using an IS comprising the FISIB, the SISIB, copper pads or pillars based on a flip-chip assembled multi-chip packaging technology and process. The process steps for forming the COIS multi-chip packaged logic drive are described as below:

(1) Performing flip-chip assembling, bonding or packaging: (a) First providing the interconnection substrate (IS) comprising the FISIS, the SISIB, copper pads or pillars at the top, copper pads at the bottom, and IC chips or packages: then flip-chip assembling, bonding or packaging the IC chips or packages to the copper pads or pillars at the top of the IS. The IS is formed as described and specified above. The IC chips or packages to be assembled, bonded or packaged to the IS include the chips or packages mentioned, described and specified above: the standard commodity FPGA chips, the non-volatile chips or packages, the dedicated control chip, the dedicated I/O chip, the dedicated control and I/O chip. IAC, chip and/or computing and/or processing IC chips, for example, CPU, GPU, DSP, TPU or APU chips. All chips to be flip-chip packaged in the logic drives comprise micro copper pillars or bumps with solder caps on the top surface of the chips. (b) The chips are flip-chip assembled, bonded or packaged on or to corresponding copper pads or pillars on the top of the IS with the side or surface of the chip with transistors faced down. That is, the high density: small size micro copper pillars or bumps (HDB) on the IC chips are flip-chip assembled to the corresponding high density: small size copper pads or pillars (HDP) on the top of the IS; and, the low density, large size micro copper pillars or bumps (LDB) on the IC chips are flip-chip assembled to the corresponding low density: large size copper pads or pillars (LDP) on the top of the IS. The backside of the silicon substrate of the IC chips (the side or surface without transistors) is faced up: (c) Filling the gaps between the IS and the IC chips (and between micro copper pillars or bumps of the IC chips on the IS) with an underfill material (2) Applying a material, resin, or compound to fill the gaps or spaces between chips and cover the backside surfaces of chips by methods, for example, spin-on coating, screen-printing, dispensing or molding in the wafer or panel format. Applying a CMP, polishing or grinding process to planarize the surface of the applied material, resin or compound. Optionally, the CMP, or grinding process is performed until a level where the backside surfaces of all IC chips are fully exposed.

(3) Forming solder bumps on or under the exposed copper pads at bottom surface of the IS.

(4) Separating, cutting or dicing the finished panel, including separating, cutting or dicing through materials or structures between two neighboring logic drives. The material (for example, polymer) filling gaps or spaces between chips of two neighboring logic drives is separated, cut or diced to form individual unit of logic drives.

Another aspect of the disclosure provides the standard commodity COIS multi-chip packaged logic drive. The standard commodity COIS logic drive may be in a shape of square or rectangle, with a certain widths, lengths and thicknesses. An industry standard may be set for the shape and dimensions of the logic drive. For example, the standard shape of the COIS-multi-chip packaged logic drive may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the COIS-multi-chip packaged logic drive may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm. Furthermore, the solder bumps on or under the IS in the logic drive may be in a standard footprint, for example, in an area array of M×N with a standard dimension of pitch and space between neighboring two metal bumps or pillars. The location of each metal bumps or pillars is also at a standard location.

Another aspect of the disclosure provides the logic drive comprising a plurality of single-layer-packaged logic drives; and each of single-layer-packaged logic drives in a multiple-chip package is as described and specified above. The logic drive here is a stacked multiple-layer-packaged logic drive. The plurality of single-layer-packaged logic drives, for example, 2, 3, 4, 5, 6, 7, 8 or greater than 8 single-layer-packaged logic drives, may be, for example, (1) flip-package assembled on a printed circuit board (PCB), high-density fine-line PCB. Ball-Grid-Array (BGA) substrate, or flexible circuit film or tape; or (2) stack assembled using the Package-on-Package (POP) assembling technology: that is assembling one single-layer-packaged logic drive on top of the other single-layer-packaged logic drive. The POP assembling technology may apply, for example, the Surface Mount Technology (SMT).

Another aspect of the disclosure provides a method for a single-layer-packaged logic drive suitable for the stacked POP assembling technology. The single-layer-packaged logic drive for use in the POP package assembling are fabricated as the same as the process steps and specifications of the COIS multi-chip packaged logic drive as described in the above paragraphs, except for forming Through-Package-Vias, or Thought Polymer Vias (TPVs) in the gaps or spaces between chips in or of the logic drive, and/or in the peripheral area of the logic drive package and outside the edges of chips in or of the logic drive. In the process (2) of the COIS multichip package process described above, the CMP, polishing or grinding process is performed until a level where all of the top surfaces of TPVs are fully exposed. An insulating dielectric layer (for example, polymer) may be then deposited on the wafer or panel, and copper pads are then formed over the insulating dielectric layer and in openings in the insulating dielectric layer. The TPVs are used for connecting or coupling circuits or components at the frontside (bottom) of the logic drive to that at the backside (top) of the logic drive package, the frontside (bottom) is the side with the IS substrate, wherein the chips with the side having transistors are faced down. The single-layer-packaged logic drive with TPVs for use in the stacked logic drive may be in a standard format or having standard sizes. For example, the single-layer-packaged logic drive may be in a shape of square or rectangle, with a certain widths, lengths and thicknesses. An industry standard may be set for the shape and dimensions of the single-layer-packaged logic drive. For example, the standard shape of the single-layer-packaged logic drive may be a square, with a width greater than or equal to 4 mm, 7 mm, 10 mm, 12 mm, 15 mm, 20 mm, 25 mm. 30 mm, 35 mm or 40 mm, and having a thickness greater than or equal to 0.03 mm, 0.05 mm, 0.1 mm, 0.3 mm. 0.5 mm, 1 mm, 2 mm, 3 mm, 4 mm, or 5 mm. Alternatively, the standard shape of the single-layer-packaged logic drive may be a rectangle, with a width greater than or equal to 3 mm, 5 mm, 7 mm, 10 mm, 12 mm, 15 mm. 20 mm, 25 mm, 30 mm, 35 mm or 40 mm, and a length greater than or equal to 5 mm, 7 mm, 10 mm, 12 mm. 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm. The logic drive with TPVs is formed by forming another set of copper pillars or posts on or of the IS, with the height of copper pillar or post taller than that of the micro copper pad or pillar on the top side of IS used for the flip-chip assembly (flip-chip micro copper pads or pillars) on or of the IS. The height of TPVs (from the level of top surface of the top-most insulating layer to the level of the top surface of the copper pillars or posts) is between, for example, 5 μm and 300 μm, 5 μm and 200 μm, 5 μm and 150 μm, 5 μm and 120 μm, 10 μm and 100 μm. 10 μm and 60 μm, 10 μm and 40 μm, or 10 μm and 30 μm, or greater than or taller than or equal to 50 μm, 30 μm, 20 μm, 15 μm, or 5 μm. The largest dimension in a cross-section of the TPVs (for example, the diameter of a circle shape or the diagonal length of a square or rectangle shape) is between, for example, 5 μm and 300 μm, 5 μm and 200 μm, 5 μm and 150 μm, and 120 μm, 10 μm and 100 μm, 10 μm and 60 μm, 10 μm and 40 μm, or 10 μm and 30 μm: or greater than or equal to 150 μm, 100 μm, 60 μm, 50 μm, 40 μm, 30 μm, 20 μm. 15 μm, or 10 μm. The smallest space between a TPV and its nearest neighboring TPV is between, for example, 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm: or greater than or equal to 150 μm, 100 μm, 60 μm. 50 μm, 40 μm, 30 μm, 20 μm, 15 μm, or 10 μm.

The panel of the IS, with the metal interconnection lines, traces or metal vias, the embedded FIBs, flip-chip micro copper pads or pillars and the tall copper pillars or posts (TPVs), are then used for flip-chip assembling or bonding the IC chips to the flip-chip micro copper pads or pillars on or of the IS for forming a logic drive. The process steps for forming the logic drive with TPVs are the same as described and specified above, including the process steps of flip-chip assembly or bonding, underfill, molding, molding compound planarization, and formation of solder bumps on or under the IS.

Another aspect of the disclosure provides a method for forming a stacked logic drive, for an example, by the following process steps: (i) providing a first single-layer-packaged logic drive, cither separated or still in the wafer or panel format, with its solder bumps faced down, and with the exposed copper pads on or over the TPVs faced up (IC chips are facing down): (ii) Package-On-Package (POP) stacking assembling, by surface-mounting and/or flip-package methods, a second separated single-layer-packaged logic drive on top of the provided first single-layer-packaged logic drive. The surface-mounting process is similar to the Surface-Mount Technology (SMT) used in the assembly of components on or to the Printed Circuit Boards (PCB), by first printing solder or solder cream, or flux on the copper pads (top surfaces) of the TPVs, and then flip-package assembling, connecting or coupling the solder bumps on or of the second separated single-layer-packaged logic drive to the solder or solder cream or flux printed copper pads of TPVs of the first single-layer-packaged logic drive. The flip-package process is performed, similar to the Package-On-Package technology (POP) used in the IC stacking-package technology, by flip-package assembling, connecting or coupling the solder bumps on or of the second separated single-layer-packaged logic drive to the copper pads of TPVs of the first single-layer-packaged logic drive. An underfill material may be filled in the gaps between the first and second single-layer-packaged logic drivers. A third separated single-layer-packaged logic drive may be flip-package assembled, connected or coupled to the exposed copper pads of TPVs of the second single-layer-packaged logic drive. The Package-On-Package stacking assembling process may be repeated for assembling more separated single-layer-packaged logic drives (for example, up to more than or equal to a nth separated single-layer-packaged logic drive, wherein n is greater than or equal to 2, 3, 4, 5, 6, 7, 8) to form the finished stacked logic drive. When the first single-layer-packaged logic drives are in the separated format, they may be first flip-package assembled to a carrier or substrate, for example a PCB, or a BGA (Ball-Grid-Array) substrate, and then performing the POP processes, in the carrier or substrate format, to form stacked logic drives, and then cutting, dicing the carrier or substrate to obtain the separated finished stacked logic drives. When the first single-layer-packaged logic drives are still in the panel format, the panel may be used directly as the carrier or substrate for performing POP stacking processes, in the panel format, for forming the stacked logic drivers. The panel is then cut or diced to obtain the separated stacked finished logic drives.

Another aspect of the disclosure provides a method for a single-layer-packaged logic drive suitable for the stacked POP assembling technology. The single-layer-packaged logic drive for use in the POP package assembling are fabricated as the same process steps and specifications of the COIS multi-chip packages described in the above paragraphs, except for forming a Backside metal Interconnection Scheme at the backside of the single-layer-packaged logic drive (abbreviated as BISD in below) and Through-Package-Vias, or Thought Polymer Vias (TPVs) in the gaps or spaces between chips in or of the logic drive, and/or in the peripheral area of the logic drive package and outside the edges of chips in or of the logic drive (the side with transistors of the IC chips are facing down). The BISD may comprise metal lines, traces, or planes in multiple interconnection metal layers, and is formed on or over (i) the backside of the IC chips (the side of IC chips with the transistors are facing down). (ii) the molding compound after the process step of planarization of the molding compound, and (iii) the exposed top surfaces of the TPVs. The BISD provides additional interconnection metal layer or layers at the backside of the logic drive package, and provides copper pads, copper pillars or solder bumps in an area array at the backside of the single-layer-packaged logic drive, including at locations vertically over the IC chips of the logic drive (IC chips with the transistors side are faced down). The TPVs are used for connecting or coupling circuits or components (for example, including the metal lines, traces or metal vias in the PCB material. FR4 or BT material, and FISIB and/or SISIB on or over silicon substrates of the FIBs) of the IS of the logic drive to that (for example, the BISD) at the backside of the logic drive package. The single-layer-packaged logic drive with TPVs and BISD for use in the stacked logic drive may be in a standard format or having standard sizes. The logic drive with the BISD is formed by forming metal lines, traces, or planes on multiple interconnection metal layers on or over the backside of the IC chips (when the side of IC chips with the transistors are faced down), the molding compound, and the exposed top surfaces of the TPVs, after the process step of planarization of the molding compound. Forming copper pads, solder bumps, copper pillars on or over the top-most metal layer of BISD exposed in openings in the top-most insulating dielectric layer of BISD using emboss copper process as described and specifies in above. Alternatively, the process steps of PCB/BGA (semi-additive copper process) in forming metal lines, traces, metal vias and metal pads, as described and specified above, may be used for forming metal lines, traces, metal vias and metal pads of the BISD.

The locations of the copper pads, copper pillars or solder bumps are on or over: (a) the gaps or spaces between chips in or of the logic drive: (b) peripheral area of the logic drive package and outside the edges of chips in or of the logic drive: (c) and/or vertically over the backside of the IC chips. The BISD may comprise 1 to 6 layers, or 2 to 5 layers of interconnection metal layers. The interconnection metal lines, traces or planes of the BISD have the adhesion layer (Ti or TiN, for example) and the copper seed layer only at the bottom, but not at the sidewalls of the metal lines or traces. The interconnection metal lines or traces of FISC and FISIB have the adhesion layer (Ti or TiN, for example) and the copper seed layer at both the bottom and the sidewalls of the metal lines or traces.

The thickness of the metal lines, traces or planes of the BISD is between, for example, 0.3 μm and 40 μm, 0.5 μm and 30 μm. 1 μm and 20 μm, 1 μm and 15 μm, 1 μm and 10 μm, or 0.5 μm to 5 μm, or thicker than or equal to 0.3 μm, 0.7 μm, 1 μm, 2 μm, 3 μm, 5 μm, 7 μm or 10 μm. The width of the metal lines or traces of the BISD is between, for example, 0.3 μm and 40 μm, 0.5 μm and 30 μm, 1 μm and 20 μm, 1 μm and 15 μm, 1 μm and 10 μm, or 0.5 μm to 5 μm, or wider than or equal to 0.3 μm, 0.7 μm, 1 μm, 2 μm, 3 μm, 5 μm, 7 μm or 10 μm. The thickness of the inter-metal dielectric layer of the BISD is between, for example, 0.3 μm and 50 μm, 0.3 μm and 30 μm, 0.5 μm and 20 μm. 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. The planes in a metal layer of interconnection metal layers of the BISD may be used for the power, ground planes of a power supply, and/or used as heat dissipaters or spreaders for the heat dissipation or spreading: wherein the metal thickness may be thicker, for example, between 5 μm and 100 μm, 5 μm and 50 μm, 5 μm and 20 μm, or 5 μm and 15 μm: or thicker than or equal to 5 μm, 10 μm, 20 μm, 30 μm or 50 μm. The power, ground plane, and/or heat dissipater or spreader may be layout as interlaced or interleaved shaped structures in a plane of an interconnection metal layer of the BISD; or may be layout in a fork shape.

The BISD interconnection metal lines or traces of the single-layer-packaged logic drive are used; (a) for connecting or coupling the copper pads, copper pillars or solder bumps at the backside (top side, with the side having transistors of IC chips faced down) surface of the single-layer-packaged logic drive to their corresponding TPVs; and through the corresponding TPVs, the copper pads, copper pillars or solder bumps at the backside surface of the single-layer-packaged logic drive are connected or coupled to the metal lines or traces of the IS; and further through the micro copper pillars or bumps, the SISC, and the FISC of the IC chips, are connected or coupled to the transistors; (b) for connecting or coupling the copper pads, copper pillars or solder bumps at the backside (with the side having transistors of IC chips faced down) surface of the single-layer-packaged logic drive to their corresponding TPVs; and through the corresponding TPVs, the copper pads, copper pillars or solder bumps at the backside surface of the single-layer-packaged logic drive are connected or coupled to the metal lines or traces of the IS, and connecting or coupling to the solder bumps on or under the IS at the frontside (bottom side, with the side having transistors of IC chips faced down) surface of the single-layer-packaged logic drive. Therefore, the copper pads, copper pillars or solder bumps at the backside (top side, with the side having transistors of IC chips faced down) of the single-layer-packaged logic drive are connected or coupled to the solder bumps at the frontside (bottom side, with the side having transistors of IC chips faced down) of the single-layer-packaged logic drive; (c) for connecting or coupling the copper pads, copper pillars or solder bumps vertically over the backside (when the side having transistors of a FPGA IC chip is faced down) surface of the FPGA IC chip in the single-layer-packaged logic drive to their corresponding TPVs; and through the corresponding TPVs, the copper pads, copper pillars or solder bumps vertically over the backside surface the FPGA IC chip in the single-layer-packaged logic drive are connected or coupled to the metal lines or traces of the IS; and further through the micro copper pillars or bumps, the SISC, and the FISC of the FPGA IC chip, are connected or coupled to the transistors of the FPGA IC chip; (d) for connecting or coupling the copper pads, copper pillars or solder bumps vertically over the backside (when the side having transistors of an semiconductor IC chip is faced down) surface of the semiconductor IC chip in the single-layer-packaged logic drive to their corresponding TPVs; and through the corresponding TPVs, the copper pads, copper pillars or solder bumps vertically over the backside surface of the semiconductor IC chip in the single-layer-packaged logic drive, further through the metal lines or traces of the IS, are connected or coupled to the solder bumps on or under the IS at the frontside (bottom side, with the side having transistors of IC chips faced down) surface of the single-layer-packaged logic drive, wherein the solder bumps on or under the IS are vertically under the front side (with the side having transistors of the semiconductor IC chip faced down) surface of the semiconductor IC chip in the single-layer-packaged logic drive. Therefore, the copper pads, copper pillars or solder bumps vertically over the backside surface of the semiconductor IC chip in the single-layer-packaged logic drive are connected or coupled to the solder bumps vertically under the front side surface of the semiconductor IC chip. (c) for connecting or coupling copper pads, copper pillars or solder bumps vertically over a backside of a first FPGA chip (top side, with the side having transistors of the first FPGA chip faced down) of the single-layer-packaged logic drive to copper pads, copper pillars or solder bumps vertically over a second FPGA chip (top side, with the side having transistors of the second FPGA chip faced down) of the single-layer-packaged logic drive by using an interconnection net or scheme of metal lines or traces in or of the BISD. The interconnection net or scheme may be connected or coupled to TPVs of the single-layer-packaged logic drive: (f) for connecting or coupling a copper pad, copper pillar or solder bump vertically over a FPGA chip of the single-layer-packaged logic drive to another copper pad, copper pillar or solder bump, or a plurality of other copper pads, copper pillars or solder bumps vertically over the same FPGA chip by using an interconnection net or scheme of metal lines or traces in or of the BISD. The interconnection net or scheme may be connected or coupled to the TPVs of the single-layer-packaged logic drive; (g) for the power or ground planes and/or heat dissipaters or spreaders.

Another aspect of the disclosure provides the logic drive in a multi-chip package format further comprising one or a plurality of Dedicated Programmable Interconnection (DPI) chip or chips. The DPI chip comprises 5T or 6T SRAM cells and cross-point switches, and is used for programming interconnection between circuits or interconnections of the standard commodity FPGA chips. The programmable interconnection comprises interconnection metal lines or traces on, over or of the IS (including interconnection metal lines, traces or metal vias of the PCB or BGA substrate, and the FISIB and/or SISIB of the FIBs) between the standard commodity FPGA chips or other semiconductor IC chips in or of the logic drive, with cross-point switch circuits in the middle of interconnection metal lines or traces of the IS. For example, n metal lines or traces of the IS are coupled or input to a cross-point switch circuit on the DPI chip, and m metal lines or traces of the IS are coupled or output from the switch circuit on the DPI chip. The cross-point switch circuit on the DPI chip is designed such that each of the n metal lines or traces of the IS can be programed to connect to anyone of the m metal lines or traces of the IS. The cross-point switch circuit on DPI chip may be controlled by the programming code stored in, for example, an SRAM cell in or of the DPI chip. The cross-point switches on the DPI chip may comprise: (1) n-type and p-type transistor pair circuits: or (2) multiplexers and switch buffers. Alternatively, the DPI chip comprising 5T or 6T SRAM cells and cross-point switches may be used for programmable interconnection of metal lines or traces of the IS between the standard commodity FPGA chips and the TPVs (for example, the bottom surfaces of the TPVs) in the logic drive, in the same or similar method as described above. The stored (programming) data in the 5T or 6T SRAM cell is used to program the connection or not-connection between (i) a first metal line, trace, or net of the IS, connecting to one or more micro copper pillars or bumps on or under one or a plurality of the IC chips of the logic drive, and/or to one or a plurality of solder bumps of the IS, and (ii) a second metal line, trace or net of the IS, connecting or coupling to a TPV (for example, the bottom surface of the TPV), in a same or similar method described above. With this aspect of disclosure. TPVs are programmable: in other words, this aspect of disclosure provides programmable TPVs. The programmable TPVs may, alternatively, use the programmable interconnection circuits, comprising 5T or 6T SRAM cells and cross-point switches, on or of the FPGA chips in or of the logic drive. The programmable TPV may be, by (software) programming. (i) connected or coupled to one or more micro copper pillars or bumps of one or a plurality of IC chips (therefor to the metal lines or traces of the SISC and/or the FISC, and/or the transistors) of the logic drive, and/or (ii) connected or coupled to one or more solder bumps on or under metal pads, pillars or bumps of the IS of the logic drive. When a metal pad, bump or pillar (on or over the BISD) at the backside of the logic drive is connected to the programmable TPV, the copper pad, copper pillar or solder bump (on or over the BISD) becomes a programmable metal pad, pillar or bump (on or over the BISD). The programmable metal pad, pillar or bump (on or over the BISD) at the backside of the logic drive may be connected or coupled to, by programming and through the programmable TPV. (i) one or a plurality of micro copper pillars or bumps of one or a plurality of IC chips (therefor to the metal lines or traces of the SISC and/or the FISC, and/or the transistors) at the frontside (the side with the transistors) of the one or a plurality of IC chips of the logic drive, and/or (ii) one or a plurality of solder bumps on or under metal pads, pillars or bumps of the IS of the logic drive. Alternatively, the DPI chip comprises 5T or 6T SRAM cells and cross-point switches may be used for programmable interconnection of metal lines or traces of the IS between the solder bumps on or under the IS of the logic drive and one or a plurality of micro copper pillars or bumps on or of one or a plurality of IC chips of the logic drive, in a same or similar method as described above. The stored (programming) data in the 5T or 6T SRAM cell of the DPI chip is used to program the connection or not-connection between (i) a first metal line, trace or net of the IS, connecting to one or a plurality of micro copper pillars or bumps on or of one or a plurality of IC chips of the logic drive, and (ii) a second metal line, trace or net of the IS, connecting or coupling to the solder bumps on or under the IS, in a same or similar method described above. With this aspect of disclosure, the solder bumps on or under the IS are programmable: in other words, this aspect of disclosure provides programmable solder bumps on or under the IS. The programmable solder bumps on or under then IS may, alternatively, use the programmable interconnection circuits, comprising 5T or 6T SRAM cells and cross-point switches, on or of the FPGA chips in or of the logic drive. The programmable solder bump on or under the IS may be connected or coupled, by programming, to one or more micro copper pillars or bumps of one or a plurality of IC chips (therefor to the metal lines or traces of the SISC and/or the FISC, and/or the transistors) of the logic drive.

In the above aspects of disclosure, the DPI chips are flip-chip assembled on or over the IS. Alternatively: the DPI chip, as described and specified above, may further include the functions of interconnection bridge (as specified and described above for the FIB bridge). The DPI chip comprising the FIB functions may be embedded in the IS, and used as a FIB bridge. In this alternative, the DPI chip becomes a Programmable Interconnection FIB (PIFIB). The PIFIB bridge provides high density, high speed, wide bandwidth programmable interconnects between IC chips and is flip-chip assembled on the IS substrate of the logic drive. For example, a PIFIB bridge may be between two FPGA IC chips, between a FPGA chip and a computing/processing chip (CPU, GPU, DSP or TPU chip), between a high bandwidth, high speed memory chip (DRAM, SRAM or NVM) and a FPGA chip, or between a high bandwidth, high speed memory chip (DRAM, SRAM or NVM) and a computing/processing chip (CPU, GPU, DSP or TPU chip).

Another aspect of the disclosure provides a standardized IS used in the COIS, in the panel form in the stock or in the inventory for use in the later processing in forming the standard commodity logic drive, as described and specified above. The standardized IS comprises a fixed physical layout or design of the solder bumps on or under the IS; and a fixed design and layout of the TPVs on or over the IS if included in the IS. The locations or coordinates of the solder bumps on or under the IS and the TPVs in or on the IS are the same or of certain types of standards of layouts and designs for the standard IS. For example, connection schemes between solder bumps and the TPVs, are the same for each of the standard commodity IS. Furthermore, the design or interconnection of the metal lines, traces or metal vias of the IS, and the layout or coordinates of the micro copper pads, pillars or bumps on or over the IS are the same or of certain types of standards of layouts and designs for the standard IS. The standard commodity IS in the stock or inventory is then used for forming the standard commodity logic drive by the process described and specified above, including process steps: (1) flip-chip assembling or bonding the IC chips on or to the standard IS with the side or surface of the chip with transistors faced down: (2) Applying a material, resin, or compound to fill the gaps or spaces between chips and cover the backside surfaces of IC chips by methods, for example, spin-on coating, screen-printing, dispensing or molding in the panel format. Applying a CMP process, polishing process, or backside grinding process to planarize the surface of the applied material, resin or compound to a level where the top surfaces of all TPVs on or of the IS and the backside of IC chips are fully exposed: (3)

forming the BISD; and (4) forming the metal pads, pillars or bumps on or over the BISD. The standard commodity IS substrates with a fixed layout or design may be used and customized using the programmable TPVs, and/or programmable solder bumps on or under the IS, as described and specified above, for different applications. As described above, the data installed or programed in the 5T or 6T SRAM cells of the DPI chips may be used for programmable TPVs and/or programmable solder bumps on or under the IS. The data installed or programed in the 5T or 6T SRAM cells of the FPGA chips may be alternatively used for programmable TPVs and/or programmable solder bumps on or under the IS.

Another aspect of the disclosure provides the standardized commodity logic drive (for example, the single-layer-packaged logic drive) with a fixed design, layout or footprint of (i) the solder bumps on or under the IS, and (ii) copper pads, copper pillars or solder bumps (on or over the BISD) on the backside (when the side with the transistors of IC chips are faced down) of the standard commodity logic drive. The standardized commodity logic drive may be used, customized for different applications by software coding or programming, using the programmable solder bumps on or under the IS, and/or using programmable copper pads, copper pillars or bumps, or solder bumps on or over the BISD (through programmable TPVs), as described and specified above, for different applications. As described above, the codes of the software programs are loaded, installed or programed in the 5T or 6T SRAM cells of the DPI chip for controlling cross-point switches of the same DPI chip in or of the standard commodity logic drive for different varieties of applications. Alternatively, the codes of the software programs are loaded, installed or programed in the 5T or 6T SRAM cells of one of the FPGA IC chips in or of the standard commodity logic drive, for controlling cross-point switches of the FPGA IC chip for different varieties of applications. Each of the standard commodity logic drives with the same design, layout or footprint of the solder bumps on or under the IS, and the copper pads, copper pillars or bumps, or solder bumps on or over the BISD may be used for different applications, purposes or functions, by software coding or programming, using the programmable solder bumps on or under the IS, and/or programmable copper pads, copper pillars or bumps, or solder bumps on or over the BISD (through programmable TPVs) of the logic drive.

Another aspect of the disclosure provides the logic drive, either in the single-layer-packaged or in a stacked format, comprising IC chips, logic blocks (comprising LUTs, cross-point switches, multiplexers, switch buffers, logic circuits, switch buffers, logic gates, and/or computing circuits) and/or memory cells or arrays, immersing in a super-rich interconnection scheme or environment. The logic blocks (comprising LUTs, cross-point switches, multiplexers, logic circuits, logic gates, and/or computing circuits) and/or memory cells or arrays of each of the plurality of standard commodity FPGA IC chips (and/or other IC chips in the single-layer-packaged or in a stacked logic drive) are immersed in a programmable 3D Immersive IC Interconnection Environment (IIIE). The programmable 3D IIIE on, in, or of the logic drive package provides the super-rich interconnection scheme or environment, comprising (1) the FISC, the SISC and micro copper pillars or bumps on, in or of the IC chips, (2) the metal interconnection lines, traces, metal vias, flip-chip micro copper pads, pillars or bumps of the IS (including semi-additive copper of the IS and the FISIB and/or SISIB of the embedded FIBs), (3) TPVs. (4) the BISD, and (5) copper pads, copper pillars or bumps, or solder bumps on or over the BISD. The programmable 3D IIIE provides a programmable 3-Dimension (3D) super-rich interconnection scheme or system comprising: (A) in x-y directions, (i) the FISC and the SISC of the FPGA chip, (ii) the metal interconnection lines, traces of the IS (including semi-additive copper lines or traces of the IS and FISIB and/or SISIB of the embedded FIBs), and/or (iii) the BISD, for interconnecting or coupling the logic blocks and/or memory cells or arrays in or of a same FPGA IC chip, or in or of different FPGA chips in or of the single-layer-packaged logic drive. The interconnection of metal lines or traces in the interconnection scheme or system in the x-y directions is programmable; (B) in the z direction, (i) metal vias in the FISC and SISC, (ii) micro pillars or bumps on the SISC, (iii) metal vias in the IS (including metal vias in the embedded FIBs), (iv) flip-chip micro copper pads, pillars or bumps on the IS. (v) solder bumps on or under the IS, (vi) TPVs, (vii) metal vias in the BISD, and/or (viii) copper pads, copper pillars or bumps, or solder bumps on or over the BISD, for interconnecting or coupling the logic blocks, and/or memory cells or arrays in or of different FPGA chips in or of different single-layer-packaged logic drives stacking-packaged in the stacked logic drive. The interconnection of the metal structures in the interconnection scheme or system in the z, direction is also programmable. The programmable 3D IIIE provides an almost unlimited number of the transistors or logic blocks, interconnection metal lines or traces, and memory cells/switches at an extremely low cost. The programmable 3D IIIE similar or analogous to the human brain: (i) transistors and/or logic blocks (comprising logic gates, logic circuits, computing operators, computing circuits. LUTs, and/or cross-point switches) are similar or analogous to the neurons (cell bodies) or the nerve cells; (ii) the metal lines or traces of the FISC and/or the SISC are similar or analogous to the dendrites connecting to the neurons (cell bodies) or nerve cells. The micro pillars or bumps (of the semiconductor IC chip) connecting to the receivers for the inputs of the logic blocks (comprising, for example, logic gates, logic circuits, computing operators, computing circuits. LUTs, and/or cross-point switches) in or of the FPGA IC chips are similar or analogous to the post-synaptic cells at the ends of the dendrites; (iii) the long distance connects formed by metal lines or traces of the FISC, the SISC, the metal interconnection lines, traces of the IS (including FISIB and/or SISIB of the embedded FIBs), and/or the BISD, and the metal vias, metal pads, pillars or bumps, including the micro copper pillars or bumps on the SISC, solder bumps on or under the IS. TPVs, and/or copper pads, copper pads, pillars or bumps, or solder bumps on or over the BISD, are similar or analogous to the axons connecting to the neurons (cell bodies) or nerve cells. The micro pillars or bumps (of the semiconductor IC chip) connecting the drivers or transmitters for the outputs of the logic blocks (comprising, for example, logic gates, logic circuits, computing operators, computing circuits. LUTs, and/or cross-point switches) in or of the FPGA IC chips are similar or analogous to the pre-synaptic cells at the axons terminals.

Another aspect of the disclosure provides the programmable 3D IIIE with similar or analogous connections, interconnection and/or functions of a human brain: (1) transistors and/or logic blocks (comprising, for example, logic gates, logic circuits, computing operators, computing circuits. LUTs, and/or cross-point switches) are similar or analogous to the neurons (cell bodies) or the nerve cells; (2) The interconnection schemes and/or structures of the logic drives are similar or analogous to the axons or dendrites connecting or coupling to the neurons (cell bodies) or the nerve cells. The interconnection schemes and/or structures of the logic drives comprise (i) metal lines or traces of the FISC, the SISC, the metal interconnection lines, traces of the IS (including FISIB and/or SISIB of the embedded FIBs) and/or BISD and/or (ii) the micro copper pillars or bumps on the SISC, solder bumps on or under the IS substrate. TPVs, and/or copper pads, copper pillars or bumps, or solder bumps on or over the BISD. An axon-like interconnection scheme and/or structure of the logic drive is connected to the driving or transmitting output (a driver) of a logic unit or operator; and having a scheme or structure like a tree, comprising: (i) a trunk or stem connecting to the logic unit or operator: (ii) a plurality of branches branching from the stem, and the terminal of each branch may be connected or coupled to other logic units or operators. Programmable cross-point switches (5T or 6T SRAM cells/switches of the FPGA IC chips and/or of the DPIs) are used to control the connection or not-connection between the stem and each of the branches: (iii) sub-branches branching form the branches, and the terminal of each sub-branch may be connected or coupled to other logic units or operators. Programmable cross-point switches (5T or 6T SRAM cells/switches of the FPGA IC chips and/or of the DPIs) are used to control the connection or not-connection between a branch and each of its sub-branches. A dendrite-like interconnection scheme and/or structure of the logic drive is connected to the receiving or sensing input (a receiver) of a logic unit or operator; and having a scheme or structure like a shrub or bush comprising: (i) a short stem connecting to the logic unit or operator: (ii) a plurality of branches branching from the stem. Programmable switches (5T or 6T SRAM cells/switches of the FPGA IC chips and/or of the DPIs) are used to control the connection or not-connection between the stem and each of its branches. There are a plurality of dendrite-like interconnection schemes or structures connecting or coupling to the logic unit or operator. The end of each branch of the dendrite-like interconnection scheme or structure is connected or coupled to the terminal of a branch or sub-branch of the axon-like interconnection scheme or structure. The dendrite-like interconnection scheme and/or structure of the logic drive may comprise the FISCs and SISCs of the FPGA IC chips.

Another aspect of the disclosure provides a reconfigurable plastic and/or integral architecture for system/machine computing or processing using integral and alterable memory units and logic units, in addition to the sequential, parallel, pipelined or Von Neumann computing or processing system architecture and/or algorithm. The disclosure provides a programmable logic device (the logic drive) with elasticity and integrality: comprising integral and alterable memory units and logic units, to alter or reconfigure logic functions and/or computing (or processing) architecture (or algorithm), and/or the memories (data or information) in the memory units. The properties of the elasticity and integrality of the logic drive is similar or analogous to that of a human brain. The brain or nerves have elasticity and integrality. Many aspects of brain or nerves can be altered (or are "plastic") and reconfigured through adulthood. The logic drives (or FPGA IC chips) described and specified above provide capabilities to alter or reconfigure the logic functions and/or computing (or processing) architecture (or algorithm) for a given fixed hardware using the memories (data or information) stored in the near-by Configuration Programing Memory (CPM) cells, wherein the CPM cells are the SRAM cells in the standard commodity FPGA IC chips of the logic drive. The data or information of the CPM cells in the FPGA IC chips may be also stored in the CPM cells of, for example, the SRAM or DRAM cells in the HBM IC chips in the logic drive or NAND flash memory cells in NVM IC chips in the logic drive. The data or information stored in the CPM cells are used for LUTs or the programming interconnection in the FPGA IC chips. Some other memories stored in the memory cells of the semiconductor chips in the logic drive, for example, the SRAM cells of the FPGA IC chips, the SRAM or DRAM cells in the HBM IC chips or NAND flash memory cells in NVM IC chips, are used for storing data or information (Data Information Memory cells. DIM): wherein one or a plurality of SRAM or DRAM HBM IC chips or the NVM (NAND flash memory) IC chips are further included in the logic drive. The NAND flash IC chips are packaged in the logic drive by using the same method that the FPGA IC chips are packaged in the logic drive. The NAND flash IC chips may be used to backup the data or information of DIM cells of the SRAM or DRAM cells in the HBM IC chips. When the power supply of the logic drive is turned off, the data or information stored in the NVM (NAND flash memory) IC chips will be kept. The data or information in the DIM cells are related to the operation, computing or processing, for example: (i) the input data or information required for the operation, computing or processing, or (ii) the output data or information of the operation, computing or processing.

These, as well as other components, steps, features, benefits, and advantages of the present application, will now become clear from a review of the following detailed description of illustrative embodiments, the accompanying drawings, and the claims.

BRIEF DESCRIPTION OF THE DRAWINGS

The drawings disclose illustrative embodiments of the present application. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 23E is a top view of FIGS. 28A-28D, showing a layout of metal pads of a standard commodity logic drive in accordance with an embodiment of the present application.

FIG. 28 shows two tables illustrating reconfiguration for a commodity standard logic drive in accordance with an embodiment of the present application.

Figure 1A:
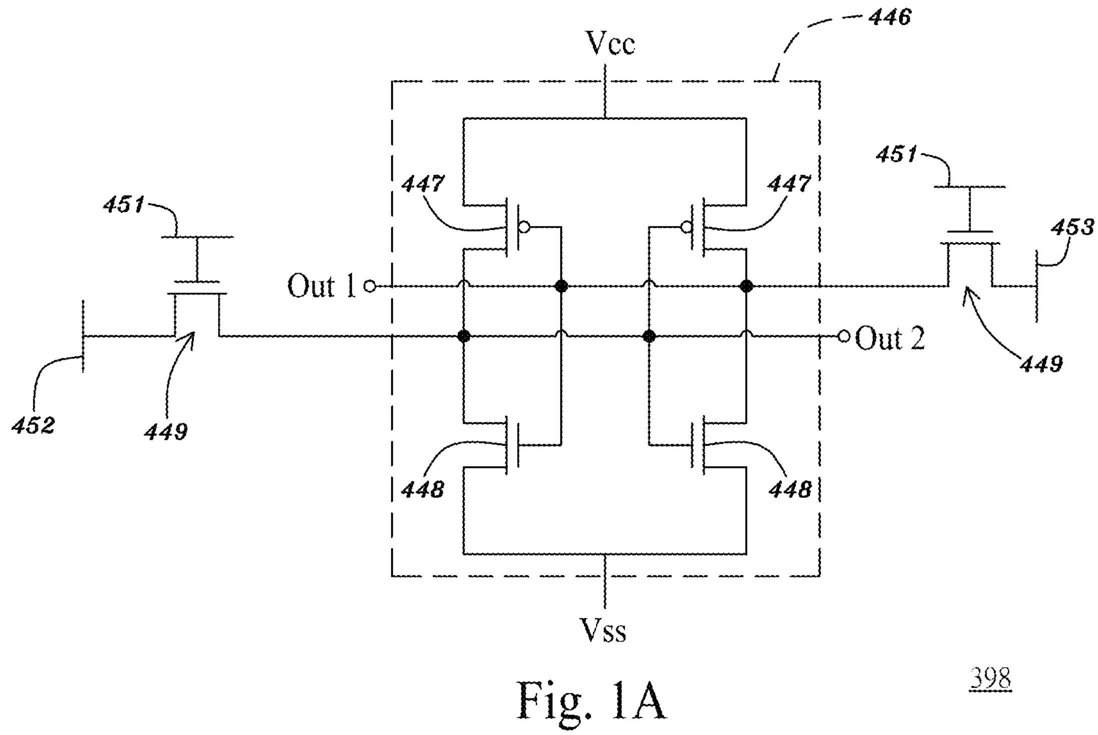
FIGS. 1A and 1B are circuit diagrams illustrating first and second types of SRAM cells in accordance with an embodiment of the present application.

While certain embodiments are depicted in the drawings, one skilled in the art will appreciate that the embodiments depicted are illustrative and that variations of those shown, as well as other embodiments described herein, may be envisioned and practiced within the scope of the present application.

DETAILED DESCRIPTION OF THE DISCLOSURE

Illustrative embodiments are now described. Other embodiments may be used in addition or instead. Details that may be apparent or unnecessary may be omitted to save space or for a more effective presentation. Conversely; some embodiments may be practiced without all of the details that are disclosed.

Specification for Static Random-Access Memory (SRAM) cells (1) First type of Volatile Storage Unit FIG. 1A is a circuit diagram illustrating a first type of volatile storage unit in accordance with an embodiment of the present application. Referring to FIG. 1A, a first type of volatile storage unit 398 may have a memory unit 446, i.e., static random-access memory (SRAM) cell, composed of 4 data-latch transistors 447 and 448, that is, two pairs of a P-type MOS transistor 447 and N-type MOS transistor 448 both having respective drain terminals coupled to each other, respective gate terminals coupled to each other and respective source terminals coupled to the voltage Vcc of power supply and to the voltage Vss of ground reference. The gate terminals of the P-type and N-type MOS transistors 447 and 448 in the left pair are coupled to the drain terminals of the P-type and N-type MOS transistors 447 and 448 in the right pair, acting as a first output point of the memory unit 446 for a first data output Out1 of the memory unit 446. The gate terminals of the P-type and N-type MOS transistors 447 and 448 in the right pair are coupled to the drain terminals of the P-type and N-type MOS transistors 447 and 448 in the left pair, acting as a second output point of the memory unit 446 for a second data output Out2 of the memory unit 446.

Referring to FIG. 1A, the first type of volatile storage unit 398 may further include two switches or transfer (write) transistor 449, such as N-type or P-type MOS transistors, a first one of which has a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair, and a second one of which has a gate terminal coupled to the word line 451 and a channel having a terminal coupled to a bit-bar line 453 and another terminal coupled to the drain terminals of the P-type and N-type MOS transistors 447 and 448 in the right pair and the gate terminals of the P-type and N-type MOS transistors 447 and 448 in the left pair. A logic level on the bit line 452 is opposite a logic level on the bit-bar line 453. The switch 449 may be considered as a programming transistor for writing a programing code or data into storage nodes of the 4 data-latch transistors 447 and 448, i.e., at the drains and gates of the 4 data-latch transistors 447 and 448. The switches 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the first one of the switches 449, and thereby the logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Further, the bit-bar line 453 may be coupled to the drain terminals of the P-type and N-type MOS transistors 447 and 448 in the right pair and the gate terminals of the P-type and N-type MOS transistors 447 and 448 in the left pair via the channel of the second one of the switches 449, and thereby the logic level on the bit line 453 may be reloaded into the conductive line between the gate terminals of the P-type and N-type MOS transistors 447 and 448 in the left pair and the conductive line between the drain terminals of the P-type and N-type MOS transistors 447 and 448 in the right pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair: a logic level on the bit line 453 may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

(2) Second type of Volatile Storage Unit

Figure 1B:
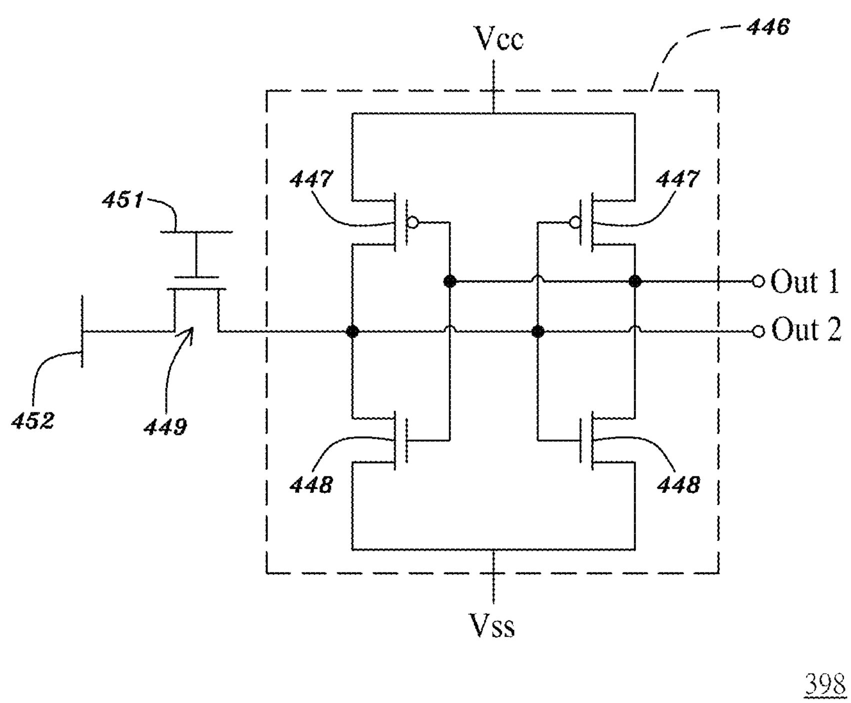

FIG. 1B is a circuit diagram illustrating a second type of volatile storage unit in accordance with an embodiment of the present application. Referring to FIG. 1B, a second type of volatile storage unit 398 may have the memory unit 446, i.e., static random-access memory (SRAM) cell, as illustrated in FIG. 1A. The second type of volatile storage unit 398 may further have a switch or transfer (write) transistor 449, such as N-type or P-type MOS transistor, having a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair. The switch 449 may be considered as a programming transistor for writing a programing code or data into storage nodes of the 4 data-latch transistors 447 and 448, i.e., at the drains and gates of the 4 data-latch transistors 447 and 448. The switch 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the switch 449, and thereby a logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair: a logic level, opposite to the logic level on the bit line 452, may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

Specification for Pass/No-Pass Switches (1) First Type of Pass/No-Pass Switch

Figure 2B:
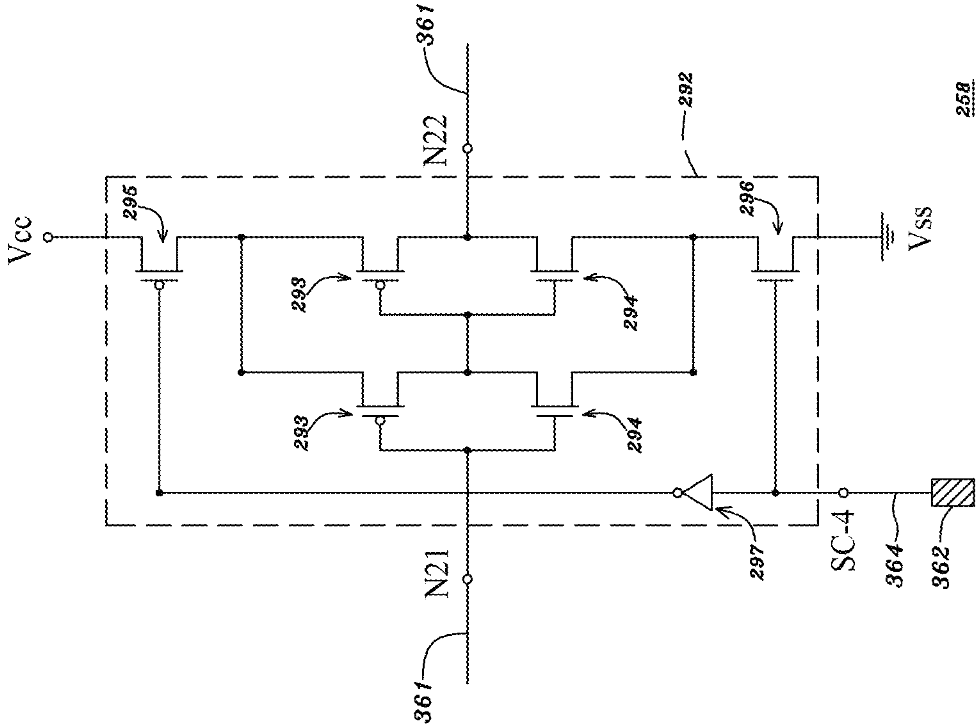
FIGS. 2A-2C are circuit diagrams illustrating first, second and third types of pass/no-pass switches in accordance with an embodiment of the present application.
Figure 2A:
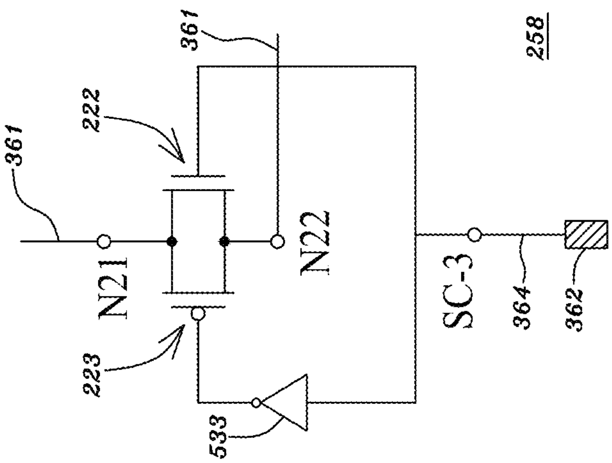

FIG. 2A is a circuit diagram illustrating a first type of pass/no-pass switch in accordance with an embodiment of the present application. Referring to FIG. 2A, a first type of pass/no-pass switch 258 may include an N-type metal-oxide-semiconductor (MOS) transistor 222 and a P-type metal-oxide-semiconductor (MOS) transistor 223 coupling in parallel to each other. Each of the N-type and P-type metal-oxide-semiconductor (MOS) transistors 222 and 223 of the first type of pass/no-pass switch 258 may be configured to form a channel having an end at a node N21 of the pass/no-pass switch 258 and the other opposite end at a node N22 of the pass/no-pass switch 258. Thereby, the first type of pass/no-pass switch 258 may be set to turn on or off connection between its nodes N21 and N22. The first type of pass/no-pass switch 258 may further include an inverter 533 configured to invert its data input at its input point coupling to a gate terminal of the N-type MOS transistor 222 and a node SC-3 as its data output at its output point coupling to a gate terminal of the P-type MOS transistor 223.

(2) Second Type of Pass/No-Pass Switch

FIG. 2B is a circuit diagram illustrating a second type of pass/no-pass switch in accordance with an embodiment of the present application. Referring to FIG. 2B, a second type of pass/no-pass switch 258 may be a multi-stage tri-state buffer 292, i.e., switch buffer, having a pair of a P-type MOS transistor 293 and N-type MOS transistor 294 in each stage, both having respective drain terminals coupling to each other and respective source terminals configured to couple to the voltage Vcc of power supply and to the voltage Vss of ground reference. In this case, the multi-stage tri-state buffer 292 is two-stage tri-state buffer, i.e., two-stage inverter buffer, having two pairs of the P-type MOS transistor 293 and N-type MOS transistor 294 in the two respective stages, i.e., first and second stages. The P-type MOS and N-type MOS transistors 293 and 294 in the pair in the first stage may have gate terminals at a node N21 of the pass/no-pass switch 258. The drain terminals of the P-type MOS and N-type MOS transistors 293 and 294 in the pair in the first stage may couple to each other and to gate terminals of the P-type MOS and N-type MOS transistors 293 and 294 in the pair in the second stage, i.e., output stage. The P-type MOS and N-type MOS transistors 293 and 294 in the pair in the second stage, i.e., output stage, may have drain terminals couple to each other at a node N22 of the pass/no-pass switch 258.

Referring to FIG. 2B, the second type of pass/no-pass switch 258 may further include a switching mechanism configured to enable or disable the multi-stage tri-state buffer 292, wherein the switching mechanism may be composed of (1) a control P-type MOS transistor 295 having a source terminal coupling to the voltage Vcc of power supply and a drain terminal coupling to the source terminals of the P-type MOS transistors 293 in the first and second stages, (2) a control N-type MOS transistor 296 having a source terminal coupling to the voltage Vss of ground reference and a drain terminal coupling to the source terminals of the N-type MOS transistors 294 in the first and second stages and (3) an inverter 297 configured to invert a data input SC-4 of the pass/no-pass switch 258 at an input point of the inverter 297 coupling to a gate terminal of the control N-type MOS transistor 296 as a data output of the inverter 297 at an output point of the inverter 297 coupling to a gate terminal of the control P-type MOS transistor 295.

For example, referring to FIG. 2B, when the pass/no-pass switch 258 has the data input SC-4 at a logic level of "1" to turn on the pass/no-pass switch 258, the pass/no-pass switch 258 may amplify its data input and pass its data input from its input point at the node N21 to its output point at its node N22 as its data output. When the pass/no-pass switch 258 has the data input SC-4 at a logic level of "0" to turn off the pass/no-pass switch 258, the pass/no-pass switch 258 may neither pass data from its node N21 to its node N22 nor pass data from its node N22 to its node N21.

(3) Third Type of Pass/No-Pass Switch

Figure 2C:
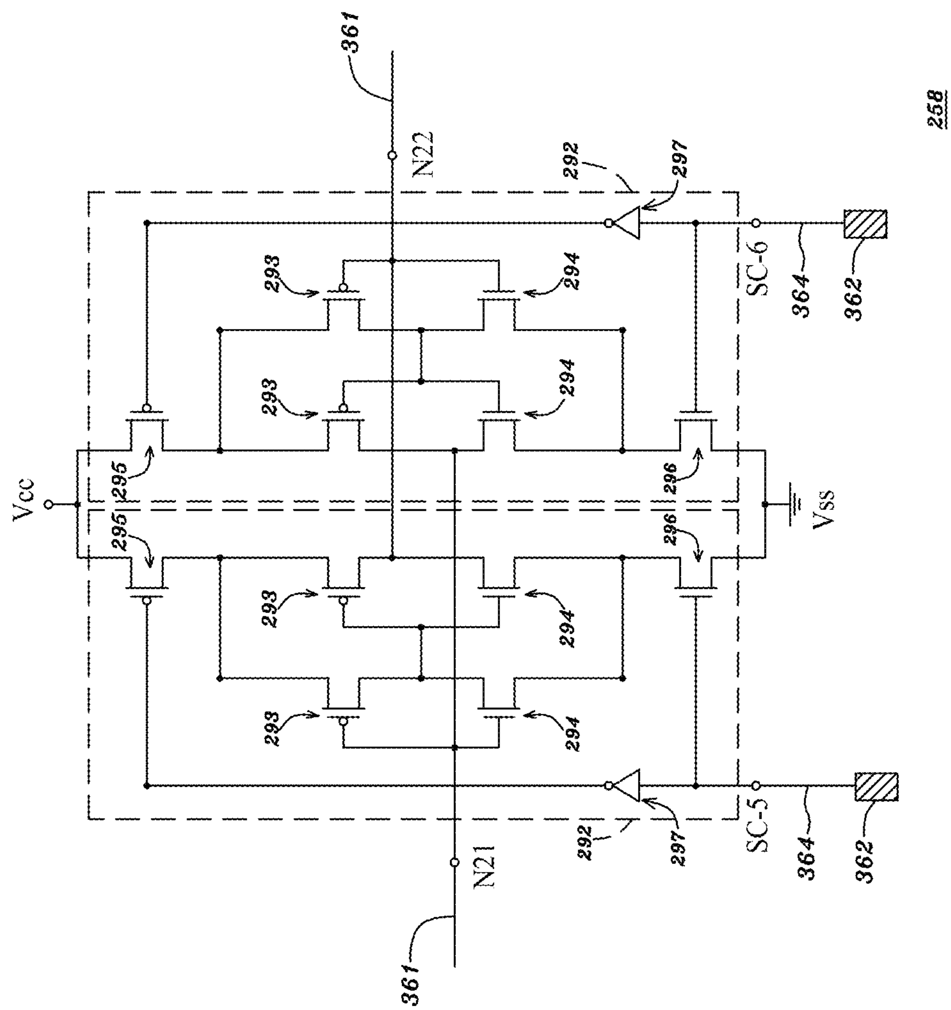

FIG. 2C is a circuit diagram illustrating a third type of pass/no-pass switch in accordance with an embodiment of the present application. For an element indicated by the same reference number shown in FIGS. 2B and 2C, the specification of the element as seen in FIG. 2C may be referred to that of the element as illustrated in FIG. 2B. Referring to FIG. 2C, a third type of pass/no-pass switch 258 may include a pair of multi-stage tri-state buffers 292, i.e., switch buffers, as illustrated in FIG. 2B. The P-type and N-type MOS transistors 293 and 294 in the first stage in the left one of the multi-stage tri-state buffers 292 in the pair may have their gate terminals at a node N21 of the pass/no-pass switch 258, which couples to the drain terminals of the P-type and N-type MOS transistors 293 and 294 in the second stage, i.e., output stage, in the right one of the multi-stage tri-state buffers 292 in the pair. The P-type and N-type MOS transistors 293 and 294 in the first stage in the right one of the multi-stage tri-state buffers 292 in the pair may have gate terminals at a node N22 of the pass/no-pass switch 258, which couples to the drain terminals of the P-type and N-type MOS transistors 293 and 294 in the second stage, i.e., output stage, in the left one of the multi-stage tri-state buffers 292 in the pair. For the left one of the multi-stage tri-state buffers 292 in the pair, its inverter 297 is configured to invert a data input SC-5 of the pass/no-pass switch 258 at an input point of its inverter 297 coupling to the gate terminal of its control N-type MOS transistor 296 as a data output of its inverter 297 at an output point of its inverter 297 coupling to the gate terminal of its control P-type MOS transistor 295. For the right one of the multi-stage tri-state buffers 292 in the pair, its inverter 297 is configured to invert a data input SC-6 of the pass/no-pass switch 258 at an input point of its inverter 297 coupling to the gate terminal of its control N-type MOS transistor 296 as a data output of its inverter 297 at an output point of its inverter 297 coupling to the gate terminal of its control P-type MOS transistor 295.

For example, referring to FIG. 2C, when the pass/no-pass switch 258 has the data input SC-5 at a logic level of "1" to turn on the left one of the multi-stage tri-state buffers 292 in the pair and the pass/no-pass switch 258 has the data input SC-6 at a logic level of "0" to turn off the right one of the multi-stage tri-state buffers 292 in the pair, the third type of pass/no-pass switch 258 may amplify its data input and pass its data input from its input point at its node N21 to its output point at its node N22 as its data output. When the pass/no-pass switch 258 has the data input SC-5 at a logic level of "0" to turn off the left one of the multi-stage tri-state buffers 292 in the pair and the pass/no-pass switch 258 has the data input SC-6 at a logic level of "1" to turn on the right one of the multi-stage tri-state buffers 292 in the pair, the third type of pass/no-pass switch 258 may amplify its data input and pass its data input from its input point at its node N22 to its output point at its node N21 as its data output. When the pass/no-pass switch 258 has the data input SC-5 at a logic level of "0" to turn off the left one of the multi-stage tri-state buffers 292 in the pair and the pass/no-pass switch 258 has the data input SC-6 at a logic level of "0" to turn off the right one of the multi-stage tri-state buffers 292 in the pair, the third type of pass/no-pass switch 258 may neither pass data from its node N21 to its node N22 nor pass data from its node N22 to its node N21. When the pass/no-pass switch 258 has the data input SC-5 at a logic level of "1" to turn on the left one of the multi-stage tri-state buffers 292 in the pair and the pass/no-pass switch 258 has the data input SC-6 at a logic level of "1" to turn on the right one of the multi-stage tri-state buffers 292 in the pair, the third type of pass/no-pass switch 258 may either amplify its data input and pass its data input from its input point at its node N21 to its output point at its node N22 as its data output or amplify its data input and pass its data input from its input point at its node N22 to its output point at its node N21 as its data output.

Figure 3A:
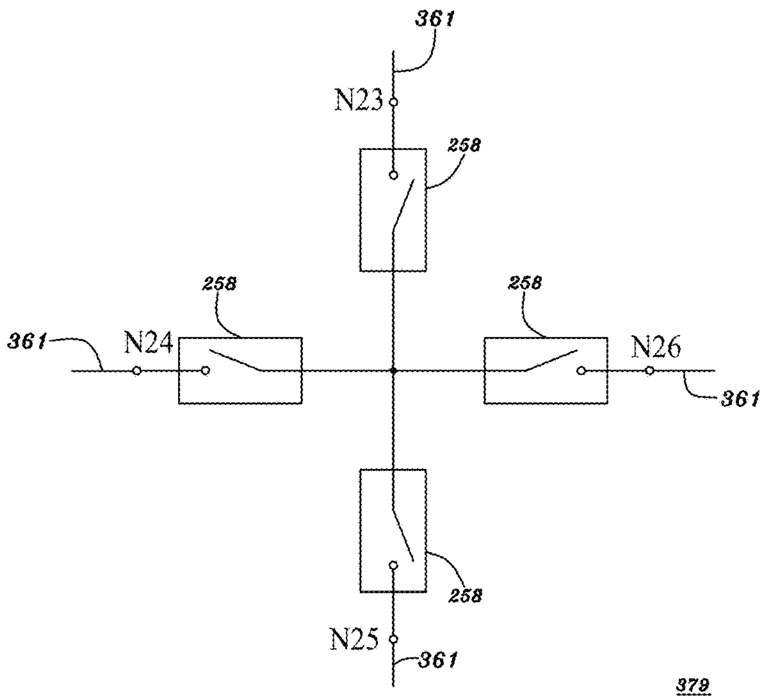
FIGS. 3A and 3B are circuit diagrams illustrating first and second types of cross-point switches composed of multiple pass/no-pass switches in accordance with an embodiment of the present application.

Specification for Cross-Point Switches Constructed from Pass/No-Pass Switches (1) First Type of Cross-Point Switch FIG. 3A is a circuit diagram illustrating a first type of cross-point switch composed of four pass/no-pass switches in accordance with an embodiment of the present application. Referring to FIG. 3A, four pass/no-pass switches 258, each of which may be one of the first and third types of pass/no-pass switches 258 as illustrated in FIGS. 2A and 2C respectively, may compose a first type of cross-point switch 379. The first type of cross-point switch 379 may have four terminals N23-N26 each configured to be switched to couple to another one of its four terminals N23-N26 via two of its four pass/no-pass switches 258. The first type of cross-point switch 379 may have a central node configured to couple to its four terminals N23-N26 via its four respective pass/no-pass switches 258. Each of the pass/no-pass switches 258 may have one of the nodes N21 and N22 coupling to one of the four terminals N23-N26 and the other one of the nodes N21 and N22 coupling to the central node of the first type of cross-point switch 379. For example, the first type of cross-point switch 379 may be switched to pass data from its terminal N23 to its terminal N24 via top and left ones of its four pass/no-pass switches 258, to its terminal N25 via top and bottom ones of its four pass/no-pass switches 258 and/or to its terminal N26 via top and right ones of its four pass/no-pass switches 258.

(2) Second Type of Cross-Point Switch

Figure 3B:
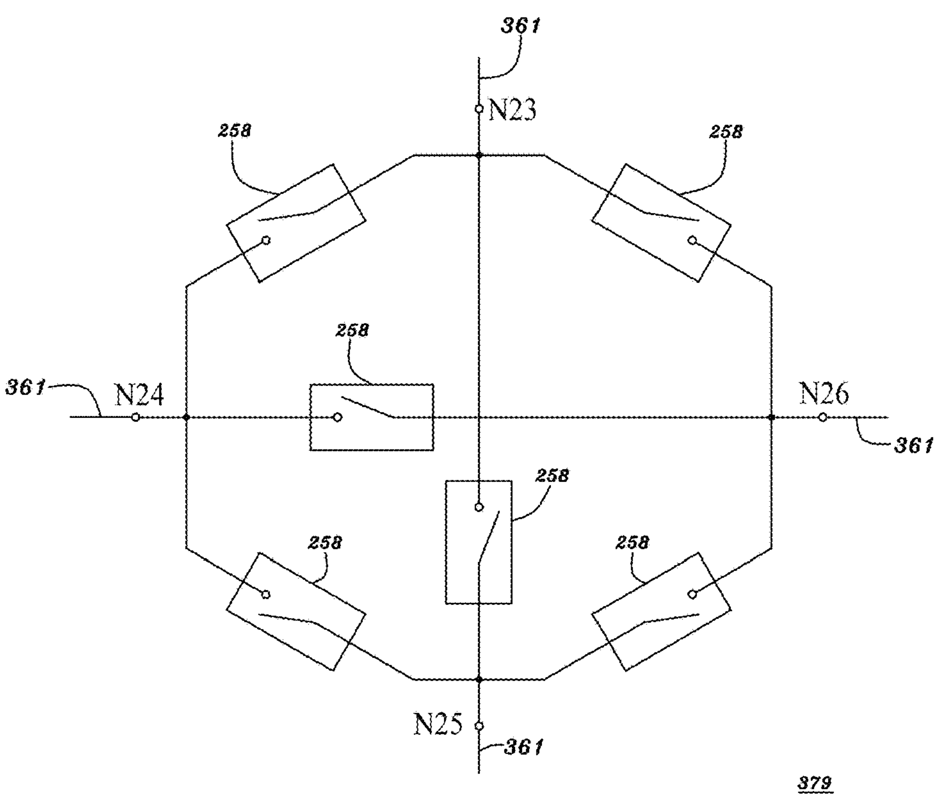

FIG. 3B is a circuit diagram illustrating a second type of cross-point switch composed of six pass/no-pass switches in accordance with an embodiment of the present application. Referring to FIG. 3B, six pass/no-pass switches 258, each of which may be one of the first and three types of pass/no-pass switches as illustrated in FIGS. 2A and 2C respectively, may compose a second type of cross-point switch 379. The second type of cross-point switch 379 may have four terminals N23-N26 each configured to be switched to couple to another one of its four terminals N23-N26 via one of its six pass/no-pass switches 258. Each of the pass/no-pass switches 258 may have one of the nodes N21 and N22 coupling to one of the four terminals N23-N26 and the other one of the nodes N21 and N22 coupling to another one of the four terminals N23-N26. For example, the second type of cross-point switch 379 may be switched to pass data from its terminal N23 to its terminal N24 via a first one of its six pass/no-pass switches 258 between its terminals N23 and N24, to its terminal N25 via a second one of its six pass/no-pass switches 258 between its terminals N23 and N25 and/or to its terminal N26 via a third one of its six pass/no-pass switches 258 between its terminals N23 and N26.

Specification for Multiplexer (MUXER)

Figure 4:
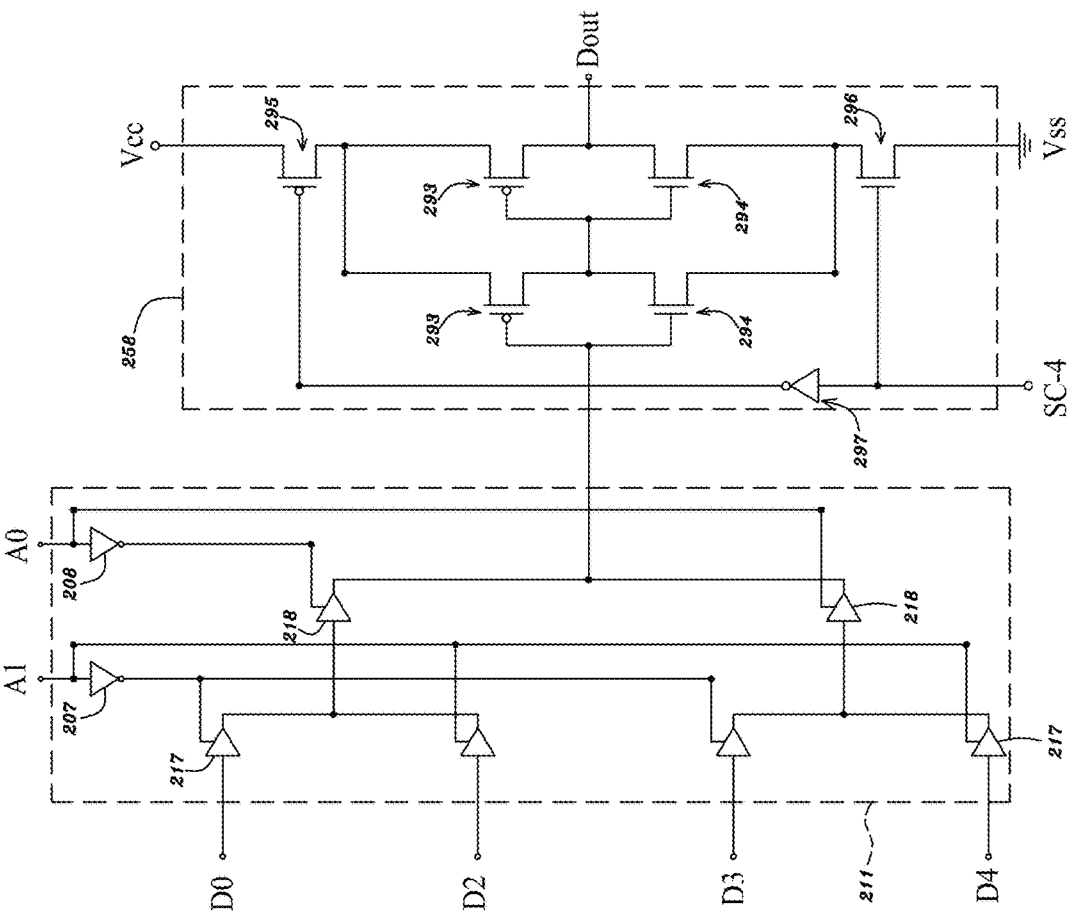
FIG. 4 is a circuit diagram illustrating a multiplexer in accordance with an embodiment of the present application.

FIG. 4 is a circuit diagram illustrating a multiplexer in accordance with an embodiment of the present application. Referring to FIG. 4, a multiplexer (MUXER) 211 may have a first set of two input points arranged in parallel for a first input data set, e.g., A0 and A1, and a second set of four input points arranged in parallel for a second input data set, e.g., D0, D1, D2 and D3. The multiplexer (MUXER) 211 may select a data input, e.g., D0, D1, D2 or D3, from its second input data set at a second set of its input points as a data output Dout at its output point based on its first input data set, e.g., A0 and A1, at a first set of its input points.

Referring to FIG. 4, the multiplexer 211 may include multiple stages of switch buffers, e.g., two stages of switch buffers 217 and 218, coupling to each other or one another stage by stage. For more elaboration, the multiplexer 211 may include four switch buffers 217 in two pairs in the first stage, i.e., input stage, arranged in parallel, each having a first input point for a first data input associated with data A1 of the first input data set of the multiplexer 211 and a second input point for a second data input associated with data, e.g., D0, D1, D2 or D3, of the second input data set of the multiplexer 211. Said each of the four switch buffers 217 in the first stage may be switched on or off to pass or not to pass its second data input from its second input point to its output point in accordance with its first data input at its first input point. The multiplexer 211 may include an inverter 207 having an input point for the data A1 of the first input data set of the multiplexer 211, wherein the inverter 207 is configured to invert the data A1 of the first input data set of the multiplexer 211 as a data output at an output point of the inverter 207. One of the two switch buffers 217 in each pair in the first stage may be switched on, in accordance with the first data input at its first input point coupling to one of the input and output points of the inverter 207, to pass the second data input from its second input point to its output point as a data output of said pair of switch buffers 217 in the first stage: the other one of the switch buffers 217 in said each pair in the first stage may be switched off, in accordance with the first data input at its first input point coupling to the other one of the input and output points of the inverter 207, not to pass the second data input from its second input point to its output point. The output points of the two switch buffers 217 in said each pair in the first stage may couple to each other. For example, a top one of the two switch buffers 217 in a top pair in the first stage may have its first input point coupling to the output point of the inverter 207 and its second input point for its second data input associated with data D0 of the second input data set of the multiplexer 211: a bottom one of the two switch buffers 217 in the top pair in the first stage may have its first input point coupling to the input point of the inverter 207 and its second input point for its second data input associated with data D1 of the second input data set of the multiplexer 211. The top one of the two switch buffers 217 in the top pair in the first stage may be switched on in accordance with its first data input at its first input point to pass its second data input from its second input point to its output point as a data output of the top pair of switch buffers 217 in the first stage: the bottom one of the two switch buffers 217 in the top pair in the first stage may be switched off in accordance with its first data input at its first input point not to pass its second data input from its second input point to its output point. Thereby: each of the two pairs of switch buffers 217 in the first stage may be switched in accordance with its two first data inputs at its two first input points coupling to the input and output points of the inverter 207 respectively to pass one of its two second data inputs from one of its two second input points to its output point coupling to a second input point of one of the switch buffers 218 in the second stage, i.e., output stage, as a data output of said each of the two pairs of switch buffers 217 in the first stage.

Referring to FIG. 4, the multiplexer 211 may include a pair of two switch buffers 218 in the second stage, i.e., output stage, arranged in parallel, each having a first input point for a first data input associated with data A0 of the first input data set of the multiplexer 211 and a second input point for a second data input associated with the data output of one of the two pairs of switch buffers 217 in the first stage. Said each of the two switch buffers 218 in the pair in the second stage, i.e., output stage, may be switched on or off to pass or not to pass its second data input from its second input point to its output point in accordance with its first data input at its first input point. The multiplexer 211 may include an inverter 208 having an input point for the data A0 of the first input data set of the multiplexer 211, wherein the inverter 208 is configured to invert the data A0 of the first input data set of the multiplexer 211 as its data output at an output point of the inverter 208. One of the two switch buffers 218 in the pair in the second stage, i.e., output stage, may be switched on, in accordance with the first data input at its first input point coupling to one of the input and output points of the inverter 208, to pass the second data input from its second input point to its output point as a data output of said pair of switch buffers 218 in the second stage: the other one of the two switch buffers 218 in the pair in the second stage, i.e., output stage, may be switched off, in accordance with the first data input at its first input point coupling to the other one of the input and output points of the inverter 208, not to pass the second data input from its second input point to its output point. The output points of the two switch buffers 218 in the pair in the second stage, i.e., output stage, may couple to each other. For example, a top one of the two switch buffers 218 in the pair in the second stage, i.e., output stage, may have its first input point coupling to the output point of the inverter 208 and its second input point for its second data input associated with the data output of the top one of the two pairs of switch buffers 217 in the first stage: a bottom one of the two switch buffers 218 in the pair in the second stage, i.e., output stage, may have its first input point coupling to the input point of the inverter 208 and its second input point for its second data input associated with the data output of the bottom one of the two pairs of switch buffers 217 in the first stage. The top one of the two switch buffers 218 in the pair in the second stage, i.e., output stage, may be switched on in accordance with its first data input at its first input point to pass its second data input from its second input point to its output point as a data output of the pair of switch buffers 218 in the second stage: the bottom one of the two switch buffers 218 in the pair in the second stage, i.e., output stage, may be switched off in accordance with its first data input at its first input point not to pass its second data input from its second input point to its output point. Thereby: the pair of switch buffers 218 in the second stage, i.e., output stage, may be switched in accordance with its two first data inputs at its two first input points coupling to the input and output points of the inverter 207 respectively to pass one of its two second data inputs from one of its two second input points to its output point as a data output of the pair of switch buffers 218 in the second stage, i.e., output stage.

Referring to FIG. 4, the second type of pass/no-pass switch or switch buffer 292 as seen in FIG. 2B may be provided to couple to the output point of the pair of switch buffers 218 of the multiplexer 211. The pass/no-pass switch or switch buffer 292 may have the input point at its node N21 coupling to the output point of the pair of switch buffers 218 in the last stage, e.g., in the second stage or output stage in this case. For an element indicated by the same reference number shown in FIGS. 2B and 4, the specification of the element as seen in FIG. 4 may be referred to that of the element as illustrated in FIG. 2B. Accordingly, referring to FIG. 4, the multiplexer (MUXER) 211 may select a data input from its second input data set, e.g., D0, D1, D2 and D3, at its second set of four input points as its data output Dout at its output point based on its first input data set, e.g., A0 and A1, at its first set of two input points. The second type of pass/no-pass switch 292 may amplify its data input associated with the data output Dout of the pair of switch buffers 218 of the multiplexer 211 as its data output at its output point at its node N22.

Specification for Large I/O Circuits

Figure 5A:
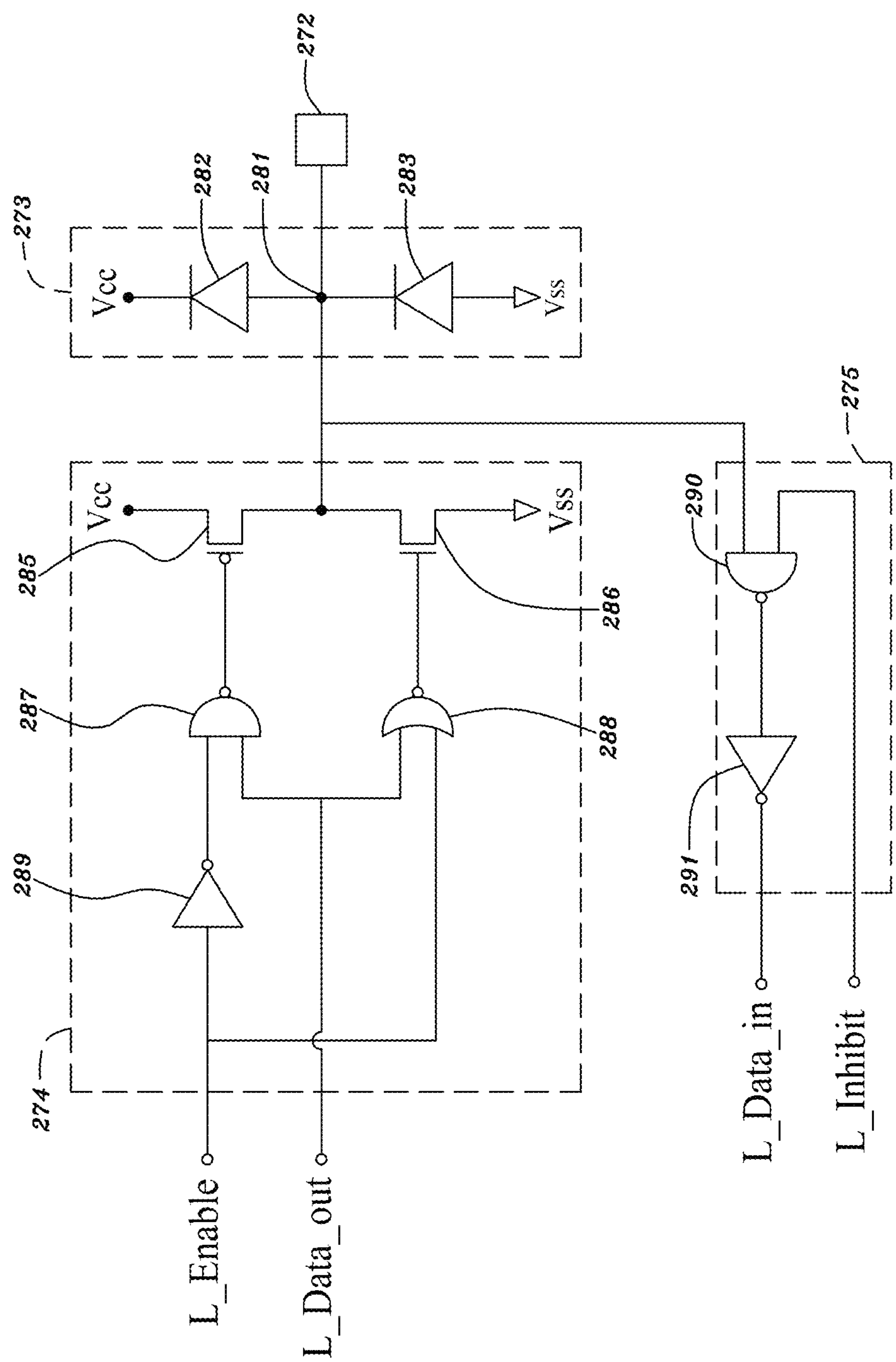
FIG. 5A is a circuit diagram of a large I/O circuit in accordance with an embodiment of the present application.

FIG. 5A is a circuit diagram of a large I/O circuit in accordance with an embodiment of the present application. Referring to FIG. 5A, a semiconductor chip may include multiple I/O pads 272 each coupling to its large ESD protection circuit or device 273, its large driver 274 and its large receiver 275. The large driver 274, large receiver 275 and large ESD protection circuit or device 273 may compose a large I/O circuit 341. The large ESD protection circuit or device 273 may include a diode 282 having a cathode coupling to the voltage Vcc of power supply and an anode coupling to a node 281 and a diode 283 having a cathode coupling to the node 281 and an anode coupling to the voltage Vss of ground reference. The node 281 couples to one of the I/O pads 272.

Referring to FIG. 5A, the large driver 274 may have a first input point for a first data input L_Enable for enabling the large driver 274 and a second input point for a second data input L_Data_out, and may be configured to amplify or drive the second data input L_Data_out as its data output at its output point at the node 281 to be transmitted to circuits outside the semiconductor chip through said one of the I/O pads 272. The large driver 274 may include a P-type MOS transistor 285 and N-type MOS transistor 286 both having respective drain terminals coupling to each other as its output point at the node 281 and respective source terminals coupling to the voltage Vcc of power supply and to the voltage Vss of ground reference. The large driver 274 may have a NAND gate 287 having a data output at an output point of the NAND gate 287 coupling to a gate terminal of the P-type MOS transistor 285 and a NOR gate 288 having a data output at an output point of the NOR gate 288 coupling to a gate terminal of the N-type MOS transistor 286. The NAND gate 287 may have a first data input at its first input point associated with a data output of its inverter 289 at an output point of an inverter 289 of the large driver 274 and a second data input at its second input point associated with the second data input L_Data_out of the large driver 274 to perform a NAND operation on its first and second data inputs as its data output at its output point coupling to the gate terminal of its P-type MOS transistor 285. The NOR gate 288 may have a first data input at its first input point associated with the second data input L_Data_out of the large driver 274 and a second data input at its second input point associated with the first data input L_Enable of the large driver 274 to perform a NOR operation on its first and second data inputs as its data output at its output point coupling to the gate terminal of the N-type MOS transistor 286. The inverter 289 may be configured to invert its data input at its input point associated with the first data input L_Enable of the large driver 274 as its data output at its output point coupling to the first input point of the NAND gate 287.

Referring to FIG. 5A, when the large driver 274 has the first data input L_Enable at a logic level of "1", the data output of the NAND gate 287 is always at a logic level of "1" to turn off the P-type MOS transistor 285 and the data output of the NOR gate 288 is always at a logic level of "0" to turn off the N-type MOS transistor 286. Thereby: the large driver 274 may be disabled by its first data input L_Enable and the large driver 274 may not pass the second data input L_Data_out from its second input point to its output point at the node 281.

Referring to FIG. 5A, the large driver 274 may be enabled when the large driver 274 has the first data input L_Enable at a logic level of "0". Meanwhile, if the large driver 274 has the second data input L_Data_out at a logic level of "0", the data outputs of the NAND and NOR gates 287 and 288 are at a logic level of "1" to turn off the P-type MOS transistor 285 and on the N-type MOS transistor 286, and thereby the data output of the large driver 274 at the node 281 is at a logic level of "0" to be passed to said one of the I/O pads 272. If the large driver 274 has the second data input L_Data_out is at a logic level of "1", the data outputs of the NAND and NOR gates 287 and 288 are at a logic level of "0" to turn on the P-type MOS transistor 285 and off the N-type MOS transistor 286, and thereby the data output of the large driver 274 at the node 281 is at a logic level of "1" to be passed to said one of the I/O pads 272. Accordingly, the large driver 274 may be enabled by its first data input L_Enable to amplify or drive its second data input L_Data_out at its second input point as its data output at its output point at the node 281 to be transmitted to circuits outside the semiconductor chip through said one of the I/O pads 272.

Referring to FIG. 5A, the large receiver 275 may have a first data input L_Inhibit at its first input point and a second data input at its second input point coupling to said one of the I/O pads 272 to be amplified or driven by the large receiver 275 as its data output L_Data_in. The large receiver 275 may be inhibited by its first data input L_Inhibit from generating its data output L_Data_in associated with its second data input. The large receiver 275 may include a NAND gate 290 and an inverter 291 having a data input at an input point of the inverter 291 associated with a data output of the NAND gate 290. The NAND gate 290 has a first input point for its first data input associated with the second data input of the large receiver 275 and a second input point for its second data input associated with the first data input L_Inhibit of the large receiver 275 to perform a NAND operation on its first and second data inputs as its data output at its output point coupling to the input point of its inverter 291. The inverter 291 may be configured to invert its data input associated with the data output of the NAND gate 290 as its data output at its output point acting as the data output L_Data_in of the large receiver 275 at an output point of the large receiver 275.

Referring to FIG. 5A, when the large receiver 275 has the first data input L_Inhibit at a logic level of "0", the data output of the NAND gate 290 is always at a logic level of "1" and the data output L_Data_in of the large receiver 275 is always at a logic level of "0". Thereby, the large receiver 275 is inhibited from generating its data output L_Data_in associated with its second data input at the node 281.

Referring to FIG. 5A, the large receiver 275 may be activated when the large receiver 275 has the first data input L_Inhibit at a logic level of "1". Meanwhile, if the large receiver 275 has the second data input at a logic level of "1" from circuits outside the semiconductor chip through said one of the I/O pads 272, the NAND gate 290 has its data output at a logic level of "0", and thereby the large receiver 275 may have its data output L_Data_in at a logic level of "1". If the large receiver 275 has the second data input at a logic level of "0" from circuits outside the semiconductor chip through said one of the I/O pads 272, the NAND gate 290 has its data output at a logic level of "1", and thereby the large receiver 275 may have its data output L_Data_in at a logic level of "0". Accordingly, the large receiver 275 may be activated by its first data input L_Inhibit signal to amplify or drive its second data input from circuits outside the semiconductor chip through said one of the I/O pads 272 as its data output L_Data_in.

Referring to FIG. 5A, the large I/O circuit 274 may have output capacitance or driving capability or loading, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 3 pF, 5 pF, 10 pF, 15 pF or 20 pF, provided by its large driver 274. Further, the large I/O circuit 274 may have input capacitance, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 3 pF, 5 pF, 10 pF, 15 pF or 20 pF, provided by its large receiver 275 and/or its large ESD protection circuit 273. The size of the large ESD protection circuit or device 273 may be between 0.5 pF and 20 pF, between 0.5 pF and 15 pF, between 0.5 pF and 10 pF, between 0.5 pF and 5 pF or between 0.5 pF and 2 pF, or larger than 0.5 pF, 1 pF, 2 pF, 3 pF, 5 pF or 10 pF.

Specification for Small I/O Circuits

Figure 5B:
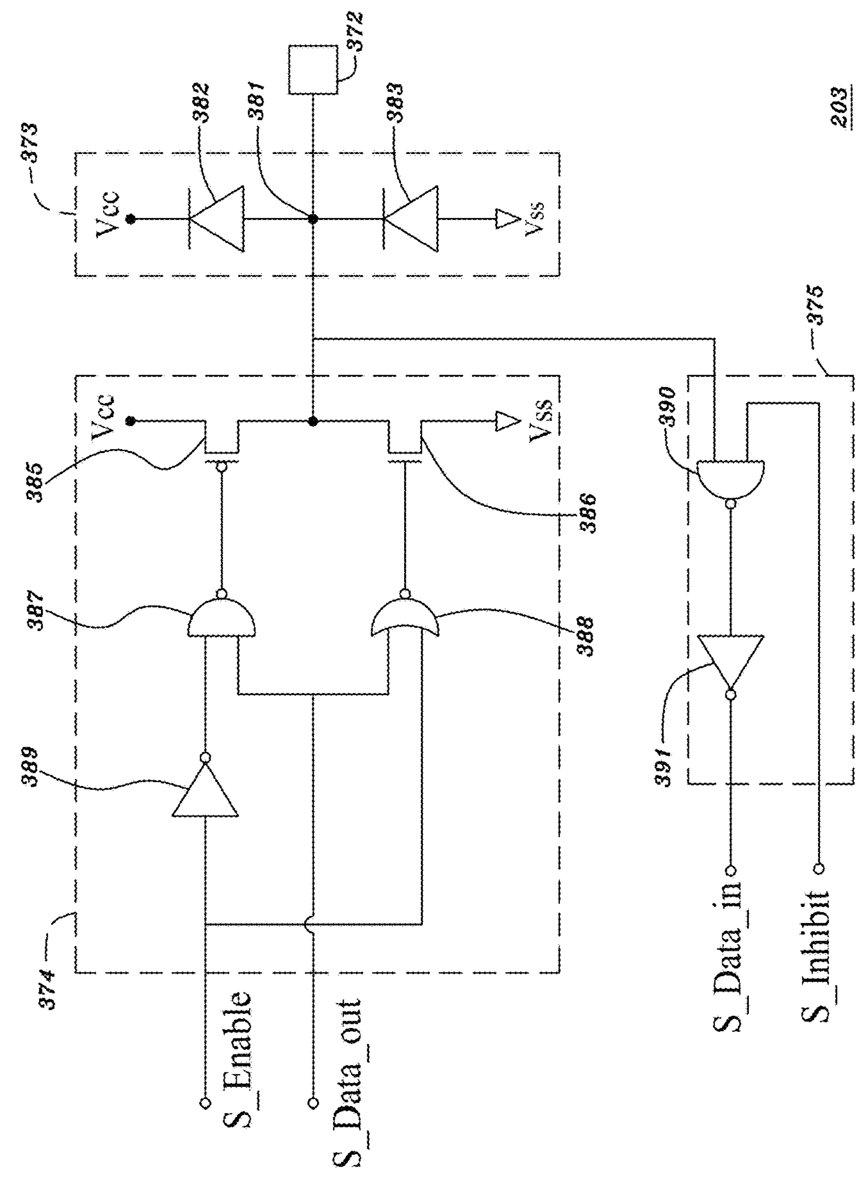
FIG. 5B is a circuit diagram of a small I/O circuit in accordance with an embodiment of the present application.

FIG. 5B is a circuit diagram of a small I/O circuit in accordance with an embodiment of the present application. Referring to FIG. 5B, a semiconductor chip may include multiple I/O pads 372 each coupling to its small ESD protection circuit or device 373, its small driver 374 and its small receiver 375. The small driver 374, small receiver 375 and small ESD protection circuit or device 373 may compose a small I/O circuit 203. The small ESD protection circuit or device 373 may include a diode 382 having a cathode coupling to the voltage Vcc of power supply and an anode coupling to a node 381 and a diode 383 having a cathode coupling to the node 381 and an anode coupling to the voltage Vss of ground reference. The node 381 couples to one of the I/O pads 372.

Referring to FIG. 5B, the small driver 374 may have a first input point for a first data input S_Enable for enabling the small driver 374 and a second input point for a second data input S_Data_out, and may be configured to amplify or drive the second data input S_Data_out as its data output at its output point at the node 381 to be transmitted to circuits outside the semiconductor chip through said one of the I/O pads 372. The small driver 374 may include a P-type MOS transistor 385 and N-type MOS transistor 386 both having respective drain terminals coupling to each other as its output point at the node 381 and respective source terminals coupling to the voltage Vcc of power supply and to the voltage Vss of ground reference. The small driver 374 may have a NAND gate 387 having a data output at an output point of the NAND gate 387 coupling to a gate terminal of the P-type MOS transistor 385 and a NOR gate 388 having a data output at an output point of the NOR gate 388 coupling to a gate terminal of the N-type MOS transistor 386. The NAND gate 387 may have a first data input at its first input point associated with a data output of its inverter 389 at an output point of an inverter 389 of the small driver 374 and a second data input at its second input point associated with the second data input S_Data_out of the small driver 374 to perform a NAND operation on its first and second data inputs as its data output at its output point coupling to the gate terminal of its P-type MOS transistor 385. The NOR gate 388 may have a first data input at its first input point associated with the second data input S_Data_out of the small driver 374 and a second data input at its second input point associated with the first data input S_Enable of the small driver 374 to perform a NOR operation on its first and second data inputs as its data output at its output point coupling to the gate terminal of the N-type MOS transistor 386. The inverter 389 may be configured to invert its data input at its input point associated with the first data input S_Enable of the small driver 374 as its data output at its output point coupling to the first input point of the NAND gate 387.

Referring to FIG. 5B, when the small driver 374 has the first data input S_Enable at a logic level of "1", the data output of the NAND gate 387 is always at a logic level of "1" to turn off the P-type MOS transistor 385 and the data output of the NOR gate 388 is always at a logic level of "0" to turn off the N-type MOS transistor 386. Thereby, the small driver 374 may be disabled by its first data input S_Enable and the small driver 374 may not pass the second data input S_Data_out from its second input point to its output point at the node 381.

Referring to FIG. 5B, the small driver 374 may be enabled when the small driver 374 has the first data input S_Enable at a logic level of "0". Meanwhile, if the small driver 374 has the second data input S_Data_out at a logic level of "0", the data outputs of the NAND and NOR gates 387 and 388 are at a logic level of "1" to turn off the P-type MOS transistor 385 and on the N-type MOS transistor 386, and thereby the data output of the small driver 374 at the node 381 is at a logic level of "0" to be passed to said one of the I/O pads 372. If the small driver 374 has the second data input S_Data_out at a logic level of "1", the data outputs of the NAND and NOR gates 387 and 388 are at a logic level of "0" to turn on the P-type MOS transistor 385 and off the N-type MOS transistor 386, and thereby the data output of the small driver 374 at the node 381 is at a logic level of "1" to be passed to said one of the I/O pads 372. Accordingly, the small driver 374 may be enabled by its first data input S_Enable to amplify or drive its second data input S_Data_out at its second input point as its data output at its output point at the node 381 to be transmitted to circuits outside the semiconductor chip through said one of the I/O pads 372.

Referring to FIG. 5B, the small receiver 375 may have a first data input S_Inhibit at its first input point and a second data input at its second input point coupling to said one of the I/O pads 372 to be amplified or driven by the small receiver 375 as its data output S_Data_in. The small receiver 375 may be inhibited by its first data input S_Inhibit from generating its data output S_Data_in associated with its second data input. The small receiver 375 may include a NAND gate 390 and an inverter 391 having a data input at an input point of the inverter 391 associated with a data output of the NAND gate 390. The NAND gate 390 has a first input point for its first data input associated with the second data input of the large receiver 275 and a second input point for its second data input associated with the first data input S_Inhibit of the small receiver 375 to perform a NAND operation on its first and second data inputs as its data output at its output point coupling to the input point of its inverter 391. The inverter 391 may be configured to invert its data input associated with the data output of the NAND gate 390 as its data output at its output point acting as the data output S_Data_in of the small receiver 375 at an output point of the small receiver 375.

Referring to FIG. 5B, when the small receiver 375 has the first data input S_Inhibit at a logic level of "0", the data output of the NAND gate 390 is always at a logic level of "1" and the data output S_Data_in of the small receiver 375 is always at a logic level of "0". Thereby: the small receiver 375 is inhibited from generating its data output S_Data_in associated with its second data input at the node 381.

Referring to FIG. 5B, the small receiver 375 may be activated when the small receiver 375 has the first data input S_Inhibit at a logic level of "1". Meanwhile, if the small receiver 375 has the second data input at a logic level of "1" from circuits outside the semiconductor chip through said one of the I/O pads 372, the NAND gate 390 has its data output at a logic level of "0", and thereby the small receiver 375 may have its data output S_Data_in at a logic level of "1". If the small receiver 375 has the second data input at a logic level of "0" from circuits outside the semiconductor chip through said one of the I/O pads 372, the NAND gate 390 has its data output at a logic level of "1", and thereby the small receiver 375 may have its data output S_Data_in at a logic level of "0". Accordingly, the small receiver 375 may be activated by its first data input S_Inhibit to amplify or drive its second data input from circuits outside the semiconductor chip through said one of the I/O pads 372 as its data output S_Data_in.

Referring to FIG. 5B, the small I/O circuit 203 may have output capacitance or driving capability or loading, for example, between 0.05 pF and 2 pF or between 0.1 pF and 1 pF, or smaller than 2 pF or 1 pF, provided by its small driver 374. Further, the small I/O circuit 203 may have input capacitance, for example, between 0.05 pF and 2 pF or between 0.1 pF and 1 pF, or smaller than 2 pF or 1 pF, provided by its small receiver 375 and/or its small ESD protection circuit 373.

Specification for Programmable Logic Blocks

Figure 6A:
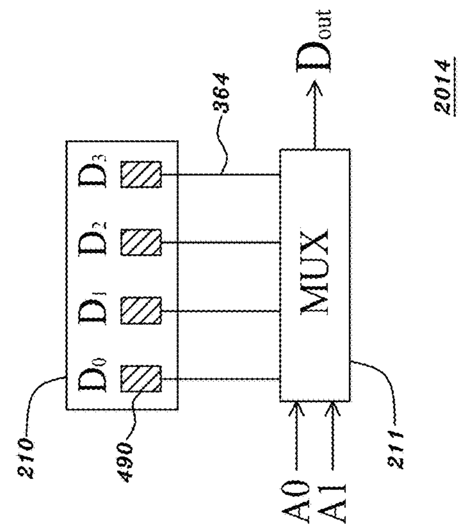
FIG. 6A is a schematic view showing a block diagram of a programmable logic cell in accordance with an embodiment of the present application.

FIG. 6A is a schematic view showing a block diagram of a programmable logic cell in accordance with an embodiment of the present application. Referring to FIG. 6A, a programmable logic block (LB) or element may include one or a plurality of programmable logic cells (LC) 2014 each configured to perform logic operation on its input data set at its input points. Each of the programmable logic cells (LC) 2014 may include multiple memory cells, i.e., configuration-programming-memory (CPM) cells, each configured to save or store one of resulting values or data of a look-up table (LUT) 210 and a multiplexer (MUXER) 211 having a first set of two input points arranged in parallel for a first input data set, e.g., A0 and A1 as illustrated in FIG. 4, and a second set of four input points arranged in parallel for a second input data set, e.g., D0, D1, D2 and D3 as illustrated in FIG. 4, each associated with one of the resulting values or data or programming codes for the look-up table (LUT) 210. The multiplexer (MUXER) 211 is configured to select, in accordance with its first input data set associated with the input data set of said each of the programmable logic cells (LC) 2014, a data input, e.g., D0, D1, D2 or D3 as illustrated in FIG. 4, from its second input data set as a data output Dout at its output point acting as a data output of said each of the programmable logic cells (LC) 2014 at an output point of said each of the programmable logic cells (LC) 2014.

Referring to FIG. 6A, each of the memory cells 490, i.e., configuration-programming-memory (CPM) cells, may be referred to the memory cell 446 as illustrated in FIG. 1A or 1B. The multiplexer (MUXER) 211 may have its second input data set, e.g., D0, D1, D2 and D3 as illustrated in FIG. 4, each associated with a data output, i.e., configuration-programming-memory (CPM) data, of one of the memory cells 490, e.g., one of the first and second data outputs Out1 and Out2 of the memory cell 446 as illustrated in FIG. 1A or 1B via fixed interconnects 364 configured not to be programmable for interconnection. Alternatively, each of the programmable logic cells (LC) 2014 may further include the second type of pass/no-pass switch or switch buffer 292 as seen in FIGS. 2B and 4 having the input point coupling to the output point of its multiplexer (MUXER) 211 to amplify the data output Dout of its multiplexer 211 as a data output of said each of the programmable logic cells (LC) 2014 at an output point of said each of the programmable logic cells (LC) 2014, wherein its second type of pass/no-pass switch or switch buffer 292 may have the data input SC-4 associated with a data output, i.e., configuration-programming-memory (CPM) data, of another of the memory cells 490, e.g., one of the first and second data outputs Out1 and Out2 of the memory cell 446 as illustrated in FIG. 1A or 1B.

Referring to FIG. 6A, each of the programmable logic cells (LC) 2014 may have the memory cells 490, i.e., configuration-programming-memory (CPM) cells, configured to be programed to store or save the resulting values or programing codes for the look-up table (LUT) 210 to perform the logic operation, such as AND operation, NAND operation, OR operation, NOR operation, EXOR operation or other Boolean operation, or an operation combining two or more of the above operations. For this case, each of the programmable logic cells (LC) 2014 may perform the logic operation on its input data set, e.g., A0 and A1, at its input points as a data output Dout at its output point. For more elaboration, each of the programmable logic cells (LC) 2014 may include the number 2$n$ of memory cells 490, i.e., configuration-programming-memory (CPM) cells, each configured to save or store one of resulting values of the look-up table (LUT) 210 and a multiplexer (MUXER) 211 having a first set of the number n of input points arranged in parallel for a first input data set, e.g., A0-A1, and a second set of the number 2$n$ of input points arranged in parallel for a second input data set, e.g., D0-D3, each associated with one of the resulting values or programming codes for the look-up table (LUT) 210, wherein the number n may range from 2 to 8, such as 2 for this case. The multiplexer (MUXER) 211 is configured to select, in accordance with its first input data set associated with the input data set of said each of the programmable logic cells (LC) 2014, a data input, e.g., one of D0-D3, from its second input data set as a data output Dout at its output point acting as a data output of said each of the programmable logic cells (LC) 2014 at an output point of said each of the programmable logic cells (LC) 2014.

Figure 6B:
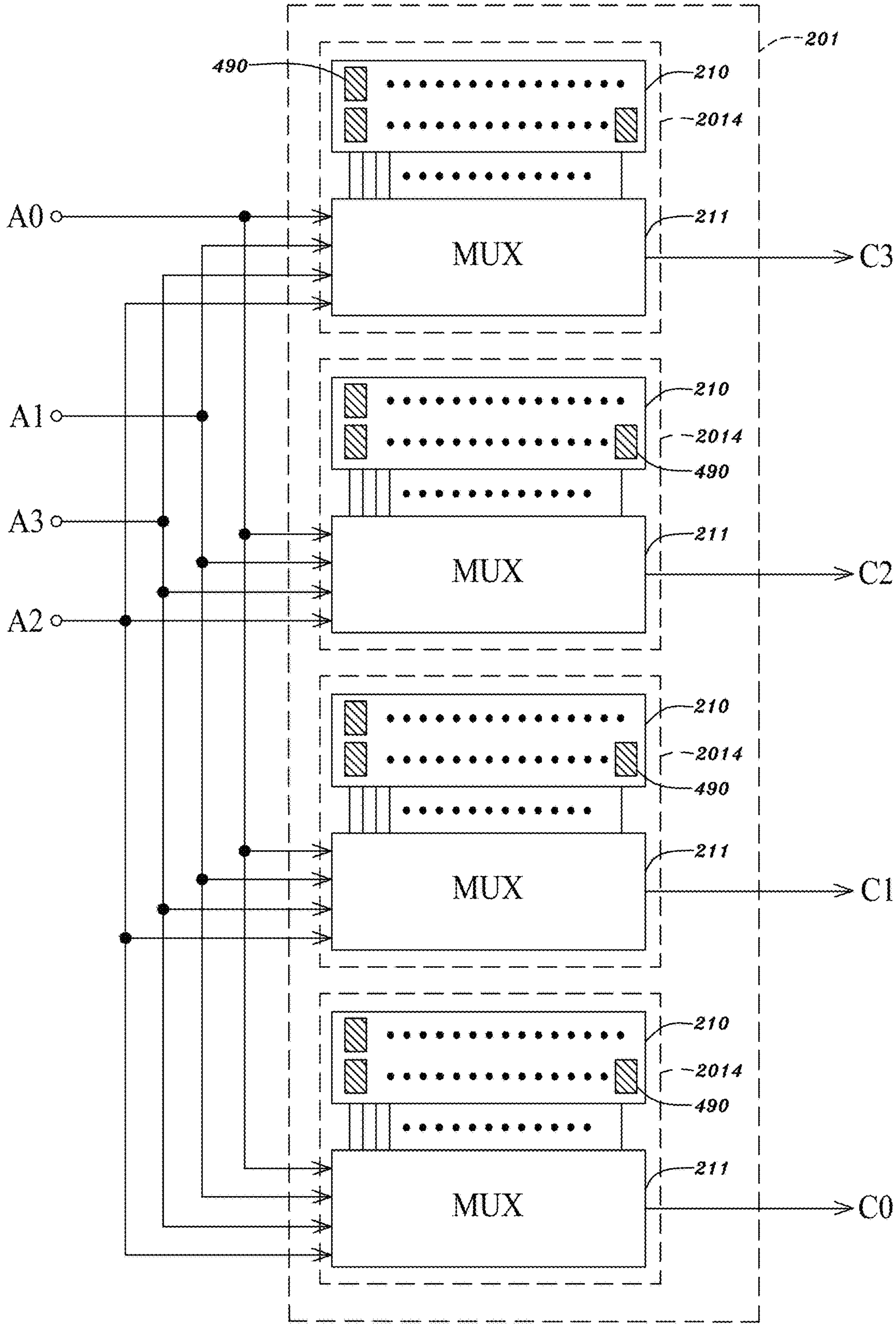
FIG. 6B is a block diagram illustrating a computation operator in accordance with an embodiment of the present application.
Figures 6C, 6D:
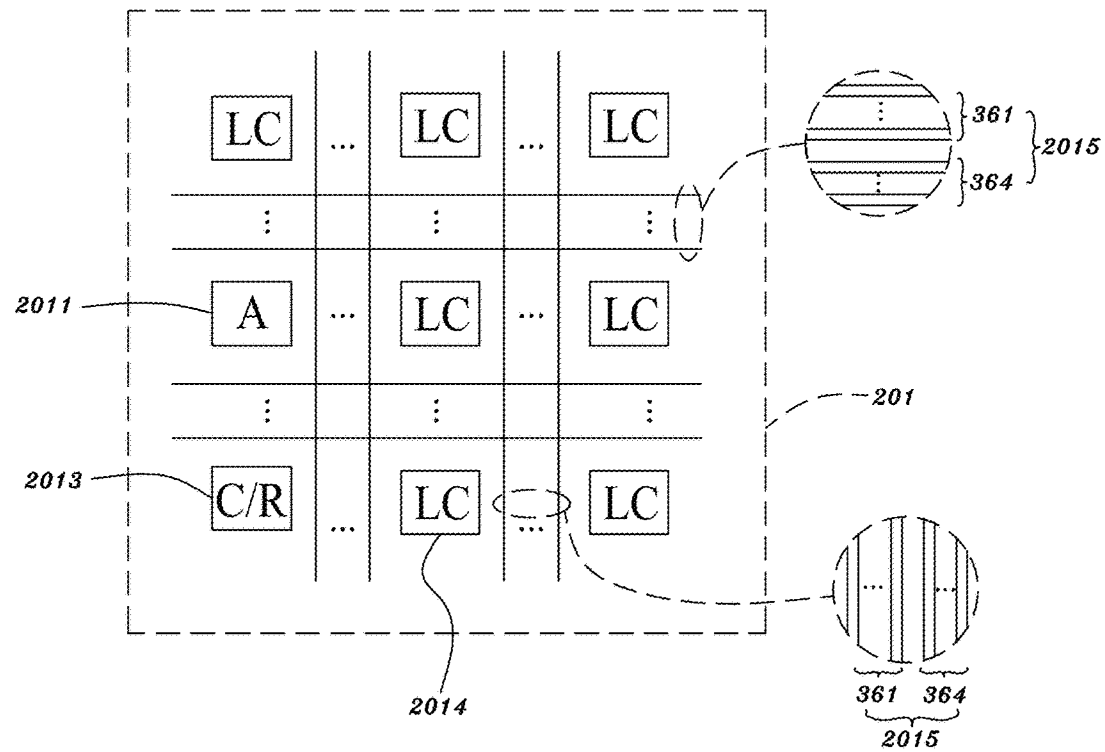
FIG. 6C shows a truth table for a logic operator as seen in FIG. 6B.
FIG. 6D is a block diagram illustrating a programmable logic block for a standard commodity FPGA IC chip in accordance with an embodiment of the present application.

Alternatively, a plurality of programmable logic cells (LC) 2014 as illustrated in FIG. 6A are configured to be programed to be integrated into a programmable logic block (LB) or element 201 as seen in FIG. 6B acting as a computation operator to perform computation operation, such as addition, subtraction, multiplication or division operation. The computation operator may be an adder, a multiplier, a multiplexer, a shift register, floating-point circuits and/or division circuits. FIG. 6B is a block diagram illustrating a computation operator in accordance with an embodiment of the present application. For example, the computation operator as seen in FIG. 6B may be configured to multiply two two-binary-digit data inputs, i.e., [A1, A0] and [A3, A2], into a four-binary-digit output data set, i.e., [C3, C2, C1, C0], as seen in FIG. 1C. FIG. 6C shows a truth table for a logic operator as seen in FIG. 6B.

Referring to FIGS. 6B and 6C, four programmable logic cells (LC) 2014, each of which may be referred to one as illustrated in FIG. 6A, may be programed to be integrated into the computation operator. Each of the four programmable logic cells (LC) 2014 may have its input data set at its four input points associated with an input data set [A1, A0, A3, A2] of the computation operator respectively. Each of the programmable logic cells (LC) 2014 of the computation operator may generate a data output, e.g., C0, C1. C2 or C3, of the four-binary-digit data output of the computation operator based on its input data set [A1, A0, A3, A2]. In the multiplication of the two-binary-digit number, i.e., [A1, A0], by the two-binary-digit number, i.e., [A3, A2], the programmable logic block (LB) 201 may generate its four-binary-digit output data set, i.e., [C3, C2, C1, C0], based on its input data set [A1, A0, A3, A2]. Each of the four programmable logic cells (LC) 2014 may have the memory cells 490, each of which may be referred to the memory cell 446 as illustrated in FIG. 1A or 1B, to be programed to save or store resulting values or programming codes of its look-up table 210. e.g., Table-0, Table-1, Table-2 or Table-3.

For example, referring to FIGS. 6B and 6C, a first one of the four programmable logic cells (LC) 2014 may have its memory cells 490, i.e., configuration-programming-memory (CPM) cells, configured to save or store the resulting values or programming codes of its look-up table (LUT) 210 of Table-0 and its multiplexer (MUXER) 211 configured to select, in accordance with the first input data set of its multiplexer (MUXER) 211 associated with the input data set [A1, A0, A3, A2] of the computation operator respectively, a data input from the second input data set D0-D15 of its multiplexer (MUXER) 211, each associated with the data output of one of its memory cells 490, e.g., one of the first and second data outputs Out1 and Out2 of the memory cell 446 as illustrated in FIG. 1A or 1B, associated with one of the resulting values or programming codes of its look-up table (LUT) 210 of Table-0, as its data output C0 acting as a binary-digit data output of the four-binary-digit output data set, i.e., [C3, C2, C1, C0], of the programmable logic block (LB) 201. A second one of the four programmable logic cells (LC) 2014 may have its memory cells 490, i.e., configuration-programming-memory (CPM) cells, configured to save or store the resulting values or programming codes of its look-up table (LUT) 210 of Table-1 and its multiplexer (MUXER) 211 configured to select, in accordance with the first input data set of its multiplexer (MUXER) 211 associated with the input data set [A1, A0, A3, A2] of the computation operator respectively, a data input from the second input data set D0-D15 of its multiplexer (MUXER) 211, each associated with the data output of one of its memory cells 490, e.g., one of the first and second data outputs Out1 and Out2 of the memory cell 446 as illustrated in FIG. 1A or 1B, associated with one of the resulting values or programming codes of its look-up table (LUT) 210 of Table-1, as its data output C1 acting as a binary-digit data output of the four-binary-digit output data set, i.e., [C3, C2, C1, C0], of the programmable logic block (LB) 201. A third one of the four programmable logic cells (LC) 2014 may have its memory cells 490, i.e., configuration-programming-memory (CPM) cells, configured to save or store the resulting values or programming codes of its look-up table (LUT) 210 of Table-2 and its multiplexer (MUXER) 211 configured to select, in accordance with the first input data set of its multiplexer (MUXER) 211 associated with the input data set [A1, A0, A3, A2] of the computation operator respectively, a data input from the second input data set D0-D15 of its multiplexer (MUXER) 211, each associated with the data output of one of its memory cells 490, e.g., one of the first and second data outputs Out1 and Out2 of the memory cell 446 as illustrated in FIG. 1A or 1B, associated with one of the resulting values or programming codes of its look-up table (LUT) 210 of Table-2, as its data output C2 acting as a binary-digit data output of the four-binary-digit output data set, i.e., [C3, C2, C1, C0], of the programmable logic block (LB) 201. A fourth one of the four programmable logic cells (LC) 2014 may have its memory cells 490, i.e., configuration-programming-memory (CPM) cells, configured to save or store the resulting values or programming codes of its look-up table (LUT) 210 of Table-3 and its multiplexer (MUXER) 211 configured to select, in accordance with the first input data set of its multiplexer (MUXER) 211 associated with the input data set [A1, A0, A3, A2] of the computation operator respectively, a data input from the second input data set D0-D15 of its multiplexer (MUXER) 211, each associated with the data output of one of its memory cells 490, e.g., one of the first and second data outputs Out1 and Out2 of the memory cell 446 as illustrated in FIG. 1A or 1B, associated with one of the resulting values or programming codes of its look-up table (LUT) 210 of Table-3, as its data output C3 acting as a binary-digit data output of the four-binary-digit output data set, i.e., [C3, C2, C1, C0], of the programmable logic block (LB) 201.

Thereby, referring to FIGS. 6B and 6C, the programmable logic block (LB) 201 acting as the computation operator may be composed of the four programmable logic cells (LC) 2014 to generate its four-binary-digit output data set, i.e., [C3, C2, C1, C0], based on its input data set [A1, A0, A3, A2].

Referring to FIGS. 6B and 6C, in a particular case for multiplication of 3 by 3, each of the four programmable logic cells (LC) 2014 may have its multiplexer (MUXER) 211 configured to select, in accordance with the first input data set of its multiplexer (MUXER) 211 associated with the input data set, i.e., [A1, A0, A3, A2]=[1, 1, 1, 1], of the computation operator respectively: a data input from the second input data set D0-D15 of its multiplexer (MUXER) 211, each associated with one of the resulting values or programming codes of its look-up table (LUT) 210, i.e., one of Table-0, Table-1, Table-2 and Table-3, as its data output, i.e., one of C0, C1, C2 and C3, acting as a binary-digit data output of the four-binary-digit output data set, i.e., [C3, C2, C1, C0]=[1, 0, 0, 1], of the programmable logic block (LB) 201. The first one of the four programmable logic cells (LC) 2014 may generate its data output C0 at a logic level of "1" based on its input data set, i.e., [A1, A0, A3, A2]=[1, 1, 1, 1]: the second one of the four programmable logic cells (LC) 2014 may generate its data output C1 at a logic level of "0" based on its input data set, i.e., [A1, A0, A3, A2]=[1, 1, 1, 1]: the third one of the four programmable logic cells (LC) 2014 may generate its data output C2 at a logic level of "0" based on its input data set, i.e., [A1, A0, A3, A2]=[1, 1, 1, 1]: the fourth one of the four programmable logic cells (LC) 2014 may generate its data output C3 at a logic level of "1" based on its input data set, i.e., [A1, A0, A3, A2]=[1, 1, 1, 1].

Alternatively: FIG. 6D is a block diagram illustrating a programmable logic block for a standard commodity FPGA IC chip in accordance with an embodiment of the present application. Referring to FIG. 6D, the programmable logic block (LB) 201 may include (1) one or more cells (A) 2011 for fixed-wired adders, having the number ranging from 1 to 16 for example, (2) one or more cells (C/R) 2013 for caches and registers, each having capacity ranging from 256 to 2048 bits for example, and (3) the programmable logic cells (LC) 2014 as illustrated in FIGS. 6A-6C having the number ranging from 64 to 2048 for example. The programmable logic block (LB) 201 may further include multiple intra-block interconnects 2015 each extending over spaces between neighboring two of its cells 2011, 2013 and 2014 arranged in an array therein. For the programmable logic block (LB) 201, its intra-block interconnects 2015 may be divided into programmable interconnects 361 configured to be programmed for interconnection by its memory cells 362 as seen in FIGS. 3A, 3B and 7 and fixed interconnects 364 as seen in FIGS. 6A and 7 configured not to be programmable for interconnection.

Referring to FIG. 6D, each of the programmable logic cells (LC) 2014 may have the memory cells 490, i.e., configuration-programming-memory (CPM) cells, having the number ranging from 4 to 256 for example, each configured to save or store one of the resulting values or programming codes of its look-up table 210 and the multiplexer (MUXER) 211 configured to select, in accordance with the first input data set of its multiplexer (MUXER) 211 having a bit-width ranging from 2 to 8 for example at its input points coupling to at least one of the programmable interconnects 361 and fixed interconnects 364 of the intra-block interconnects 2015, a data input from the second input data set of its multiplexer (MUXER) 211 having a bit-width ranging from 4 to 256 for example as its data output at its output point coupling to at least one of the programmable interconnects 361 and fixed interconnects 364 of the intra-block interconnects 2015.

Specification for Programmable Interconnect

Figure 7:
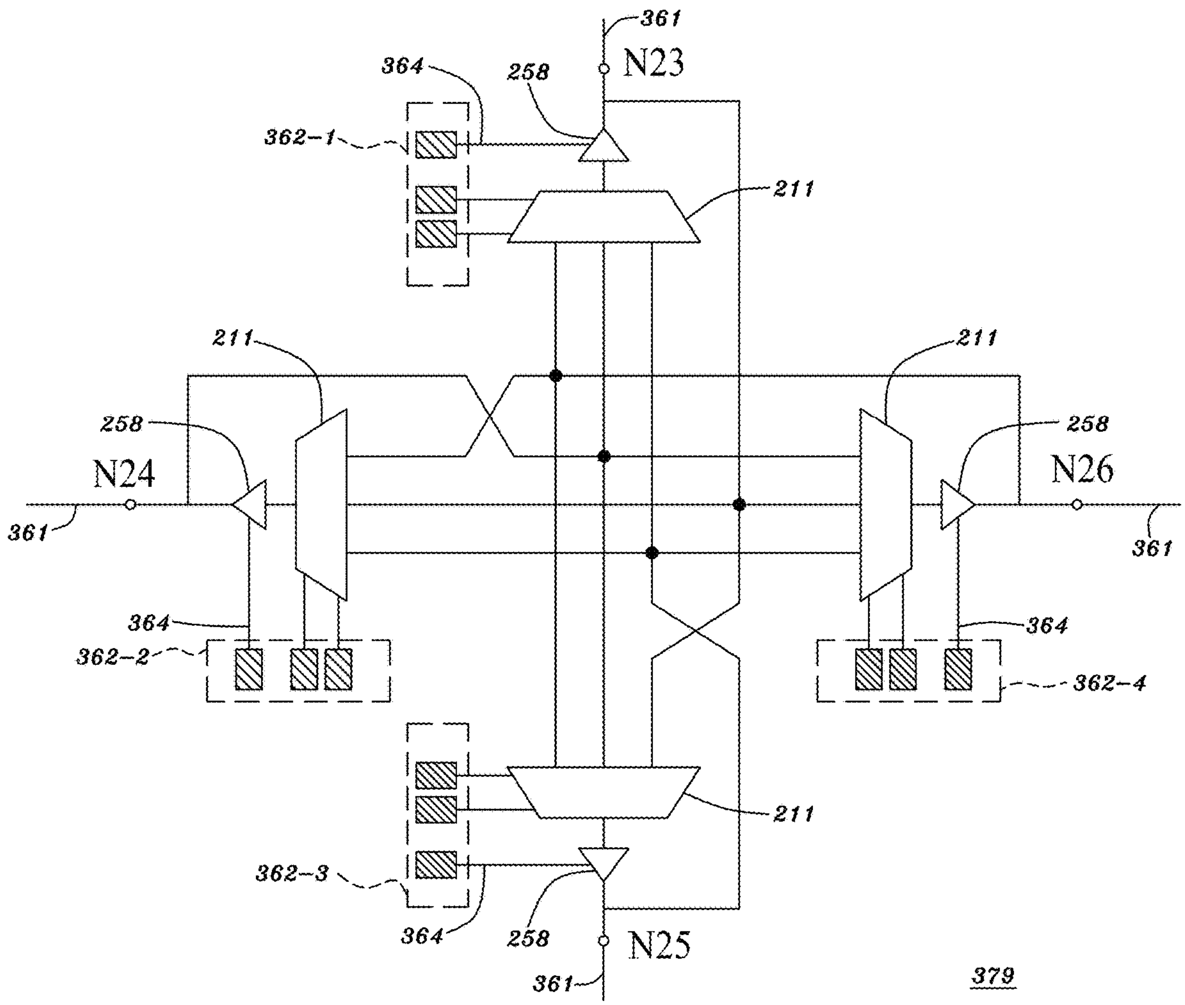
FIG. 7 is a circuit diagram illustrating programmable interconnects programmed by a third type of cross-point switch in accordance with an embodiment of the present application.

FIG. 7 is a circuit diagram illustrating programmable interconnects programmed by a third type of cross-point switch in accordance with an embodiment of the present application. Besides the first and second types of cross-point switches 379 as illustrated in FIGS. 3A and 3B, a third type of cross-point switch 379 may presented as seen in FIG. 7 to include the four multiplexers (MUXERs) 211 as seen in FIG. 4. Each of the four multiplexers (MUXERs) 211 may be configured to select, in accordance with its first input data set, e.g., A0 and A1, at its first set of input points, a data input from its second input data set, e.g., D0-D2, at its second set of input points as its data output. Each of the second set of three input points of one of the four multiplexers (MUXERs) 211 may couple to one of the second set of three input points of one of another two of the four multiplexers (MUXERs) 211 and to the output point of the other of the four multiplexers (MUXERs) 211. Thereby, each of the four multiplexers (MUXERs) 211 may select, in accordance with its first input data set, e.g., A0 and A1, a data input from its second input data set, e.g., D0-D2, at its second set of three input points coupling to three respective programmable interconnects 361 extending in three different directions and to the output points of the other respective three of the four multiplexers (MUXERs) 211 as its data output, e.g., Dout, at its output point at one of four nodes N23-N26 of the third type of cross-point switch 379 coupling to the other programmable interconnect 361 extending in a direction other than the three different directions. For example, the top one of the four multiplexers (MUXERs) 211 may select, in accordance with its first input data set, e.g., A0 and A1, a data input from its second input data set, e.g., D0-D2, at its second set of three input points at the nodes N24, N25 and N26 of the third type of cross-point switch 379 respectively, i.e., at the output points of the left, bottom and right ones of the four multiplexers 211 respectively, as its data output, e.g., Dout, at its output point at the node N23 of the third type of cross-point switch 379.

Referring to FIG. 7, the four programmable interconnects 361 may couple to the respective four nodes N23-N26 of the third type of cross-point switch 379. Thereby, data from one of the four programmable interconnects 361 may be switched by the third type of cross-point switch 379 to be passed to another one, two or three of the four programmable interconnects 361. For the third type of cross-point switch 379, each of its four multiplexers (MUXERs) 211, which may be referred to that as seen in FIG. 4, may have the data inputs, e.g., A0 and A1, of the first input data set each associated with a data output of one of its memory cells 362, i.e., configuration-programming-memory (CPM) cell, e.g., one of the first and second data outputs Out1 and Out2 of the memory cell 446 as illustrated in FIG. 1A or 1B.

Alternatively, referring to FIG. 7, the third type of cross-point switch 379 may further include four pass/no-pass switches or switch buffers 258 of the second type each having the input point coupling to the output point of one of the four multiplexers (MUXERs) 211 as seen in FIG. 4. For the third type of cross-point switch 379, each of its four pass/no-pass switch or switch buffer 258 is configured to be switched on or off in accordance with the data input SC-4 of said each of its four pass/no-pass switch or switch buffer 258 to pass or not to pass the data output, e.g., Dout, of one of its four multiplexers (MUXERs) 211 as its data output at its output point, i.e., at the node 23, 24, 25 or 26, coupling to one of the four programmable interconnects 361. For example, for the third type of cross-point switch 379, the top one of its four multiplexers (MUXERs) 211 may couple to the top one of its four pass/no-pass switch or switch buffers 258 configured to be switched on or off in accordance with the data input SC-4 of the top one of its four pass/no-pass switch or switch buffers 258 to pass or not to pass the data output, e.g., Dout, of the top one of its four multiplexers (MUXERs) 211 as the data output of the top one of its four pass/no-pass switch or switch buffers 258 at the output point of the top one of its four pass/no-pass switch or switch buffers 258, i.e., at the node 23, coupling to the top one of the four programmable interconnects 361. For the third type of cross-point switch 379, each of its four pass/no-pass switch or switch buffer 258 may have the data input SC-4 associated with a data output of another of its memory cells 362, i.e., configuration-programming-memory (CPM) cell, e.g., one of the first and second data outputs Out1 and Out2 of the memory cell 446 as illustrated in FIG. 1A or 1B.

Thereby: for the third type of cross-point switch 379, each of its memory cells 362, i.e., configuration-programming-memory (CPM) cell, is configured to be programmed to save or store a programming code to control data transmission between each of three of the four programmable interconnects 361 coupling respectively to the three input points of the second set of one of its four multiplexers (MUXERs) 211 and the other of the four programmable interconnects 361 coupling to the output point of said one of its four multiplexers (MUXERs) 211, that is, to pass or not to pass one of the data inputs, e.g., D0, D1 and D2, of the second input data set of said one of its four multiplexers (MUXERs) 211 at the respective three input points of the second set of said one of its four multiplexers (MUXERs) 211 coupling respectively to said three of the four programmable interconnects 361 as the data output, e.g., Dout, of said one of its four multiplexers (MUXERs) 211 at the output point of said one of its four multiplexers (MUXERs) 211 coupling to the other of the four programmable interconnects 361.

For example, referring to FIG. 7, for the third type of cross-point switch 379, the top one of its four multiplexers (MUXERs) 211 as seen in FIG. 4 may have the data inputs, e.g., A0 and A1, of the first input data set associated respectively with the data outputs, i.e., configuration-programming-memory (CPM) data, of two of its three memory cells 362-1, each of which may be referred to one of the data outputs Out1 and Out2 of the memory cell 446 as illustrated in FIG. 1A or 1B, and the top one of its four pass/no-pass switches or switch buffers 258 of the second type as seen in FIG. 4 may have the data input SC-4 associated with the data output, i.e., configuration-programming-memory (CPM) data, of the other of its three memory cells 362-1, which may be referred to one of the data outputs Out1 and Out2 of the memory cell 446 as illustrated in FIG. 1A or 1B; the left one of its four multiplexers (MUXERs) 211 as seen in FIG. 4 may have the data inputs, e.g., A0 and A1, of the first input data set associated respectively with the data outputs, i.e., configuration-programming-memory (CPM) data, of two of its three memory cells 362-2, each of which may be referred to one of the data outputs Out1 and Out2 of the memory cell 446 as illustrated in FIG. 1A or 1B, and the left one of its four pass/no-pass switches or switch buffers 258 of the second type as seen in FIG. 4 may have the data input SC-4 associated with the data output, i.e., configuration-programming-memory (CPM) data, of the other of its three memory cells 362-2, which may be referred to one of the data outputs Out1 and Out2 of the memory cell 446 as illustrated in FIG. 1A or 1B: the bottom one of its four multiplexers (MUXERs) 211 as seen in FIG. 4 may have the data inputs, e.g., A0 and A1, of the first input data set associated respectively with the data outputs, i.e., configuration-programming-memory (CPM) data, of two of its three memory cells 362-3, each of which may be referred to one of the data outputs Out1 and Out2 of the memory cell 446 as illustrated in FIG. 1A or 1B, and the bottom one of its four pass/no-pass switches or switch buffers 258 of the second type as seen in FIG. 4 may have the data input SC-4 associated with the data output, i.e., configuration-programming-memory (CPM) data, of the other of its three memory cells 362-3, which may be referred to one of the data outputs Out1 and Out2 of the memory cell 446 as illustrated in FIG. 1A or 1B: the right one of its four multiplexers (MUXERs) 211 as seen in FIG. 4 may have the data inputs, e.g., A0 and A1, of the first input data set associated the respectively with data outputs, i.e., configuration-programming-memory (CPM) data, of two of its three memory cells 362-4, each of which may be referred to one of the data outputs Out1 and Out2 of the memory cell 446 as illustrated in FIG. 1A or 1B, and the right one of its four pass/no-pass switches or switch buffers 258 of the second type as seen in FIG. 4 may have the data input SC-4 associated with the data output, i.e., configuration-programming-memory (CPM) data, of the other of its three memory cells 362-4, which may be referred to one of the data outputs Out1 and Out2 of the memory cell 446 as illustrated in FIG. 1A or 1B.

Referring to FIG. 7, for the third type of cross-point switch 379, before its memory cells 362-1, 362-2, 362-3 and 362-4, i.e., configuration-programming-memory (CPM) cells, are programmed or when its memory cells 362-1, 362-2, 362-3 and 362-4 are being programmed, the four programmable interconnects 361 may not be used for signal transmission. Its memory cells 362-1, 362-2, 362-3 and 362-4, i.e., configuration-programming-memory (CPM) cells, may be programmed to save or store programming codes, i.e., configuration-programming-memory (CPM) data, to pass data from one of the four programmable interconnects 361 to another, another two or the other three of the four programmable interconnects 361, that is, from one of the nodes N23-N26 to another, another two or the other three of the nodes N23-N26, for signal transmission in operation.

Alternatively, two programmable interconnects 361 may be controlled, by either of the first through third types of pass/no-pass switch 258 as seen in FIGS. 2A-2C, to pass or not to pass data therebetween. One of the programmable interconnects 361 may couple to the node N21 of the pass/no-pass switch 258, and another of the programmable interconnects 361 may couple to the node N22 of the pass/no-pass switch 258. Accordingly, either of the first through third types of pass/no-pass switch 258 may be switched on to pass data from said one of the programmable interconnects 361 to said another of the programmable interconnects 361; either of the first through third types of pass/no-pass switch 258 may be switched off not to pass data from said one of the programmable interconnects 361 to said another of the programmable interconnects 361.

Referring to FIG. 2A, the first type of pass/no-pass switch 258 may have the data input SC-3 associated via a fixed interconnect 364 with a data output, i.e., configuration-programming-memory (CPM) data, of a memory cell 362, i.e., configuration-programming-memory (CPM) cell, which may be referred to one of the data outputs Out1 and Out2 of the memory cell 446 as illustrated in FIG. 1A or 1B. Thereby, the memory cell 362 may be programmed to save or store a programming code to switch on or off the first type of pass/no-pass switch 258 to control data transmission between said one of the programmable interconnects 361 and said another of the programmable interconnects 361, that is, to pass or not to pass data from the node N21 of the first type of pass/no-pass switch 258 to the node N22 of the first type of pass/no-pass switch 258 or from the node N22 of the first type of pass/no-pass switch 258 to the node N21 of the first type of pass/no-pass switch 258.

Referring to FIG. 2B, the second type of pass/no-pass switch 258 may have the data input SC-4 associated via a fixed interconnect 364 with a data output, i.e., configuration-programming-memory (CPM) data, of a memory cell 362, i.e., configuration-programming-memory (CPM) cell, which may be referred to one of the data outputs Out1 and Out2 of the memory cell 446 as illustrated in FIG. 1A or 1B. Thereby: the memory cell 362 may be programmed to save or store a programming code to switch on or off the second type of pass/no-pass switch 258 to control data transmission between said one of the programmable interconnects 361 and said another of the programmable interconnects 361, that is, to pass or not to pass data from the node N21 of the second type of pass/no-pass switch 258 to the node N22 of the second type of pass/no-pass switch 258.

Referring to FIG. 2C, the third type of pass/no-pass switch 258 may have the data inputs SC-5 and SC-6 each associated via a fixed interconnect 364 with a data output, i.e., configuration-programming-memory (CPM) data, of a memory cell 362, i.e., configuration-programming-memory (CPM) cell, which may be referred to one of the data outputs Out1 and Out2 of the memory cell 446 as illustrated in FIG. 1A or 1B. Thereby: each of the memory cells 362 may be programmed to save or store a programming code to switch on or off the third type of pass/no-pass switch 258 to control data transmission between said one of the programmable interconnects 361 and said another of the programmable interconnects 361, that is, to pass or not to pass data from the node N21 of the third type of pass/no-pass switch 258 to the node N22 of the third type of pass/no-pass switch 258 or from the node N22 of the third type of pass/no-pass switch 258 to the node N21 of the third type of pass/no-pass switch 258.

Similarly, each of the first and second types of cross-point switches 379 as seen in FIGS. 3A and 3B may be composed of a plurality of pass/no-pass switches 258 of the first, second or third type, wherein each of the first, second or third type of pass/no-pass switches 258 may have the data input(s) SC-3. SC-4 or (SC-5 and SC-6) each associated with a data output, i.e., configuration-programming-memory (CPM) data, of a memory cell 362, i.e., configuration-programming-memory (CPM) cell, as mentioned above. Each of the memory cells 362 may be programmed to save or store a programming code to switch said each of the first and second types of cross-point switches 379 to pass data from one of the nodes N23-N26 of said each of the first and second types of cross-point switches 379 to another, another two or another three of the nodes N23-N26 of said each of the first and second types of cross-point switches 379 for signal transmission in operation. Four of the programmable interconnects 361 may couple respectively to the nodes N23-N26 of said each of the first and second types of cross-point switches 379 and thus may be controlled, by said each of the first and second types of cross-point switches 379, to pass data from one of said four of the programmable interconnects 361 to another one, two or three of said four of the programmable interconnects 361.

Figure 8A:
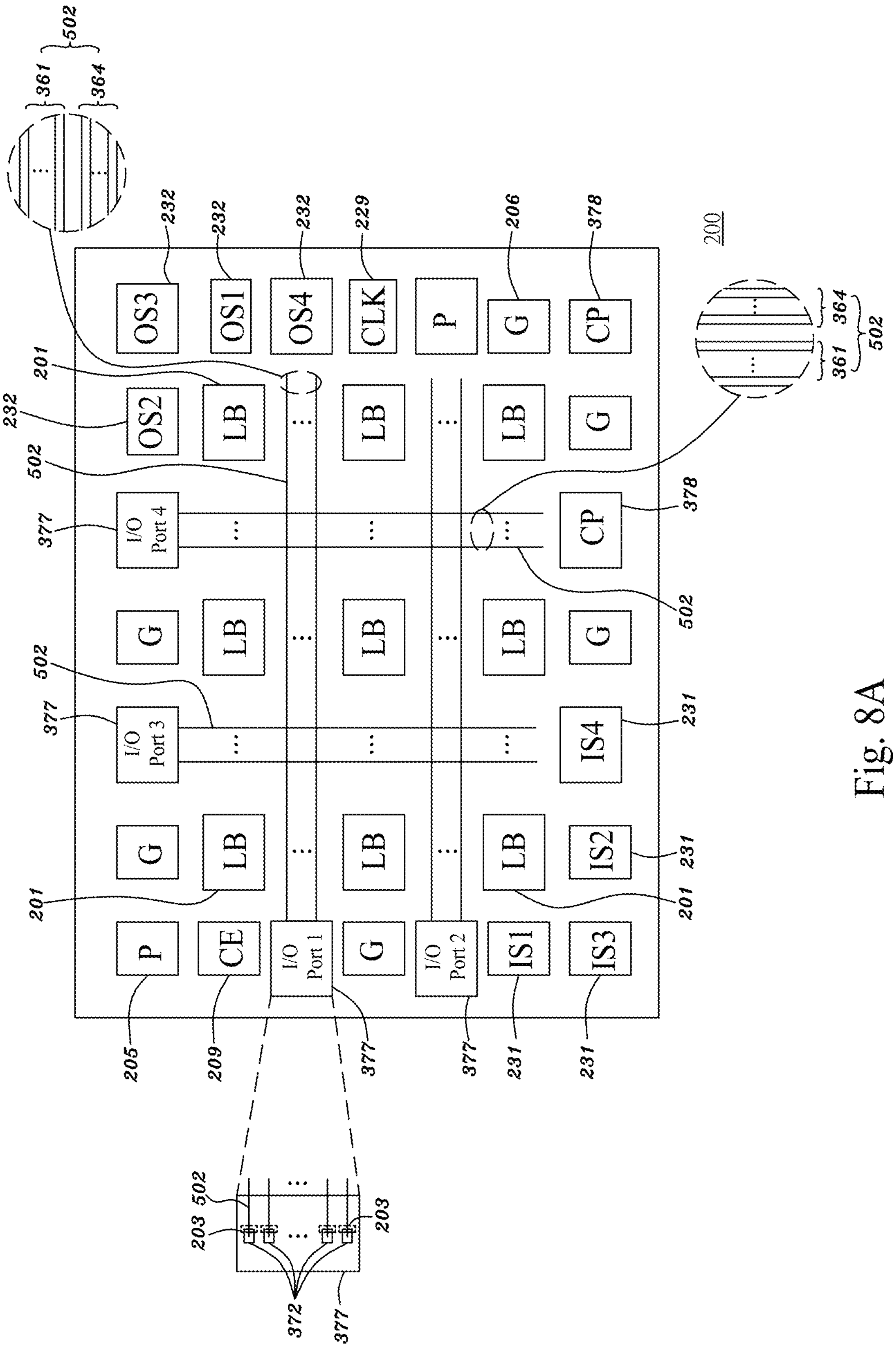
FIG. 8A is a schematically top view showing a block diagram of a standard commodity FPGA IC chip in accordance with an embodiment of the present application.

Specification for Standard Commodity Field-Programmable-Gate-Array (FPGA) Integrated-Circuit (IC) Chip FIG. 8A is a schematically top view showing a block diagram of a standard commodity FPGA IC chip in accordance with an embodiment of the present application. Referring to FIG. 8A, the standard commodity FPGA IC chip 200 may include (1) a plurality of programmable logic blocks (LB) 201 as illustrated in FIGS. 6A-6D arranged in an array in a central region thereof. (2) a plurality of cross-point switches 379 as illustrated in FIGS. 3A, 3B and 7 arranged around each of the programmable logic blocks (LB) 201. (3) a plurality of memory cells 362 as illustrated in FIGS. 3A, 3B and 7 configured to be programmed to control its cross-point switches 379. (4) a plurality of intra-chip interconnects 502 each extending over spaces between neighboring two of the programmable logic blocks (LB) 201, wherein the intra-chip interconnects 502 may include the programmable interconnects 361 as seen in FIGS. 3A, 3B and 7 configured to be programmed for interconnection by its memory cells 362 and the fixed or non-programmable interconnects 364 for programing its memory cells 362 and 490, and (5) a plurality of small input/output (I/O) circuits 203 as illustrated in FIG. 5B each providing the small driver 374 with the second data input S_Data_out at the second input point of the small driver 374 configured to couple to its programmable interconnects 361 or fixed interconnects 364 and providing the small receiver 375 with the data output S_Data_in at the output point of the small receiver 375 configured to couple to its programmable interconnects 361 or fixed interconnects 364.

Referring to FIG. 8A, the programmable interconnects 361 of the intra-chip interconnects 502 may couple to the programmable interconnects 361 of the intra-block interconnects 2015 of each of the programmable logic blocks (LB) 201 as seen in FIG. 6D. The fixed interconnects 364 of the intra-chip interconnects 502 may couple to the fixed interconnects 364 of the intra-block interconnects 2015 of each of the programmable logic blocks (LB) 201 as seen in FIG. 6D.

Referring to FIG. 8A, each of the programmable logic blocks (LB) 201 may include one or more programmable logic cells (LC) 2014 as illustrated in FIGS. 6A-6D. Each of the one or more programmable logic cells (LC) 2014 may have the input data set at its input points each coupling to one of the programmable and fixed interconnects 361 and 364 of the intra-chip interconnects 502 and may be configured to perform logic operation or computation operation on its input data set into its data output coupling to another of the programmable and fixed interconnects 361 and 364 of the intra-chip interconnects 502, wherein the computation operation may include an addition, subtraction, multiplication or division operation, and the logic operation may include a Boolean operation such as AND. NAND. OR or NOR operation.

Referring to FIG. 8A, the standard commodity FPGA IC chip 200 may include multiple I/O pads 372 as seen in FIG. 5B each vertically over one of its small input/output (I/O) circuits 203. For example, in a first clock cycle, for one of the small input/output (I/O) circuits 203 of the standard commodity FPGA IC chip 200, its small driver 374 may be enabled by the first data input S_Enable of its small driver 374 and its small receiver 375 may be inhibited by the first data input S_Inhibit of its small receiver 375. Thereby, its small driver 374 may amplify the second data input S_Data_out of its small driver 374, associated with the data output of one of the programmable logic cells (LC) 2014 of the standard commodity FPGA IC chip 200 as illustrated in FIGS. 6A-6D through first one or more of the programmable interconnects 361 of the standard commodity FPGA IC chip 200 and/or one or more of the cross-point switches 379 of the standard commodity FPGA IC chip 200 each coupled between two of said first one or more of the programmable interconnects 361, as the data output of its small driver 374 to be transmitted to one of the I/O pads 372 vertically over said one of the small input/output (I/O) circuits 203 for external connection to circuits outside the standard commodity FPGA IC chip 200, such as non-volatile memory (NVM) integrated-circuit (IC) chip.

In a second clock cycle, for said one of the small input/output (I/O) circuits 203 of the standard commodity FPGA IC chip 200, its small driver 374 may be disabled by the first data input S_Enable of its small driver 374 and its small receiver 375 may be activated by the first data input S_Inhibit of its small receiver 375. Thereby: its small receiver 375 may amplify the second data input of its small receiver 375 transmitted from circuits outside the standard commodity FPGA IC chip 200 through said one of the I/O pads 372 as the data output S_Data_in of its small receiver 375 to be associated with a data input of the input data set of one of the programmable logic cells (LC) 2014 of the standard commodity FPGA IC chip 200 as illustrated in FIGS. 6A-6D through second one or more of the programmable interconnects 361 of the standard commodity FPGA IC chip 200 and/or one or more of the cross-point switches 379 of the standard commodity FPGA IC chip 200 each coupled between two of said second one or more of the programmable interconnects 361.

Referring to FIG. 8A, the standard commodity FPGA IC chip 200 may include multiple I/O ports 377 having the number ranging from 2 to 64 for example, such as I/O Port 1, I/O Port 2, I/O Port 3 and I/O Port 4 for this case. Each of the I/O ports 377 may include (1) the small I/O circuits 203 as seen in FIG. 5B having the number ranging from 4 to 256, such as 64 for this case, arranged in parallel for data transmission with bit width ranging from 4 to 256, such as 64 for this case, and (2) the I/O pads 372 as seen in FIG. 5B having the number ranging from 4 to 256, such as 64 for this case, arranged in parallel and vertically over the small I/O circuits 203 respectively.

Referring to FIG. 8A, the standard commodity FPGA IC chip 200 may further include a chip-enable (CE) pad 209 configured for enabling or disabling the standard commodity FPGA IC chip 200. For example, when the chip-enable (CE) pad 209 is at a logic level of "0", the standard commodity FPGA IC chip 200 may be enabled to process data and/or operate with circuits outside of the standard commodity FPGA IC chip 200: when the chip-enable (CE) pad 209 is at a logic level of "1", the standard commodity FPGA IC chip 200 may be disabled not to process data and/or operate with circuits outside of the standard commodity FPGA IC chip 200.

Referring to FIG. 8A, the standard commodity FPGA IC chip 200 may include multiple input selection (IS) pads 231, e.g., IS1, IS2, IS3 and IS4 pads, each configured to receive data to be associated with the first data input S_Inhibit of the small receiver 375 of each of the small I/O circuits 203 of one of its I/O ports 377, e.g., I/O Port 1, I/O Port 2, I/O Port 3 and I/O Port 4. For more elaboration, the IS1 pad 231 may receive data to be associated with the first data input S_Inhibit of the small receiver 375 of each of the small I/O circuits 203 of I/O Port 1; the IS2 pad 231 may receive data to be associated with the first data input S_Inhibit of the small receiver 375 of each of the small I/O circuits 203 of I/O Port 2: the IS3 pad 231 may receive data to be associated with the first data input S_Inhibit of the small receiver 375 of each of the small I/O circuits 203 of I/O Port 3; and the IS4 pad 231 may receive data to be associated with the first data input S_Inhibit of the small receiver 375 of each of the small I/O circuits 203 of I/O Port 4. The standard commodity FPGA IC chip 200 may select, in accordance with logic levels at the input selection (IS) pads 231, e.g., IS1, IS2, IS3 and IS4 pads, one or more from its I/O ports 377, e.g., I/O Port 1, I/O Port 2, I/O Port 3 and I/O Port 4 to pass data for its input operation. For each of the small I/O circuits 203 of one or more of the I/O ports 377 selected in accordance with the logic levels at the input selection (IS) pads 231, its small receiver 375 may be activated by the first data input S_Inhibit of its small receiver 375 associated with the logic level at one or more of the input selection (IS) pads 231 to amplify or pass the second data input of its small receiver 375, transmitted from circuits outside the standard commodity FPGA IC chip 200 through one of the I/O pads 372 of said one of the I/O ports 377 selected in accordance with the logic level at said one or more of the input selection (IS) pads 231, as the data output S_Data_in of its small receiver 375 to be associated with a data input of the input data set of one of the programmable logic cells (LC) 2014 as seen in FIGS. 6A-6D of the standard commodity FPGA IC chip 200 through one or more of the programmable interconnects 361 as seen in FIGS. 3A, 3B and 7 of the standard commodity FPGA IC chip 200, for example. For each of the small I/O circuits 203 of the other one or more of the I/O ports 377, not selected in accordance with the logic levels at the input selection (IS) pads 231, of the standard commodity FPGA IC chip 200, its small receiver 375 may be inhibited by the first data input S_Inhibit of its small receiver 375 associated with the logic level at the other one or more of the input selection (IS) pads 231.

For example, referring to FIG. 8A, provided that the standard commodity FPGA IC chip 200 may have (1) the chip-enable (CE) pad 209 at a logic level of "0", (2) the IS1 pad 231 at a logic level of "I", (3) the IS2 pad 231 at a logic level of "0", (4) the IS3 pad 231 at a logic level of "0" and (5) the IS4 pad 231 at a logic level of "0", the standard commodity FPGA IC chip 200 may be enabled in accordance with the logic level at its chip-enable (CE) pad 209 and may select, in accordance with the logic levels at its IS1, IS2, IS3 and IS4 pads 231, one or more I/O port, i.e., I/O Port 1, from its I/O ports 377, i.e., I/O Port 1, I/O Port 2, I/O Port 3 and I/O Port 4, to pass data for the input operation. For each of the small I/O circuits 203 of the selected I/O port 377, i.e., I/O Port 1, of the standard commodity FPGA IC chip 200, its small receiver 375 may be activated by the first data input S_Inhibit of its small receiver 375 associated with the logic level at the IS1 pad 231 of the standard commodity FPGA IC chip 200. For each of the small I/O circuits 203 of the unselected I/O ports, i.e., I/O Port 2, I/O Port 3 and I/O Port 4, of the standard commodity FPGA IC chip 200, its small receiver 375 may be inhibited by the first data input S_Inhibit of its small receiver 375 associated respectively with the logic levels at the IS2, IS3 and IS4 pads 231 of the standard commodity FPGA IC chip 200.

For example, referring to FIG. 8A, provided that the standard commodity FPGA IC chip 200 may have (1) the chip-enable (CE) pad 209 at a logic level of "0", (2) the IS1 pad 231 at a logic level of "1", (3) the IS2 pad 231 at a logic level of "1", (4) the IS3 pad 231 at a logic level of "1" and (5) the IS4 pad 231 at a logic level of "1", the standard commodity FPGA IC chip 200 may be enabled in accordance with the logic level at its chip-enable (CE) pad 209 and may select, in accordance with the logic levels at its IS1, IS2, IS3 and IS4 pads 231, all from its I/O ports 377, i.e., I/O Port 1, I/O Port 2, I/O Port 3 and I/O Port 4, to pass data for the input operation at the same clock cycle. For each of the small I/O circuits 203 of the selected I/O ports 377, i.e., I/O Port 1, I/O Port 2, I/O Port 3 and I/O Port 4, of the standard commodity FPGA IC chip 200, its small receiver 375 may be activated by the first data input S_Inhibit of its small receiver 375 associated respectively with the logic levels at the IS1, IS2, IS3 and IS4 pads 231 of the standard commodity FPGA IC chip 200.

Referring to FIG. 8A, the standard commodity FPGA IC chip 200 may include multiple output selection (OS) pads 232, e.g., OS1, OS2, OS3 and OS4 pads, each configured to receive data to be associated with the first data input S_Enable of the small driver 374 of each of the small I/O circuits 203 of one of its I/O ports 377, e.g., I/O Port 1, I/O Port 2, I/O Port 3 and I/O Port 4. For more elaboration, the OS1 pad 232 may receive data to be associated with the first data input S_Enable of the small driver 374 of each of the small I/O circuits 203 of I/O Port 1: the OS2 pad 232 may receive data to be associated with the first data input S_Enable of the small driver 374 of each of the small I/O circuits 203 of I/O Port 2: the OS3 pad 232 may receive data to be associated with the first data input S_Enable of the small driver 374 of each of the small I/O circuits 203 of I/O Port 3: the OS4 pad 232 may receive data to be associated with the first data input S_Enable of the small driver 374 of each of the small I/O circuits 203 of I/O Port 4. The standard commodity FPGA IC chip 200 may select, in accordance with logic levels at the output selection (OS) pads 232, e.g., OS1, OS2, OS3 and OS4 pads, one or more from its I/O ports 377, e.g., I/O Port 1, I/O Port 2, I/O Port 3 and I/O Port 4 to pass data for its output operation. For each of the small I/O circuits 203 of each of the one or more I/O ports 377 selected in accordance with the logic levels at the output selection (OS) pads 232, its small driver 374 may be enabled by the first data input S_Enable of its small driver 374 associated with the logic level at one of the output selection (OS) pads 232 to amplify or pass the second data input S_Data_out of its small driver 374, associated with the data output of one of the programmable logic cells (LC) 2014 as seen in FIGS. 6A-6D of the standard commodity FPGA IC chip 200 through one or more of the programmable interconnects 361 as seen in FIGS. 3A, 3B and 7 of the standard commodity FPGA IC chip 200, into the data output of its small driver 374 to be transmitted to circuits outside the standard commodity FPGA IC chip 200 through one of the I/O pads 372 of said each of the one or more I/O ports 377, for example. For each of the small I/O circuits 203 of each of the I/O ports 377, not selected in accordance with in accordance with the logic levels at the output selection (OS) pads 232, of the standard commodity FPGA IC chip 200, its small driver 374 may be disabled by the first data input S_Enable of its small driver 374 associated with the logic level at one of the output selection (OS) pads 232.

For example, referring to FIG. 8A, provided that the standard commodity FPGA IC chip 200 may have (1) the chip-enable (CE) pad 209 at a logic level of "0", (2) the OS1 pad 232 at a logic level of "0", (3) the OS2 pad 232 at a logic level of "1", (4) the OS3 pad 232 at a logic level of "1" and (5) the OS4 pad 232 at a logic level of "1", the standard commodity FPGA IC chip 200 may be enabled in accordance with the logic level at its chip-enable (CE) pad 209 and may select, in accordance with the logic levels at its OS1, OS2, OS3 and OS4 pads 232, one or more I/O port, i.e., I/O Port 1, from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, of the standard commodity FPGA IC chip 200, its small driver 374 may be enabled by the first data input S_Enable of its small driver 374 associated with the logic level at the OS1 pad 232 of the standard commodity FPGA IC chip 200. For each of the small I/O circuits 203 of the unselected I/O ports, i.e., I/O Port 2, I/O Port 3 and I/O Port 4, of the standard commodity FPGA IC chip 200, its small driver 374 may be disabled by the first data input S_Enable of its small driver 374 associated respectively with the logic levels at the OS2, OS3 and OS4 pads 232 of the standard commodity FPGA IC chip 200.

For example, referring to FIG. 8A, provided that the standard commodity FPGA IC chip 200 may have (1) the chip-enable (CE) pad 209 at a logic level of "0", (2) the OS1 pad 232 at a logic level of "0", (3) the OS2 pad 232 at a logic level of "0", (4) the OS3 pad 232 at a logic level of "0" and (5) the OS4 pad 232 at a logic level of "0", the standard commodity FPGA IC chip 200 may be enabled in accordance with the logic level at its chip-enable (CE) pad 209 and may select, in accordance with the logic levels at its OS1, OS2, OS3 and OS4 pads 232, all from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1. I/O Port 2, I/O Port 3 and I/O Port 4, of the standard commodity FPGA IC chip 200, its small driver 374 may be enabled by the first data input S_Enable of its small driver 374 associated respectively with the logic levels at the OS1, OS2, OS3 and OS4 pads 232 of the standard commodity FPGA IC chip 200.

Thereby, referring to FIG. 8A, in a clock cycle, one or more of the I/O ports 377, e.g., I/O Port 1. I/O Port 2, I/O Port 3 and I/O Port 4, may be selected, in accordance with the logic levels at the IS1, IS2, IS3 and IS4 pads 231, to pass data for the input operation, while another one or more of the I/O ports 377, e.g., I/O Port 1, I/O Port 2, I/O Port 3 and I/O Port 4, may be selected, in accordance with the logic levels at the OS1, OS2, OS3 and OS4 pads 232, to pass data for the output operation. The input selection (IS) pads 231 and output selection (OS) pads 232 may be provided as I/O-port selection pads.

Referring to FIG. 8A, the standard commodity FPGA IC chip 200 may further include (1) multiple power pads 205 configured for applying the voltage Vcc of power supply to its memory cells 490 for the look-up tables (LUT) 210 of its programmable logic cells (LC) 2014 as illustrated in FIGS. 6A-6D, the multiplexers (MUXERs) 211 of its programmable logic cells (LC) 2014, its memory cells 362 for its cross-point switches 379 as illustrated in FIGS. 3A, 3B and 7, its cross-point switches 379 and/or the small drivers 374 and receivers 375 of its small I/O circuits 203 as seen in FIG. 5B through one or more of its fixed interconnects 364, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 configured for providing the voltage Vss of ground reference to its memory cells 490 for the look-up tables (LUT) 210 of its programmable logic cells (LC) 2014 as illustrated in FIGS. 6A-6D, the multiplexers (MUXERs) 211 of its programmable logic cells (LC) 2014, its memory cells 362 for its cross-point switches 379 as illustrated in FIGS. 3A, 3B and 7, its cross-point switches 379 and/or the small drivers 374 and receivers 375 of its small I/O circuits 203 as seen in FIG. 5B through one or more of its fixed interconnects 364.

Referring to FIG. 8A, the standard commodity FPGA IC chip 200 may further include a clock pad (CLK) 229 configured to receive a clock signal from circuits outside of the standard commodity FPGA IC chip 200 and multiple control pads (CP) 378 configured to receive control commands to control the standard commodity FPGA IC chip 200.

Referring to FIG. 8A, for the standard commodity FPGA IC chip 200, its programmable logic cells (LC) 2014 as seen in FIGS. 6A-6D may be reconfigurable for artificial-intelligence (AI) application. For example, in a clock cycle, one of the programmable logic cells (LC) 2014 of the standard commodity FPGA IC chip 200 may have its memory cells 490 to be programmed to perform OR operation: however, after one or more events happen, in another clock cycle said one of its programmable logic cells (LC) 2014 of the standard commodity FPGA IC chip 200 may have its memory cells 490 to be programmed to perform NAND operation for better AI performance.

Figure 8B:
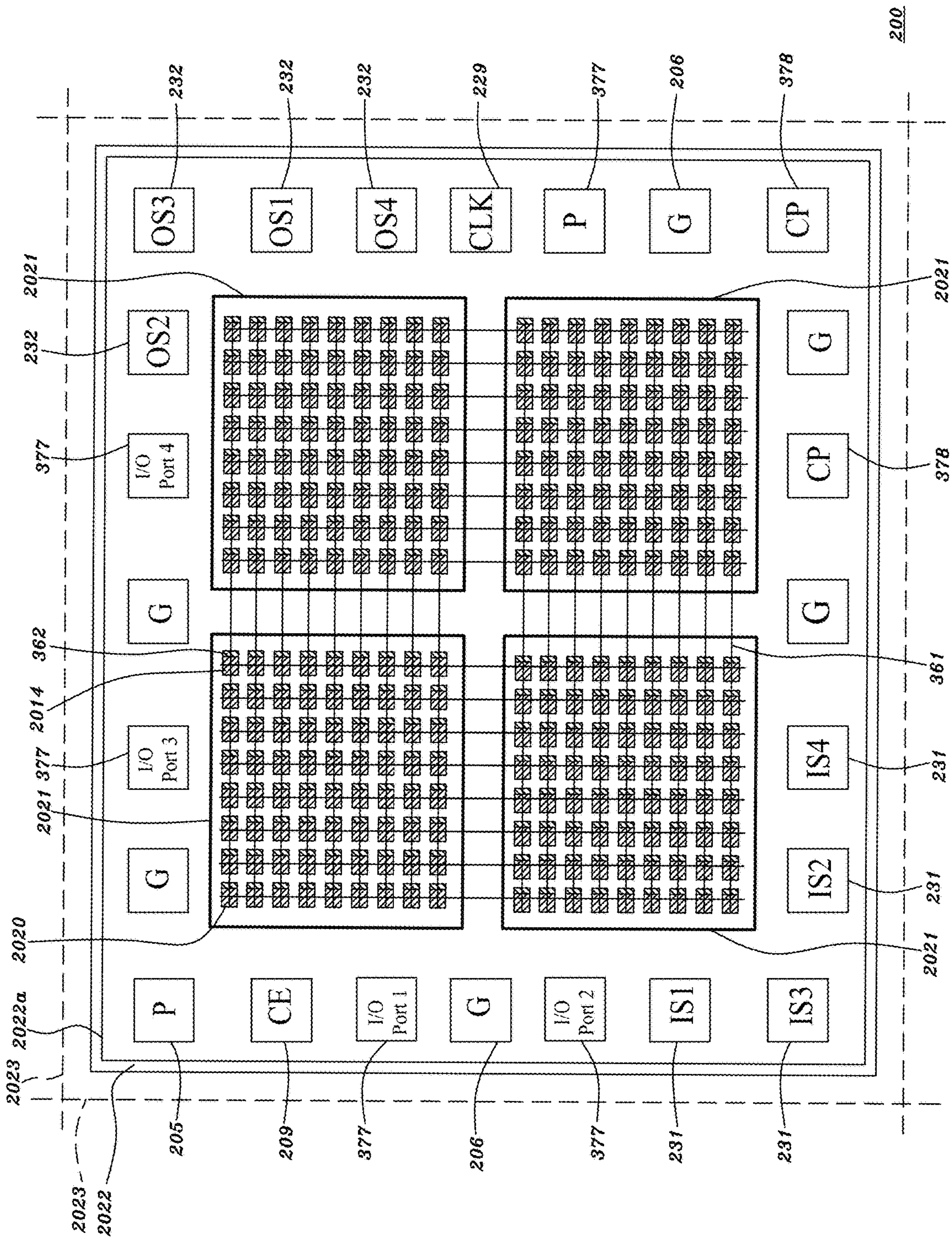
FIG. 8B is a top view showing a layout of a standard commodity FPGA IC chip in accordance with an embodiment of the present application.

FIG. 8B is a top view showing a layout of a standard commodity FPGA IC chip in accordance with an embodiment of the present application. Referring to FIG. 8B, the standard commodity FPGA IC chip 200 may include multiple repetitive circuit arrays 2021 arranged in an array therein, and each of the repetitive circuit arrays 2021 may include multiple repetitive circuit units 2020 arranged in an array therein. Each of the repetitive circuit units 2020 may include a programmable logic cell (LC) 2014 as illustrated in FIG. 6A, and/or the memory cells 362 for the programmable interconnection as illustrated in FIGS. 2A-2C. 3A, 3B and 7. The programmable logic cells (LC) 2014 may be programmed or configured as functions of, for example, digital-signal processor (DSP), microcontroller, adders, and/or multipliers. For the standard commodity FPGA IC chip 200, its programmable interconnects 361 may couple neighboring two of its repetitive circuit units 2020 and the repetitive circuit units 2020 in neighboring two of its repetitive circuit units 2020. The standard commodity FPGA IC chip 200 may include a seal ring 2022 at its four edges, enclosing its repetitive circuit arrays 2021, its I/O ports 277 and its various circuits as illustrated in FIG. 8A, and a scribe line, kerf or die-saw area 2023 at its border and outside and around the seal ring 2022. For example, for the standard commodity FPGA IC chip 200, greater than 85%, 90%, 95% or 99% area (not counting its seal ring 2022 and scribe line 2023, that is, only including an area within an inner boundary 2022*a* of its seal ring 2022) is used for its repetitive circuit arrays 2021: alternatively, all or most of its transistors are used for its repetitive circuit arrays 2021. Alternatively, for the standard commodity FPGA IC chip 200, none or minimal area may be provided for its control circuits. I/O circuits or hard macros, for example, less than 15%, 10%, 5%, 2% or 1% of its area (not counting its seal ring 2022 and scribe line 2023, that is, only including an area within an inner boundary 2022*a* of its seal ring 2022) is used for its control circuits. I/O circuits or hard macros: alternatively, none or minimal transistors may be provided for its control circuits. I/O circuits or hard macros, for example, less than 15%, 10%, 5%, 2% or 1% of the total number of its transistors are used for its control circuits. I/O circuits or hard macros.

The standard commodity plural FPGA IC chip 200 may have standard common features, counts or specifications: (1) its regular repetitive logic array may have the number of programmable logic arrays or sections equal to or greater than 2, 4, 8, 10 or 16, wherein its regular repetitive logic array may include programmable logic blocks or elements 201 as illustrated in FIGS. 6A-6D with the count equal to or greater than 128K, 512K, 1M, 4M, 8M, 16M, 32M or 80M: (2) its regular memory array may have the number of memory banks equal to or greater than 2, 4, 8, 10 or 16, wherein its regular memory array may include memory cells with the bit count equal to or greater than 1M, 10M, 50M, 100M, 200M or 500M bits: (3) the number of data inputs to each of its programmable logic blocks or elements 201 may be greater than or equal to 4, 8, 16, 32, 64, 128 or 256: (4) its applied voltage may be between 0.1V and 1.5V, between 0.1V and 1.0V, between 0.1V and 0.7V, or between 0.1V and 0.5V; and (4) its I/O pads 372 as seen in FIG. 8A may be arranged in terms of layout, location, number and function.

Figure 9:
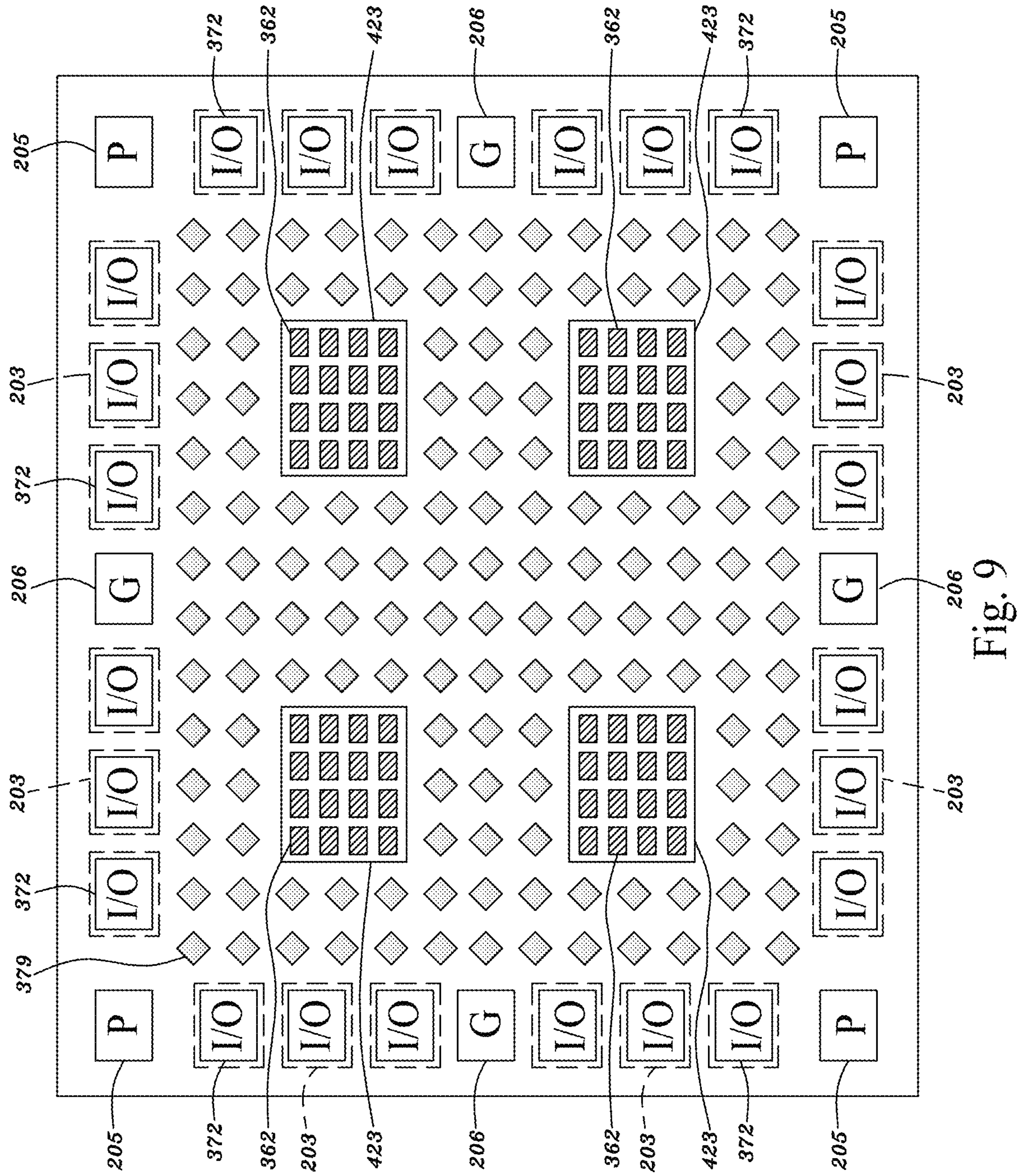
FIG. 9 is a schematically top view showing a block diagram of a dedicated programmable interconnection (DPI) integrated-circuit (IC) chip in accordance with an embodiment of the present application.

Specification for Dedicated Programmable Interconnection (DPI) Integrated-Circuit (IC) Chip FIG. 9 is a schematically top view showing a block diagram of a dedicated programmable interconnection (DPI) integrated-circuit (IC) chip in accordance with an embodiment of the present application.

Referring to FIG. 9, the DPIIC chip 410 may include (1) a plurality of memory-array blocks 423 arranged in an array in a central region thereof, wherein each of the memory-array blocks 423 may include a plurality of memory cells 362 as illustrated in FIGS. 3A, 3B and 7 arranged in an array. (2) a plurality of groups of cross-point switches 379 as illustrated in FIGS. 3A, 3B and 7, each group of which is arranged in one or more rings around one of the memory-array blocks 423, wherein each of its memory cells 362 in one of its memory-array blocks 423 is configured to be programmed to control its cross-point switches 379 around said one of its memory-array blocks 423. (4) a plurality of intra-chip interconnects including the programmable interconnects 361 as seen in FIGS. 3A, 3B and 7 configured to be programmed for interconnection by its memory cells 362 and multiple fixed or non-programmable interconnects for programing its memory cells 362, and (6) a plurality of small input/output (I/O) circuits 203 as illustrated in FIG. 5B each providing the small receiver 375 with the data output S_Data_in associated with a data input at one of the nodes N23-N26 of one of its cross-point switches 379 as illustrated in FIGS. 3A, 3B and 8 through one or more of its programmable interconnects 361 and providing the small driver 374 with the data input S_Data_out associated with a data output at one of the nodes N23-N26 of another of its cross-point switches 379 as illustrated in FIGS. 3A, 3B and 8 through another one or more of its programmable interconnects 361.

Referring to FIG. 9, each of the memory cells 362 may be referred to a memory cell 446 as illustrated in FIGS. 1A and 1B. The DPIIC chip 410 may provide the first type of pass/no-pass switches 258 for its first or second type of cross-point switches 379 as illustrated in FIGS. 3A and 3B close to one of its memory-array blocks 423, each of which may have the data input SC-3 as seen in FIG. 2A associated with a data output, i.e., configuration-programming-memory (CPM) data, of one of its memory cells 362, i.e., configuration-programming-memory (CPM) cells, in said one of its memory-array blocks 423, which may be referred to one of the data outputs Out1 and Out2 of the memory cell 446 as illustrated in FIGS. 1A and 1B. Alternatively, the DPIIC chip 410 may provide the third type of pass/no-pass switches 258 for its first or second type of cross-point switches 379 as illustrated in FIGS. 3A and 3B close to one of the memory-array blocks 423, each of which may have the data inputs SC-5 and SC-6 as seen in FIG. 2C each associated with a data output, i.e., configuration-programming-memory (CPM) data, of one of its memory cells 362, i.e., configuration-programming-memory (CPM) cells, in said one of its memory-array blocks 423, which may be referred to one of the data outputs Out1 and Out2 of the memory cell 446 as illustrated in FIGS. 1A and 1B. Alternatively, the DPIIC chip 410 may provide the multiplexers 211 for its third type of cross-point switches 379 as illustrated in FIG. 7 close to one of the memory-array blocks 423, each of which may have the first set of input points for multiple data inputs of the first input data set of said each of its multiplexers 211 each associated with a data output, i.e., configuration-programming-memory (CPM) data, of one of its memory cells 362, i.e., configuration-programming-memory (CPM) cells, in said one of its memory-array blocks 423, which may be referred to one of the data outputs Out1 and Out2 of the memory cell 446 as illustrated in FIGS. 1A and 1B.

Referring to FIG. 9, the DPIIC chip 410 may include multiple intra-chip interconnects (not shown) each extending over spaces between neighboring two of the memory-array blocks 423, wherein said each of the intra-chip interconnects may be the programmable interconnect 361, coupling to one of the nodes N23-N26 of one of its cross-point switches 379 as illustrated in FIGS. 3A, 3B and 7. For the DPIIC chip 410, each of its small input/output (I/O) circuits 203, as illustrated in FIGS. 5B, may provide the small receiver 375 with the data output S_Data_in to be passed through one or more of its programmable interconnects 361 and the first data input S_Inhibit passed through another one or more of its programmable interconnects 361 and provide the small driver 374 with the first data input S_Enable passed through another one or more of its programmable interconnects 361 and the second data input S_Data_out passed through another one or more of its programmable interconnects.

Referring to FIG. 9, the DPIIC chip 410 may include multiple of the I/O pads 372 as seen in FIG. 5B, each vertically over one of its small input/output (I/O) circuits 203, coupling to the node 381 of said one of its small input/output (I/O) circuits 203. For the DPIIC chip 410, in a first clock cycle, data from one of the nodes N23-N26 of one of its cross-point switches 379 as illustrated in FIGS. 3A, 3B and 7 may be associated with the second data input S_Data_out of the small driver 374 of one of its small input/output (I/O) circuits 203 through one or more of the programmable interconnects 361 programmed by a first group of its memory cells 362, and then the small driver 374 of said one of its small input/output (I/O) circuits 203 may amplify or pass the second data input S_Data_out of the small driver 374 of said one of its small input/output (I/O) circuits 203 into the data output of the small driver 374 of said one of its small input/output (I/O) circuits 203 to be transmitted to one of its I/O pads 372 vertically over said one of its small input/output (I/O) circuits 203 for external connection to circuits outside the DPIIC chip 410. In a second clock cycle, data from circuits outside the DPIIC chip 410 may be associated with the second data input of the small receiver 375 of said one of its small input/output (I/O) circuits 203 through said one of its I/O pads 372, and then the small receiver 375 of said one of the small input/output (I/O) circuits 203 may amplify or pass the second data input of the small receiver 375 of said one of its small input/output (I/O) circuits 203 into the data output S_Data_in of the small receiver 375 of said one of its small input/output (I/O) circuits 203 to be associated with one of the nodes N23-N26 of another of its cross-point switches 379 as illustrated in FIGS. 3A, 3B and 7 through another one or more of the programmable interconnects 361 programmed by a second group of its memory cells 362.

Referring to FIG. 9, the DPIIC chip 410 may further include (1) multiple power pads 205 for applying the voltage Vcc of power supply to its memory cells 362 for its cross-point switches 379 as illustrated in FIGS. 3A, 3B and 7 and/or its cross-point switches 379, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 for providing the voltage Vss of ground reference to its memory cells 362 for its cross-point switches 379 as illustrated in FIGS. 3A, 3B and 7 and/or its cross-point switches 379.

Referring to FIG. 9, the DPIIC chip 410 may further include multiple volatile storage units 398 of the first type as illustrated in FIG. 1A used as cache memory for data latch or storage. Each of the volatile storage units 398 may include two switches 449, such as N-type or P-type MOS transistors, for bit and bit-bar data transfer, and two pairs of P-type and N-type MOS transistors 447 and 448 for data latch or storage nodes. For each of the volatile storage units 398 acting as the cache memory of the DPIIC chip 410, its two switches 449 may perform control of writing data into each of its memory cells 446 and reading data stored in each of its memory cells 446. The DPIIC chip 410 may further include a sense amplifier for reading, amplifying or detecting data from the memory cells 446 of its volatile storage units 398 acting as the cache memory:

Specification for Fine-Line Interconnection Bridge (FIB)

Figure 10:
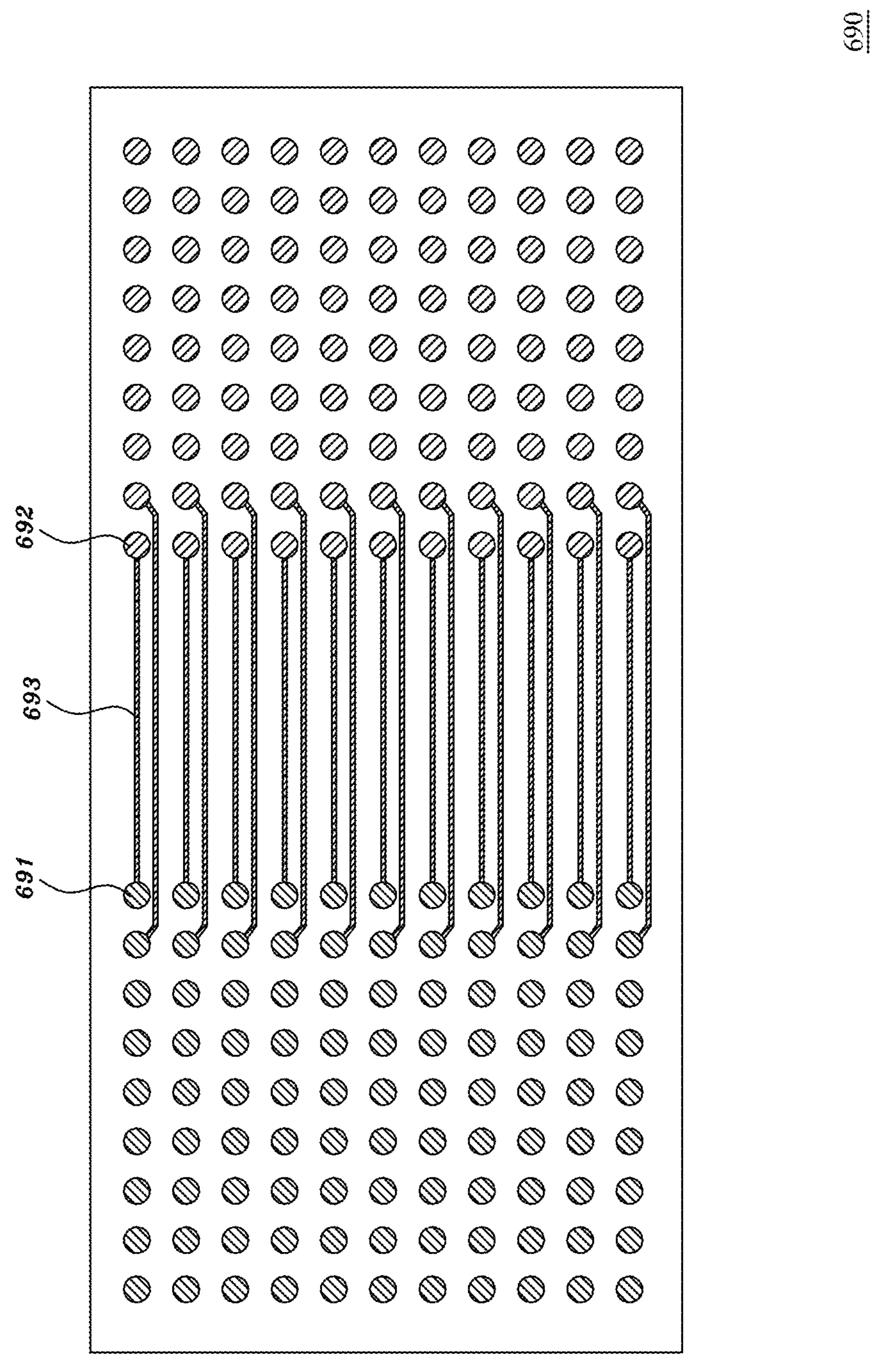
FIG. 10 is a top view showing a layout for a fine-line interconnection bridge in accordance with an embodiment of the present application.

FIG. 10 is a top view showing a layout for a fine-line interconnection bridge in accordance with an embodiment of the present application. Referring to FIG. 10, a fine-line interconnection bridge (FIB) 690 may include (1) multiple first metal pads 691 arranged in an array at a side, i.e., left side, of a top surface thereof, (2) multiple second metal pads 692 arranged in an array at the opposite side, i.e., right side, of the top surface thereof, and (3) multiple metal bridging interconnects 693 therein each coupling one of the first metal pads 691 to one of the second metal pads 692. The first and second metal pads 691 and 692 and metal bridging interconnects 693 of the fine-line interconnection bridge (FIB) 690 may be designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm.

Alternatively; the fine-line interconnection bridge (FIB) 690 may be provided with multiple pass/no-pass switches 258 or cross-point switches 379 as illustrated in FIGS. 2A-2C, 3A, 3B and 7 each to be programmed to control high density, high speed, wide bandwidth interconnection between one of the first metal pads 691 and one of the second metal pads 692. Accordingly, the fine-line interconnection bridge (FIB) 690 may become a programmable interconnection fine-line interconnection bridge (PIFIB).

Specification for Standard Commodity Logic Drive

I. First Type of Standard Commodity Logic Drive

Figure 11A:
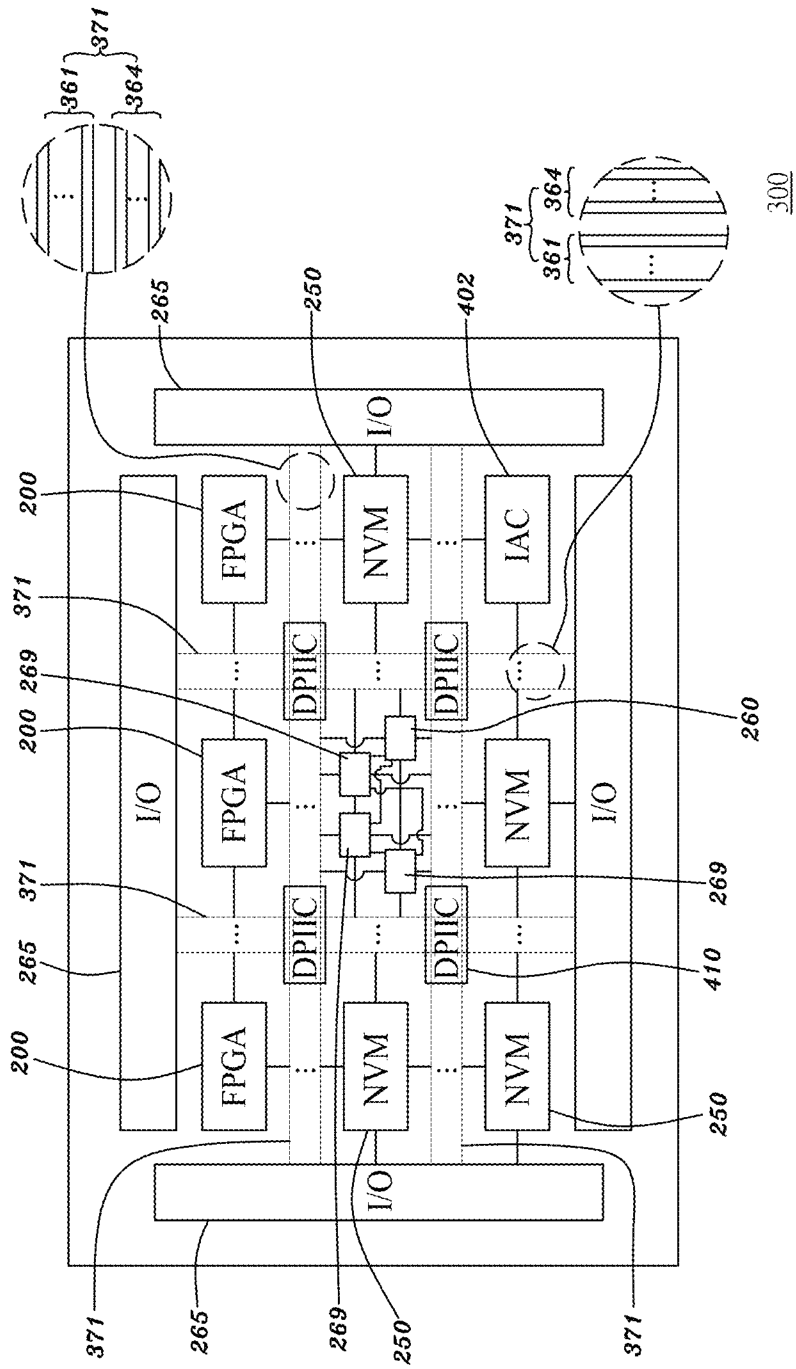
FIG. 11A is a schematically top view showing arrangement for various chips and inter-chip interconnects packaged in a first type of standard commodity logic drive in accordance with an embodiment of the present application.
Figure 12A:
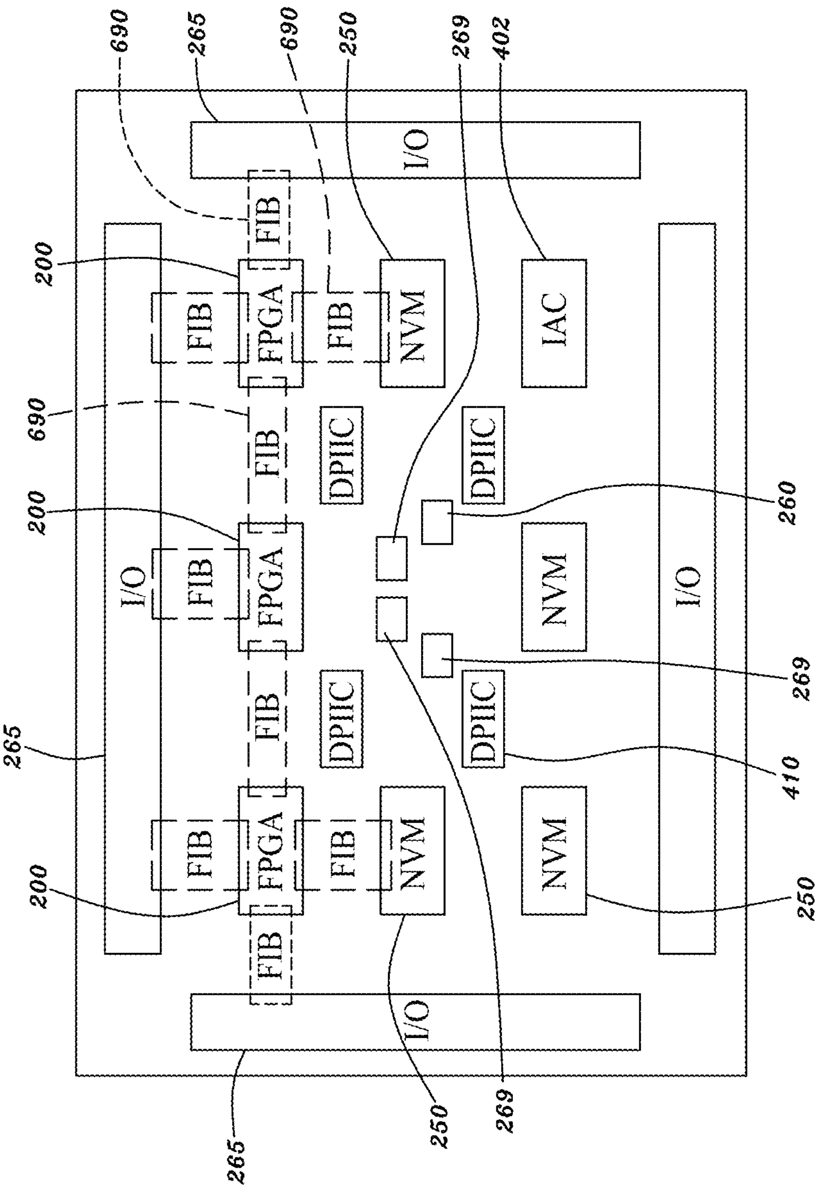
FIG. 12A is a schematically top view showing arrangement for various chips and fine-line interconnection bridges packaged in a first type of standard commodity logic drive in accordance with an embodiment of the present application.

FIG. 11A is a schematically top view showing arrangement for various chips and inter-chip interconnects packaged in a first type of standard commodity logic drive in accordance with an embodiment of the present application. FIG. 12A is a schematically top view showing arrangement for various chips and fine-line interconnection bridges packaged in a first type of standard commodity logic drive in accordance with an embodiment of the present application. Referring to FIGS. 11A and 12A, the standard commodity logic drive 300 may be packaged with a plurality of the standard commodity FPGA IC chip 200 as illustrated in FIGS. 8A and 8B, one or more non-volatile memory (NVM) IC chips 250 and an Innovated ASIC or COT (abbreviated as IAC below) chip 402, which are arranged in an array. The NVM IC chips 250 are configured to store the resulting values and programming codes in a non-volatile manner for programming the programmable logic cells (LC) 2014 and cross-point switches 379 of the standard commodity FPGA IC chips 200, as illustrated in FIGS. 6A-6D, 7, 8A and 8B. The resulting values and programming codes stored in the NVM IC chips 250 may be passed to and stored in the memory cells 490 and 362 of the standard commodity FPGA IC chips 200. The IAC chip 402 may include intellectual property (IP) circuits, application specific (AS) circuits, analog circuits, mixed-mode signal circuits, radio-frequency (RF) circuits and/or transmitter, receiver, transceiver circuits. The standard commodity logic drive 300 may be further packaged with multiple process and computing integrated-circuit (PCIC) chips 269 and a dedicated control and I/O chip 260, surrounded by the standard commodity FPGA IC chips 200, NVM IC chips 250 and IAC chips 402. Each of the PCIC chips 269 may be a central-processing-unit (CPU) chip, graphic-processing-unit (GPU) chip, digital-signal-processing (DSP) chip, tensor-processing-unit (TPU) chip or neural-processing-unit (NPU) chip. One of the NVM IC chips 250 at a right middle side of the standard commodity logic drive 300 may be arranged between one of the standard commodity FPGA IC chips 200 at right top side of the standard commodity logic drive 300 and the IAC chip 402 at the right bottom side of the standard commodity logic drive 300. The FPGA IC chips 200 may be arranged in a line at a top side of the standard commodity logic drive 300.

Referring to FIGS. 11A and 12A, the standard commodity logic drive 300 may include multiple inter-chip interconnects 371 each extending under spaces between neighboring two of the standard commodity FPGA IC chips 200, NVM IC chips 250, dedicated control and I/O chip 260. IAC chip 402 and PCIC chips 269. The standard commodity logic drive 300 may include a plurality of DPIIC chips 410 as illustrated in FIG. 9 vertical over a cross of a vertical bundle of inter-chip interconnects 371 and a horizontal bundle of inter-chip interconnects 371.

Referring to FIGS. 11A and 12A, each of the inter-chip interconnects 371 may be a fixed or non-programmable interconnect 364 for programing one or more of the memory cells 362 and 490 of one of the standard commodity FPGA IC chips 200 or one or more of the memory cells 362 of one of the DPIIC chip 410, or a programmable interconnect 361 configured to be programmed by one or more of the memory cells 362 of one of the standard commodity FPGA IC chips 200 or one or more of the memory cells 362 of one of the DPIIC chip 410. Signal transmission may be built (1) between one of the programmable interconnects 361 of the inter-chip interconnects 371 and one of the programmable interconnects 361 of the intra-chip interconnects 502 of one of the standard commodity FPGA IC chips 200 via one of the small input/output (I/O) circuits 203 of said one of the standard commodity FPGA IC chips 200 as seen in FIGS. 8A and 8B or (2) between one of the programmable interconnects 361 of the inter-chip interconnects 371 and one of the programmable interconnects of the intra-chip interconnects of one of the DPIIC chips 410 via one of the small input/output (I/O) circuits 203 of said one of the DPIIC chips 410 as seen in FIG. 9. Signal transmission may be built (1) between one of the fixed interconnects 364 of the inter-chip interconnects 371 and one of the fixed interconnects 364 of the intra-chip interconnects 502 of one of the standard commodity FPGA IC chips 200 via one of the small input/output (I/O) circuits 203 of said one of the standard commodity FPGA IC chips 200 as seen in FIGS. 8A and 8B or (2) between one of the fixed interconnects 364 of the inter-chip interconnects 371 and one of the fixed interconnects of the intra-chip interconnects of one of the DPIIC chips 410 via one of the small input/output (I/O) circuits 203 of said one of the DPIIC chips 410 as seen in FIG. 9. The NVM IC chips 250 are configured to store the programming codes in a non-volatile manner for programming the cross-point switches 379 of the DPIIC chips 410, as illustrated in FIGS. 7 and 9. The programming codes stored in the NVM IC chips 250 may be passed to and stored in the memory cells 362 of the DPIIC chips 410.

Referring to FIGS. 11A and 12A, one or more of the programmable or fixed interconnects 361 or 364 of the inter-chip interconnects 371 may couple from each of the standard commodity FPGA IC chips 200 to all of the DPIIC chips 410. One or more of the programmable or fixed interconnects 361 or 364 of the inter-chip interconnects 371 may couple from each of the standard commodity FPGA IC chips 200 to the dedicated control and I/O chip 260. One or more of the programmable or fixed interconnects 361 or 364 of the inter-chip interconnects 371 may couple from each of the standard commodity FPGA IC chips 200 to all of the NVM IC chips 250. One or more of the programmable or fixed interconnects 361 or 364 of the inter-chip interconnects 371 may couple from each of the standard commodity FPGA IC chips 200 to the IAC chip 402. One or more of the programmable or fixed interconnects 361 or 364 of the inter-chip interconnects 371 may couple from each of the standard commodity FPGA IC chips 200 to all of the PCIC chips 269. One or more of the programmable or fixed interconnects 361 or 364 of the inter-chip interconnects 371 may couple from each of the standard commodity FPGA IC chips 200 to the others of the standard commodity FPGA IC chips 200. One or more of the programmable or fixed interconnects 361 or 364 of the inter-chip interconnects 371 may couple from each of the DPIIC chips 410 to the dedicated control and I/O chip 260. One or more of the programmable or fixed interconnects 361 or 364 of the inter-chip interconnects 371 may couple from each of the DPIIC chips 410 to all of the NVM IC chips 250. One or more of the programmable or fixed interconnects 361 or 364 of the inter-chip interconnects 371 may couple from each of the DPIIC chips 410 to the others of the DPIIC chips 410. One or more of the programmable or fixed interconnects 361 or 364 of the inter-chip interconnects 371 may couple from each of the DPIIC chips 410 to the IAC chip 402. One or more of the programmable or fixed interconnects 361 or 364 of the inter-chip interconnects 371 may couple from each of the DPIIC chips 410 to all of the PCIC chips 269. One or more of the programmable or fixed interconnects 361 or 364 of the inter-chip interconnects 371 may couple from each of the NVM IC chips 250 to the dedicated control and I/O chip 260. One or more of the programmable or fixed interconnects 361 or 364 of the inter-chip interconnects 371 may couple from each of the NVM IC chips 250 to all of the PCIC chips 269. One or more of the programmable or fixed interconnects 361 or 364 of the inter-chip interconnects 371 may couple from each of the NVM IC chips 250 to the IAC chip 402. One or more of the programmable or fixed interconnects 361 or 364 of the inter-chip interconnects 371 may couple from each of the NVM IC chips 250 to the other of the NVM IC chips 250. One or more of the programmable or fixed interconnects 361 or 364 of the inter-chip interconnects 371 may couple from each of the PCIC chips 269 to the dedicated control and I/O chip 260. One or more of the programmable or fixed interconnects 361 or 364 of the inter-chip interconnects 371 may couple from each of the PCIC chips 269 to the IAC chip 402. One or more of the programmable or fixed interconnects 361 or 364 of the inter-chip interconnects 371 may couple from each of the PCIC chips 269 to the other of the PCIC chips 269. One or more of the programmable or fixed interconnects 361 or 364 of the inter-chip interconnects 371 may couple from the dedicated control and I/O chip 260 to the IAC chip 402.

Accordingly, referring to FIGS. 11A and 12A, a first one of the standard commodity FPGA IC chips 200 may have a first one of the programmable logic cells (LC) 2014, as illustrated in FIG. 6A, to transmit its output Dout to one of the inputs A0-A1 of a second one of the programmable logic cells (LC) 2014, as illustrated in FIG. 6A, of a second one of the standard commodity FPGA IC chips 200 through one of the cross-point switches 379 of one of the DPIIC chips 410. The output Dout of the first one of the programmable logic cells (LC) 2014 may be passed to said one of the inputs A0-A1 of the second one of the programmable logic cells (LC) 2014 through, in sequence. (1) the programmable interconnects 361 of the intra-chip interconnects 502 of the first one of the standard commodity FPGA IC chips 200. (2) a first group of programmable interconnects 361 of the inter-chip interconnects 371. (3) a first group of programmable interconnects 361 of the intra-chip interconnects of said one of the DPIIC chips 410. (4) said one of the cross-point switches 379 of said one of the DPIIC chips 410. (5) a second group of programmable interconnects 361 of the intra-chip interconnects of said one of the DPIIC chips 410. (6) a second group of programmable interconnects 361 of the inter-chip interconnects 371 and (7) the programmable interconnects 361 of the intra-chip interconnects 502 of the second one of the standard commodity FPGA IC chips 200.

Alternatively, referring to FIGS. 11A and 12A, one of the standard commodity FPGA IC chips 200 may have a first one of the programmable logic cells (LC) 2014, as illustrated in FIG. 6A, to transmit its output Dout to one of the inputs A0-A1 of a second one of the programmable logic cells (LC) 2014, as illustrated in FIG. 6A, of said one of the standard commodity FPGA IC chips 200 through one of the cross-point switches 379 of one of the DPIIC chips 410. The output Dout of the first one of the programmable logic cells (LC) 2014 may be passed to one of the inputs A0-A1 of the second one of the programmable logic cells (LC) 2014 through, in sequence, (1) a first group of programmable interconnects 361 of the intra-chip interconnects 502 of said one of the standard commodity FPGA IC chips 200, (2) a first group of programmable interconnects 361 of the inter-chip interconnects 371, (3) a first group of programmable interconnects 361 of the intra-chip interconnects of said one of the DPIIC chips 410, (4) said one of the cross-point switches 379 of said one of the DPIIC chips 410, (5) a second group of programmable interconnects 361 of the intra-chip interconnects of said one of the DPIIC chips 410, (6) a second group of programmable interconnects 361 of the inter-chip interconnects 371 and (7) a second group of programmable interconnects 361 of the intra-chip interconnects 502 of said one of the standard commodity FPGA IC chips 200.

Referring to FIGS. 11A and 12A, the standard commodity logic drive 300 may include multiple dedicated control and input/output (I/O) chips 265 in a peripheral region thereof surrounding a central region thereof having the standard commodity FPGA IC chips 200, NVM IC chips 250, dedicated control and I/O chip 260. DPIIC chips 410. IAC chip 402 and PCIC chips 269 located therein. One or more of the programmable or fixed interconnects 361 or 364 of the inter-chip interconnects 371 may couple from each of the standard commodity FPGA IC chips 200 to all of the dedicated control and input/output (I/O) chips 265. One or more of the programmable or fixed interconnects 361 or 364 of the inter-chip interconnects 371 may couple from one of the DPIIC chips 410 to all of the dedicated control and input/output (I/O) chips 265. One or more of the programmable or fixed interconnects 361 or 364 of the inter-chip interconnects 371 may couple from one of the NVM IC chips 250 to all of the dedicated control and input/output (I/O) chips 265. One or more of the programmable or fixed interconnects 364 of the inter-chip interconnects 371 may couple from the dedicated control and I/O chip 260 to all of the dedicated control and input/output (I/O) chips 265. One or more of the programmable or fixed interconnects 361 or 364 of the inter-chip interconnects 371 may couple from one of the PCIC chips 269 to all of the dedicated control and input/output (I/O) chips 265. One or more of the programmable or fixed interconnects 361 or 364 of the inter-chip interconnects 371 may couple from the IAC chip 402 to all of the dedicated control and input/output (I/O) chips 265. One or more of the programmable or fixed interconnects 361 or 364 of the inter-chip interconnects 371 may couple from each of the dedicated control and input/output (I/O) chips 265 to the others of the dedicated control and input/output (I/O) chips 265.

Referring to FIGS. 11A and 12A, each of the standard commodity FPGA IC chips 200 may be referred to ones as illustrated in FIGS. 8A and 8B, each of the DPIIC chips 410 may be referred to ones as illustrated in FIG. 9 and each of the fine-line interconnection bridges (FIB) 690 may be referred to one as illustrated in FIG. 10.

Referring to FIGS. 11A and 12A, each of the dedicated control and I/O chips 260 and 265 and IAC chip 402 may be designed, implemented and fabricated using varieties of semiconductor technology nodes or generations, including old or matured technology nodes or generations, for example, a semiconductor node or generation less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. Packaged in the same logic drive 300, the semiconductor technology node or generation used in each of the dedicated control and I/O chips 260 and 265 and IAC chip 402 is 1, 2, 3, 4, 5 or greater than 5 nodes or generations older, more matured or less advanced than that used in each of the standard commodity FPGA IC chips 200 and the DPIIC chips 410.

Referring to FIGS. 11A and 12A, transistors or semiconductor devices used in each of the dedicated control and I/O chips 260 and 265 and IAC chip 402 may be a Fully Depleted Silicon-on-insulator (FDSOI) MOSFET, a Partially Depleted Silicon-on-insulator (PDSOI) MOSFET or a conventional MOSFET. Packaged in the same logic drive 300, transistors or semiconductor devices used in each of the dedicated control and I/O chips 260 and 265 and IAC chip 402 may be different from those used in each of the standard commodity FPGA IC chips 200 and DPIIC chips 410; for example, packaged in the same logic drive 300, each of the dedicated control and I/O chips 260 and 265 and IAC chip 402 may use the conventional MOSFET, while each of the standard commodity FPGA IC chips 200 and DPIIC chips 410 may use the FINFET; alternatively, packaged in the same logic drive 300, each of the dedicated control and I/O chips 260 and 265 and IAC chip 402 may use the Fully Depleted Silicon-on-insulator (FDSOI) MOSFET, while each of the standard commodity FPGA IC chips 200 and DPIIC chips 410 may use the FINFET.

Referring to FIGS. 11A and 12A, each of the NVM IC chips 250 may be a NAND flash chip, in a bare-die format or in a multi-chip flash package format. Data stored in the NVM IC chips 250 of the standard commodity logic drive 300 are kept even if the standard commodity logic drive 300 is powered off. Alternatively, the NVM IC chips 250 may be Non-Volatile Radom-Access-Memory (NVRAM) IC chips, in a bare-die format or in a package format. The NVRAM may be a Ferroelectric RAM (FRAM). Magnetoresistive RAM (MRAM), or Phase-change RAM (PRAM). Each of the NVM IC chips 250 may have a standard memory density, capacity or size of greater than or equal to 64 Mb, 512 Mb, 1 Gb, 4 Gb, 16 Gb, 64 Gb, 128 Gb, 256 Gb, or 512 Gb, wherein "b" is bits. Each of the NVM IC chips 250 may be designed and fabricated using advanced NAND flash technology nodes or generations, for example, more advanced than or smaller than or equal to 40 nm, 28 nm, 20 nm, 16 nm or 10 nm, wherein the advanced NAND flash technology may comprise Single Level Cells (SLC) or multiple level cells (MLC) (for example, Double Level Cells DLC, or triple Level cells TLC), and in a 2D-NAND or a 3D NAND structure. The 3D NAND structures may comprise multiple stacked layers or levels of NAND cells, for example, greater than or equal to 4, 8, 16, 32 stacked layers or levels of NAND cells. Accordingly, the standard commodity logic drive 300 may have a standard non-volatile memory density, capacity or size of greater than or equal to 8 MB, 64 MB, 128 MB, 512 MB, 1 GB, 4 GB, 16 GB, 64 GB, 256 GB, or 512 GB, wherein "B" is bytes, each byte has 8 bits.

Referring to FIGS. 11A and 12A, packaged in the same logic drive 300, the voltage Vcc of power supply used in each of the dedicated control and I/O chips 260 and 265 and IAC chip 402 may be greater than or equal to 1.5V, 2.0V, 2.5V, 3V, 3.5V, 4V, or 5V, while the voltage Vcc of power supply used in each of the standard commodity FPGA IC chips 200 and DPIIC chips 410 may be between 0.2V and 2.5V, between 0.2V and 2V, between 0.2V and 1.5V, between 0.1V and 1V, or between 0.2V and 1V, or smaller or lower than or equal to 2.5V, 2V, 1.8V, 1.5V or 1V. Packaged in the same logic drive 300, the voltage Vcc of power supply used in each of the dedicated control and I/O chips 260 and 265 and IAC chip 402 may be different from that used in each of the standard commodity FPGA IC chips 200 and DPIIC chips 410; for example, packaged in the same logic drive 300, each of the dedicated control and I/O chips 260 and 265 and IAC chip 402 may use the voltage Vcc of power supply at 4V, while each of the standard commodity FPGA IC chips 200 and DPIIC chips 410 may use the voltage Vcc of power supply at 1.5V; alternatively, packaged in the same logic drive 300, each of the control and I/O chips 260 and 265 and IAC chip 402 may use the voltage Vcc of power supply at 2.5V, while each of the standard commodity FPGA IC chips 200 and DPIIC chips 410 may use the voltage Vcc of power supply at 0.75V.

Referring to FIGS. 11A and 12A, packaged in the same logic drive 300, the gate oxide (physical) thickness of the Field-Effect-Transistors (FETs) of semiconductor devices used in each of the control and I/O chips 260 and 265 and IAC chip 402 may be thicker than or equal to 5 nm, 6 nm, 7.5 nm, 10 nm, 12.5 nm, or 15 nm, while the gate oxide (physical) thickness of FETs of semiconductor devices used in each of the standard commodity FPGA IC chips 200 and DPIIC chips 410 may be thinner than 4.5 nm, 4 nm, 3 nm or 2 nm. Packaged in the same logic drive 300, the gate oxide (physical) thickness of FETs of the semiconductor devices used in each of the dedicated control and I/O chips 260 and 265 and IAC chip 402 may be different from that used in each of the standard commodity FPGA IC chips 200 and DPIIC chips 410; for example, packaged in the same logic drive 300, each of the dedicated control and I/O chips 260 and 265 and IAC chip 402 may use a gate oxide (physical) thickness of FETs of 10 nm, while each of the standard commodity FPGA IC chips 200 and DPIIC chips 410 may use a gate oxide (physical) thickness of FETs of 3 nm; alternatively, packaged in the same logic drive 300, each of the dedicated control and I/O chips 260 and 265 and IAC chip 402 may use a gate oxide (physical) thickness of FETs of 7.5 nm, while each of the standard commodity FPGA IC chips 200 and DPIIC chips 410 may use a gate oxide (physical) thickness of FETs of 2 nm.

Referring to FIGS. 11A and 12A, each of the PCIC chips 269 may be designed, implemented and fabricated using an advanced semiconductor technology node or generation, for example more advanced than or equal to, or below or equal to 30 nm, 20 nm or 10 nm, and for example using the technology node of 28 nm, 22 nm, 16 nm, 14 nm, 12 nm, 10 nm, 7 nm, 5 nm or 3 nm, which may be the same as, one generation or node less advanced than or one generation or node more advanced than that used for each of the standard commodity FPGA IC chips 200 and DPIIC chips 410. Transistors or semiconductor devices used in the PCIC chip 269 may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET.

Referring to FIGS. 11A and 12A, each of the dedicated control and I/O chip(s) 165 may arrange a plurality of the large I/O circuit 341 and I/O pad 272, as seen in FIG. 5A, for the standard commodity logic drive 300 to employ one or multiple (2, 3, 4, or more than 4) Universal Serial Bus (USB) ports, one or more IEEE 1394 ports, one or more Ethernet ports, one or more HDMI ports, one or more VGA ports, one or more audio ports or serial ports, for example, RS-232 or COM (communication) ports, wireless transceiver I/Os, and/or Bluetooth transceiver I/Os, and etc. Each of the dedicated control and I/O chips 165 may have a plurality of the large I/O circuit 341 and I/O pad 272, as seen in FIG. 5A, for the standard commodity logic drive 300 to employ Serial Advanced Technology Attachment (SATA) ports, or Peripheral Components Interconnect express (PCIe) ports to communicate, connect or couple with a memory drive.

Referring to FIGS. 11A and 12A, the standard commodity FPGA IC chips 200 may have standard common features or specifications, mentioned as below: (1) logic blocks including (i) system gates with the count greater than or equal to 8M, 40M, 80M, 200M or 400M, (ii) logic cells or elements with the count greater than or equal to 256K, 512K, 2M, 4M, 16M or 32M, (iii) hard macros, for example DSP slices, microcontroller macros, multiplexer macros, fixed-wired adders, and/or fixed-wired multipliers and/or (iv) blocks of memory with the bit count equal to or greater than 4M, 40M, 200M, 400M, 800M or 2G bits; (2) the power supply voltage: the voltage may be between 0.1V and 12V, 0.1V and 7V, 0.1V and 3V, 0.1V and 2V, 0.1V and 1.5V, or 0.1V and 1V; (3) the I/O pads in the multi-chip package of the standard commodity logic drive, in terms of layout, location, number and function: wherein the logic drive may comprise the I/O pads, metal pillars or bumps connecting or coupling to one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc.

Referring to FIGS. 11A and 12A, the standard commodity logic drive 300 may include a plurality of fine-line interconnection bridges (FIB) 690 as illustrated in FIG. 10 across under neighboring two of the FPGA IC chips 200, NVM IC chips 250 and dedicated control and I/O chips 265. One of said neighboring two of the FPGA IC chips 200, NVM IC chips 250 and dedicated control and I/O chips 265 may be bonded over and coupled to the metal pads 691 of one of the fine-line interconnection bridges (FIB) 690 and the other of said neighboring two of the FPGA IC chips 200, NVM IC chips 250 and dedicated control and I/O chips 265 may be bonded over and coupled to the metal pads 692 of said one of the fine-line interconnection bridges (FIB) 690. Thereby, said neighboring two of the FPGA IC chips 200, NVM IC chips 250 and dedicated control and I/O chips 265 may couple to each other through the metal bridging interconnects 693 of said one of the fine-line interconnection bridges (FIB) 690. For an example, one of the standard commodity FPGA IC chips 200 may be bonded over and coupled to the metal pads 691 of a first one of the fine-line interconnection bridges (FIB) 690 and another of the standard commodity FPGA IC chips 200 neighboring said one of the standard commodity FPGA IC chips 200 may be bonded over and coupled to the metal pads 692 of the first one of the fine-line interconnection bridges (FIB) 690. Thereby: said neighboring two of the standard commodity FPGA IC chips 200 may couple to each other through the metal bridging interconnects 693 of the first one of the fine-line interconnection bridges (FIB) 690. For another example, one of the standard commodity FPGA IC chips 200 may be bonded over and coupled to the metal pads 691 of a second one of the fine-line interconnection bridges (FIB) 690 and one of the NVM IC chips 250 neighboring said one of the standard commodity FPGA IC chips 200 may be bonded over and coupled to the metal pads 692 of the second one of the fine-line interconnection bridges (FIB) 690. Thereby, said one of the standard commodity FPGA IC chips 200 and said one of the NVM IC chips 250 may couple to each other through the metal bridging interconnects 693 of the second one of the fine-line interconnection bridges (FIB) 690. For another example, one of the standard commodity FPGA IC chips 200 may be bonded over and coupled to the metal pads 691 of a third one of the fine-line interconnection bridges (FIB) 690 and one of the dedicated control and input/output (I/O) chips 265 neighboring said one of the standard commodity FPGA IC chips 200 may be bonded over and coupled to the metal pads 692 of the third one of the fine-line interconnection bridges (FIB) 690. Thereby, said one of the standard commodity FPGA IC chips 200 and said one of the dedicated input/output (I/O) chips 265 may couple to each other through the metal bridging interconnects 693 of the third one of the fine-line interconnection bridges (FIB) 690.

II. Second Type of Standard Commodity Logic Drive

Figure 11B:
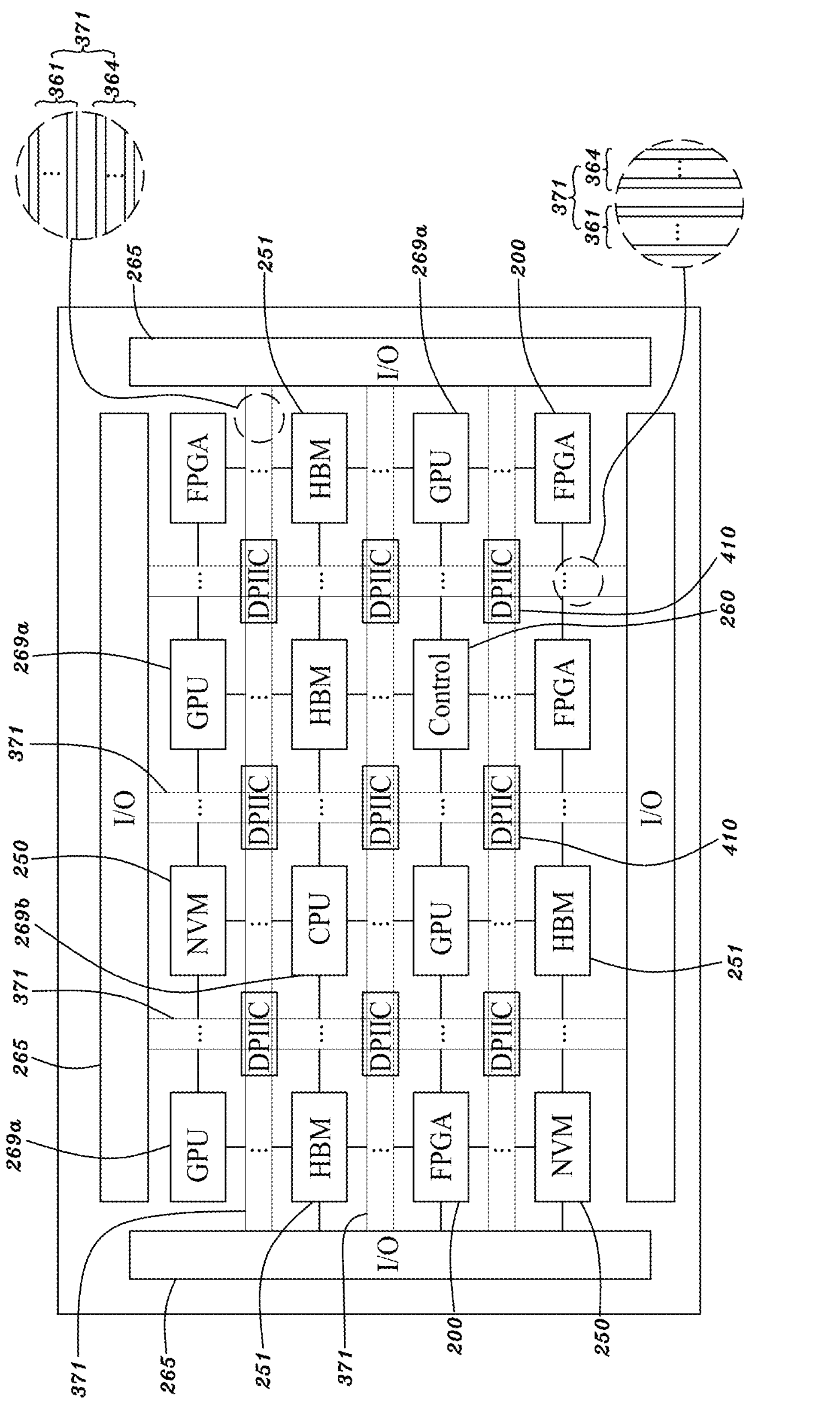
FIG. 11B is a schematically top view showing arrangement for various chips and inter-chip interconnects packaged in a second type of standard commodity logic drive in accordance with an embodiment of the present application.
Figure 12B:
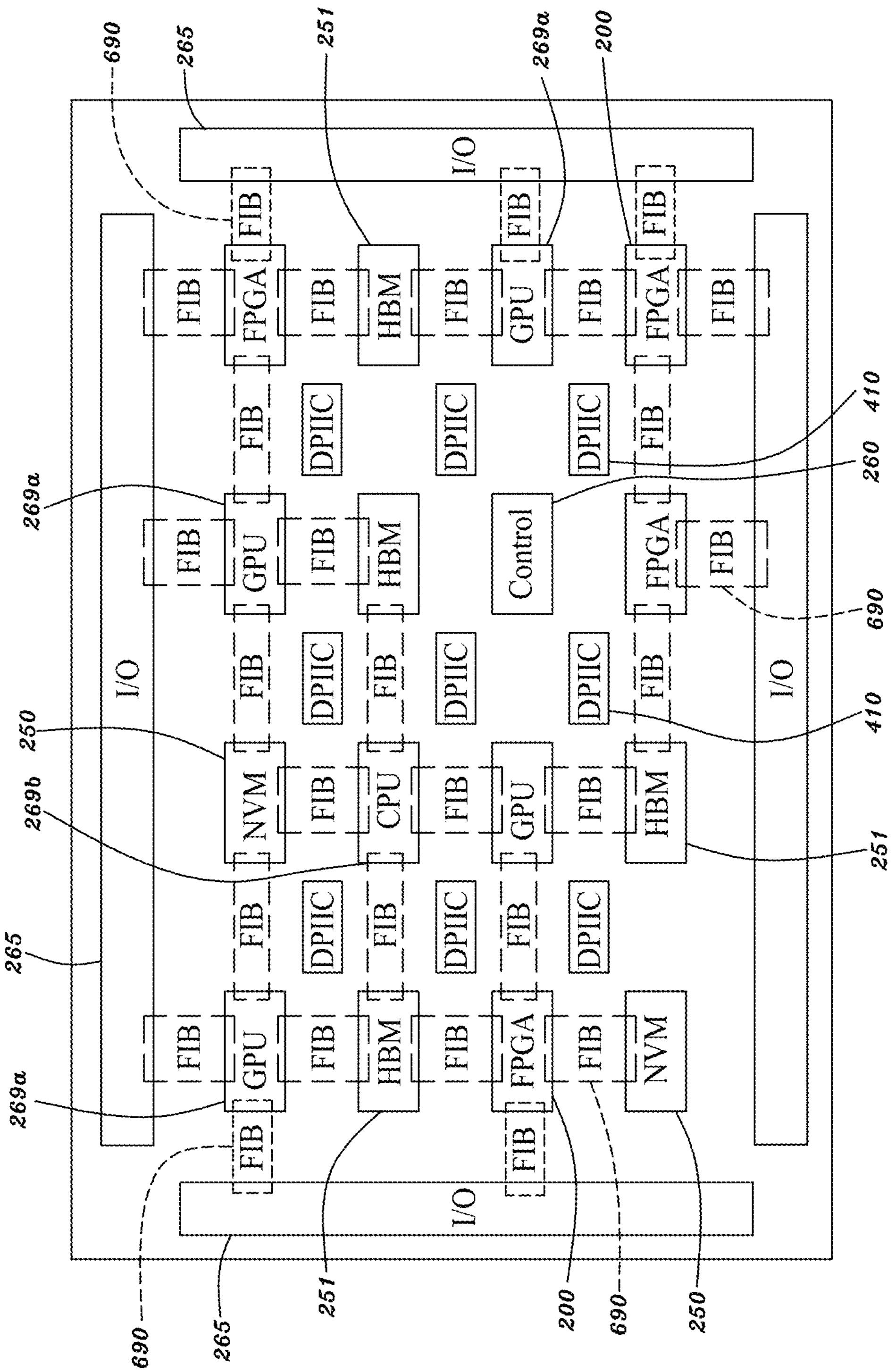
FIG. 12B is a schematically top view showing arrangement for various chips and fine-line interconnection bridges packaged in a second type of standard commodity logic drive in accordance with an embodiment of the present application.

FIG. 11B is a schematically top view showing arrangement for various chips and inter-chip interconnects packaged in a second type of standard commodity logic drive in accordance with an embodiment of the present application. FIG. 12B is a schematically top view showing arrangement for various chips and fine-line interconnection bridges packaged in a second type of standard commodity logic drive in accordance with an embodiment of the present application. For an element indicated by the same reference number shown in FIGS. 11A-11B and 12A-12B, the specification of the element as seen in FIGS. 11B and 12B and the process for forming the same may be referred to that of the element as illustrated in FIGS. 11A and 12A and the process for forming the same. Referring to FIGS. 11B and 12B, the standard commodity logic drive 300 may be packaged with multiple GPU chips 269*a* and a CPU chip 269*b* for the PCIC chips 269 as above mentioned. Further, the standard commodity logic drive 300 may be packaged with multiple high-bitwidth-memory (HBM) integrated-circuit (IC) chips 251 each arranged next to one of the GPU chips 269*a* for communication with said one of the GPU chips 269*a* in a high speed, high bandwidth and wide bitwidth. Each of the HBM IC chips 251 in the standard commodity logic drive 300 may be a high speed, high bandwidth, wide bitwidth dynamic-random-access-memory (DRAM) IC chip, high speed, high bandwidth, wide bitwidth cache SRAM chip, high speed, high bandwidth, wide bitwidth magnetoresistive random-access-memory (MRAM) chip or high speed, high bandwidth, wide bitwidth resistive random-access-memory (RRAM) chip. The standard commodity logic drive 300 may be further packaged with a plurality of standard commodity FPGA IC chips 200 as illustrated in FIGS. 8A and 8B and one or more NVM IC chips 250 configured to store the resulting values or programming codes in a non-volatile manner for programming the programmable logic cells (LC) 2014 or cross-point switches 379 of the standard commodity FPGA IC chips 200, as illustrated in FIGS. 6A-6D, 7, 8A and 8B. The resulting values and programming codes stored in the NVM IC chips 250 may be passed to and stored in the memory cells 490 and 362 of the standard commodity FPGA IC chips 200.

Referring to FIGS. 10, 11B and 12B, the standard commodity logic drive 300 may include a plurality of fine-line interconnection bridges (FIB) 690 across under neighboring two of the standard commodity FPGA IC chips 200, non-volatile memory (NVM) IC chips 250, HBM IC chips 251, dedicated control and I/O chips 265, GPU chips 269*a* and CPU chip 269*b*. One of said neighboring two of the standard commodity FPGA IC chips 200, non-volatile memory (NVM) IC chips 250, HBM IC chips 251, dedicated control and I/O chips 265, GPU chips 269*a* and CPU chip 269*b* may be bonded over and coupled to the metal pads 691 of one of the fine-line interconnection bridges (FIB) 690 and the other of said neighboring two of the semiconductor chips 200, 250, 251, 265, 269*a* and 269*b* may be bonded over and coupled to the metal pads 692 of said one of the fine-line interconnection bridges (FIB) 690. Thereby, said neighboring two of the standard commodity FPGA IC chips 200, non-volatile memory (NVM) IC chips 250. HBM IC chips 251, dedicated control and I/O chips 265, GPU chips 269*a* and CPU chip 269*b* may couple to each other through the metal bridging interconnects 693 of said one of the fine-line interconnection bridges (FIB) 690. For an example, one of the standard commodity FPGA IC chips 200 may be bonded over and coupled to the metal pads 691 of a first one of the fine-line interconnection bridges (FIB) 690 and one of the HBM IC chips 251 neighboring said one of the standard commodity FPGA IC chips 200 may be bonded over and coupled to the metal pads 692 of the first one of the fine-line interconnection bridges (FIB) 690. Thereby, said one of the standard commodity FPGA IC chips 200 and said one of the HBM IC chips 251 may couple to each other through the metal bridging interconnects 693 of the first one of the fine-line interconnection bridges (FIB) 690. For another example, one of the GPU chips 269*a* may be bonded over and coupled to the metal pads 691 of a second one of the fine-line interconnection bridges (FIB) 690 and one of the HBM IC chips 251 neighboring said one of the GPU chips 269*a* may be bonded over and coupled to the metal pads 692 of the second one of the fine-line interconnection bridges (FIB) 690. Thereby, said one of the GPU chips 269*a* and said one of the HBM IC chips 251 may couple to each other through the metal bridging interconnects 693 of the second one of the fine-line interconnection bridges (FIB) 690. For another example, the CPU chip 269*b* may be bonded over and coupled to the metal pads 691 of a third one of the fine-line interconnection bridges (FIB) 690 and one of the HBM IC chips 251 neighboring the CPU chip 269*b* may be bonded over and coupled to the metal pads 692 of the third one of the fine-line interconnection bridges (FIB) 690. Thereby, the CPU chip 269*b* and said one of the HBM IC chips 251 may couple to each other through the metal bridging interconnects 693 of the third one of the fine-line interconnection bridges (FIB) 690. For another example, one of the standard commodity FPGA IC chips 200 may be bonded over and coupled to the metal pads 691 of a fourth one of the fine-line interconnection bridges (FIB) 690 and one of the NVM IC chips 250 neighboring said one of the standard commodity FPGA IC chips 200 may be bonded over and coupled to the metal pads 692 of the fourth one of the fine-line interconnection bridges (FIB) 690. Thereby, said one of the standard commodity FPGA IC chips 200 and said one of the NVM IC chips 250 may couple to each other through the metal bridging interconnects 693 of the fourth one of the fine-line interconnection bridges (FIB) 690. For another example, one of the GPU chips 269*a* may be bonded over and coupled to the metal pads 691 of a fifth one of the fine-line interconnection bridges (FIB) 690 and one of the NVM IC chips 250 neighboring said one of the GPU chips 269*a* may be bonded over and coupled to the metal pads 692 of the fifth one of the fine-line interconnection bridges (FIB) 690. Thereby, said one of the GPU chips 269*a* and said one of the NVM IC chips 250 may couple to each other through the metal bridging interconnects 693 of the fifth one of the fine-line interconnection bridges (FIB) 690. For another example, the CPU chip 269*b* may be bonded over and coupled to the metal pads 691 of a sixth one of the fine-line interconnection bridges (FIB) 690 and one of the NVM IC chips 250 neighboring the CPU chip 269*b* may be bonded over and coupled to the metal pads 692 of the sixth one of the fine-line interconnection bridges (FIB) 690. Thereby: the CPU chip 269*b* and said one of the NVM IC chips 250 may couple to each other through the metal bridging interconnects 693 of the sixth one of the fine-line interconnection bridges (FIB) 690. For another example, one of the FPGA IC chips 200 may be bonded over and coupled to the metal pads 691 of a seventh one of the fine-line interconnection bridges (FIB) 690 and another of the FPGA IC chips 200 neighboring said one of the FPGA IC chips 200 may be bonded over and coupled to the metal pads 692 of the seventh one of the fine-line interconnection bridges (FIB) 690. Thereby, said neighboring two of the FPGA chips 200 may couple to each other through the metal bridging interconnects 693 of the seventh one of the fine-line interconnection bridges (FIB) 690. For another example, one of the FPGA IC chips 200 may be bonded over and coupled to the metal pads 691 of an eighth one of the fine-line interconnection bridges (FIB) 690 and one of the GPU chips 269*a* neighboring said one of the FPGA IC chips 200 may be bonded over and coupled to the metal pads 692 of the eighth one of the fine-line interconnection bridges (FIB) 690. Thereby, said one of the FPGA chips 200 and said one of the GPU chips 269*a* may couple to each other through the metal bridging interconnects 693 of the eighth one of the fine-line interconnection bridges (FIB) 690. For another example, one of the GPU chips 269*a* may be bonded over and coupled to the metal pads 691 of a ninth one of the fine-line interconnection bridges (FIB) 690 and the CPU chip 269*b* neighboring said one of the GPU chips 269*a* may be bonded over and coupled to the metal pads 692 of the ninth one of the fine-line interconnection bridges (FIB) 690. Thereby, said one of the GPU chips 269*a* and the CPU chip 269*b* may couple to each other through the metal bridging interconnects 693 of the ninth one of the fine-line interconnection bridges (FIB) 690. For another example, one of the standard commodity FPGA IC chips 200 may be bonded over and coupled to the metal pads 691 of a tenth one of the fine-line interconnection bridges (FIB) 690 and one of the dedicated control and I/O chips 265 neighboring said one of the standard commodity FPGA IC chips 200 may be bonded over and coupled to the metal pads 692 of the tenth one of the fine-line interconnection bridges (FIB) 690. Thereby, said one of the standard commodity FPGA IC chips 200 and said one of the dedicated I/O chips 265 may couple to each other through the metal bridging interconnects 693 of the tenth one of the fine-line interconnection bridges (FIB) 690. For another example, one of the GPU chips 269*a* may be bonded over and coupled to the metal pads 691 of an eleventh one of the fine-line interconnection bridges (FIB) 690 and one of the dedicated I/O chips 265 neighboring said one of the GPU chips 269*a* may be bonded over and coupled to the metal pads 692 of the eleventh one of the fine-line interconnection bridges (FIB) 690. Thereby, said one of the GPU chips 269*a* and said one of the dedicated I/O chips 265 may couple to each other through the metal bridging interconnects 693 of the eleventh one of the fine-line interconnection bridges (FIB) 690.

Referring to FIGS. 11B and 12B, the standard commodity logic drive 300 may include multiple inter-chip interconnects 371 each extending under spaces between neighboring two of the standard commodity FPGA IC chips 200. NVM IC chips 250, dedicated control chip 260. GPU chips 269*a*. CPU chip 269*b* and HBMIC chips 251. The standard commodity logic drive 300 may include a plurality of DPIIC chips 410 as illustrated in FIG. 9 vertical over a cross of a vertical bundle of inter-chip interconnects 371 and a horizontal bundle of inter-chip interconnects 371.

Referring to FIGS. 11B and 12B, each of the inter-chip interconnects 371 may be a fixed or non-programmable interconnect 364 for programing one or more of the memory cells 362 and 490 of one of the standard commodity FPGA IC chips 200 or one or more of the memory cells 362 of one of the DPIIC chip 410, or a programmable interconnect 361 configured to be programmed by one or more of the memory cells 362 of one of the standard commodity FPGA IC chips 200 or one or more of the memory cells 362 of one of the DPIIC chip 410. Signal transmission may be built (1) between one of the programmable interconnects 361 of the inter-chip interconnects 371 and one of the programmable interconnects 361 of the intra-chip interconnects 371 of one of the standard commodity FPGA IC chips 200 via one of the small input/output (I/O) circuits 203 of said one of the standard commodity FPGA IC chips 200 as seen in FIGS. 8A and 8B or (2) between one of the programmable interconnects 361 of the inter-chip interconnects 371 and one of the programmable interconnects 361 of the intra-chip interconnects of one of the DPIIC chips 410 via one of the small input/output (I/O) circuits 203 of said one of the DPIIC chips 410 as seen in FIG. 9. Signal transmission may be built (1) between one of the fixed interconnects 364 of the inter-chip interconnects 371 and one of the fixed interconnects 364 of the intra-chip interconnects 502 of one of the standard commodity FPGA IC chips 200 via one of the small input/output (I/O) circuits 203 of said one of the standard commodity FPGA IC chips 200 as seen in FIGS. 8A and 8B or (2) between one of the fixed interconnects 364 of the inter-chip interconnects 371 and one of the fixed interconnects 364 of the intra-chip interconnects of one of the DPIIC chips 410 via one of the small input/output (I/O) circuits 203 of said one of the DPIIC chips 410 as seen in FIG. 9. The NVM IC chips 250 are configured to store the programming codes in a non-volatile manner for programming the cross-point switches 379 of the DPIIC chips 410, as illustrated in FIGS. 7 and 9. The programming codes stored in the NVM IC chips 250 may be passed to and stored in the memory cells 362 of the DPIIC chips 410.

Referring to FIGS. 11B and 12B, one or more of the programmable or fixed interconnects 361 or 364 of the inter-chip interconnects 371 may couple from each of the standard commodity FPGA IC chips 200 to all of the DPIIC chips 410. One or more of the programmable or fixed interconnects 361 or 364 of the inter-chip interconnects 371 may couple from each of the standard commodity FPGA IC chips 200 to the dedicated control chip 260. One or more of the programmable or fixed interconnects 361 or 364 of the inter-chip interconnects 371 may couple from each of the standard commodity FPGA IC chips 200 to both of the NVM IC chips 250. One or more of the programmable or fixed interconnects 361 or 364 of the inter-chip interconnects 371 may couple from each of the standard commodity FPGA IC chips 200 to all of the GPU chips 269*a*. One or more of the programmable or fixed interconnects 361 or 364 of the inter-chip interconnects 371 may couple from each of the standard commodity FPGA IC chips 200 to the CPU chip 269*b*. One or more of the programmable or fixed interconnects 361 or 364 of the inter-chip interconnects 371 may couple from each of the standard commodity FPGA IC chips 200 to all of the HBMIC chips 251. One or more of the programmable or fixed interconnects 361 or 364 of the inter-chip interconnects 371 may couple from each of the standard commodity FPGA IC chips 200 to the other of the standard commodity FPGA IC chips 200. One or more of the programmable or fixed interconnects 361 or 364 of the inter-chip interconnects 371 may couple from each of the DPIIC chips 410 to the dedicated control chip 260. One or more the programmable or fixed interconnects 361 or 364 of the inter-chip interconnects 371 may couple from each of the DPIIC chips 410 to both of the NVM IC chips 250. One or more of the programmable or fixed interconnects 361 or 364 of the inter-chip interconnects 371 may couple from each of the DPIIC chips 410 to all of the GPU chips 269*a*. One or more of the programmable or fixed interconnects 361 or 364 of the inter-chip interconnects 371 may couple from each of the DPIIC chips 410 to the CPU chip 269*b*. One or more of the programmable or fixed interconnects 361 or 364 of the inter-chip interconnects 371 may couple from each of the DPIIC chips 410 to all of the HBMIC chips 251. One or more of the programmable or fixed interconnects 361 or 364 of the inter-chip interconnects 371 may couple from each of the DPIIC chips 410 to the others of the DPIIC chips 410. One or more of the programmable or fixed interconnects 361 or 364 of the inter-chip interconnects 371 may couple from the CPU chip 269*b* to all of the GPU chips 269*a*. One or more of the programmable or fixed interconnects 361 or 364 of the inter-chip interconnects 371 may couple from the CPU chip 269*b* to both of the NVM IC chips 250. One or more of the programmable or fixed interconnects 361 or 364 of the inter-chip interconnects 371 may couple from the CPU chip 269*b* to all of the HBMIC chips 251. One or more of the programmable or fixed interconnects 361 or 364 of the inter-chip interconnects 371 may couple from one of the GPU chips 269*a* to one of the HBMIC chips 251 and a data bus between said one of the GPU chips 269*a* and said one of the HBM IC chips 251 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from each of the GPU chips 269*a* to both of the NVM IC chips 250. One or more of the programmable or fixed interconnects 361 or 364 of the inter-chip interconnects 371 may couple from each of the GPU chips 269*a* to the others of the GPU chips 269*a*. One or more of the programmable or fixed interconnects 361 or 364 of the inter-chip interconnects 371 may couple from each of the NVM IC chips 250 to the dedicated control chip 260. One or more of the programmable or fixed interconnects 361 or 364 of the inter-chip interconnects 371 may couple from each of the HBMIC chips 251 to the dedicated control chip 260. One or more of the programmable or fixed interconnects 361 or 364 of the inter-chip interconnects 371 may couple from each of the GPU chips 269*a* to the dedicated control chip 260. One or more of the programmable or fixed interconnects 361 or 364 of the inter-chip interconnects 371 may couple from the CPU chip 269*b* to the dedicated control chip 260. One or more of the programmable or fixed interconnects 361 or 364 of the inter-chip interconnects 371 may couple from each of the NVM IC chips 250 to all of the HBMIC chips 251. One or more of the programmable or fixed interconnects 361 or 364 of the inter-chip interconnects 371 may couple from each of the NVM IC chips 250 to the other of the NVM IC chips 250. One or more of the programmable or fixed interconnects 361 or 364 of the inter-chip interconnects 371 may couple from each of the HBMIC chips 251 to the others of the HBMIC chips 251.

Referring to FIGS. 11B and 12B, the standard commodity logic drive 300 may include multiple dedicated input/output (I/O) chips 265 in a peripheral region thereof surrounding a central region thereof having the standard commodity FPGA IC chips 200. NVM IC chips 250, dedicated control chip 260, GPU chips 269*a*, CPU chip 269*b*, HBMIC chips 251 and DPIIC chips 410 located therein. One or more of the programmable or fixed interconnects 361 or 364 of the inter-chip interconnects 371 may couple from each of the standard commodity FPGA IC chips 200 to all of the dedicated input/output (I/O) chips 265. One or more of the programmable or fixed interconnects 361 or 364 of the inter-chip interconnects 371 may couple from each of the DPIIC chips 410 to all of the dedicated input/output (I/O) chips 265. One or more of the programmable or fixed interconnects 361 or 364 of the inter-chip interconnects 371 may couple from each of the NVM IC chips 250 to all of the dedicated input/output (I/O) chips 265. One or more of the programmable or fixed interconnects 361 or 364 of the inter-chip interconnects 371 may couple from the dedicated control chip 260 to all of the dedicated input/output (I/O) chips 265. One or more of the programmable or fixed interconnects 361 or 364 of the inter-chip interconnects 371 may couple from each of the GPU chips 269*a* to all of the dedicated input/output (I/O) chips 265. One or more of the programmable or fixed interconnects 361 or 364 of the inter-chip interconnects 371 may couple from the CPU chip 269*b* to all of the dedicated input/output (I/O) chips 265. One or more of the programmable or fixed interconnects 361 or 364 of the inter-chip interconnects 371 may couple from each of the HBMIC chips 251 to all of the dedicated input/output (I/O) chips 265.

Referring to FIGS. 11B and 12B, for parallel signal transmission, multiple parallel paths for a data bus, i.e., metal bridging interconnects 693, may be arranged in the fine-line interconnection bridge (FIB) 690 between one of the GPU chips 269*a* and one of the HBM IC chips 251 neighboring said one of the GPU chips 269*a* to provide a data bit width of equal to or greater than 64, 128, 256, 512, 1024, 2048, 4096, 8K, or 16K therebetween. For parallel signal transmission, multiple parallel paths for a data bus, i.e., metal bridging interconnects 693, may be arranged in the fine-line interconnection bridge (FIB) 690 between one of the standard commodity FPGA IC chips 200 and one of the HBM IC chips 251 neighboring said one of the standard commodity FPGA IC chips 200 to provide a data bit width of equal to or greater than 64, 128, 256, 512, 1024, 2048, 4096, 8K, or 16K therebetween. For parallel signal transmission, multiple parallel paths for a data bus, i.e., metal bridging interconnects 693, may be arranged in the fine-line interconnection bridge (FIB) 690 between the CPU chip 269*b* and one of the HBM IC chips 251 neighboring the CPU chip 269*b* to provide a data bit width of equal to or greater than 64, 128, 256, 512, 1024, 2048, 4096, 8K, or 16K therebetween.

Accordingly, referring to FIGS. 11B and 12B, in the second type of logic drive 300, the GPU chips 269*a* may operate with the HBM IC chips 251 for high speed, high bandwidth, wide bit-width parallel processing and/or computing, the FPGA IC chips 200 may operate with the HBM IC chips 251 for high speed, high bandwidth, wide bit-width parallel processing and/or computing, and the CPU chip 269*b* may operate with the HBM IC chips 251 for high speed, high bandwidth, wide bit-width parallel processing and/or computing.

Referring to FIGS. 11B and 12B, each of the standard commodity FPGA IC chips 200 may be referred to ones as illustrated in FIGS. 8A and 8B, each of the DPIIC chips 410 may be referred to ones as illustrated in FIG. 9 and each of the fine-line interconnection bridges (FIB) 690 may be referred to one as illustrated in FIG. 10. The specification of the commodity standard FPGA IC chips 200, DPIIC chips 410, dedicated control and I/O chips 260 and 265 and NVM IC chips 250 as seen in FIGS. 11B and 12B may be referred to that as illustrated in FIGS. 11A and 12A.

Interconnection for Standard Commodity Logic Drive

Figure 13:
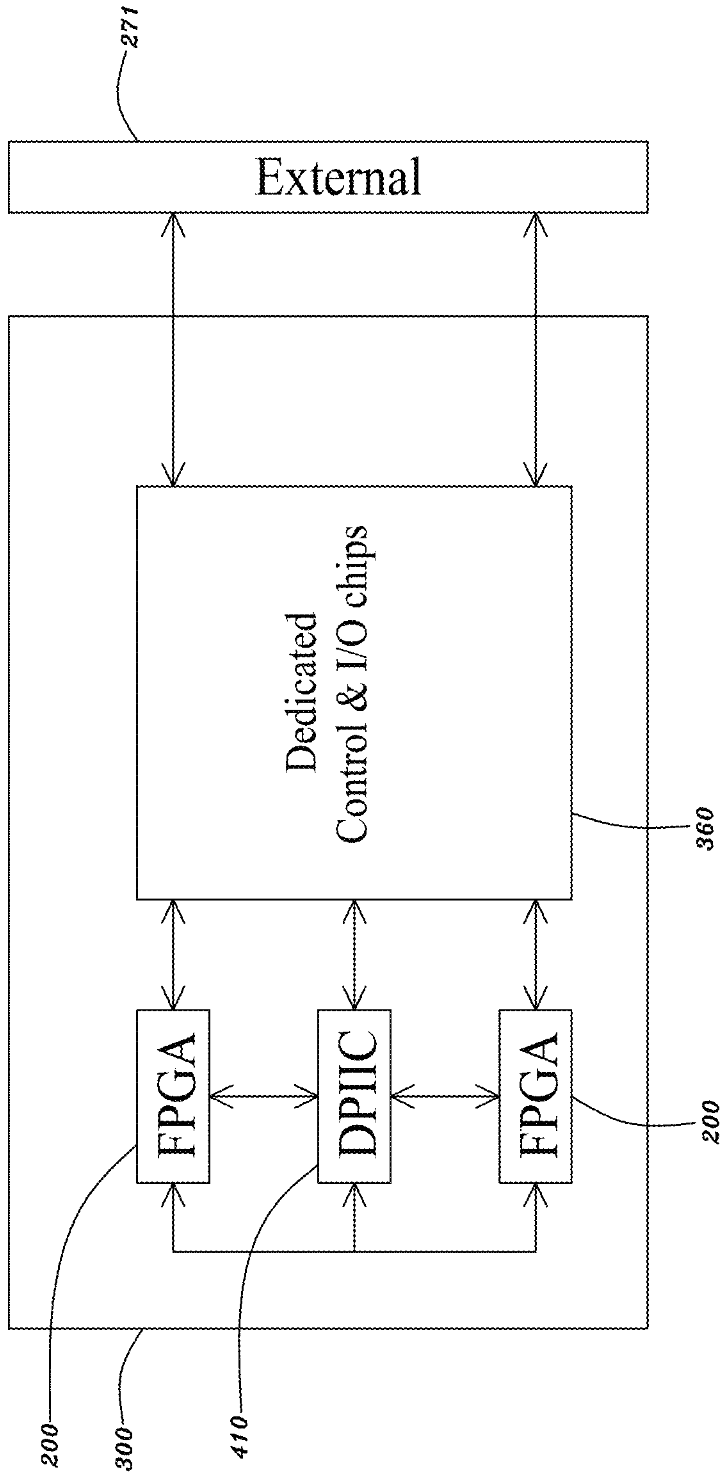
FIG. 13 is a block diagram showing interconnection between chips in a standard commodity logic drive in accordance with an embodiment of the present application.

FIG. 13 is a block diagram showing interconnection between chips in a standard commodity logic drive in accordance with an embodiment of the present application. Referring to FIG. 13, two blocks 200 may be two different groups of the standard commodity FPGA IC chips 200 in the first or second type of standard commodity logic drive 300 illustrated in FIGS. 11A and 12A or in FIGS. 11B and 12B; a block 410 may be a combination of the DPIIC chips 410 in the first or second type of standard commodity logic drive 300 illustrated in FIGS. 11A and 12A or in FIGS. 11B and 12B; a block 360 may be a combination of the dedicated control and I/O chips 260 and 265 in the first or second type of standard commodity logic drive 300 illustrated in FIGS. 11A and 12A or in FIGS. 11B and 12B.

Referring to FIG. 13, for the first or second type of standard commodity logic drive 300 illustrated in FIGS. 11A and 12A or in FIGS. 11B and 12B, one or more of the programmable interconnects 361 of its inter-chip interconnects 371 may couple one or more of the small I/O circuits 203 of each of its dedicated I/O chips 265 in the block 360 to one or more of the small I/O circuits 203 of one of its standard commodity FPGA IC chips 200. One or more of the programmable interconnects 361 of its inter-chip interconnects 371 may couple one or more of the small I/O circuits 203 of each of its dedicated I/O chips 265 in the block 360 to one or more of the small I/O circuits 203 of one of its DPIIC chips 410. One or more of the fixed interconnects 364 of the inter-chip interconnects 371 may couple one or more of the small I/O circuits 203 of each of its dedicated I/O chips 265 in the block 360 to one or more of the small I/O circuits 203 of one of its standard commodity FPGA IC chips 200. One or more of the fixed interconnects 364 of the inter-chip interconnects 371 may couple one or more of the small I/O circuits 203 of each of its dedicated I/O chips 265 in the block 360 to one or more of the small I/O circuits 203 of one of its DPIIC chips 410.

Referring to FIG. 13, for the first or second type of standard commodity logic drive 300 illustrated in FIGS. 11A and 12A or in FIGS. 11B and 12B, one or more of the programmable interconnects 361 of its inter-chip interconnects 371 may couple one or more of the small I/O circuits 203 of each of its DPIIC chips 410 to one or more of the small I/O circuits 203 of one of the standard commodity FPGA IC chips 200. One or more of the programmable interconnects 361 of its inter-chip interconnects 371 may couple one or more of the small I/O circuits 203 of each of its DPIIC chips 410 to one or more of the small I/O circuits 203 of another of the DPIIC chips 410. One or more of the fixed interconnects 364 of the inter-chip interconnects 371 may couple one or more of the small I/O circuits 203 of each of its DPIIC chips 410 to one or more of the small I/O circuits 203 of one of its standard commodity FPGA IC chips 200. One or more of the fixed interconnects 364 of the inter-chip interconnects 371 may couple one or more of the small I/O circuits 203 of each of its DPIIC chips 410 to one or more of the small I/O circuits 203 of another of its DPIIC chips 410.

Referring to FIG. 13, for the first or second type of standard commodity logic drive 300 illustrated in FIGS. 11A and 12A or in FIGS. 11B and 12B, one or more of the programmable interconnects 361 of its inter-chip interconnects 371 may couple one or more of the small I/O circuits 203 of each of its standard commodity FPGA IC chips 200 to one or more of the small I/O circuits 203 of another of the standard commodity FPGA IC chips 200. One or more of the fixed interconnects 364 of its inter-chip interconnects 371 may couple one or more of the small I/O circuits 203 of each of its standard commodity FPGA IC chips 200 to one or more of the small I/O circuits 203 of another of its standard commodity FPGA IC chips 200.

Referring to FIG. 13, for the first or second type of standard commodity logic drive 300 illustrated in FIGS. 11A and 12A or in FIGS. 11B and 12B, one or more of the programmable interconnects 361 of its inter-chip interconnects 371 may couple one or more of the small I/O circuits 203 of the dedicated control and I/O chip 260 in the block 360 to one or more of the small I/O circuits 203 of each of the standard commodity FPGA IC chips 200. One more of the fixed interconnects 364 of its inter-chip interconnects 371 may couple one or more of the small I/O circuits 203 of its dedicated control and I/O chip 260 in the block 360 to one or more of the small I/O circuits 203 of each of its standard commodity FPGA IC chips 200. One or more of the programmable interconnects 361 of its inter-chip interconnects 371 may couple one or more of the small I/O circuits 203 of its dedicated control and I/O chip 260 in the block 360 to one or more of the small I/O circuits 203 of each of the DPIIC chips 410. One more of the fixed interconnects 364 of its inter-chip interconnects 371 may couple one or more of the small I/O circuits 203 of the dedicated control and I/O chip 260 in the block 360 to one or more of the small I/O circuits 203 of each of its DPIIC chips 410. One or more of the fixed interconnects 364 of its inter-chip interconnects 371 may couple one or more of the large I/O circuits 341 of the dedicated control and I/O chip 260 in the block 360 to one or more of the large I/O circuits 341 of each of the dedicated I/O chips 265. One or more of the large I/O circuits 341 of its dedicated control and I/O chip 260 in the block 360 may couple to the external circuitry 271 outside the first or second type of standard commodity logic drive 300.

Referring to FIG. 13, for the first or second type of standard commodity logic drive 300 illustrated in FIGS. 11A and 12A or in FIGS. 11B and 12B, one or more of the large I/O circuits 341 of each of its dedicated I/O chips 265 in the block 360 may couple to the external circuitry 271 outside the standard commodity logic drive 300.

(1) Interconnection for Operation

Referring to FIG. 13, for the first or second type of standard commodity logic drive 300 illustrated in FIGS. 11A and 12A or in FIGS. 11B and 12B, each of its standard commodity FPGA IC chips 200 may reload resulting values or first programming codes from its non-volatile memory (NVM) IC chip 250 to the memory cells 490 of said each of its standard commodity FPGA IC chips 200 via one or more of the fixed interconnects 364 of its intra-chip interconnects 502, and thereby the resulting values or first programming codes may be stored or latched in the memory cells 490 of said each of its standard commodity FPGA IC chips 200 to program its programmable logic cells (LC) 2014 as illustrated in FIGS. 6A-6D. 8A and 8B. Said each of its standard commodity FPGA IC chips 200 may reload second programming codes from its non-volatile memory (NVM) IC chip 250 to the memory cells 362 of said each of its standard commodity FPGA IC chips 200 via one or more of the fixed interconnects 364 of its intra-chip interconnects 502, and thereby the second programming codes may be stored or latched in the memory cells 362 of said each of its standard commodity FPGA IC chips 200 to program the pass/no-pass switches 258 or cross-point switches 379 of said each of its standard commodity FPGA IC chips 200 as illustrated in FIGS. 2A-2C, 3A, 3B, 7, 8A and 8B. Said each of its DPIIC chips 410 may reload third programming codes from its non-volatile memory (NVM) IC chip 250 to the memory cells 362 of said each of its DPIIC chips 410, and thereby the third programming codes may be stored or latched in the memory cells 362 of said each of its DPIIC chips 410 to program the pass/no-pass switches 258 or cross-point switches 379 of said each of its DPIIC chips 410 as illustrated in FIGS. 2A-2C, 3A, 3B, 7 and 9.

Thereby, referring to FIG. 13, one of the dedicated I/O chips 265 of the first or second type of standard commodity logic drive 300 illustrated in FIGS. 11A and 12A or in FIGS. 11B and 12B may have one of its large I/O circuits 341 to drive data from the external circuitry 271 outside the first or second type of standard commodity logic drive 300 to one of its small I/O circuits 203. For said one of the dedicated I/O chips 265, said one of its small I/O circuits 203 may drive the data to a first one of the small I/O circuits 203 of one of the DPIIC chips 410 of the first or second type of standard commodity logic drive 300 via one or more of the programmable interconnects 361 of the inter-chip interconnects 371 of the first or second type of standard commodity logic drive 300. For said one of the dedicated DPIIC chips 410, the first one of its small I/O circuits 203 may drive the data to one of its cross-point switches 379 via a first one of the programmable interconnects 361 of its intra-chip interconnects; said one of its cross-point switches 379 may pass the data from the first one of the programmable interconnects 361 of its intra-chip interconnects to a second one of the programmable interconnects 361 of its intra-chip interconnects to be passed to a second one of its small I/O circuits 203; the second one of its small I/O circuits 203 may drive the data to one of the small I/O circuits 203 of one of the standard commodity FPGA IC chips 200 of the first or second type of standard commodity logic drive 300 via one or more of the programmable interconnects 361 of the inter-chip interconnects 371 of the first or second type of standard commodity logic drive 300. For said one of the standard commodity FPGA IC chips 200, said one of its small I/O circuits 203 may drive the data to one of its cross-point switches 379 through a first group of programmable interconnects 361 of its intra-chip interconnects 502 as seen in FIGS. 2A-2C, 3A, 3B, 7, 8A and 8B; said one of its cross-point switches 379 may pass the data from the first group of programmable interconnects 361 of its intra-chip interconnects 502 to a second group of programmable interconnects 361 of its intra-chip interconnects 502 to be associated with a data input of the first input set of one of its programmable logic cells (LC) 2014 as seen in FIGS. 6A-6D, 8A and 8B.

Referring to FIG. 13, in another aspect, for a first one of the standard commodity FPGA IC chips 200 of the first or second type of standard commodity logic drive 300, one of its programmable logic cells (LC) 2014 as seen in FIGS.

6A-6D. 8A and 8B may have the data output to be passed to one of its cross-point switches 379 via a first group of programmable interconnects 361 of its intra-chip interconnects 502; said one of its cross-point switches 379 may pass the data output of said one of its programmable logic cells (LC) 2014 from the first group of programmable interconnects 361 of its intra-chip interconnects 502 to a second group of programmable interconnects 361 of its intra-chip interconnects 502 to be passed to one of its small I/O circuits 203; said one of its small I/O circuits 203 may drive the data output of said one of its programmable logic cells (LC) 2014 to a first one of the small I/O circuits 203 of one of the DPIIC chips 410 of the first or second type of standard commodity logic drive 300 via one or more of programmable interconnects 361 of the inter-chip interconnects 371 of the first or second type of standard commodity logic drive 300. For said one of the DPIIC chips 410, the first one of its small I/O circuits 203 may drive the data output of said one of its programmable logic cells (LC) 2014 to one of its cross-point switches 379 via a first group of programmable interconnects 361 of its intra-chip interconnects; said one of its cross-point switches 379 may pass the data output of said one of its programmable logic cells (LC) 2014 from the first group of programmable interconnects 361 of its intra-chip interconnects to a second group of programmable interconnects 361 of its intra-chip interconnects to be passed to a second one of its small I/O circuits 203; the second one of its small I/O circuits 203 may drive the data output of said one of its programmable logic cells (LC) 2014 to one of the small I/O circuits 203 of a second one of the standard commodity FPGA IC chips 200 of the first or second type of standard commodity logic drive 300 via one or more of the programmable interconnects 361 of the inter-chip interconnects 371 of the first or second type of standard commodity logic drive 300. For the second one of the FPGA IC chips 200, said one of its small I/O circuits 203 may drive the data output of said one of its programmable logic cells (LC) 2014 to one of its cross-point switches 379 through a first group of programmable interconnects 361 of its intra-chip interconnects 502; said one of its cross-point switches 379 may pass the data output of said one of its programmable logic cells (LC) 2014 from the first group of programmable interconnects 361 of its intra-chip interconnects 502 to a second group of programmable interconnects 361 of its intra-chip interconnects 502 to be associated with a data input of the input data set of one of its programmable logic cells (LC) 2014 as seen in FIGS. 6A-6D, 8A and 8B.

Referring to FIG. 13, in another aspect, for one of the standard commodity FPGA IC chips 200 of the first or second type of standard commodity logic drive 300, one of its programmable logic cells (LC) 2014 as seen in FIGS. 6A-6D, 8A and 8B may have a data output to be passed to one of its cross-point switches 379 via a first group of programmable interconnects 361 of its intra-chip interconnects 502; said one of its cross-point switches 379 may pass the data output of said one of its programmable logic cells (LC) 2014 from the first group of programmable interconnects 361 of its intra-chip interconnects 502 to a second group of programmable interconnects 361 of its intra-chip interconnects 502 to be passed to one of its small I/O circuits 203; said one of its small I/O circuits 203 may drive the data output of said one of its programmable logic cells (LC) 2014 to a first one of the small I/O circuits 203 of one of the DPIIC chips 410 of the standard commodity FPGA IC chips 200 via one or more of the programmable interconnects 361 of the inter-chip interconnects 371 of the standard commodity FPGA IC chips 200. For said one of the DPIIC chips 410, the first one of its small I/O circuits 203 may drive the data output of said one of its programmable logic cells (LC) 2014 to one of its cross-point switches 379 via a first group of programmable interconnects 361 of its intra-chip interconnects; said one of its cross-point switches 379 may pass the data output of said one of its programmable logic cells (LC) 2014 from the first group of programmable interconnects 361 of its intra-chip interconnects to a second group of programmable interconnects 361 of its intra-chip interconnects to be passed to a second one of its small I/O circuits 203; the second one of its small I/O circuits 203 may drive the data output of said one of its programmable logic cells (LC) 2014 to one of the small I/O circuits 203 of one of the dedicated I/O chips 265 of the standard commodity FPGA IC chips 200 via one or more of programmable interconnects 361 of the inter-chip interconnects 371 of the standard commodity FPGA IC chips 200. For said one of the dedicated I/O chips 265, said one of its small I/O circuits 203 may drive the data output of said one of its programmable logic cells (LC) 2014 to one of its large I/O circuits 341 to be passed to the external circuitry 271 outside the first or second type of standard commodity logic drive 300.

(3) Accessibility

Referring to FIG. 13, the external circuitry 271 outside the first or second type of standard commodity logic drive 300 may not be allowed to reload the resulting values and first, second and third programming codes from any of the NVM IC chips 250 of the first or second type of standard commodity logic drive 300. Alternatively, the external circuitry 271 outside the first or second type of standard commodity logic drive 300 may be allowed to reload the resulting values and first, second and third programming codes from one or more of the NVM IC chips 250 of the first or second type of standard commodity logic drive 300.

Figure 14:
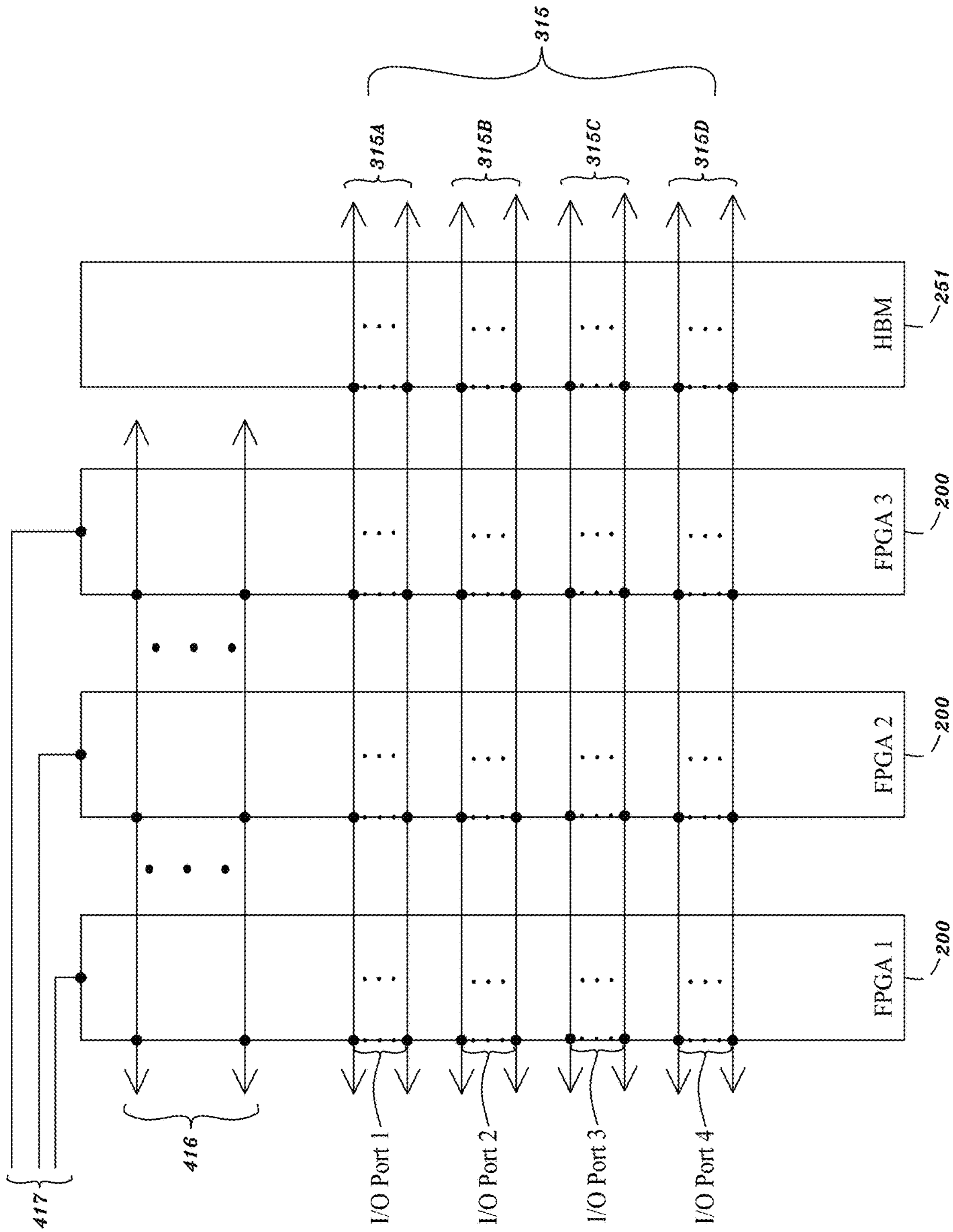
FIG. 14 is a block diagram illustrating multiple control buses for one or more standard commodity FPGA IC chips and multiple data buses for an expandable logic scheme based on one or more standard commodity FPGA IC chips and high bandwidth memory (HBM) IC chips in accordance with an embodiment the present application.

Data and Control Buses for Expandable Logic Scheme Based on Standard Commodity FPGA IC Chips and/or High Bandwidth Memory (HBM) IC Chips FIG. 14 is a block diagram illustrating multiple control buses for one or more standard commodity FPGA IC chips and multiple data buses for an expandable logic scheme based on one or more standard commodity FPGA IC chips and high bandwidth memory (HBM) IC chips in accordance with an embodiment of the present application. Referring to FIG. 14, the second type of standard commodity logic drive 300 as seen in FIGS. 11B and 12B may be provided with multiple control buses 416 each constructed from multiple of the programmable interconnects 361 of its inter-chip interconnects 371 or multiple of the fixed interconnects 364 of its inter-chip interconnects 371.

For example, in the arrangement as illustrated in FIGS. 8A and 8B, for the second type of standard commodity logic drive 300 as seen in FIGS. 11B and 12B, one of its control buses 416 may couple the IS1 pads 231 of all of its standard commodity FPGA IC chips 200 to each other or one another. Another of its control buses 416 may couple the IS2 pads 231 of all of its standard commodity FPGA IC chips 200 to each other or one another. Another of its control buses 416 may couple the IS3 pads 231 of all of its standard commodity FPGA IC chips 200 to each other or one another. Another of its control buses 416 may couple the IS4 pads 231 of all of its standard commodity FPGA IC chips 200 to each other or one another. Another of its control buses 416 may couple the OS1 pads 232 of all of its standard commodity FPGA IC chips 200 to each other or one another. Another of its control buses 416 may couple the OS2 pads 232 of all of its standard commodity FPGA IC chips 200 to each other or one another. Another of its control buses 416 may couple the OS3 pads

232 of all of its standard commodity FPGA IC chips 200 to each other or one another. Another of its control buses 416 may couple the OS4 pads 232 of all of its standard commodity FPGA IC chips 200 to each other or one another.

Referring to FIG. 14, the standard commodity logic drive 300 as seen in FIGS. 11B and 12B may be provided with multiple chip-enable (CE) lines 417 each constructed from one or more of the programmable interconnects 361 of its inter-chip interconnects 371 or one or more of the fixed interconnects 364 of its inter-chip interconnects 371 to couple to the chip-enable (CE) pad 209 of one of its standard commodity FPGA IC chips 200 as seen in FIGS. 8A and 8B.

Furthermore, referring to FIG. 14, the second type of standard commodity logic drive 300 as seen in FIGS. 11B and 12B may be provided with a set of data buses 315 for use in an expandable interconnection scheme. In this case, for the second type of standard commodity logic drive 300, the set of its data buses 315 may include four data bus subsets or data buses, e.g., 315A, 315B, 315C and 315D, each coupling to or being associated with one of the I/O ports 377, e.g., I/O Port 1, I/O Port 2, I/O Port 3 and I/O Port 4, of each of its standard commodity FPGA IC chips 200 as seen in FIGS. 8A and 8B and one of multiple I/O ports of each of its high bandwidth memory (HBM) IC chips 251, that is, the data bus 315A couples to and is associated with one of the I/O ports 377, e.g., I/O Port 1, of each of its standard commodity FPGA IC chips 200 and a first one of the I/O ports of each of its high bandwidth memory (HBM) IC chips 251: the data bus 315B couples to and is associated with one of the I/O ports 377, e.g., I/O Port 2, of each of its standard commodity FPGA IC chips 200 and a second one of the I/O ports of each of its high bandwidth memory (HBM) IC chips 251; the data bus 315C couples to and is associated with one of the I/O ports 377, e.g., I/O Port 3, of each of its standard commodity FPGA IC chips 200 and a third one of the I/O ports of each of its high bandwidth memory (HBM) IC chips 251; and the data bus 315D couples to and is associated with one of the I/O ports 377, e.g., I/O Port 4, of each of its standard commodity FPGA IC chips 200 and a fourth one of the I/O ports of each of its high bandwidth memory (HBM) IC chips 251. Each of the four data buses, e.g., 315A, 315B, 315C and 315D, may provide data transmission with bit width ranging from 4 to 256, such as 64 for a case. In this case, for the second type of standard commodity logic drive 300, each of its four data buses, e.g., 315A, 315B, 315C and 315D, may be composed of multiple data paths, having the number of 64 arranged in parallel, coupling respectively to the I/O pads 372, having the number of 64 arranged in parallel, of one of the I/O ports 377, e.g., I/O Port 1, I/O Port 2, I/O Port 3 and I/O Port 4, of each of its standard commodity FPGA IC chips 200, wherein each of the data paths of said each of its four data buses, e.g., 315A, 315B, 315C and 315D, may be constructed from multiple of the programmable interconnects 361 of its inter-chip interconnects 371 or multiple of the fixed interconnects 364 of its inter-chip interconnects 371.

Furthermore, referring to FIG. 14, for the second type of standard commodity logic drive 300 as illustrated in FIGS. 11B and 12B, each of its data buses 315 may pass data for each of its standard commodity FPGA IC chips 200 and each of its high bandwidth memory (HBM) IC chips 251 (only one is shown in FIG. 14). For example, in a fifth clock cycle, for the second type of standard commodity logic drive 300, a first one of its standard commodity FPGA IC chips 200 may be selected in accordance with a logic level at the chip-enable pad 209 of the first one of its standard commodity FPGA IC chips 200 to be enabled to pass data for the input operation of the first one of its standard commodity FPGA IC chips 200, and a second one of its standard commodity FPGA IC chips 200 may be selected in accordance with a logic level at the chip-enable pad 209 of the second one of its standard commodity FPGA IC chips 200 to be enabled to pass data for the output operation of the second one of its standard commodity FPGA IC chips 200. In the arrangement as illustrated in FIGS. 8A and 8B, for the first one of the standard commodity FPGA IC chips 200 of the second type of standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads: for the second one of its standard commodity FPGA IC chips 200, the same I/O port, e.g. I/O Port 1, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads. Thereby, in the arrangement as illustrated in FIGS. 8A and 8B, in the fifth clock cycle, for the second type of standard commodity logic drive 300, the selected I/O port, e.g., I/O Port 1, of the second one of its standard commodity FPGA IC chips 200 may have the small drivers 374 to drive or pass first data associated with the data output of one of the programmable logic cells (LC) 2014 of the second one of its standard commodity FPGA IC chips 200, for example, to a first one, e.g., 315A, of its data buses 315 and the small receivers 375 of the selected I/O port, e.g., I/O Port 1, of the first one of its standard commodity FPGA IC chips 200 may receive the first data to be associated with a data input of the input data set of one of the programmable logic cells (LC) 2014 of the first one of its standard commodity FPGA IC chips 200, for example, from the first one, e.g., 315A, of its data buses 315. The first one, e.g., 315A, of its data buses 315 may have the data paths each coupling the small driver 374 of one of the small I/O circuits 203 of the selected I/O port, e.g., I/O Port 1, of the second one of its standard commodity FPGA IC chips 200 to the small receiver 375 of one of the small I/O circuits 203 of the selected I/O port, e.g., I/O Port 1, of the first one of its standard commodity FPGA IC chips 200.

Furthermore, referring to FIG. 14, in the fifth clock cycle, for the second type of standard commodity logic drive 300 as seen in FIGS. 11B and 12B, a third one of its standard commodity FPGA IC chips 200 may be selected in accordance with a logic level at the chip-enable pad 209 of the third one of its standard commodity FPGA IC chips 200 to be enabled to pass data for the input operation of the third one of its standard commodity FPGA IC chips 200. In the arrangement as illustrated in FIGS. 8A and 8B, for the third one of the standard commodity FPGA IC chips 200 of the second type of standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby, in the arrangement as illustrated in FIGS. 8A and 8B, in the fifth clock cycle, for the second type of standard commodity logic drive 300, the small receivers 375 of the selected I/O port, e.g., I/O Port 1, of the third one of its standard commodity FPGA IC chips 200 may receive the first data to be associated with a data input of the input data set of one of the programmable logic cells (LC) 2014 of the third one of its standard commodity FPGA IC chips 200, for example, from the first one, e.g., 315A, of its data buses 315. The first one, e.g., 315A, of its data buses 315 may have the data paths each coupling to the small receiver 375 of one of the small I/O circuits 203 of the selected I/O port, e.g., I/O Port 1, of the third one of its standard commodity FPGA IC chips 200. For the others of the standard commodity FPGA IC chips 200 of the second type of standard commodity logic drive 300, the small driver and receiver 374 and 375 of each of the small I/O circuits 203 of their I/O ports 377, e.g. I/O Port 1, coupling to the first one, e.g., 315A, of its data buses 315 may be disabled and inhibited. For all of the high bandwidth memory (HBM) IC chips 251 of the second type of standard commodity logic drive 300, the small driver and receiver 374 and 375 of each of the small I/O circuits 203 of their I/O ports, e.g. first I/O Port, coupling to the first one, e.g., 315A, of the data buses 315 of the second type of standard commodity logic drive 300 may be disabled and inhibited.

Furthermore, referring to FIG. 14, in the fifth clock cycle, in the arrangement as illustrated in FIGS. 8A and 8B, for the first one of the standard commodity FPGA IC chips 200 of the second type of standard commodity logic drive 300 as seen in FIGS. 11B and 12B, an I/O port, e.g. I/O Port 2, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 2, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 2, in accordance with logic levels at its input-selection (IS) pads 231, e.g., IS1, IS2, IS3 and IS4 pads: for the second one of its standard commodity FPGA IC chips 200, the same I/O port, e.g. I/O Port 2, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 2, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 2, in accordance with logic levels at its output-selection (OS) pads 232, e.g., OS1, OS2, OS3 and OS4 pads. Thereby; in the arrangement as illustrated in FIGS. 8A and 8B, in the fifth clock cycle, for the second type of standard commodity logic drive 300, the selected I/O port, e.g., I/O Port 2, of the first one of its standard commodity FPGA IC chips 200 may have the small drivers 374 to drive or pass additional data associated with the data output of said one of the programmable logic cells (LC) 2014 of the first one of its standard commodity FPGA IC chips 200, for example, to a second one, e.g., 315B, of its data buses 315 and the small receivers 375 of the selected I/O port, e.g., I/O Port 2, of the second one of its standard commodity FPGA IC chips 200 may receive the additional data to be associated with a data input of the input data set of said one of the programmable logic cells (LC) 2014 of the second one of its standard commodity FPGA IC chips 200, for example, from the second one, e.g., 315B, of its data buses 315. The second one, e.g., 315B, of its data buses 315 may have the data paths each coupling the small driver 374 of one of the small I/O circuits 203 of the selected I/O port, e.g., I/O Port 2, of the first one of its standard commodity FPGA IC chips 200 to the small receiver 375 of one of the small I/O circuits 203 of the selected I/O port, e.g., I/O Port 2, of the second one of its standard commodity FPGA IC chips 200. For example, said one of the programmable logic cells (LC) 2014 of the first one of its standard commodity FPGA IC chips 200 may be programmed to perform logic operation for multiplication.

Further, referring to FIG. 14, in a sixth clock cycle, for the second type of standard commodity logic drive 300 as seen in FIGS. 11B and 12B, the first one of its standard commodity FPGA IC chips 200 may be selected in accordance with the logic level at the chip-enable pad 209 of the first one of its standard commodity FPGA IC chips 200 to be enabled to pass data for the input operation of the first one of its standard commodity FPGA IC chips 200. In the arrangement as illustrated in FIGS. 8A and 8B, for the first one of the standard commodity FPGA IC chips 200 of the second type of standard commodity logic drive 300, the I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Further, in the sixth clock cycle, for the second type of standard commodity logic drive 300, a first one of its high bandwidth memory (HBM) IC chips 251 may be selected to be enabled to pass data for an output operation of the first one of its high bandwidth memory (HBM) IC chips 251. For the first one of the high bandwidth memory (HBM) IC chips 251 of the second type of standard commodity logic drive 300, its first I/O port may be selected from its I/O ports, e.g., first, second, third and fourth I/O ports, to enable the small drivers 374 of the small I/O circuits 203 of its selected I/O port, e.g. first I/O Port, in accordance with logic levels at its I/O-port selection pads, and to inhibit the small receivers 375 of the small I/O circuits 203 of its selected I/O port, e.g·first I/O Port, in accordance with logic levels at its I/O-port selection pads. Thereby: in the arrangement as illustrated in FIGS. 8A and 8B, in the sixth clock cycle, for the second type of standard commodity logic drive 300, the selected I/O port, e.g., first I/O Port, of the first one of its high bandwidth memory (HBM) IC chips 251 may have the small drivers 374 to drive or pass second data to the first one, e.g., 315A, of its data buses 315 and the small receivers 375 of the selected I/O port, e.g., I/O Port 1, of the first one of its standard commodity FPGA IC chips 200 may receive the second data to be associated with a data input of the input data set of said one of the programmable logic cells (LC) 2014 of the first one of its standard commodity FPGA IC chips 200, for example, from the first one, e.g., 315A, of its data buses 315. The first one, e.g., 315A, of its data buses 315 may have the data paths each coupling the small driver 374 of one of the small I/O circuits 203 of the selected I/O port, e.g., first I/O port, of the first one of its high bandwidth memory (HBM) IC chips 251 to the small receiver 375 of one of the small I/O circuits 203 of the selected I/O port, e.g., I/O Port 1, of the first one of its standard commodity FPGA IC chips 200.

Furthermore, referring to FIG. 14, in the sixth clock cycle, for the second type of standard commodity logic drive 300, the second one of its standard commodity FPGA IC chips 200 may be selected in accordance with a logic level at the chip-enable pad 209 of the second one of its standard commodity FPGA IC chips 200 to be enabled to pass data for the input operation of the third one of its standard commodity FPGA IC chips 200. In the arrangement as illustrated in FIGS. 8A and 8B, for the second one of the standard commodity FPGA IC chips 200 of the second type of standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby, in the arrangement as illustrated in FIGS. 8A and 8B, in the sixth clock cycle, for the second type of standard commodity logic drive 300, the small receivers 375 of the selected I/O port, e.g., I/O Port 1, of the second one of its standard commodity FPGA IC chips 200 may receive the second data to be associated with a data input of the input data set of said one of the programmable logic cells (LC) 2014 of the second one of its standard commodity FPGA IC chips 200, for example, from the first one, e.g., 315A, of its data buses 315. The first one, e.g., 315A, of its data buses 315 may have the data paths each coupling to the small receiver 375 of one of the small I/O circuits 203 of the selected I/O port, e.g., I/O Port 1, of the second one of its standard commodity FPGA IC chips 200. For the others of the standard commodity FPGA IC chips 200 of the second type of standard commodity logic drive 300, the small driver and receiver 374 and 375 of each of the small I/O circuits 203 of their I/O ports 377, e.g. I/O Port 1, coupling to the first one, e.g., 315A, of the data buses 315 of the second type of standard commodity logic drive 300 may be disabled and inhibited. For the others of the high bandwidth memory (HBM) IC chips 251 of the second type of standard commodity logic drive 300, the small driver and receiver 374 and 375 of each of the small I/O circuits 203 of their I/O ports, e.g. first I/O Port, coupling to the first one, e.g., 315A, of the data buses 315 of the second type of standard commodity logic drive 300 may be disabled and inhibited.

Further, referring to FIG. 14, in a seventh clock cycle, for the second type of standard commodity logic drive 300 as seen in FIGS. 11B and 12B, the first one of its standard commodity FPGA IC chips 200 may be selected in accordance with a logic level at the chip-enable pad 209 of the first one of its standard commodity FPGA IC chips 200 to be enabled to pass data for the output operation of the first one of its standard commodity FPGA IC chips 200. In the arrangement as illustrated in FIGS. 8A and 8B, for the first one of the standard commodity FPGA IC chips 200 of the second type of standard commodity logic drive 300, the I/O port, e.g. I/O Port 1, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads. Further, in the seventh clock cycle, for the second type of standard commodity logic drive 300, the first one of its high bandwidth memory (HBM) IC chips 251 may be selected to be enabled to pass data for an input operation of the first one of its high bandwidth memory (HBM) IC chips 251. For the first one of the high bandwidth memory (HBM) IC chips 251 of the second type of standard commodity logic drive 300, its first I/O port may be selected from its I/O ports, e.g., first, second, third and fourth I/O ports, to activate the small receivers 375 of the small I/O circuits 203 of its selected I/O port, e.g. first I/O Port, in accordance with logic levels at its I/O-port selection pads, and to disable the small drivers 374 of the small I/O circuits 203 of its selected I/O port, e.g. first I/O Port, in accordance with logic levels at its I/O-port selection pads. Thereby, in the arrangement as illustrated in FIGS. 8A and 8B, in the seventh clock cycle, for the second type of standard commodity logic drive 300, the selected I/O port, e.g., first I/O Port, of the first one of its high bandwidth memory (HBM) IC chips 251 may have the small receivers 375 to receive third data from the first one, e.g., 315A, of its data buses 315 and the small drivers 374 of the selected I/O port, e.g., I/O Port 1, of the first one of its standard commodity FPGA IC chips 200 may drive or pass the third data associated with the data output of said one of the programmable logic cells (LC) 2014 of the first one of its standard commodity FPGA IC chips 200, for example, to the first one, e.g., 315A, of its data buses 315. The first one, e.g., 315A, of its data buses 315 may have the data paths each coupling the small driver 374 of one of the small I/O circuits 203 of the selected I/O port, e.g., I/O Port 1, of the first one of its standard commodity FPGA IC chips 200 to the small receiver 375 of one of the small I/O circuits 203 of the selected I/O port, e.g., first I/O port, of the first one of its high bandwidth memory (HBM) IC chips 251.

Furthermore, referring to FIG. 14, in the seventh clock cycle, for the second type of standard commodity logic drive 300 as seen in FIGS. 11B and 12B, the second one of its standard commodity FPGA IC chips 200 may be selected in accordance with a logic level at the chip-enable pad 209 of the second one of its standard commodity FPGA IC chips 200 to be enabled to pass data for the input operation of the second one of its standard commodity FPGA IC chips 200. In the arrangement as illustrated in FIGS. 8A and 8B, for the second one of the standard commodity FPGA IC chips 200 of the second type of standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby; in the arrangement as illustrated in FIGS. 8A and 8B, in the seventh clock cycle, for the second type of standard commodity logic drive 300, the small receivers 375 of the selected I/O port, e.g., I/O Port 1, of the second one of its standard commodity FPGA IC chips 200 may receive the third data to be associated with a data input of the input data set of said one of the programmable logic cells (LC) 2014 of the second one of its standard commodity FPGA IC chips 200, for example, from the first one, e.g., 315A, of its data buses 315. The first one, e.g., 315A, of its data buses 315 may have the data paths each coupling to the small receiver 375 of one of the small I/O circuits 203 of the selected I/O port, e.g., I/O Port 1, of the second one of its standard commodity FPGA IC chips 200. For the others of the standard commodity FPGA IC chips 200 of the second type of standard commodity logic drive 300, the small driver and receiver 374 and 375 of each of the small I/O circuits 203 of their I/O ports 377, e.g. I/O Port 1, coupling to the first one, e.g., 315A, of its data buses 315 may be disabled and inhibited. For the others of the high bandwidth memory (HBM) IC chips 251 of the second type of standard commodity logic drive 300, the small driver and receiver 374 and 375 of each of the small I/O circuits 203 of their I/O ports, e.g. first I/O Port, coupling to the first one, e.g., 315A, of the data buses 315 of the second type of standard commodity logic drive 300 may be disabled and inhibited.

Further, referring to FIG. 14, in an eighth clock cycle, for the second type of standard commodity logic drive 300 as seen in FIGS. 11B and 12B, the first one of its high bandwidth memory (HBM) IC chips 251 may be selected to be enabled to pass data for an input operation of the first one of its high bandwidth memory (HBM) IC chips 251. For the first one of the high bandwidth memory (HBM) IC chips 251 of the second type of standard commodity logic drive 300, its first I/O port may be selected from its I/O ports, e.g., first, second, third and fourth I/O ports, to activate the small receivers 375 of the small I/O circuits 203 of its selected I/O port, e.g. first I/O Port, in accordance with logic levels at its I/O-port selection pads, and to disable the small drivers 374 of the small I/O circuits 203 of its selected I/O port, e.g. first I/O Port, in accordance with logic levels at its I/O-port selection pads. Further, in the eighth clock cycle, for the second type of standard commodity logic drive 300, a second one of its high bandwidth memory (HBM) IC chips 251 may be selected to be enabled to pass data for an output operation of the second one of its high bandwidth memory (HBM) IC chips 251. For the second one of the high bandwidth memory (HBM) IC chips 251 of the second type of standard commodity logic drive 300, its first I/O port may be selected from its I/O ports, e.g., first, second, third and fourth I/O ports, to enable the small drivers 374 of the small I/O circuits 203 of its selected I/O port. e.g. first I/O Port, in accordance with logic levels at its I/O-port selection pads, and to inhibit the small receivers 375 of the small I/O circuits 203 of its selected I/O port, e.g. first I/O Port, in accordance with logic levels at its I/O-port selection pads. Thereby: in the eighth clock cycle, for the second type of standard commodity logic drive 300, the selected I/O port, e.g., first I/O Port, of the first one of its high bandwidth memory (HBM) IC chips 251 may have the small receivers 375 to receive fourth data from the first one, e.g., 315A, of its data buses 315 and the selected I/O port, e.g., first I/O Port, of the second one of its high bandwidth memory (HBM) IC chips 251 may have the small drivers 374 to drive of pass the fourth data to the first one, e.g., 315A, of its data buses 315. The first one, e.g., 315A, of its data buses 315 may have the data paths each coupling the small driver 374 of one of the small I/O circuits 203 of the selected I/O port, e.g., first I/O port, of the second one of its high bandwidth memory (HBM) IC chips 251 to the small receiver 375 of one of the small I/O circuits 203 of the selected I/O port, e.g., first I/O port, of the first one of its high bandwidth memory (HBM) IC chips 251. For all of the standard commodity FPGA IC chips 200 of the second type of standard commodity logic drive 300, the small driver and receiver 374 and 375 of each of the small I/O circuits 203 of their I/O ports 377, e.g. I/O Port 1, coupling to the first one, e.g., 315A, of its data buses 315 may be disabled and inhibited. For the others of the high bandwidth memory (HBM) IC chips 251 of the second type of standard commodity logic drive 300, the small driver and receiver 374 and 375 of each of the small I/O circuits 203 of their I/O ports, e.g. first I/O Port, coupling to the first one, e.g., 315A, of the data buses 315 of the second type of standard commodity logic drive 300 may be disabled and inhibited.

Architecture of Programming and Operation in Standard Commodity FPGA IC Chip

Figure 15:
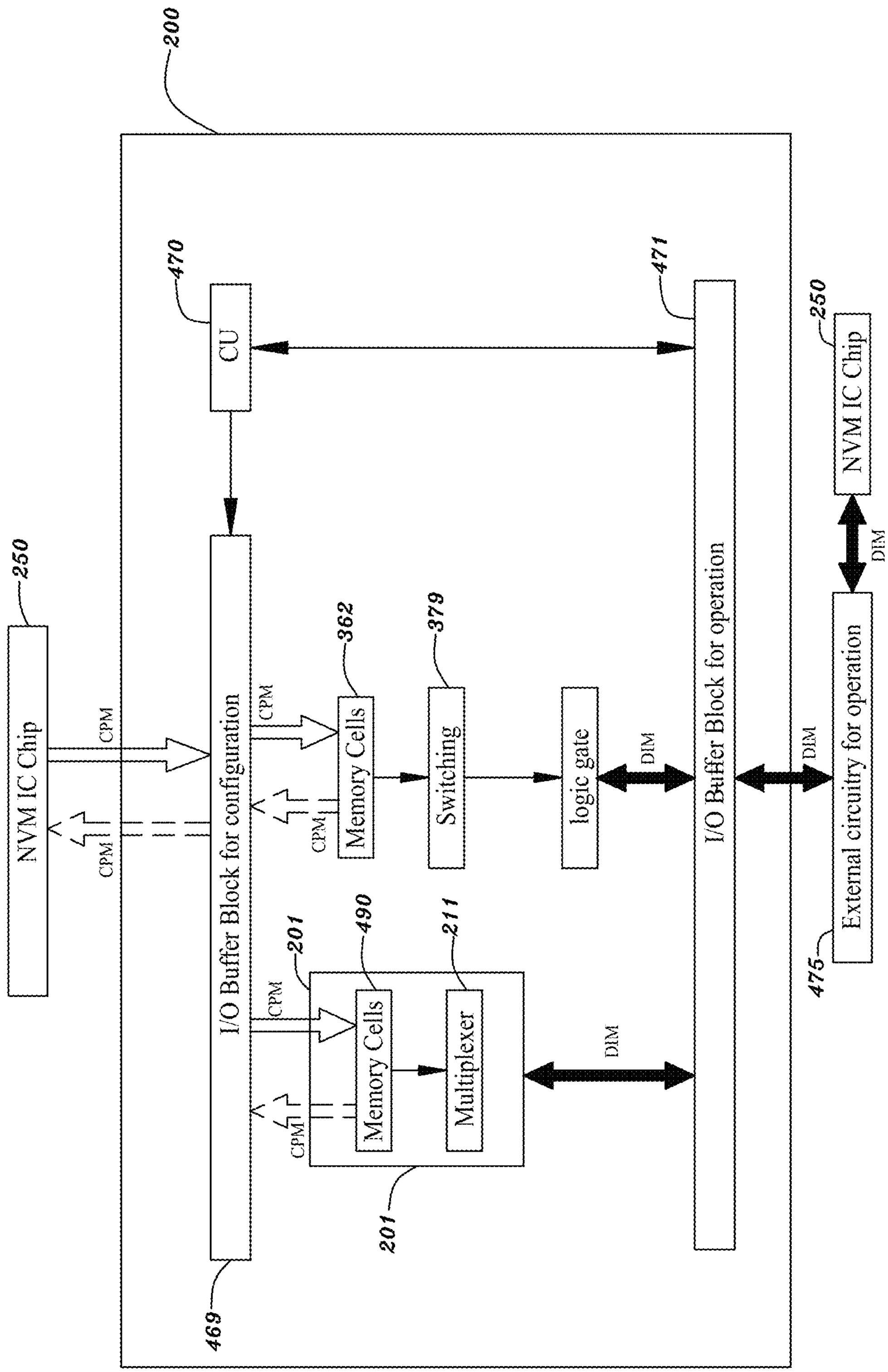
FIG. 15 is a block diagrams showing architecture of programming and operation in a standard commodity FPGA IC chip in accordance with an embodiment of the present application.

FIG. 15 is a block diagrams showing architecture of programming and operation in a standard commodity FPGA IC chip in accordance with an embodiment of the present application. Referring to FIG. 15. one of the non-volatile memory (NVM) IC chips 250 in the first or second type of standard commodity logic drive 300 as illustrated in FIGS. 11A and 12A or in FIGS. 11B and 12B may include three non-volatile memory blocks each composed of multiple non-volatile memory cells arranged in an array. For the first or second type of standard commodity logic drive 300, the non-volatile memory cells, i.e., configuration programming memory (CPM) cells, of a first one of the three non-volatile memory blocks of said one of its non-volatile memory (NVM) IC chips 250 are configured to save or store original resulting values or programming codes of the look-up tables (LUT) 210 as illustrated in FIGS. 6A-6D and original programming codes for the cross-point switches 379 as seen in FIGS. 3A, 3B and 7, i.e., configuration programming memory (CPM) data; the non-volatile memory cells, i.e., configuration programming memory (CPM) cells, of a second one of the three non-volatile memory blocks of said one of its non-volatile memory (NVM) IC chips 250 are configured to save or store immediately-previously self-configured resulting values or programming codes of the look-up tables (LUT) 210 as seen in FIGS. 6A-6D and immediately-previously self-configured programming codes for the cross-point switches 379 as seen in FIGS. 3A, 3B and 7, i.e., configuration programming memory (CPM) data: the non-volatile memory cells, i.e., configuration programming memory (CPM) cells, of a third one of the three non-volatile memory blocks of said one of its non-volatile memory (NVM) IC chips 250 are configured to save or store currently self-configured resulting values or programming codes of the look-up tables (LUT) 210 as seen in FIGS. 6A-6D and currently self-configured programming codes for the cross-point switches 379 as seen in FIGS. 3A, 3B and 7, i.e., configuration programming memory (CPM) data.

Referring to FIG. 15, for the first or second type of standard commodity logic drive 300 as illustrated in FIGS. 11A and 12A or in FIGS. 11B and 12B, the original, immediately-previously self-configured or currently self-configured resulting values or programming codes of the look-up tables (LUT) 210 and the original, immediately-previously self-configured or currently self-configured programming codes for the cross-point switches 379 stored in one of the three non-volatile memory blocks of said one of its non-volatile memory (NVM) IC chips 250 may be passed to the memory cells 490, i.e., configuration programming memory (CPM) cells, of the programmable logic cells (LC) 2014 of its standard commodity FPGA IC chips 200 as illustrated in FIGS. 6A-6D and the memory cells 362, i.e., configuration programming memory (CPM) cells, for the cross-point switches 379 of its standard commodity FPGA IC chips 200 as illustrated in FIGS. 3A, 3B and 7 through multiple of the small I/O circuits 203 of its standard commodity FPGA IC chips 200 as seen in FIG. 5B, which are defined in an I/O buffering block 469 of its standard commodity FPGA IC chips 200, to be stored in the memory cells 490 of the programmable logic cells (LC) 2014 of its standard commodity FPGA IC chips 200 and the memory cells 362 for the cross-point switches 379 of its standard commodity FPGA IC chips 200, and thereby the programmable logic cells (LC) 2014 of its standard commodity FPGA IC chips 200 may be programmed by the original, immediately-previously self-configured or currently self-configured resulting values or programming codes of the look-up tables (LUT) 210 and the cross-point switches 379 of its standard commodity FPGA IC chips 200 may be programmed by the original, immediately-previously self-configured or currently self-configured programming codes for the cross-point switches 379.

Referring to FIG. 15, for the first or second type of standard commodity logic drive 300 as illustrated in FIGS. 11A and 12A or in FIGS. 11B and 12B, multiple data information memory (DIM) cells of circuits 475 external of its standard commodity FPGA IC chips 200, such as SRAM or DRAM cells of one of the HBM IC chips 251 of the second type of standard commodity logic drive 300, may pass a data information memory (DIM) stream to be associated with the first input data set A0 and A1 of the multiplexer 211 of one of the programmable logic cells (LC) 2014 of one of its standard commodity FPGA IC chips 200 through one or more of the small I/O circuits 203 of said one of its standard commodity FPGA IC chips 200 as seen in FIG. 5B, which are defined in an I/O buffering block 471 of said one of its standard commodity FPGA IC chips 200. A data information memory (DIM) cell of circuits 475 external of its standard commodity FPGA IC chips 200, such as SRAM or DRAM cell of said one of the HBM IC chips 251 of the second type of standard commodity logic drive 300, may receive a data information memory (DIM) stream associated with the data output Dout of the multiplexer 211 of said one of the programmable logic cells (LC) 2014 of said one of its standard commodity FPGA IC chips 200 through one or more of the small I/O circuits 203 of said one of its standard commodity FPGA IC chips 200 as seen in FIG. 5B. One of the cross-point switches 379 of said one of its standard commodity FPGA IC chips 200 may pass a data information memory (DIM) stream for a data input of a logic gate or logic operation, such as data input of the input data set D0 and D1 of one of the programmable logic cells (LC) 2014 of said one of its standard commodity FPGA IC chips 200, which is associated with data from a data information memory (DIM) cell of the circuits 475 external of its standard commodity FPGA IC chips 200, such as SRAM or DRAM cell of said one of the HBM IC chips 251 of the second type of standard commodity logic drive 300, through one or more of the small I/O circuits 203 of said one of its standard commodity FPGA IC chips 200 as seen in FIG. 5B. One of the cross-point switches 379 of said one of its standard commodity FPGA IC chips 200 may pass a data information memory (DIM) stream for a data output of a logic gate or logic operation, such as the data output Dout of one of the programmable logic cells (LC) 2014 of said one of its standard commodity FPGA IC chips 200, which is associated with data to a data information memory (DIM) cell of the circuits 475 external of its standard commodity FPGA IC chips 200, such as SRAM or DRAM cell of said one of the HBM IC chips 251 of the second type of standard commodity logic drive 300, through one or more of the small I/O circuits 203 of said one of its standard commodity FPGA IC chips 200 as seen in FIG. 5B.

Referring to FIG. 15, for the first or second type of standard commodity logic drive 300 as illustrated in FIGS. 11A and 12A or in FIGS. 11B and 12B, the data for the data information memory (DIM) stream saved or stored in the SRAM or DRAM cells, i.e., data information memory (DIM) cells, of one of its HBM IC chips 251 may be backed up or stored in one of its NVM IC chips 250 or circuits outside the standard commodity logic drive 300. Thereby, when the standard commodity logic drive 300 is powered off, the data for the data information memory (DIM) stream stored in said one of the NVM IC chips 250 of the standard commodity logic drive 300 may be kept.

For reconfiguration for artificial intelligence (AI), machine learning or deep learning, for each of the standard commodity FPGA IC chips 200 of the first or second type of standard commodity logic drive 300 as illustrated in FIGS. 11A and 12A or in FIGS. 11B and 12B, the current logic operation, such as AND logic operation, of one of its programmable logic cells (LC) 2014 may be self-reconfigured to another logic operation, such as NAND logic operation, by reconfiguring the resulting values or programming codes, i.e., configuration programming memory (CPM) data, in the memory cells 490 of said one of its programmable logic cells (LC) 2014. The current switching state of one of its cross-point switches 379 may be self-reconfigured to another switching state by reconfiguring the programming codes, i.e., configuration programming memory (CPM) data, in the memory cells 362 for said one of its cross-point switches 379. The currently self-reconfigured resulting values or programming codes, i.e., configuration programming memory (CPM) data, in the memory cells 490 of said one of its programmable logic cells (LC) 2014 and in the memory cells 362 for said one of its cross-point switches 379 may be passed to the third one of the three non-volatile memory blocks of said one of the non-volatile memory (NVM) IC chips 250 of the standard commodity logic drive 300 through multiple of its small I/O circuits 203 as seen in FIG. 5B, which are defined in its I/O buffering block 469, to be stored in the non-volatile memory cells, i.e., configuration programming memory (CPM) cells, of the third one of the three non-volatile memory blocks of said one of the non-volatile memory (NVM) IC chips 250 of the standard commodity logic drive 300.

Accordingly: referring to FIG. 15, for the standard commodity logic drive 300, when it is powered on, the currently self-configured configuration programming memory (CPM) data stored or saved in the non-volatile memory cells in the third one of the three non-volatile memory blocks of said one of its non-volatile memory (NVM) IC chips 250 may be reloaded to the memory cells 490 and 362 of its standard commodity FPGA IC chips 200. During operation, its standard commodity FPGA IC chips 200 may be reset to pass the original or immediately-previously self-configured configuration programming memory (CPM) data from the non-volatile memory cells in the first or second one of the three non-volatile memory blocks of said one of its non-volatile memory (NVM) IC chips 250 to the memory cells 490 and 362 of its standard commodity FPGA IC chips 200 to be stored in the memory cells 490 and 362 of its standard commodity FPGA IC chips 200.

Specification for Processes for Fabricating Semiconductor Chip

Figure 16:
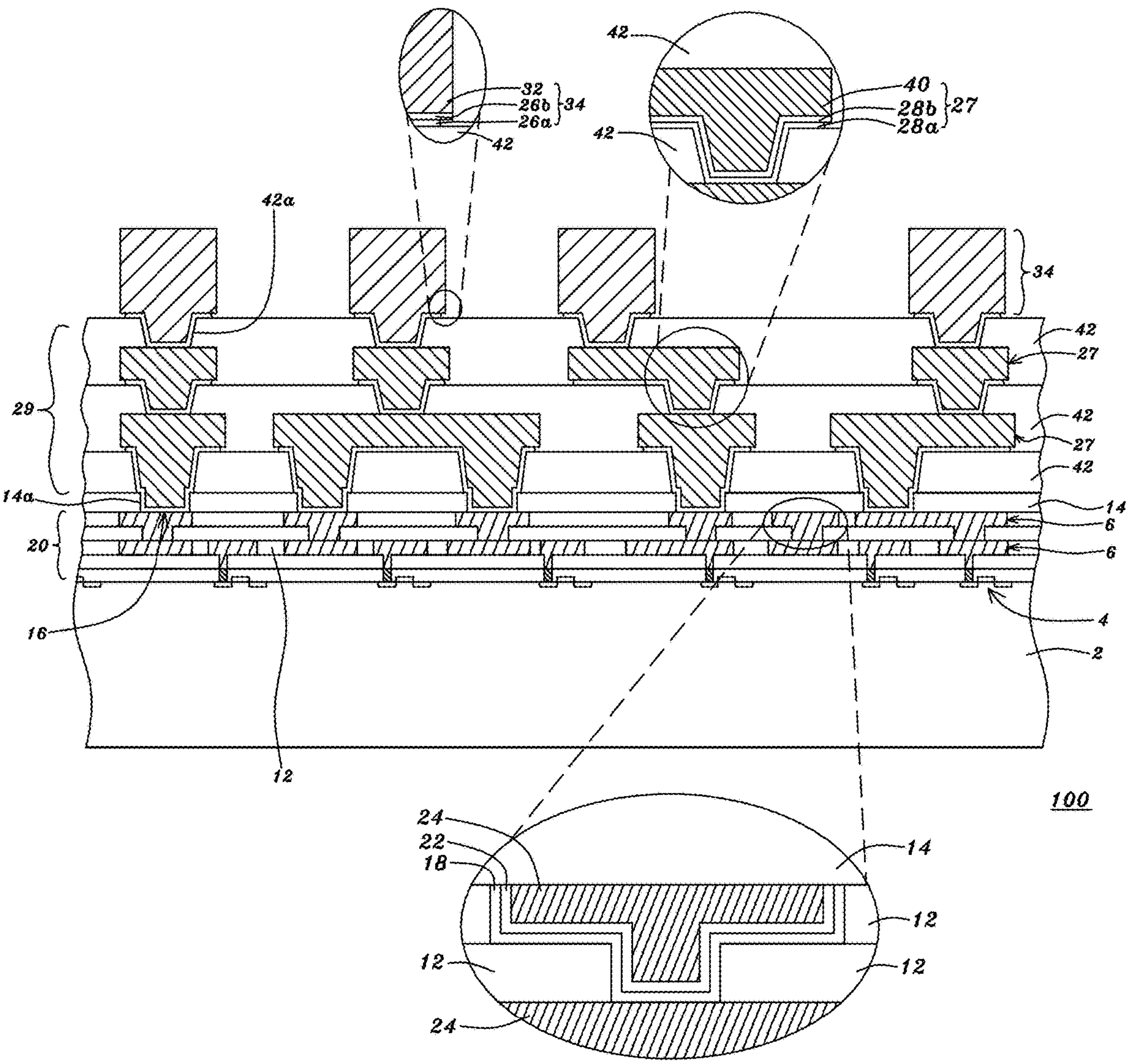
FIG. 16 is a schematically cross-sectional view showing a semiconductor chip in accordance with an embodiment of the present application.

FIG. 16 is a schematically cross-sectional view showing a semiconductor chip in accordance with an embodiment of the present application. Referring to FIG. 16, the standard commodity FPGA IC chips 200. DPIIC chips 410, dedicated control and I/O chips 260 and 265. NVM IC chips 250. IAC chip 402. HBM IC chips 251. GPU chips 269*a* and CPU chip 269*b* as seen in FIGS. 11A, 11B, 12A and 12B may have a structure for the semiconductor chip 100 mentioned as below. The semiconductor chip 100 may include (1) a semiconductor substrate 2, such as silicon substrate. GaAs substrate. SiGe substrate or Silicon-On-Insulator (SOI) substrate; (2) multiple semiconductor devices 4 in or over a semiconductor-device area of the semiconductor substrate 2: (3) a first interconnection scheme for a chip (FISC) 20 over the semiconductor substrate 2, provided with one or more interconnection metal layers 6 coupling to the semiconductor devices 4 and one or more insulating dielectric layers 12 each between neighboring two of the interconnection metal layers 6, wherein each of the one or more interconnection metal layers 6 may have a thickness between 0.1 and 2 micrometers: (4) a passivation layer 14 over the first interconnection scheme for a chip (FISC) 20, wherein the first interconnection scheme for a chip (FISC) 20 has multiple first metal pads at bottoms of multiple openings 14*a* in the passivation layer 14: (5) a second interconnection scheme for a chip (SISC) 29 optionally provided over the passivation layer 14, provided with one or more interconnection metal layers 27 coupling to the first metal pads of the first interconnection scheme for a chip (FISC) 20 through the openings 14*a* and one or more polymer layers 42 each between neighboring two of the interconnection metal layers 27, under a bottommost one of the interconnection metal layers 27 or over a topmost one of the interconnection metal layers 27, wherein the second interconnection scheme for a chip (SISC) 29 has multiple second metal pads at bottoms of multiple openings 42*a* in the topmost one of its polymer layers 42, wherein each of the interconnection metal layers 27 may have a thicknesses between 3 and 5 micrometers; and (6) multiple micro-bumps or micro-pillars 34 on the second metal pads of the second interconnection scheme for a chip (SISC) 29 or, if the SISC 29 is not provided, on the first metal pads of the first interconnection scheme for a chip (FISC) 20.

Referring to FIG. 16, the semiconductor devices 4 may include a memory cell, a logic circuit, a passive device, such as resistor, capacitor, inductor or filter, or an active device, such as p-channel and/or n-channel MOS devices. The semiconductor devices 4 may compose the multiplexer 211 of the programmable logic cells (LC) 2014, the memory cells 490 of the programmable logic cells (LC) 2014, the memory cells 362 for the cross-point switches 379 and the small I/O circuits 203, as illustrated in FIGS. 1A-8B, for each of the standard commodity FPGA IC chips 200 of the first or second type of standard commodity logic drive 300 as seen in FIGS. 11A and 12A or in FIGS. 11B and 12B. The semiconductor devices 4 may compose the memory cells 362 for the cross-point switches 379 and small I/O circuits 203, as illustrated in FIGS. 1A-5B. 7 and 9, for each of the DPIIC chips 410 of the first or second type of standard commodity logic drive 300 as seen in FIGS. 11A and 12A or in FIGS. 11B and 12B. The semiconductor devices 4 may compose the large and small I/O circuits 341 and 203, as illustrated in FIGS. 5A and 5B, for each of the dedicated I/O chips 265 of the first or second type of standard commodity logic drive 300 as seen in FIGS. 11A and 12A or in FIGS. 11B and 12B.

Referring to FIG. 16, each of the interconnection metal layers 6 of the first interconnection scheme for a chip (FISC) 20 may include (1) a copper layer 24 having lower portions in openings in a lower one of the insulating dielectric layers 12, such as SiOC layers having a thickness of between 3 nm and 500 nm, and upper portions having a thickness of between 3 nm and 500 nm over the lower one of the insulating dielectric layers 12 and in openings in an upper one of the insulating dielectric layers 12. (2) an adhesion layer 18, such as titanium or titanium nitride having a thickness of between 1 nm and 50 nm, at a bottom and sidewall of each of the lower portions of the copper layer 24 and at a bottom and sidewall of each of the upper portions of the copper layer 24, and (3) a seed layer 22, such as copper, between the copper layer 24 and the adhesion layer 18, wherein the copper layer 24 has a top surface substantially coplanar with a top surface of the upper one of the insulating dielectric layers 12. Each of the interconnection metal layers 6 of the first interconnection scheme for a chip (FISC) 20 may be patterned with a metal line or trace having a thickness between 0.1 and 2 micrometers, between 3 nm and 1.000 nm or between 10 nm and 500 nm, or thinner than or equal to 5 nm, 10 nm, 30 nm, 50 nm, 100 nm, 200 nm, 300 nm, 500 nm or 1.000 nm and a width between 3 nm and 1.000 nm or between 10 nm and 500 nm, or narrower than 5 nm, 10 nm, 20 nm, 30 nm, 70 nm, 100 nm, 300 nm, 500 nm or 1.000 nm, for example, Each of the insulating dielectric layers 12 may have a thickness between 0.1 and 2 micrometers, between 3 nm and 1.000 nm or between 10 nm and 500 nm, or thinner than 5 nm, 10 nm, 30 nm. 50 nm, 100 nm, 200 nm, 300 nm, 500 nm or 1.000 nm.

Referring to FIG. 16, the passivation layer 14 containing a silicon-nitride. SiON or SiCN layer having a thickness greater than 0.3 μm for example may protect the semiconductor devices 4 and the interconnection metal layers 6 from being damaged by moisture foreign ion contamination, or from water moisture or contamination form external environment, for example sodium mobile ions. Each of the openings 14*a* in the passivation layer 14 may have a transverse dimension, from a top view, of between 0.5 and 20 μm.

Referring to FIG. 16, each of the interconnection metal layers 27 of the second interconnection scheme for a chip (SISC) 29 may include (1) a copper layer 40 having lower portions in openings in one of the polymer layers 42 having a thickness of between 0.3 μm and 20 μm, and upper portions having a thickness 0.3 μm and 20 μm over said one of the polymer layers 42. (2) an adhesion layer 28*a*, such as titanium or titanium nitride having a thickness of between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*. Each of the interconnection metal layers 27 may be patterned with a metal line or trace having a thickness between, for example, 0.3 μm and 20 μm, 0.5 μm and 10 μm, 1 μm and 5 μm, 1 μm and 10 μm, or 2 μm and 10 μm, or thicker than or equal to 0.3 μm, 0.5 μm, 0.7 μm, 1 μm, 1.5 μm, 2 μm or 3 μm and a width between, for example, 0.3 μm and 20 μm, 0.5 μm and 10 μm, 1 μm and 5 μm, 1 μm and 10 μm, or 2 μm and 10 μm, or wider than or equal to 0.3 μm, 0.5 μm, 0.7 μm, 1 μm, 1.5 μm, 2 μm or 3 μm. Each of the polymer layers 42 may have a thickness between, for example, 0.3 μm and 20 μm, 0.5 μm and 10 μm, 1 μm and 5 μm, or 1 μm and 10 μm, or thicker than or equal to 0.3 μm, 0.5 μm, 0.7 μm, 1 μm, 1.5 μm, 2 μm or 3 μm.

Referring to FIG. 16, each of the micro-bumps or micro-pillars 34 over the second interconnection scheme for a chip (SISC) 29 or first interconnection scheme for a chip (FISC) 20 may be of various types. A first type of micro-bumps or micro-pillars 34 may include, as seen in FIG. 16. (1) an adhesion layer 26*a*, such as titanium (Ti) or titanium nitride (TiN) layer having a thickness of between 1 nm and 50 nm, on the second metal pads of the second interconnection scheme for a chip (SISC) 29 or, if the second interconnection scheme for a chip (SISC) 29 is not provided, on the first metal pads of the first interconnection scheme for a chip (FISC) 20. (2) a seed layer 26*b*, such as copper, on its adhesion layer 26*a* and (3) a copper layer 32 having a thickness of between 1 μm and 60 μm on its seed layer 26*b*.

Alternatively, a second type of micro-bumps or micro-pillars 34 may include the adhesion layer 26*a*, seed layer 26*b* and copper layer 32 as mentioned above, and may further include a tin-containing solder cap made of tin or a tin-silver alloy, which has a thickness of between 1 μm and 50 μm on its copper layer 32.

Figure 20B:
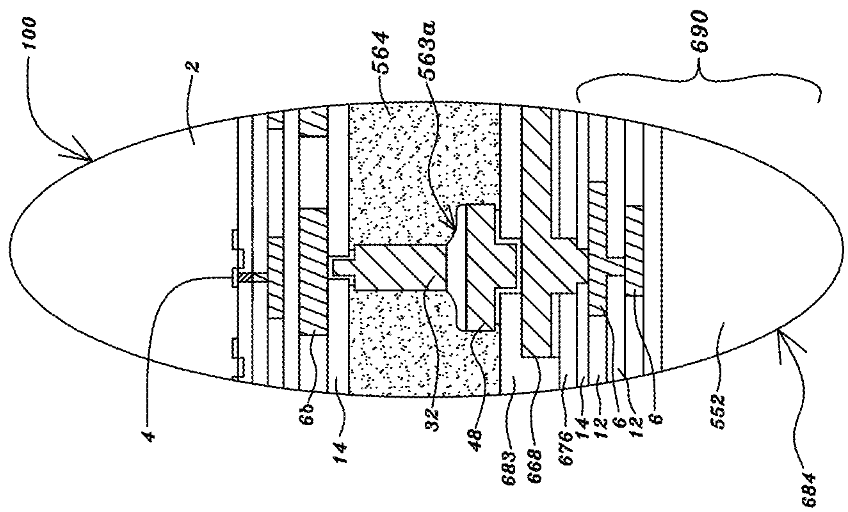
FIGS. 20A and 20B are schematically cross-sectional views showing a process of bonding a relatively-small thermal compression bump of a semiconductor chip to a relatively-small thermal compression pad preformed on an interconnection substrate in accordance with an embodiment of the present application.
Figure 20A:
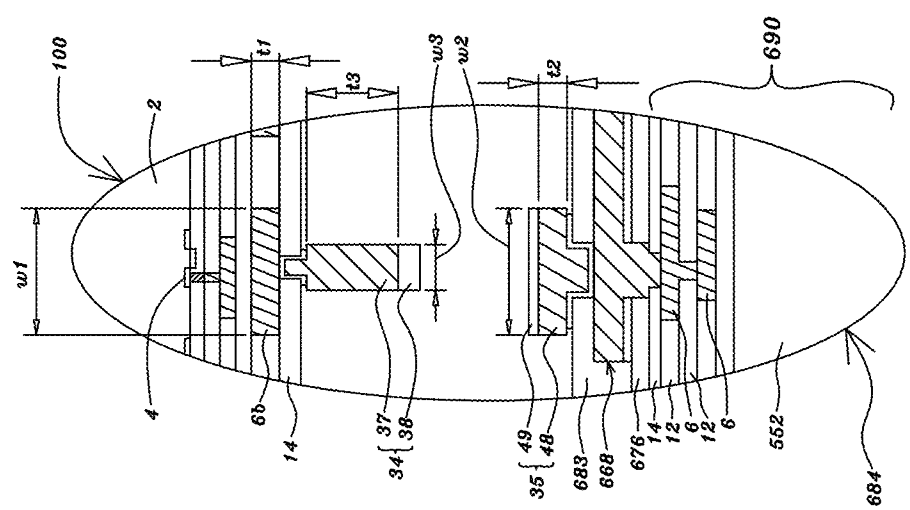

Alternatively, a third type of micro-bumps or micro-pillars 34 may be thermal compression bumps, including the adhesion layer 26*a* and seed layer 26*b* as mentioned above, and may further include, as seen in FIG. 20A, a copper layer 37 having a thickness t3 of between 2 μm and 20 μm, such as 3 μm, and a largest transverse dimension w3, such as diameter in a circular shape, between 1 μm and 15 μm, such as 3 μm, on its seed layer 26*b* and a solder cap 38 made of a tin-silver alloy, a tin-gold alloy, a tin-copper alloy, a tin-indium alloy, indium or tin, which has a thickness of between 1 μm and 15 μm, such as 2 μm, and a largest transverse dimension, such as diameter in a circular shape, between 1 μm and 15 μm, such as 3 μm, on its copper layer 37. The third type of micro-bumps or micro-pillars 34 are formed respectively on multiple metal pads 6*c* provided as seen in FIGS. 20A and 20B by a frontmost one of the interconnection metal layers 27 of the second interconnection scheme for a chip (SISC) 29 or by: if the second interconnection scheme for a chip (SISC) 29 is not provided, a frontmost one of the interconnection metal layers 6 of the first interconnection scheme for a chip (FISC) 20, wherein each of the metal pads 6*c* may have a thickness t1 between 1 and 10 micrometers or between 2 and 10 micrometers and a largest transverse dimension w1, such as diameter in a circular shape, between 1 μm and 15 μm, such as 5 μm. A pitch between neighboring two of the third type of micro-bumps or micro-pillars 34 may be between 3 μm and 20 μm.

Alternatively, a fourth type of micro-bumps or micro-pillars 34 may be thermal compression bumps, including the adhesion layer 26*a* and seed layer 26*b* as mentioned above, and may further include, as seen in FIG. 21A, a copper layer 37 having a thickness t4 of between 2 μm and 20 μm, such as 3 μm, and a largest transverse dimension w4, such as diameter in a circular shape, greater than 25 μm or between 25 μm and 150 μm, on its seed layer 26*b* and a solder cap 38 made of a tin-silver alloy, a tin-gold alloy, a tin-copper alloy, a tin-indium alloy, indium or tin, which has a thickness between 1 μm and 15 μm, such as 2 μm, and a largest transverse dimension, such as diameter in a circular shape, greater than 25 μm or between 25 μm and 150 μm, on its copper layer 37. A space between neighboring two of the fourth type of micro-bumps or micro-pillars 34 may be greater than 25 μm, 30 μm or 50 μm.

Embodiment for Fine-line Interconnection Bridge (FIB)

A fine-line interconnection bridge may be provided with high density interconnects for fan-out of two semiconductor chips bonded over the fine-line interconnection bridge the and interconnection between the two semiconductor chips.

Figure 17A:
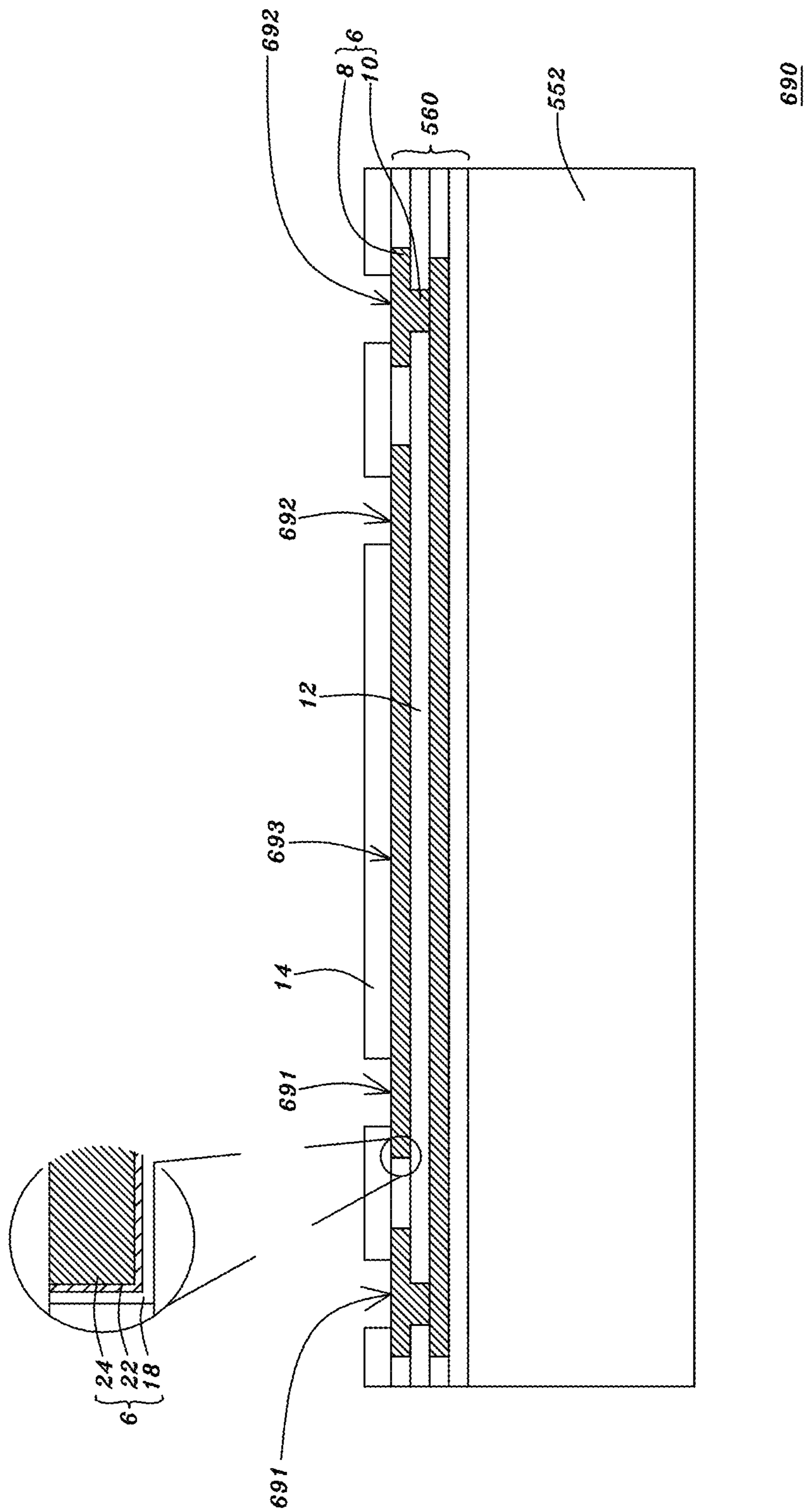
FIGS. 17A-17D are schematically cross-sectional views showing multiple structures of various types of fine-line interconnection bridges in accordance with an embodiment of the present application.
Figure 17B:
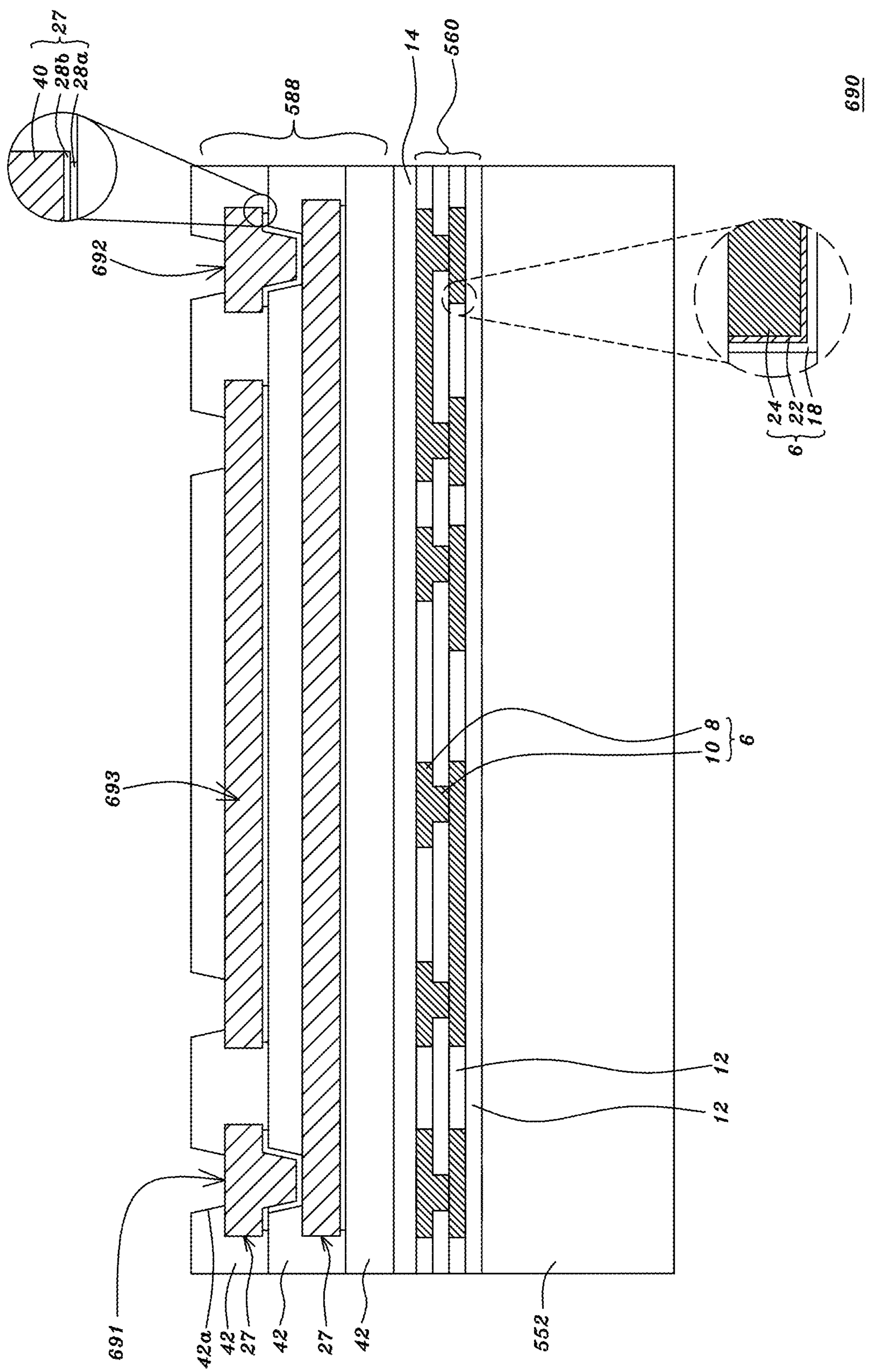
Figure 17C:
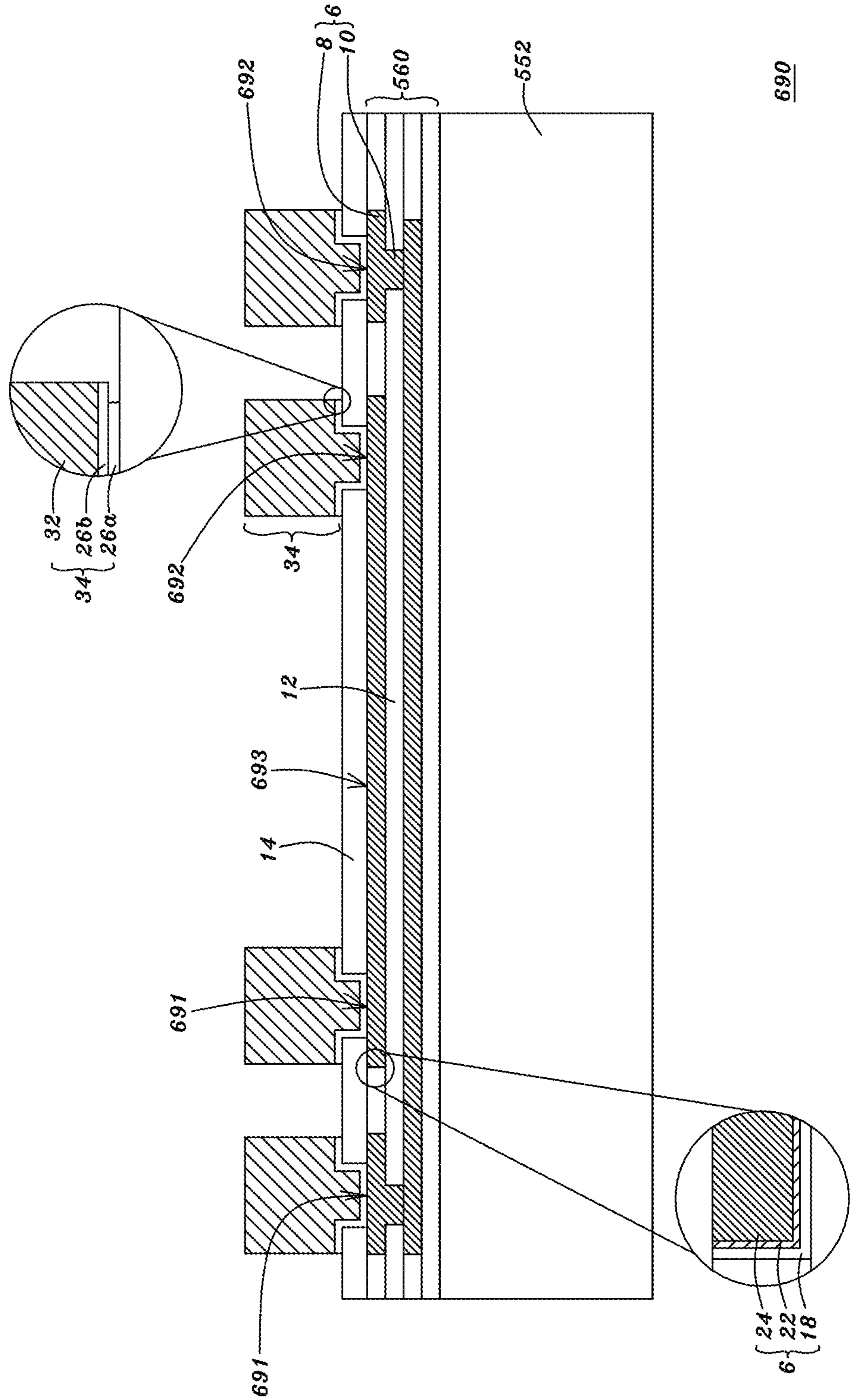
Figure 17D:
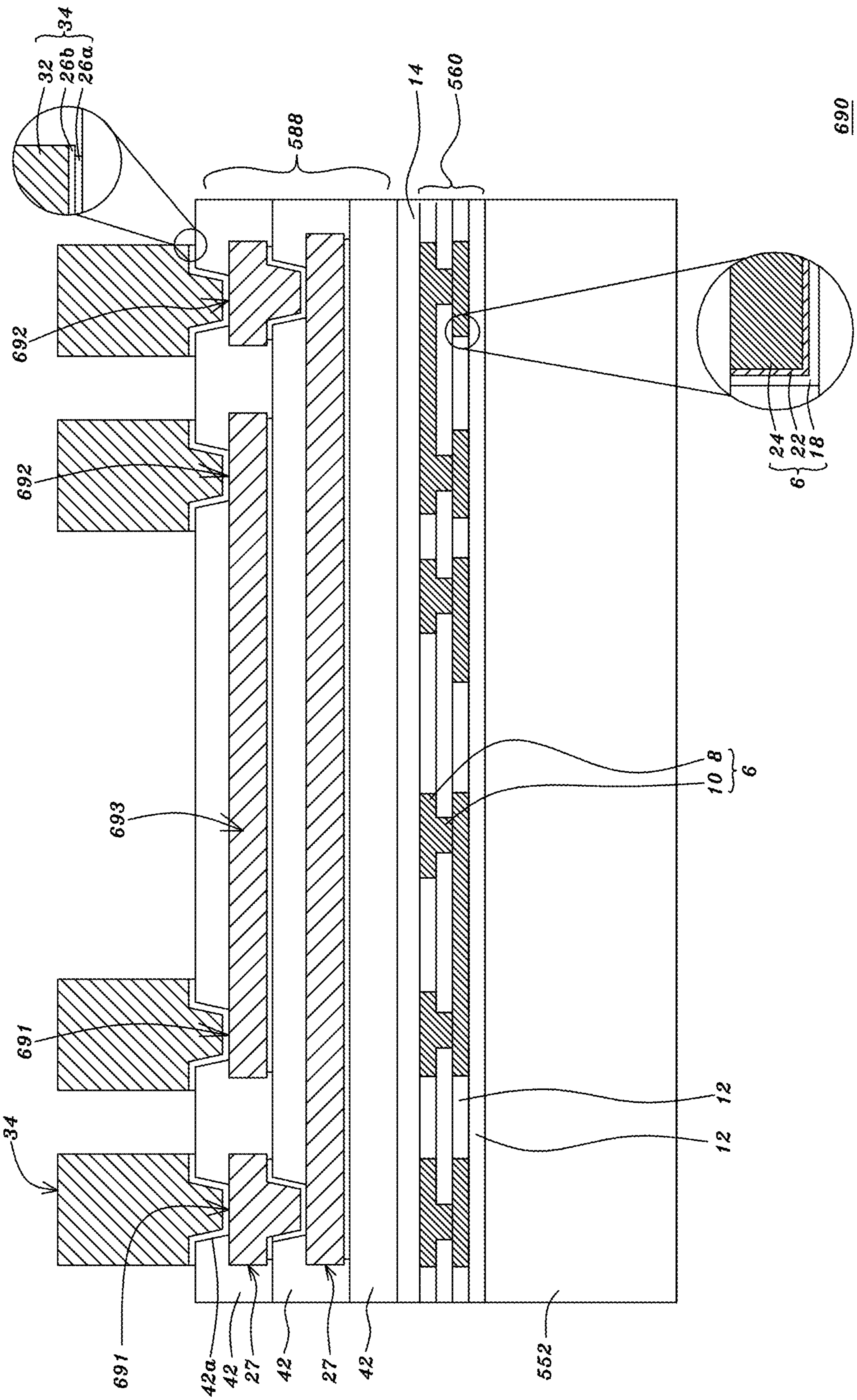

FIG. 17A is a schematically cross-sectional view showing a structure of a first type of fine-line interconnection bridge in accordance with an embodiment of the present application. FIG. 17B is a schematically cross-sectional view showing a structure of a second type of fine-line interconnection bridge in accordance with an embodiment of the present application. FIG. 17C is a schematically cross-sectional view showing a structure of a third type of fine-line interconnection bridge in accordance with an embodiment of the present application. FIG. 17D is a schematically cross-sectional view showing a structure of a fourth type of fine-line interconnection bridge in accordance with an embodiment of the present application.

First Type of Fine-line Interconnection Bridge (FIB)

Referring to FIG. 17A, a first type of fine-line interconnection bridge (FIB) 690 may include (1) a substrate 552 of silicon, metal, ceramics, glass or steel. (2) a first interconnection scheme for an interconnection bridge (FISIB) 560 on its substrate 552, provided with one or more interconnection metal layers 6 and one or more insulating dielectric layers 12 each between neighboring two of its interconnection metal layers 6, wherein an upper one of its interconnection metal layers 6 may couple to a lower one of its interconnection metal layers 6 through an opening in one of its insulating dielectric layers 12 between the upper and lower ones of its interconnection metal layers 6, wherein the bottommost one of its insulating dielectric layers 12 may be between the bottommost one of its interconnection metal layers 6 and the substrate 552, wherein the specification and process for the interconnection metal layers 6 and insulating dielectric layers 12 for its first interconnection scheme for an interconnection bridge (FISIB) 560 may be referred to those for its first interconnection scheme for a chip (FISC) 20 as illustrated in FIG. 16; and (4) a passivation layer 14 over its first interconnection scheme for an interconnection bridge (FISIB) 560, wherein the topmost one of the interconnection metal layers 6 of its first interconnection scheme for an interconnection bridge (FISIB) 560 has multiple metal pads 691 and 692 at bottoms of multiple openings 14*a* in its passivation layer 14, wherein each of the metal pads 691 may couple to one of the metal pads 692 through metal lines or traces 693 provided by its first interconnection scheme for an interconnection bridge (FISIB) 560, wherein the specification and process for its passivation layer 14 over its first interconnection scheme for an interconnection bridge (FISIB) 560 may be referred to those for the passivation layer 14 over the first interconnection scheme for a chip (FISC) 20 as illustrated in FIG. 16.

Referring to FIG. 17A, the first interconnection scheme for an interconnection bridge (FISIB) 560 may comprise 2 to 10 layers or 3 to 6 layers of interconnection metal layers 6 (only two layers are shown) each patterned with multiple metal pads, lines or traces 8 and multiple metal vias 10. The metal pads, lines or traces 8 and metal vias 10 of the first interconnection scheme for an interconnection bridge (FISIB) 560 may be composed for the metal pads 691 and 692 and metal traces or lines 693 used for the programmable and fixed interconnects 361 and 364 of the inter-chip interconnects 371 of the first or second type of standard commodity logic drive 300 as illustrated in FIGS. 11A and 12A or in FIGS. 11B and 12B.

Referring to FIG. 17A, each of the interconnection metal layers 6 of the first interconnection scheme for an interconnection bridge (FISIB) 560 may include (1) a copper layer 24 having lower portions, i.e. metal vias 10, in openings in a lower one of the insulating dielectric layers 12, such as SiOC layers each having a thickness of between 3 nm and 500 nm, and upper portions, i.e., metal pads, traces or lines 8, having a thickness less than 3 μm, such as between 0.2 and 2 μm, over the lower one of the insulating dielectric layers 12 and in openings in an upper one of the insulating dielectric layers 12. (2) an adhesion layer 18, such as titanium or titanium nitride having a thickness of between 1 nm and 50 nm, at a bottom and sidewall of each of the lower portions of the copper layer 24 and at a bottom and sidewall of each of the upper portions of the copper layer 24, and (3) a seed layer 22, such as copper, between the copper layer 24 and the adhesion layer 18, wherein the copper layer 24 has a top surface substantially coplanar with a top surface of the upper one of the insulating dielectric layers 12.

Referring to FIG. 17A, for each of the interconnection metal layers 6 of the first interconnection scheme for an interconnection bridge (FISIB) 560, its metal pads, lines or traces 8 may have a thickness between 3 nm and 500 nm, between 10 nm and 1.000 nm, between 10 nm and 2.000 nm or between 10 nm and 3.000 nm, or thinner than or equal to 10 nm, 30 nm, 50 nm, 100 nm, 200 nm, 300 nm, 500 nm, 1,000 nm, 1.500 nm or 2.000 nm and a width equal to or smaller than 10 nm, 50 nm, 100 nm, 150 nm, 200 nm, 300 nm, 500 nm. 1.000 nm, 1.500 nm or 2.000 nm. A space between neighboring two of its metal pads, lines or traces 8 may be equal to or smaller than 10 nm, 50 nm, 100 nm, 150 nm, 200 nm, 300 nm, 500 nm, 1.000 nm, 1.500 nm or 2.000 nm. Alternatively, a pitch between neighboring two of its metal pads, lines or traces 8 may be equal to or smaller than 20 nm, 100 nm, 200 nm, 300 nm, 400 nm, 600 nm, 1.000 nm, 3.000 nm or 4,000 nm. Each of its insulating dielectric layers 12 may have a thickness, for example, between 3 nm and 500 nm, between 10 nm and 1.000 nm, between 10 nm and 2.000 nm or between 10 nm and 3.000 nm, or thinner than or equal to 10 nm. 30 nm, 50 nm, 100 nm, 200 nm, 300 nm, 500 nm, 1.000 nm or 2.000 nm.

Second Type of Fine-line Interconnection Bridge (FIB)

Referring to FIGS. 17B, a second type of fine-line interconnection bridge (FIB) 690 may have a similar structure as illustrated in FIG. 17A. For an element indicated by the same reference number shown in FIGS. 17A and 17B, the specification of the element as seen in FIG. 17B may be referred to that of the element as illustrated in FIG. 17A. The difference between the first and second types of fine-line interconnection bridges (FIB) 690 is that the second type of fine-line interconnection bridge (FIB) 690 may further include a second interconnection scheme for an interconnection bridge (SISIB) 588 optionally provided over its passivation layer 14, provided with one or more interconnection metal layers 27 coupling to the interconnection metal layers 6 of its first interconnection scheme for an interconnection bridge (FISIB) 560 through the openings 14*a* in its passivation layer 14 and one or more polymer layers 42 each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27, wherein the topmost one of its interconnection metal layers 27 may have multiple metal pads 691 and 692 at bottoms of multiple openings 42*a* in the topmost one of its polymer layers 42, wherein each of the metal pads 691 may couple to one of the metal pads 692 through metal lines or traces 693 provided by its second interconnection scheme for an interconnection bridge (SISIB) 588 and, optionally, its first interconnection scheme for an interconnection bridge (FISIB) 560, wherein the bottommost one of its polymer layers 42 may be between the bottommost one of its interconnection metal layers 27 and its passivation layer 14, wherein the specification and process for the interconnection metal layers 27 and polymer layers 42 for its second interconnection scheme for an interconnection bridge (SISIB) 588 may be referred to those for the second interconnection scheme for a chip (SISC) 29 as illustrated in FIG. 16.

Referring to FIG. 17B, each of the interconnection metal layers 27 of the second interconnection scheme for an interconnection bridge (SISIB) 588 may include (1) a copper layer 40 having lower portions in openings in one of the polymer layers 42 having a thickness between 0.3 μm and 20 μm, and upper portions having a thickness 0.3 μm and 20 μm over said one of the polymer layers 42. (2) an adhesion layer 28*a*, such as titanium or titanium nitride having a thickness between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*.

Referring to FIG. 17B, for the second interconnection scheme for an interconnection bridge (SISIB) 588, each of its interconnection metal layers 27 may have multiple metal lines or traces with a thickness between, for example, 0.3 μm and 20 μm, 0.5 μm and 10 μm, 1 μm and 5 μm, 1 μm and 10 μm or 2 μm and 10 μm, or thicker than or equal to 0.3 μm, 0.5 μm, 0.7 μm, 1 μm, 1.5 μm, 2 μm or 3 μm, and a width between, for example, 0.3 μm and 20 μm, 0.5 μm and 10 μm, 1 μm and 5 μm, 1 μm and 10 μm or 2 μm and 10 μm, or wider than or equal to 0.3 μm, 0.5 μm, 0.7 μm, 1 μm, 1.5 μm, 2 μm or 3 μm. Each of its polymer layers 42 may have a thickness between, for example, 0.3 μm and 20 μm, 0.5 μm and 10 μm, 1 μm and 5 μm or 1 μm and 10 μm, or thicker than or equal to 0.3 μm, 0.5 μm, 0.7 μm, 1 μm, 1.5 μm, 2 μm or 3 μm.

Referring to FIG. 17B, the metal pads, lines or traces 8 and metal vias 10 of the first and second interconnection scheme for an interconnection bridge (FISIB and SISIB) 560 and 588 may be composed for the metal pads 691 and 692 and metal traces or lines 693 used for the programmable and fixed interconnects 361 and 364 of the inter-chip interconnects 371 of the first or second type of standard commodity logic drive 300 as illustrated in FIGS. 11A and 12A or in FIGS. 11B and 12B.

Third Type of Fine-line Interconnection Bridge (FIB)

Referring to FIGS. 17C, a third type of fine-line interconnection bridge (FIB) 690 may have a similar structure as illustrated in FIG. 17A. For an element indicated by the same reference number shown in FIGS. 17A and 17C, the specification of the element as seen in FIG. 17C may be referred to that of the element as illustrated in FIG. 17A. The difference between the first and third types of fine-line interconnection bridges (FIB) 690 is that the third type of fine-line interconnection bridge (FIB) 690 may further include multiple first type of micro-bumps or micro-pillars 34 as illustrated in FIG. 16 on the metal pads 691 and 692 of its first interconnection scheme for an interconnection bridge (FISIB) 560. The specification of the micro-bumps or micro-pillars 34 herein may be referred to that as illustrated in FIG. 16.

In this case, referring to FIG. 17C, the first type of micro-bumps or micro-pillars 34 may include (1) an adhesion layer 26*a*, such as titanium (Ti) or titanium nitride (TiN) layer having a thickness of between 1 nm and 50 nm, on the metal pads 691 and 692 of the first interconnection scheme for an interconnection bridge (FISIB) 560. (2) a seed layer 26*b*, such as copper, on its adhesion layer 26*a* and (3) a copper layer 32 having a thickness of between 1 μm and 60 μm on its seed layer 26*b*.

Fourth Type of Fine-line Interconnection Bridge (FIB)

Referring to FIGS. 17D, a fourth type of fine-line interconnection bridge (FIB) 690 may have a similar structure as illustrated in FIG. 17B. For an element indicated by the same reference number shown in FIGS. 17B and 17D, the specification of the element as seen in FIG. 17D may be referred to that of the element as illustrated in FIG. 17B. The difference between the second and fourth types of fine-line interconnection bridges (FIB) 690 is that the fourth type of fine-line interconnection bridge (FIB) 690 may further include multiple first type of micro-bumps or micro-pillars 34 as illustrated in FIG. 16 on the metal pads 691 and 692 of its second interconnection scheme for an interconnection bridge (SISIB) 588. The specification of the micro-bumps or micro-pillars 34 herein may be referred to that as illustrated in FIG. 16.

In this case, referring to FIG. 17D, the first type of micro-bumps or micro-pillars 34 may include (1) an adhesion layer 26*a*, such as titanium (Ti) or titanium nitride (TiN) layer having a thickness of between 1 nm and 50 nm, on the metal pads 691 and 692 of the second interconnection scheme for an interconnection bridge (SISIB) 588. (2) a seed layer 26*b*, such as copper, on its adhesion layer 26*a* and (3) a copper layer 32 having a thickness of between 1 μm and 60 μm on its seed layer 26*b*.

Embodiment for Interconnection Substrate (IS) and Process for Forming the Same

An interconnection substrate may have (1) fine-line interconnects provided by a plurality of fine-line interconnection bridge (FIB) 690 as illustrated in FIGS. 17A-17D embedded therein and (2) coarse-line interconnects formed by a process for forming a printed circuit board (BGA) or ball-grid-array (BGA) substrate. Each of the fine-line interconnection bridges (FIB) 690 embedded in the interconnection substrate is surrounded by the coarse-line interconnects of the interconnection substrate. FIGS. 18A-18H are schematically cross-sectional views showing a process for forming an interconnection substrate in accordance with an embodiment of the present application.

Figure 18A:
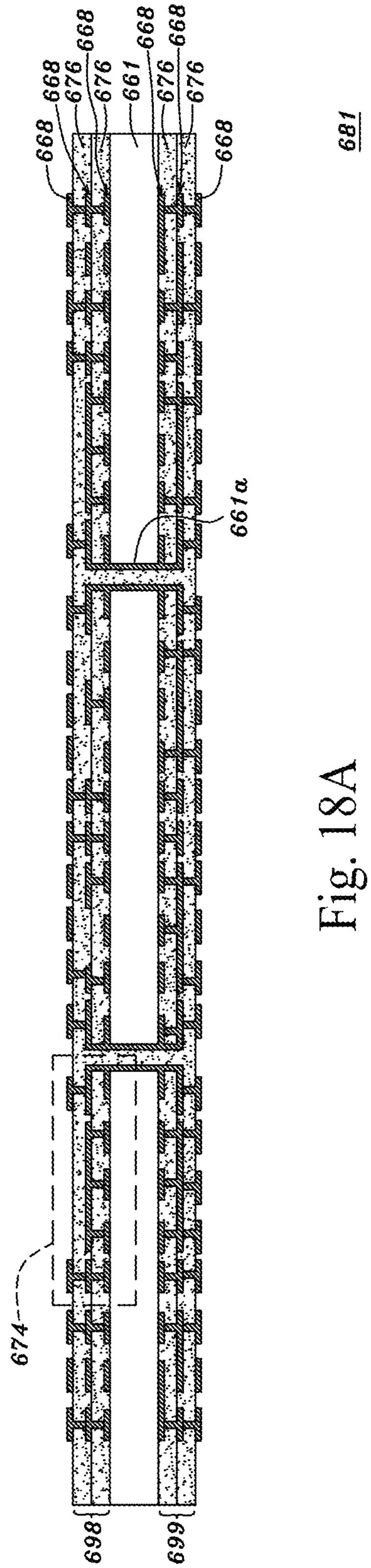
FIGS. 18A-18H are schematically cross-sectional views showing a process for forming an interconnection substrate in accordance with an embodiment of the present application.

FIG. 18A is a schematically cross-sectional view of a base structure provided for an interconnection substrate in accordance with an embodiment of the present application, wherein Referring to FIG. 18A, a base structure 681 for an interconnection substrate is provided, including (1) a polymer core 661, such as FR4 containing epoxy or bismaleimide-triazine (BT) resin, wherein FR4 may be a composite material composed of woven fiberglass cloth and an epoxy resin binder, (2) a first interconnection scheme for an interconnection substrate (FISIS) 698 over the polymer core 661, provided with one or more interconnection metal layers 668 made of copper and one or more polymer layers 676 each between neighboring two of the interconnection metal layers 668 of the first interconnection scheme for an interconnection substrate (FISIS) 698, and (3) a second interconnection scheme for an interconnection substrate (SISIS) 699 under the polymer core 661, provided with one or more interconnection metal layers 668 made of copper and one or more polymer layers 676 each between neighboring two of the interconnection metal layers 668 of the second interconnection scheme for an interconnection substrate (SISIS) 699.

Referring to FIG. 18A, for the first interconnection scheme for an interconnection substrate (FISIS) 698, an upper one of its interconnection metal layers 668 may couple to a lower one of its interconnection metal layers 668 through an opening in one of its polymer layers 676 between the upper and lower ones of its interconnection metal layers 668, wherein the bottommost one of its interconnection metal layers 668 may be on a top surface of the polymer core 661.

Referring to FIG. 18A, for the second interconnection scheme for an interconnection substrate (SISIS) 699, a lower one of its interconnection metal layers 668 may couple to an upper one of its interconnection metal layers 668 through an opening in one of its polymer layers 676 between the upper and lower ones of its interconnection metal layers 668, wherein the topmost one of its interconnection metal layers 668 may be on a bottom surface of the polymer core 661. The bottommost one of the interconnection metal layers 668 of the first interconnection scheme for an interconnection substrate (FISIS) 698 may couple to the topmost one of the interconnection metal layers 668 of the second interconnection scheme for an interconnection substrate (SISIS) 699 through one or more through holes 661*a* in the polymer core 661.

Figure 18B:
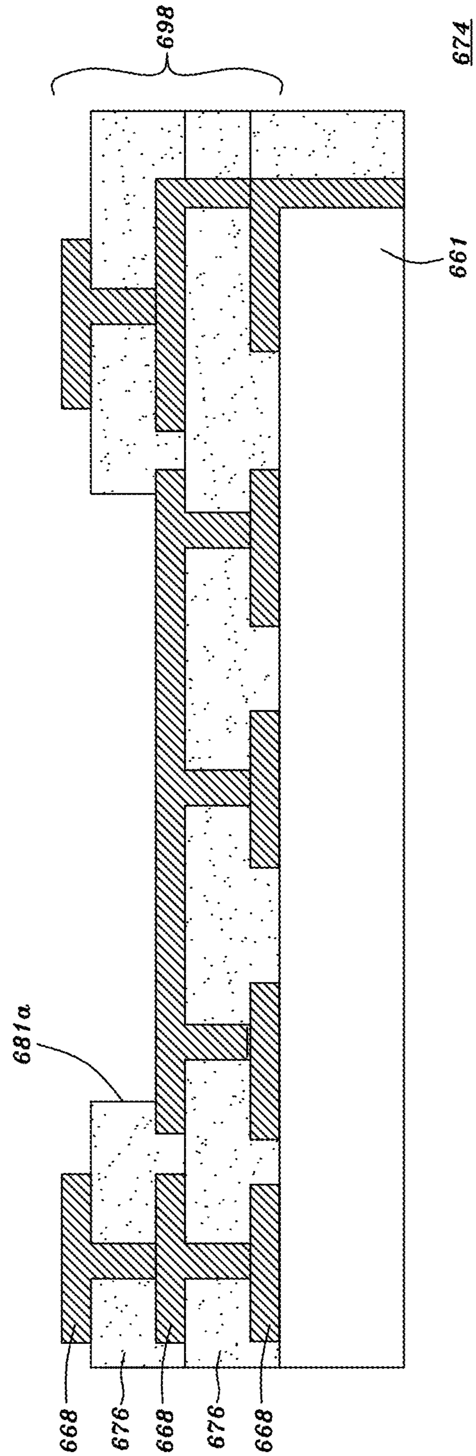

FIGS. 18B-18F are schematically enlarged views showing a process for fabricating an interconnection substrate, particularly for a portion 674 of the base structure shown in FIG. 18A, in accordance with an embodiment of the present application. After the base structure 681 for an interconnection substrate as seen in FIG. 18A is provided, multiple openings 681*a* (only one is shown) may be formed by laser drilling in the topmost one of the polymer layers 676 of the first interconnection scheme for an interconnection substrate (FISIS) 698 to expose the second topmost one of the interconnection metal layers 668 of the first interconnection scheme for an interconnection substrate (FISIS) 698, as seen in FIG. 18B.

Figure 18C:
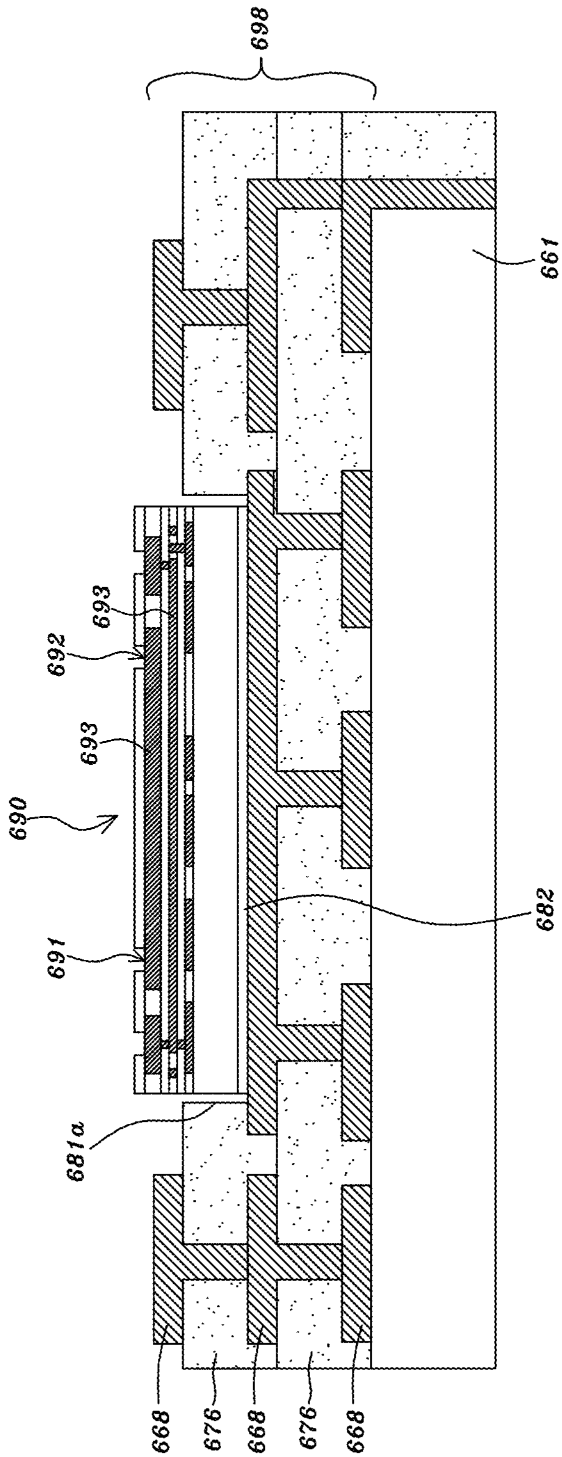

Next, referring to FIG. 18C, a plurality of first, second, third or fourth type of fine-line interconnection bridge (FIB) 690 as illustrated in FIGS. 17A-17D may be mounted in the openings 681*a*, wherein each of the first, second, third or fourth type of fine-line interconnection bridges (FIB) 690 may have a backside attached to the second topmost one of the interconnection metal layers 668 of the first interconnection scheme for an interconnection substrate (FISIS) 698 using an adhesive 682.

Figure 18D:
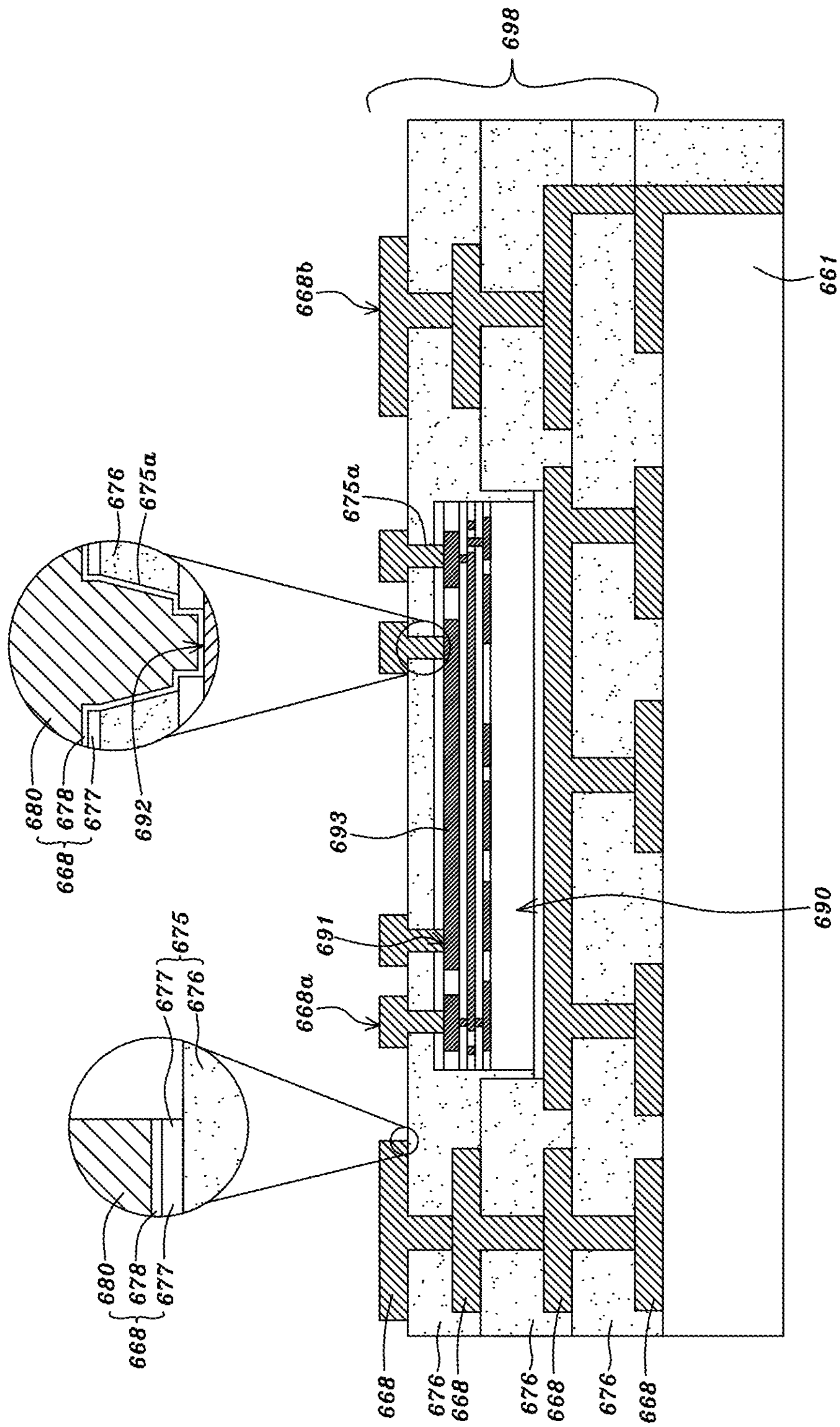

Next, referring to FIG. 18D, a sheet 675 including a polymer layer 676 and a copper foil 677 on its polymer layer 676 may have its polymer layer 676 to be laminated on one of the topmost and bottommost ones of the interconnection metal layers 668 and on one of the topmost and bottommost ones of the polymer layers 676 at each of the upper and lower sides of the base structure 681, and the top one of the sheets 675 may have its polymer layer 676 to be laminated further on or over each of the fine-line interconnection bridges (FIB) 690.

Next, referring to FIG. 18D, multiple openings 675*a* may be formed in one of the sheets 675 at each of the upper and lower sides of the base structure 681 to pass through the copper foil 677 and polymer layer 676 of said one of the sheets 675 to expose one of the topmost and bottommost ones of the interconnection metal layers 668 at said each of the upper and lower sides of the base structure 681. For the top one of the sheets 675, which contacts the fine-line interconnection bridges (FIB) 690, a first group of the openings 675*a* in its copper foil 677 and polymer layer 676 may expose the first metal pads 691 of each of the first or second type of fine-line interconnection bridges (FIB) 690 as illustrated in FIGS. 17A and 17B or the micro-bumps or micro-pillars 34 on the first metal pads 691 of each of the third or fourth type of fine-line interconnection bridges (FIB) 690 as illustrated in FIGS. 17C and 17D, and a second group of the openings 675a in its copper foil 677 and polymer layer 676 may expose the second metal pads 692 of each of the first or second type of fine-line interconnection bridges (FIB) 690 or the micro-bumps or micro-pillars 34 on the second metal pads 692 of each of the third or fourth type of fine-line interconnection bridges (FIB) 690.

Next, referring to FIG. 18D, a copper layer 678 may be electroless plated on the copper foil 677 of one of the sheets 675, on one of the topmost and bottommost ones of the interconnection metal layers 668 and in the openings 675a in said one of the sheets 675 at each of the upper and lower sides of the base structure 681. For the copper layer 678 formed on the top one of the sheets 675, which contacts the fine-line interconnection bridge (FIB) 690, it may be electroless plated further on the first metal pads 691 of the first or second type of fine-line interconnection bridge (FIB) 690 as illustrated in FIGS. 17A and 17B exposed by the first group of the openings 675a and the second metal pads 692 of the first or second type of fine-line interconnection bridge (FIB) 690 exposed by the second group of the openings 675a, or further on the micro-bumps or micro-pillars 34 on the first metal pads 691 of the third or fourth type of fine-line interconnection bridge (FIB) 690 as illustrated in FIGS. 17C and 17D exposed by the first group of the openings 675a and the micro-bumps or micro-pillars 34 on the second metal pads 692 of the third or fourth type of fine-line interconnection bridge (FIB) 690 exposed by the second group of the openings 675a.

Next, referring to FIG. 18D, a photoresist layer (not shown) may be coated on one of the copper layers 678 at each of the upper and lower sides of the base structure 681 and then may be patterned by light exposing, developing and/or etching to form multiple openings therein to expose said one of the copper layers 678.

Next, referring to FIG. 18D, a copper layer 680 may be electroplated on one of the copper layers 678 exposed by the openings in one of the photoresist layers at each of the upper and lower sides of the base structure 681.

Next, referring to FIG. 18D, each of the photoresist layers may be removed from one of the copper layers 678 at one of the upper and lower sides of the base structure 681.

Next, referring to FIG. 18D, one of the copper layers 678 and one of the copper foils 677 not covered by each of the copper layers 680 at the upper and lower sides of the base structure 681 may be removed or etched by chemical flash.

Thereby; the patterned copper foil 677 and copper layers 678 and 680 at each of the upper and lower sides of the base structure 681 may compose a topmost one of the interconnection metal layers 668 of the first interconnection scheme for an interconnection substrate (FISIS) 698 or a bottommost one of the interconnection metal layers 668 of the second interconnection scheme for an interconnection substrate (SISIS) 699. The polymer layer 676 from the sheet 675 at each of the upper and lower sides of the base structure 681 may compose a topmost one of the polymer layers 676 of the first interconnection scheme for an interconnection substrate (FISIS) 698 or a bottommost one of the polymer layers 676 of the second interconnection scheme for an interconnection substrate (SISIS) 699.

Referring to FIG. 18D, the topmost one of the interconnection metal layers 668 of its first interconnection scheme for an interconnection substrate (FISIS) 698 may be patterned with high-density metal pads 668a vertically over its fine-line interconnection bridges (FIB) 690 and low-density metal pads 668b horizontally offset from each of its fine-line interconnection bridges (FIB) 690, wherein each of the low-density metal pads 668b may have a width wider than each of the high-density metal pads 668a.

Figure 18E:
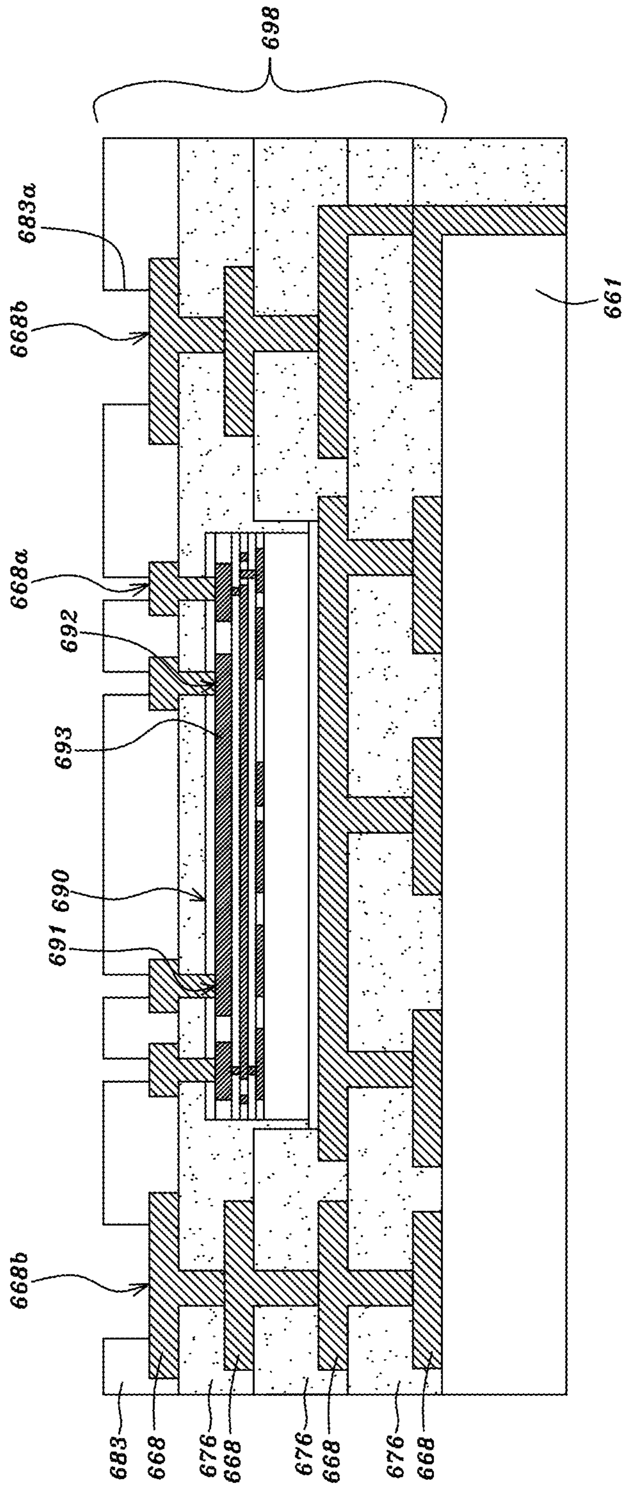

Next, referring to FIG. 18E, a solder mask 683, i.e., polymer layer, may be formed for each of the first and second interconnection schemes for an interconnection substrate (FISIS and SISIS) 698 and 699. The solder mask 683 may be formed on one of the topmost and bottommost ones of the interconnection metal layers 668 and on one of the topmost and bottommost ones of the polymer layers 676 at each of the upper and lower sides of the base structure 681. Multiple openings 683a may be formed in an upper one of the solder masks 683 at the upper side of the base structure 681 to respectively expose the high-density and low-density metal pads 668a and 668b, and multiple openings 683a may be formed in a lower one of the solder masks 683 at the lower side of the base structure 681 to respectively expose multiple metal pads of the bottommost one of the interconnection metal layers 668 at the lower side of the base structure 681.

Figure 18F:
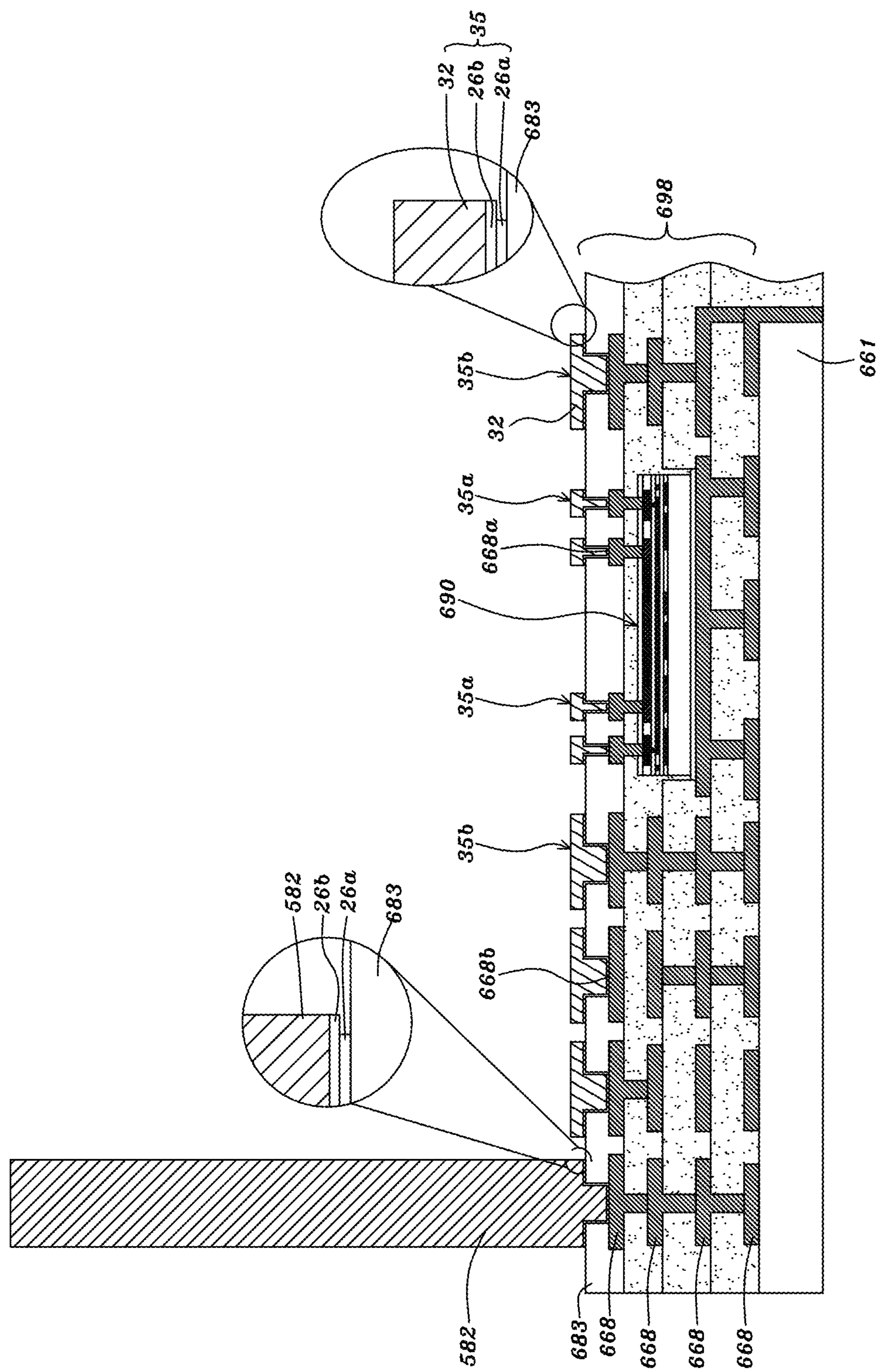

Next, referring to FIG. 18F, multiple micro-bumps or micro-pillars 35 may be formed on the high-density and low-density metal pads 668a and 668b of the topmost one of the interconnection metal layers 668 of the first interconnection scheme for an interconnection substrate (FISIS) 698 at bottoms of the openings 683a in the solder mask 683. Each of the micro-bumps or micro-pillars 35 may be of various types. A first type of micro-bumps or micro-pillars 35 may include (1) an adhesion layer 26a, such as titanium (Ti) or titanium nitride (TiN) layer having a thickness between 1 nm and 50 nm, on the copper layer 680 of the high-density and low-density metal pads 668a and 668b. (2) a seed layer 26b, such as copper, on its adhesion layer 26a and (3) an electroplated copper layer 32 having a thickness between 1 μm and 60 μm on its seed layer 26b, Alternatively, a second type of micro-bumps or micro-pillars 35 may include the adhesion layer 26a, seed layer 26b and electroplated copper layer 32 as mentioned above, and may further include a tin-containing solder cap made of tin or a tin-silver alloy having a thickness between 1 μm and 50 μm on its electroplated copper layer 32. Alternatively, a third type of micro-bumps or micro-pillars 35 may be thermal compression pads, including the adhesion layer 26a on the high-density metal pads 668a and the seed layer 26b as mentioned above, and further including, as seen in FIGS. 20A and 20B, a copper layer 48 having a thickness t2 between 1 μm and 10 μm or between 2 and 10 micrometers and a largest transverse dimension w2, such as diameter in a circular shape, between 1 μm and 15 μm, such as 5 μm, on its seed layer 26b and a metal cap 49 made of a tin-silver alloy, a tin-gold alloy, a tin-copper alloy, a tin-indium alloy, indium, tin or gold, which has a thickness between 0.1 μm and 5 μm, such as 1 μm, on its copper layer 48. A pitch between neighboring two of the third type of micro-bumps or micro-pillars 35 may be between 3 μm and 20 μm.

Alternatively, a fourth type of micro-bumps or micro-pillars 35 may be thermal compression pads, including the adhesion layer 26a on the low-density metal pads 668b and the seed layer 26b as mentioned above, and further including, as seen in FIGS. 21A and 21B, a copper layer 48 having a thickness t5 between 1 μm and 10 μm or between 2 and 10 micrometers and a largest transverse dimension w5, such as diameter in a circular shape, greater than 25 μm or between 25 μm and 150 μm, on its seed layer 26b and a metal cap 49 made of a tin-silver alloy, a tin-gold alloy, a tin-copper alloy, a tin-indium alloy, indium, tin or gold, which has a thickness between 0.1 μm and 5 μm, such as 1 μm, and a largest transverse dimension, such as diameter in a circular shape, greater than 25 μm or between 25 μm and 150 μm, on its copper layer 48. A space between neighboring two of the fourth type of micro-bumps or micro-pillars 35 may be greater than 25 μm, 30 μm or 50 μm.

Referring to FIG. 18F, multiple through package vias (TPV) 582 may be formed on the metal pads of the topmost one of the interconnection metal layers 668 of the first interconnection scheme for an interconnection substrate (FISIS) 698 at bottoms of the openings 683*a* in the solder mask 683. Each of the through package vias (TPV) 582 may include (1) an adhesion layer 26*a*, such as titanium (Ti) or titanium nitride (TiN) layer having a thickness between 1 nm and 50 nm, on the copper layer 680 of the topmost one of the interconnection metal layers 668 of the first interconnection scheme for an interconnection substrate (FISIS) 698. (2) a seed layer 26*b*, such as copper, on its adhesion layer 26*a* and (3) an electroplated copper layer 582 having a thickness, for example between 5 μm and 300 μm, 5 μm and 200 μm, 5 μm and 150 μm, 5 μm and 120 μm, 10 μm and 100 μm, 10 μm and 60 μm, 10 μm and 40 μm or 10 μm and 30 μm, on its seed layer 26*b*.

Figure 18G:
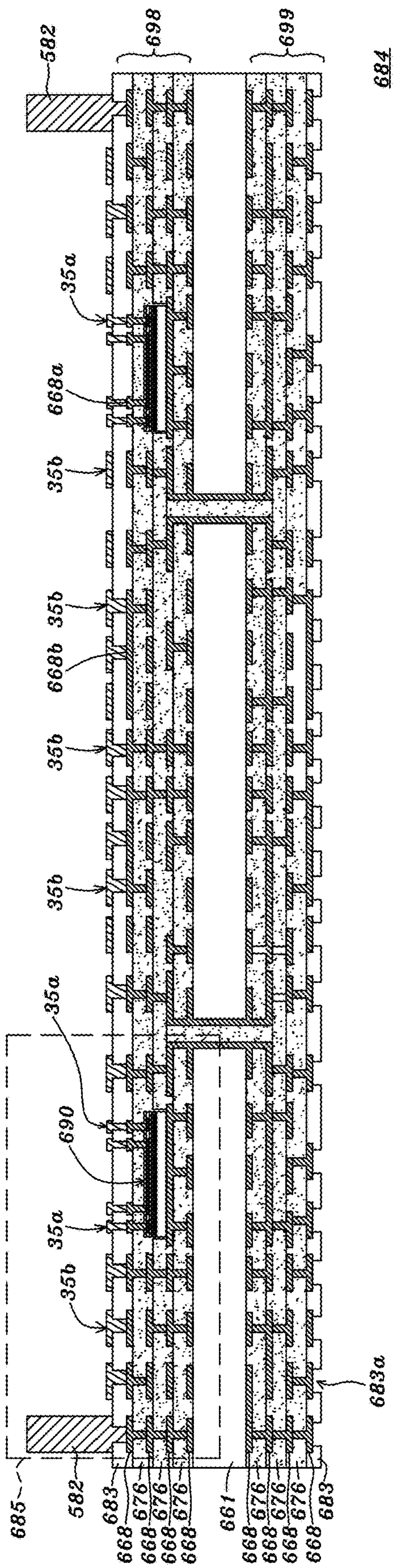

FIG. 18G is a schematically cross-sectional view of an interconnection substrate in accordance with an embodiment of the present application, wherein FIG. 18F is a schematically enlarged view showing a portion 685 of an interconnection substrate shown in FIG. 18G in accordance with an embodiment of the present application. So far, an interconnection substrate (IS) 684 may be well formed with (1) fine-line interconnects provided by the interconnection metal layers 6 of the first interconnection scheme for an interconnection bridge (FISIB) 560 and, alternatively, the interconnection metal layers 27 of the second interconnection scheme for an interconnection bridge (SISIB) 588, for its first, second, third or fourth type of interconnection bridge (FIB) 690 as seen in FIGS. 17A-17D, and (2) coarse-line interconnects provided by the interconnection metal layers 668 of its first and second interconnection schemes for an interconnection substrate (FISIS and SISIS) 698 and 699. Each of the interconnection metal layers 668 of its first and second interconnection schemes for an interconnection substrate (FISIS and SISIS) 698 and 699 may have a thickness, for example, between 5 and 100 micrometer, between 5 and 50 micrometers or between 10 and 50 micrometers, and thicker than that of each of the interconnection metal layers 6 of the first interconnection scheme for an interconnection bridge (FISIB) 560 and, alternatively, the interconnection metal layers 27 of the second interconnection scheme for an interconnection bridge (SISIB) 588, for its first, second, third or fourth type of fine-line interconnection bridge (FIB) 690. Each of the polymer layers 676 of its first and second interconnection schemes for an interconnection substrate (FISIS and SISIS) 698 and 699 may have a thickness, for example, between 5 and 100 micrometer, between 5 and 50 micrometers or between 10 and 50 micrometers, and thicker than that of each of the insulating dielectric layers 12 of the first interconnection scheme for an interconnection bridge (FISIB) 560 and, alternatively, the polymer layers 42 of the second interconnection scheme for an interconnection bridge (SISIB) 588, for its first, second, third or fourth type of fine-line interconnection bridge (FIB) 690.

Figure 18H:
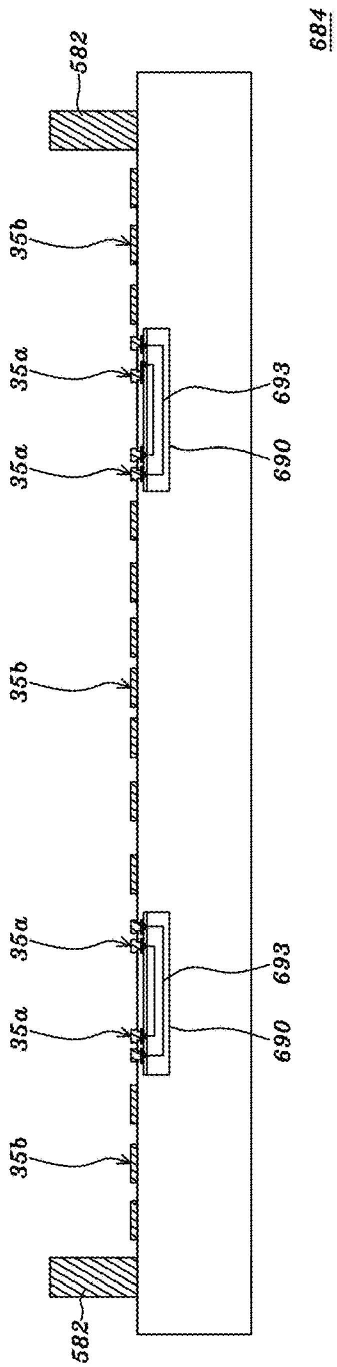

For explaining the subsequent processes, the fine-line and coarse-line interconnects, fine-line interconnection bridges (FIB) 690 and metal pads, bumps or pillars 35 shown in FIG. 18G may be simplified as seen in FIG. 18H.

Figure 21B:
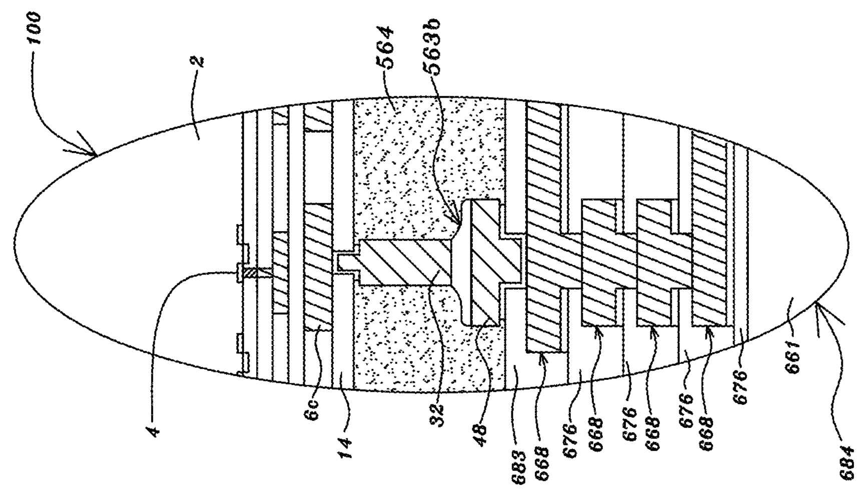
FIGS. 21A and 21B are schematically cross-sectional views showing a process of bonding a relatively-large thermal compression bump of a semiconductor chip to a relatively-large thermal compression pad preformed on an interconnection substrate in accordance with an embodiment of the present application.
Figure 21A:
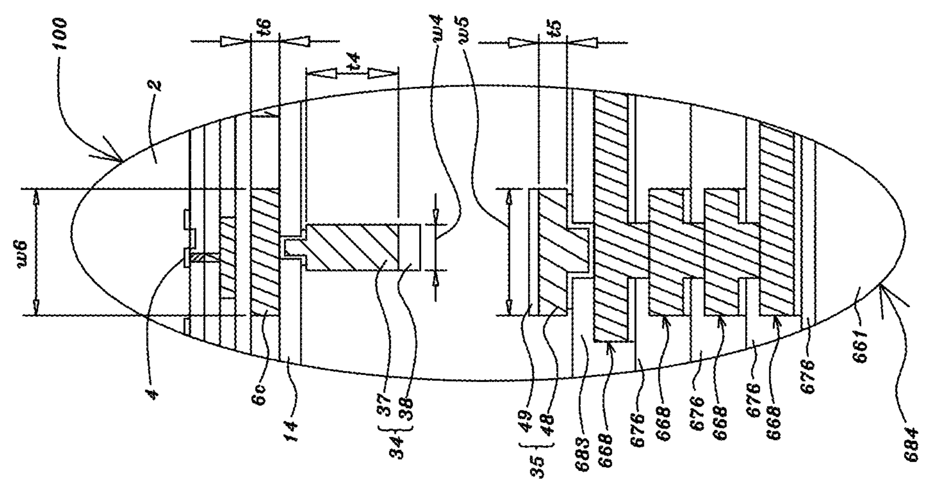

Chip-On-Interconnection-Substrate (COIS) Package and Process for Forming the Same FIGS. 19A-19F are schematic views showing a process for forming a chip-on-interconnection-substrate (COIS) package in accordance with an embodiment of the present application. FIGS. 20A and 20B are schematically cross-sectional views showing a process of bonding a relatively-small thermal compression bump of a semiconductor chip to a relatively-small thermal compression pad preformed on an interconnection substrate in accordance with an embodiment of the present application. FIGS. 21A and 21B are schematically cross-sectional views showing a process of bonding a relatively-large thermal compression bump of a semiconductor chip to a relatively-large thermal compression pad preformed on an interconnection substrate in accordance with an embodiment of the present application.

The process as illustrated in FIGS. 19A-19F may be performed to fabricate the first or second type of standard commodity logic drive 300 as seen in FIGS. 11A and 12A or in FIGS. 11B and 12B. First, referring to FIG. 19A, multiple semiconductor chips 100 may be provided, each of which may be one of its standard commodity FPGA IC chips 200, DPIIC chips 410, NVM IC chips 250, HBM IC chips 251, dedicated control and I/O chips 260 and 265, PCIC chips 269, GPU chips 269*a*, CPU chip 269*b* or IAC chips 402 for the first or second type of standard commodity logic drive 300 as seen in FIGS. 11A and 12A or in FIGS. 11B and 12B.

Figure 19A:
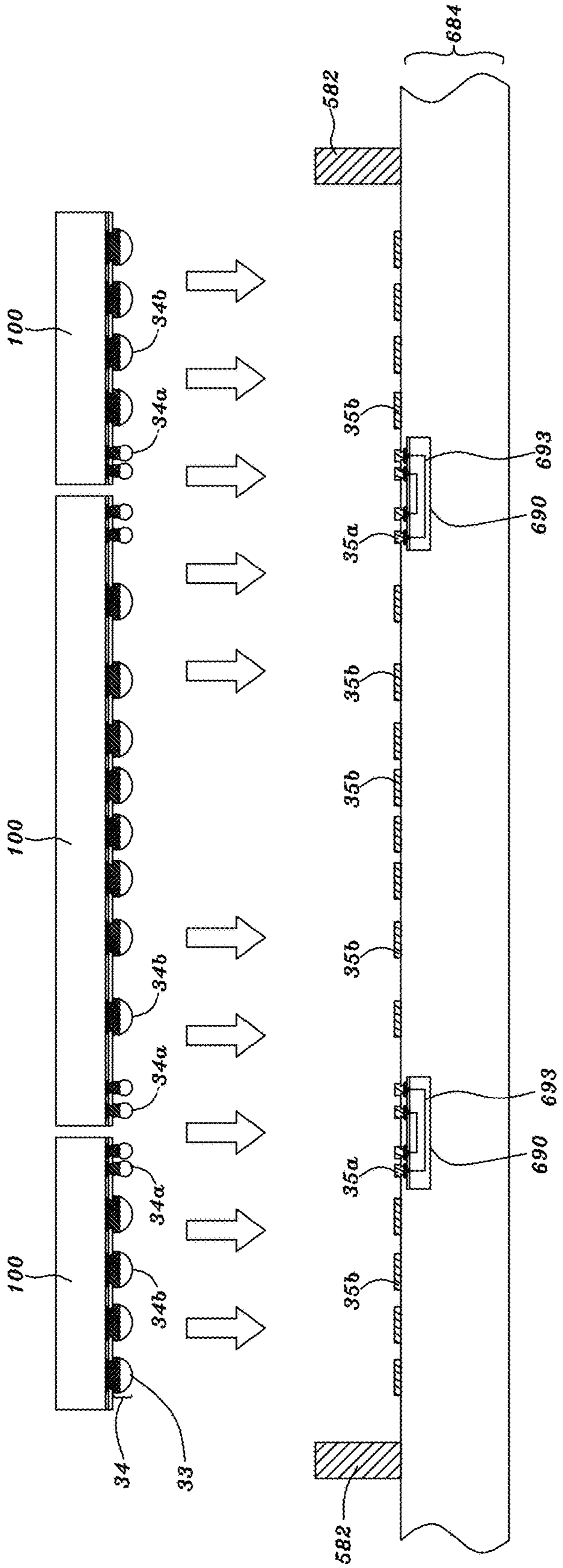
FIGS. 19A-19F are schematic views showing a process for forming a chip-on-interconnection-substrate (COIS) package in accordance with an embodiment of the present application.
Figure 19B:
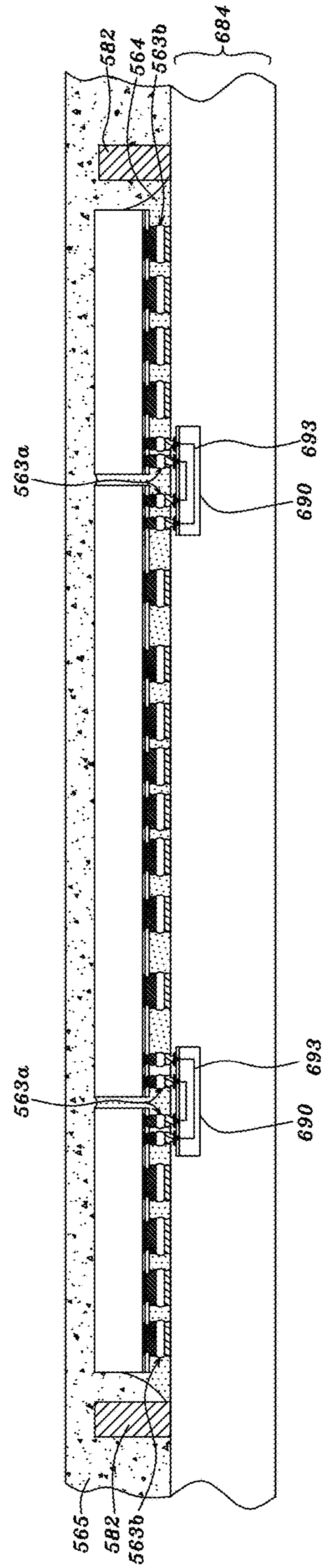

Referring to FIGS. 19A and 19B, each of the semiconductor chips 100 as seen in FIG. 16 may have the first, second, third or fourth type of micro-bumps or micro-pillars 34 to be bonded to the first, second, third or fourth type of micro-bumps or micro-pillars 35 of the interconnection substrate (IS) 684 as seen in FIG. 18H into multiple high-density and low-density bonded contacts 563*a* and 563*b* between said each of the semiconductor chips 100 and the interconnection substrate (IS) 684.

Referring to FIGS. 19A and 19B, the micro-bumps or micro-pillars 34 of the semiconductor chips 100 may be divided into two groups, i.e., a first group 34*a* of high density and small size micro-bumps (HDB) and a second group 34*b* of low density and large size micro-bumps (LDB). The micro-bumps or micro-pillars 35 of the interconnection substrate (IS) 684 may be shaped like micro-pads that are divided into two groups, i.e., (1) a first group 35*a* of high density: small size copper pads (HDP) each on one of the high-density metal pads 668*a* connecting to one of the first and second metal pads 691 and 692 of the fine-line interconnection bridge (FIB) 690 embedded in the interconnection substrate (IS) 684 and (2) a second group 35*b* of low density, large size copper pads (LDP) each on one of the low-density metal pads 668*b* connecting to an electrical circuitry of the interconnection substrate (IS) 684 horizontally around and under the fine-line interconnection bridge (FIB) 690. The micro-bumps or micro-pillars 34*a* of the semiconductor chips 100 in the first group of HDB may be bonded to the micro-bumps or micro-pillars 35*a* of the interconnection substrate (IS) 684 in the first group of HDP. The micro-bumps or micro-pillars 34*b* of the semiconductor chips 100 in the second group of LDB may be bonded to the micro-bumps or micro-pillars 35*b* of the interconnection substrate (IS) 684 in the second group of LDP.

The micro-bumps or micro-pillars 34*a* of the semiconductor chips 100 in the first group of HDB may have the largest dimension in a horizontal cross section (for example, the diameter of a circle shape, or the diagonal length of a square or rectangle shape) between 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. The smallest space between neighboring two of the micro-bumps or micro-pillars 34*a* of the semiconductor chips 100 in the first group of HDB may be between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm.

The micro-bumps or micro-pillars 34*b* of the semiconductor chips 100 in the second group of LDB may have the largest dimension in a horizontal cross section (for example, the diameter of a circle shape, or the diagonal length of a square or rectangle shape) between, for example, 20 μm and 200 μm, 20 μm and 150 μm, 20 μm and 100 μm, 20 μm and 75 μm, or 20 μm and 50 μm or larger than or equal to 20 μm, 30 μm. 40 μm, or 50 μm. The smallest space between neighboring two of the micro-bumps or micro-pillars 34*b* of the semiconductor chips 100 in the second group of LDB may be between, for example, 20 μm and 200 μm. 20 μm and 150 μm, 20 μm and 100 μm, 20 μm and 75 μm, or 20 μm and 50 μm or larger than or equal to 20 μm, 30 μm, 40 μm, or 50 μm.

The ratio of the largest dimension in a horizontal cross section of the micro-bumps or micro-pillars 34*b* of the semiconductor chips 100 in the second group of LDB to that of the micro-bumps or micro-pillars 34*a* of the semiconductor chips 100 in the first group of HDB may be between 1.1 and 5 or greater than 1.2, 1.5 or 2, for example. The ratio of the smallest space between neighboring two of the micro-bumps or micro-pillars 34*b* of the semiconductor chips 100 in the second group of LDB to that between neighboring two of the micro-bumps or micro-pillars 34*a* of the semiconductor chips 100 in the first group of HDB may be between 1.1 and 5 or greater than 1.2, 1.5 or 2, for example.

The micro-bumps or micro-pillars 35*a* of the interconnection substrate (IS) 684 in the first group of HDP may have the largest dimension in a horizontal cross section (for example, the diameter of a circle shape, or the diagonal length of a square or rectangle shape) between 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. The smallest space between neighboring two of the micro-bumps or micro-pillars 35*a* of the interconnection substrate (IS) 684 in the first group of HDP may be between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm.

The micro-bumps or micro-pillars 35*b* of the interconnection substrate (IS) 684 in the second group of LDP may have the largest dimension in a horizontal cross section (for example, the diameter of a circle shape, or the diagonal length of a square or rectangle shape) between, for example, 20 μm and 200 μm, 20 μm and 150 μm, 20 μm and 100 μm, 20 μm and 75 μm, or 20 μm and 50 μm or larger than or equal to 20 μm, 30 μm, 40 μm, or 50 μm. The smallest space between neighboring two of the micro-bumps or micro-pillars 35*b* of the interconnection substrate (IS) 684 in the second group of LDP may be between, for example, 20 μm and 200 μm, 20 μm and 150 μm, 20 μm and 100 μm, 20 μm and 75 μm, or 20 μm and 50 μm or larger than or equal to 20 μm, 30 μm, 40 μm, or 50 μm.

The ratio of the largest dimension in a horizontal cross section of the micro-bumps or micro-pillars 35*b* of the interconnection substrate (IS) 684 in the second group of LDP to that of the micro-bumps or micro-pillars 35*a* of the interconnection substrate (IS) 684 in the first group of HDP may be between 1.1 and 5 or greater than 1.2, 1.5 or 2, for example. The ratio of the smallest space between neighboring two of the micro-bumps or micro-pillars 35*b* of the interconnection substrate (IS) 684 in the second group of LDP to that between neighboring two of the micro-bumps or micro-pillars 35*a* of the interconnection substrate (IS) 684 in the first group of HDP may be between 1.1 and 5 or greater than 1.2, 1.5 or 2, for example.

For a first case, referring to FIGS. 19A, 19B, 20A, 20B, 21A and 21B, each of the semiconductor chips 100 as illustrated in FIG. 16 may have the third type of micro-bumps or micro-pillars 34 in the first group 34*a* of HDB to be bonded to the third type of micro-bumps or micro-pillars 35 preformed in the first group 35*a* of HDP of the interconnection substrate (IS) 684 and the fourth type of micro-bumps or micro-pillars 34 in the second group 34*b* of LDB to be bonded to the fourth type of micro-bumps or micro-pillars 35 preformed in the second group 35*b* of LDP of the interconnection substrate (IS) 684. For example, referring to FIGS. 19A, 19B, 20A and 20B, the third type of micro-bumps or micro-pillars 34 of said each of the semiconductor chips 100 may have the solder caps 38 to be thermally compressed, at a temperature between 240 and 300 degrees Celsius, at a pressure between 0.3 and 3 Mpa and for a time period between 3 and 15 seconds, onto the metal caps 49 of the third type of micro-bumps or micro-pillars 35 preformed on the interconnection substrate (IS) 684 into multiple high-density bonded contacts 563*a* between said each of the semiconductor chips 100 and the interconnection substrate (IS) 684, respectively. Each of the third type of micro-bumps or micro-pillars 34 of said each of the semiconductor chips 100 may have the copper layer 37 having the thickness t3 greater than the thickness t2 of the copper layer 48 of each of the third type of micro-bumps or micro-pillars 35 preformed on the interconnection substrate (IS) 684 and having the largest transverse dimension w3 equal to between 0.7 and 0.1 times of the largest transverse dimension w2 of the copper layer 48 of the underlying one of the third type of micro-bumps or micro-pillars 35 preformed on the interconnection substrate (IS) 684. Alternatively, each of the third type of micro-pillars or micro-bumps 34 of said each of the semiconductor chips 100 may be provided with the copper layer 37 having a cross-sectional area equal to between 0.5 and 0.01 times of the cross-sectional area of the copper layer 48 of the underlying of the third type of micro-bumps or micro-pillars 35 preformed on the interconnection substrate (IS) 684.

Further, referring to FIGS. 19A, 19B, 21A and 21B, the fourth type of micro-bumps or micro-pillars 34 of said each of the semiconductor chips 100 may have the solder caps 38 to be thermally compressed, at a temperature between 240 and 300 degrees Celsius, at a pressure between 0.3 and 3 Mpa and for a time period between 3 and 15 seconds, onto the metal caps 49 of the fourth type of micro-bumps or micro-pillars 35 preformed on the interconnection substrate (IS) 684 into multiple low-density bonded contacts 563*b* between said each of the semiconductor chips 100 and the interconnection substrate (IS) 684, respectively. Each of the fourth type of micro-bumps or micro-pillars 34 of said each of the semiconductor chips 100 may have the copper layer 37 having the thickness t4 greater than the thickness t5 of the copper layer 48 of each of the fourth type of micro-bumps or micro-pillars 35 preformed on the interconnection substrate (IS) 684 and having the largest transverse dimension w4 equal to between 0.7 and 0.1 times of the largest transverse dimension w5 of the copper layer 48 of the underlying one of the fourth type of micro-bumps or micro-pillars 35 preformed on the interconnection substrate (IS) 684. Alternatively, each of the fourth type of micro-pillars or micro-bumps 34 of said each of the semiconductor chips 100 may be provided with the copper layer 37 having a cross-sectional area equal to between 0.5 and 0.01 times of the cross-sectional area of the copper layer 48 of the underlying of the fourth type of micro-bumps or micro-pillars 35 preformed on the interconnection substrate (IS) 684.

Thereby, referring to FIGS. 19B, 20B and 21B, a bonded solder between the copper layers 37 and 48 of each of the high-density and low-density bonded contacts 563*a* and 563*b* may be mostly kept on a top surface of the copper layer 48 of the underlying one of the third or fourth type of micro-bumps or micro-pillars 35 preformed on the interconnection substrate (IS) 684 and extends out of the edge of the copper layer 48 of the underlying one of the third or fourth type of micro-bumps or micro-pillars 35 preformed on the interconnection substrate (IS) 684 less than 0.5 micrometers. Thus, a short between neighboring two of the high-density and low-density bonded contacts 563*a* and 563*b* even in a fine-pitched fashion may be avoided.

Alternatively, referring to FIGS. 20A and 20B, for said each of the semiconductor chips 100, its third type of micro-bumps or micro-pillars 34 may be formed respectively on a bottom surface of the metal pads 6*b* provided by the bottommost one, i.e., the topmost one as seen in FIG. 16, of the interconnection metal layers 27 of its second interconnection scheme for a chip (SISC) 29 or by, if the second interconnection scheme 588 for a chip (SISC) 29 is not provided for said each of the first type of semiconductor chips 100, the bottommost one, i.e., the topmost one as seen in FIG. 16, of the interconnection metal layers 6 of its first interconnection scheme for a chip (FISC) 20, wherein each of its third type of micro-bumps or micro-pillars 34 may be provided with the copper layer 37 having the thickness t3 greater than the thickness t1 of the overlying one of its metal pads 6*b* and having the largest transverse dimension w3 equal to between 0.7 and 0.1 times of the largest transverse dimension w1 of the overlying one of its metal pads 6*b*; alternatively, each of its third type of micro-bumps or micro-pillars 34 may be provided with the copper layer 37 having a cross-sectional area equal to between 0.5 and 0.01 times of the cross-sectional area of the overlying one of its metal pads 6*b*; each of its metal pads 6*b* may have a thickness t1 between 1 and 10 micrometers or between 2 and 10 micrometers and a largest transverse dimension w1, such as diameter in a circular shape, between 1 μm and 15 μm, such as 5 μm.

Alternatively, referring to FIGS. 21A and 21B, for said each of the semiconductor chips 100, its fourth type of micro-bumps or micro-pillars 34 may be formed respectively on a bottom surface of the metal pads 6*c* provided by the bottommost one, i.e., the topmost one as seen in FIG. 16, of the interconnection metal layers 27 of its second interconnection scheme for a chip (SISC) 29 or by, if the second interconnection scheme 588 for a chip (SISC) 29 is not provided for said each of the first type of semiconductor chips 100, the bottommost one, i.e., the topmost one as seen in FIG. 16, of the interconnection metal layers 6 of its first interconnection scheme for a chip (FISC) 20, wherein each of its fourth type of micro-bumps or micro-pillars 34 may be provided with the copper layer 37 having the thickness t4 greater than the thickness t6 of the overlying one of its metal pads 6*c* and having the largest transverse dimension w4 equal to between 0.7 and 0.1 times of the largest transverse dimension w6 of the overlying one of its metal pads 6*c*; alternatively, each of its fourth type of micro-bumps or micro-pillars 34 may be provided with the copper layer 37 having a cross-sectional area equal to between 0.5 and 0.01 times of the cross-sectional area of the overlying one of its metal pads 6*c*; each of its metal pads 6*c* may have a thickness t6 between 1 and 10 micrometers or between 2 and 10 micrometers and a largest transverse dimension w6, such as diameter in a circular shape, between 30 μm and 250 μm, such as 40 μm.

Alternatively, for a second case, referring to FIGS. 19A and 19B, each of the semiconductor chips 100 may have the second type of micro-bumps or micro-pillars 34 to be bonded to the first type of micro-bumps or micro-pillars 35 preformed on the interconnection substrate (IS) 684. For example, the second type of micro-bumps or micro-pillars 34 of said each of the semiconductor chips 100 may have the solder caps 33 to be bonded onto the electroplated copper layer 32 of the first type of micro-bumps or micro-pillars 35 preformed on the interconnection substrate (IS) 684 into multiple high-density and low-density bonded contacts 563*a* and 563*b* between said each of the semiconductor chips 100 and the interconnection substrate (IS) 684. Each of the second type of micro-bumps or micro-pillars 34 of said each of the semiconductor chips 100 may have the electroplated copper layer 32 having a thickness greater than that of the electroplated copper layer 32 of each of the first type of micro-bumps or micro-pillars 35 preformed on the interconnection substrate (IS) 684.

Alternatively, for a third case, referring to FIGS. 19A and 19B, each of the semiconductor chips 100 may have the first type of micro-bumps or micro-pillars 34 to be bonded to the second type of metal bumps or pillars 35 preformed on the interconnection substrate (IS) 684. For example, the first type of micro-bumps or micro-pillars 34 of said each of the semiconductor chips 100 may have the electroplated metal layer 32, e.g. copper layer, to be bonded onto the solder caps 33 of the second type of micro-bumps or micro-pillars 35 preformed on the interconnection substrate (IS) 684 into multiple high-density and low-density bonded contacts 563*a* and 563*b* between said each of the semiconductor chips 100 and the interconnection substrate (IS) 684. Each of the first type of micro-bumps or micro-pillars 34 of said each of the semiconductor chips 100 may have the electroplated copper layer 32 having a thickness greater than that of the electroplated copper layer 32 of each of the second type of micro-bumps or micro-pillars 35 preformed on the interconnection substrate (IS) 684.

Alternatively: for a fourth case, referring to FIGS. 19A and 19B, each of the semiconductor chips 100 may have the second type of micro-bumps or micro-pillars 34 to be bonded to the second type of micro-bumps or micro-pillars 35 preformed on the interconnection substrate (IS) 684. For example, the second type of micro-bumps or micro-pillars 34 of said each of the semiconductor chips 100 may have the solder caps 33 to be bonded onto the solder caps 33 of the second type of micro-bumps or micro-pillars 35 preformed on the interconnection substrate (IS) 684 into multiple high-density and low-density bonded contacts 563*a* and 563*b* between said each of the semiconductor chips 100 and the interconnection substrate (IS) 684. Each of the second type of micro-bumps or micro-pillars 34 of said each of the semiconductor chips 100 may have the electroplated copper layer 32 having a thickness greater than that of the electroplated copper layer 32 of each of the second type of micro-bumps or micro-pillars 35 preformed on the interconnection substrate (IS) 684.

Referring to FIG. 19B, for the first through fourth cases, each of the high-density bonded contacts 563*a* may have a width wider than that of each of the low-density bonded contacts 563*b*.

Thereby, referring to FIGS. 19A and 19B, for fabricating the first or second type of standard commodity logic drive 300 as seen in FIGS. 11A and 12A or in FIGS. 11B and 12B, neighboring two of the semiconductor chips 100 shown in FIGS. 19A and 19B may be (1) one of its standard commodity FPGA IC chips 200 and one of its GPU chips 269*a* coupling to each other through the metal bridging interconnects 693 of one of the fine-line interconnection bridges (FIB) 690 of its interconnection substrate (IS) 684, (2) one of its GPU chips 269*a* and its CPU chip 269 coupling to each other through the metal bridging interconnects 693 of one of the fine-line interconnection bridges (FIB) 690 of its interconnection substrate (IS) 684, (3) one of its standard commodity FPGA IC chips 200 and one of its dedicated control and I/O chips 260 and 265 coupling to each other through the metal bridging interconnects 693 of one of the fine-line interconnection bridges (FIB) 690 of its interconnection substrate (IS) 684, (4) two of its standard commodity FPGA IC chips 200 coupling to each other through the metal bridging interconnects 693 of one of the fine-line interconnection bridges (FIB) 690 of its interconnection substrate (IS) 684, (5) one of its standard commodity FPGA IC chips 200 and one of its NVM IC chips 250 coupling to each other through the metal bridging interconnects 693 of one of the fine-line interconnection bridges (FIB) 690 of its interconnection substrate (IS) 684, (6) one of its standard commodity FPGA IC chips 200 and one of its HBM IC chips 251 coupling to each other through the metal bridging interconnects 693 of one of the fine-line interconnection bridges (FIB) 690 of its interconnection substrate (IS) 684, (7) one of its GPU chip 269*a* and one of its NVM IC chip 250 coupling to each other through the metal bridging interconnects 693 of one of the fine-line interconnection bridges (FIB) 690 of its interconnection substrate (IS) 684, (8) its CPU chip 269*b* and one of its NVM IC chips 250 coupling to each other through the metal bridging interconnects 693 of one of the fine-line interconnection bridges (FIB) 690 of its interconnection substrate (IS) 684, (9) one of its GPU chips 269*a* and one of its HBM IC chip 251 coupling to each other through the metal bridging interconnects 693 of one of the fine-line interconnection bridges (FIB) 690 of its interconnection substrate (IS) 684, (10) its CPU chip 269*b* and one of its HBM IC chips 251 coupling to each other through the metal bridging interconnects 693 of one of the fine-line interconnection bridges (FIB) 690 of its interconnection substrate (IS) 684, or (11) one of its GPU chips 269*a* and one of its dedicated control and I/O chips 260 and 265 coupling to each other through the metal bridging interconnects 693 of one of the fine-line interconnection bridges (FIB) 690 of its interconnection substrate (IS) 684.

Next, referring to FIG. 19B, an underfill 564, such as epoxy resins or compounds, may be filled into a gap between each of the semiconductor chips 100 and the interconnection substrate (IS) 684 by a dispensing method performed using a dispenser. Next, a polymer layer 565, e.g., resin or compound, may be applied to fill a gap between each neighboring two of the semiconductor chips 100 and cover a backside of each of the semiconductor chips 100 by methods, for example, spin-on coating, screen-printing, dispensing or molding in a wafer or panel format. For the molding method, a compress molding method (using top and bottom pieces of molds) or casting molding (using a dispenser) may be employed. The polymer layer 565 may be, for example, polyimide. BenzoCycloButene (BCB), parylene, epoxy-based material or compound, photo epoxy SU-8, elastomer, or silicone.

Figure 19C:
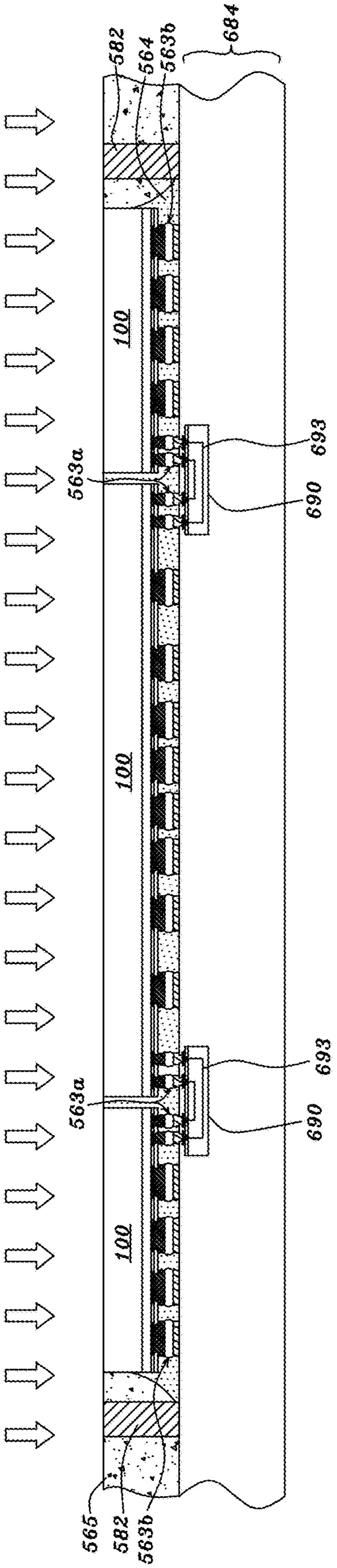

Next, referring to FIG. 19C, a chemical mechanical polishing (CMP), polishing or grinding process may be applied to remove a top portion of the polymer layer 565 and a backside of each of the semiconductor chips 100 to planarize a top surface of each of the through package vias (TPV) 582, a top surface of the polymer layer 565 and the backside of each of the semiconductor chips 100. Thereby, the top surface of the electroplated copper layer of each of the through package vias (TPV) 582 and the backside of each of the semiconductor chips 100 may be exposed.

Figure 19D:
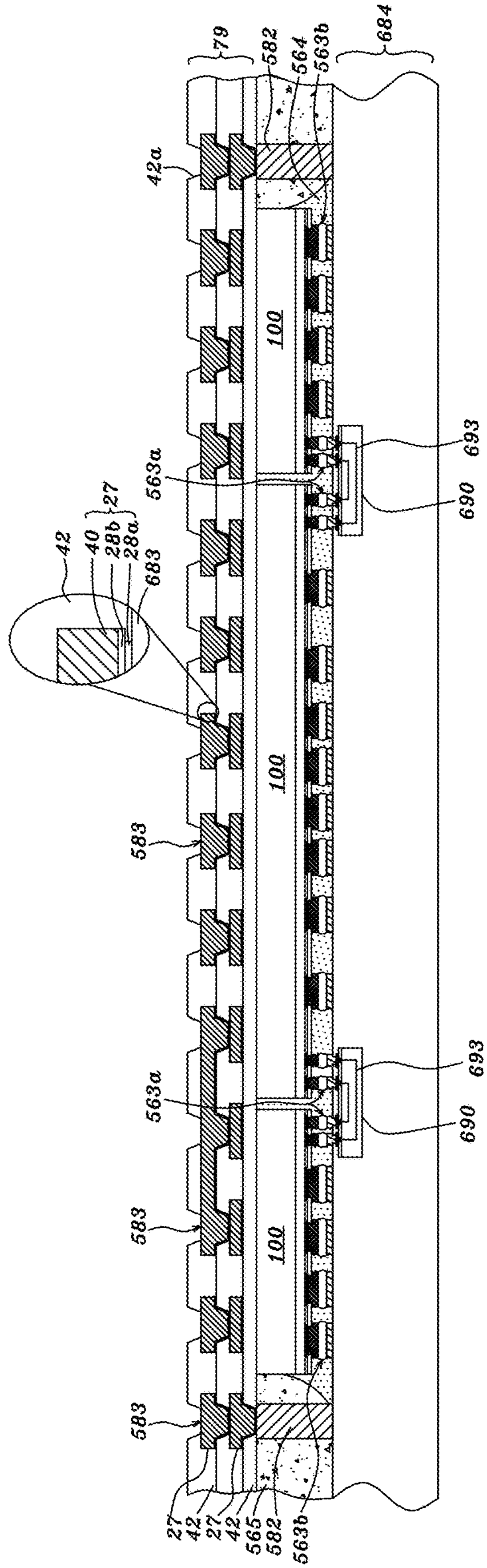

Next, referring to FIG. 19D, a backside interconnection scheme for a logic drive (BISD) 79 may be formed over the top surface of the polymer layer 565, the through package vias (TPVs) 582 and the backsides of the semiconductor chips 100. The backside interconnection scheme for a logic drive (BISD) 79 may include one or more interconnection metal layers 27 coupling to each of the through silicon vias (TPVs) 582 and one or more polymer layers 42 each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. The bottommost one of its polymer layers 42 may be between the bottommost one of its interconnection metal layers 27 and the polymer layer 585 and between the bottommost one of its interconnection metal layers 27 and the backside of each of the semiconductor chips 100, wherein each opening in the bottommost one of its polymer layers 42 may be over the top surface of one of the through silicon vias (TPVs) 582, that is, the top surface of the electroplated copper layer of each of the through silicon vias (TPVs) 582 may be at a bottom of one of the openings in the bottommost one of its polymer layers 42. Each of its interconnection metal layers 27 may extend horizontally across an edge of each of the semiconductor chips 100. The topmost one of its interconnection metal layers 27 may have multiple metal pads 583 at bottoms of multiple respective openings 42*a* in the topmost one of its polymer layers 42.

Referring to FIG. 19D, for the backside interconnection scheme for a logic drive (BISD) 79, each of its polymer layers 42 may be a layer of polyimide. BenzoCycloButene (BCB), parylene, epoxy-based material or compound, photo epoxy SU-8, elastomer or silicone, having a thickness between, for example, 0.3 μm and 30 μm, 0.5 μm and 20 μm, 1 μm and 10 μm, or 0.5 μm and 5 μm, or thicker than or equal to 0.3 μm. 0.5 μm, 0.7 μm, 1 μm, 1.5 μm, 2 μm, 3 μm or 5 μm. Each of its interconnection metal layers 27 may be provided with multiple metal traces or lines each including (1) a copper layer 40 having one or more lower portions in openings in one of its polymer layers 42 having a thickness between 0.3 μm and 20 μm, and an upper portion having a thickness 0.3 μm and 20 μm over said one of its polymer layers 42. (2) an adhesion layer 28*a*, such as titanium or titanium nitride having a thickness between 1 nm and 50 nm, at a bottom and sidewall of each of the one or more lower portions of the copper layer 40 of said each of the metal traces or lines and at a bottom of the upper portion of the copper layer 40 of said each of the metal traces or lines, and (3) a seed layer 28*b*, such as copper, between the copper layer 40 and adhesion layer 28*a* of said each of the metal traces or lines, wherein the upper portion of the copper layer 40 of said each of the metal traces or lines may have a sidewall not covered by the adhesion layer 28*a* of said each of the metal traces or lines. Each of its interconnection metal layers 27 may provide multiple metal lines or traces with a thickness between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm, and a width between, for example, 0.3 μm and 30 μm, 0.5 μm and 20 μm, 1 μm and 10 μm, or 0.5 μm and 5 μm, or wider than or equal to 0.3 μm. 0.5 μm, 0.7 μm, 1 μm, 1.5 μm, 2 μm, 3 μm or 5 μm.

Figure 19E:
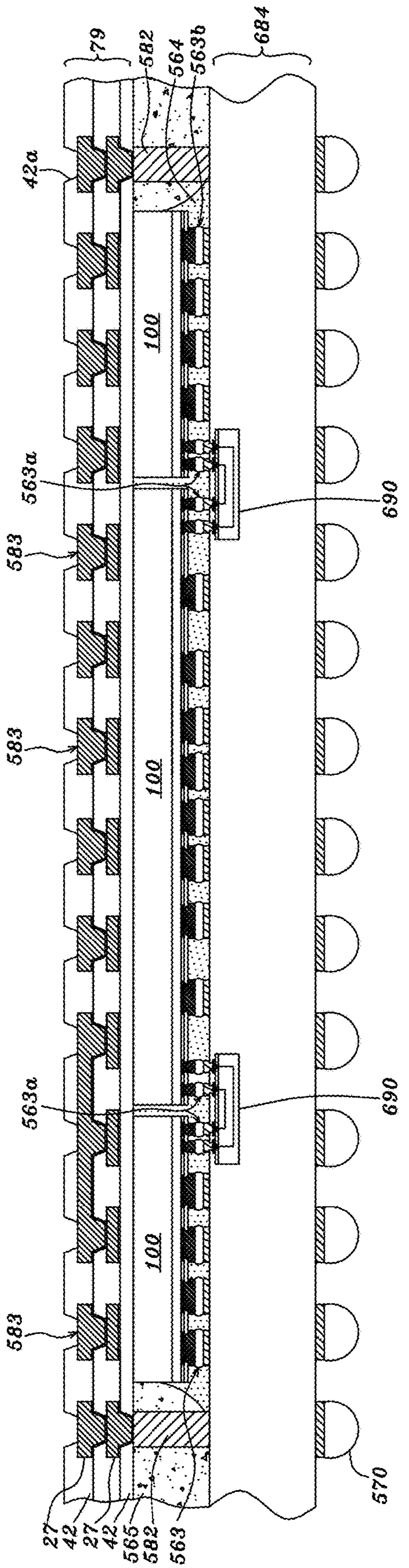

Next, referring to FIG. 19E, multiple metal bumps 570, such as solder bumps, may be formed on multiple metal pads of the bottommost one of the interconnection metal layers 668 of the second interconnection scheme for an interconnection substrate (SISIS) 699 of the interconnection substrate (IS) 684, which are exposed by the openings 683*a* in the solder mask 683 of the second interconnection scheme for an interconnection substrate (SISIS) 699 of the interconnection substrate (IS) 684, by a screen printing method or a solder-ball mounting method, and then by a solder reflow process. The metal bumps 570 may be a lead-frec solder containing tin, copper, silver, bismuth, indium zinc, antimony, and/or traces of other metals, for example. Sn—Ag—Cu (SAC) solder·Sn—Ag solder, or Sn—Ag—Cu—Zn solder. Each of the metal bumps 570 may have a height, from a backside surface of the interconnection substrate (IS) 684, for example between 5 μm and 150 μm, between 5 μm and 120 μm, between 10 μm and 100 μm, between 10 μm and 60 μm, between 10 μm and 40 μm, between 10 μm and 30 μm or greater than or equal to 75 μm, 50 μm, 30 μm, 20 μm, 15 μm or 10 μm and a largest dimension in cross-sections, such as a diameter of a circle shape or a diagonal length of a square or rectangle shape, between 5 μm and 200 μm, between 5 μm and 150 μm, between 5 μm and 120 μm, between 10 μm and 100 μm, between 10 μm and 60 μm, between 10 μm and 40 μm, between 10 μm and 30 μm or greater than or equal to 100 μm, 60 μm, 50 μm, 40 μm, 30 μm, 20 μm, 15 μm or 10 μm. The smallest space from one of the metal bumps 570 to its nearest neighboring one of the metal bumps 570 is, for example, between 5 μm and 150 μm, between 5 μm and 120 μm, between 10 μm and 100 μm, between 10 μm and 60 μm, between 10 μm and 40 μm, between 10 μm and 30 μm or greater than or equal to 60 μm, 50 μm, 40 μm, 30 μm, 20 μm, 15 μm or 10 μm.

Figure 19F:
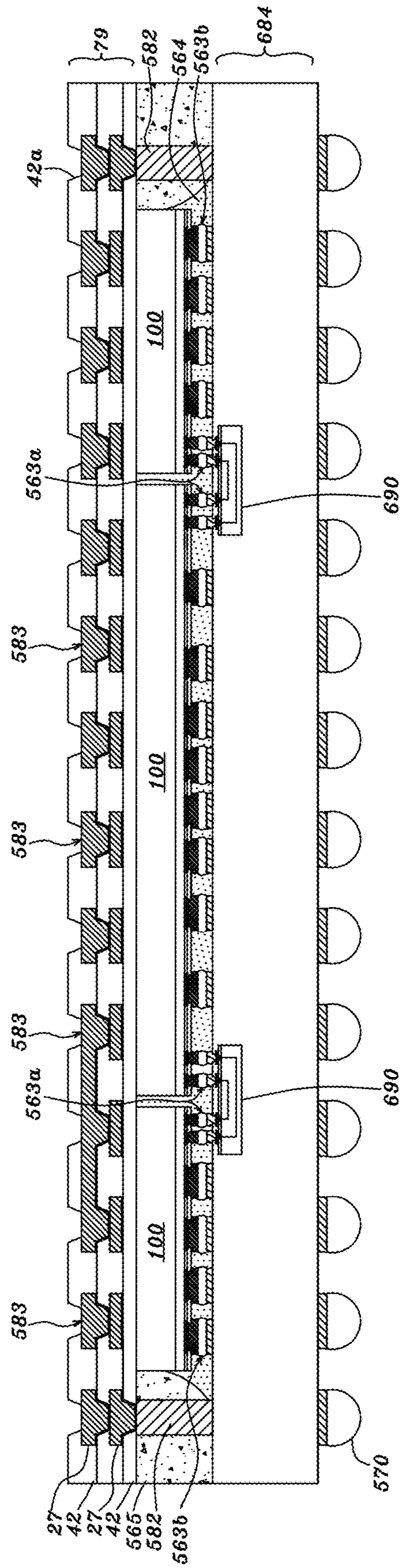

Next, the structure as seen in FIG. 19E may be cut or diced into multiple individual chip packages 300 as shown in FIG. 19F for the first or second type of standard commodity logic drives 300 as seen in FIGS. 11A and 12A or in FIGS. 11B and 12B by a laser cutting process or by a mechanical cutting process.

Embodiment for Memory Module

Figure 22:
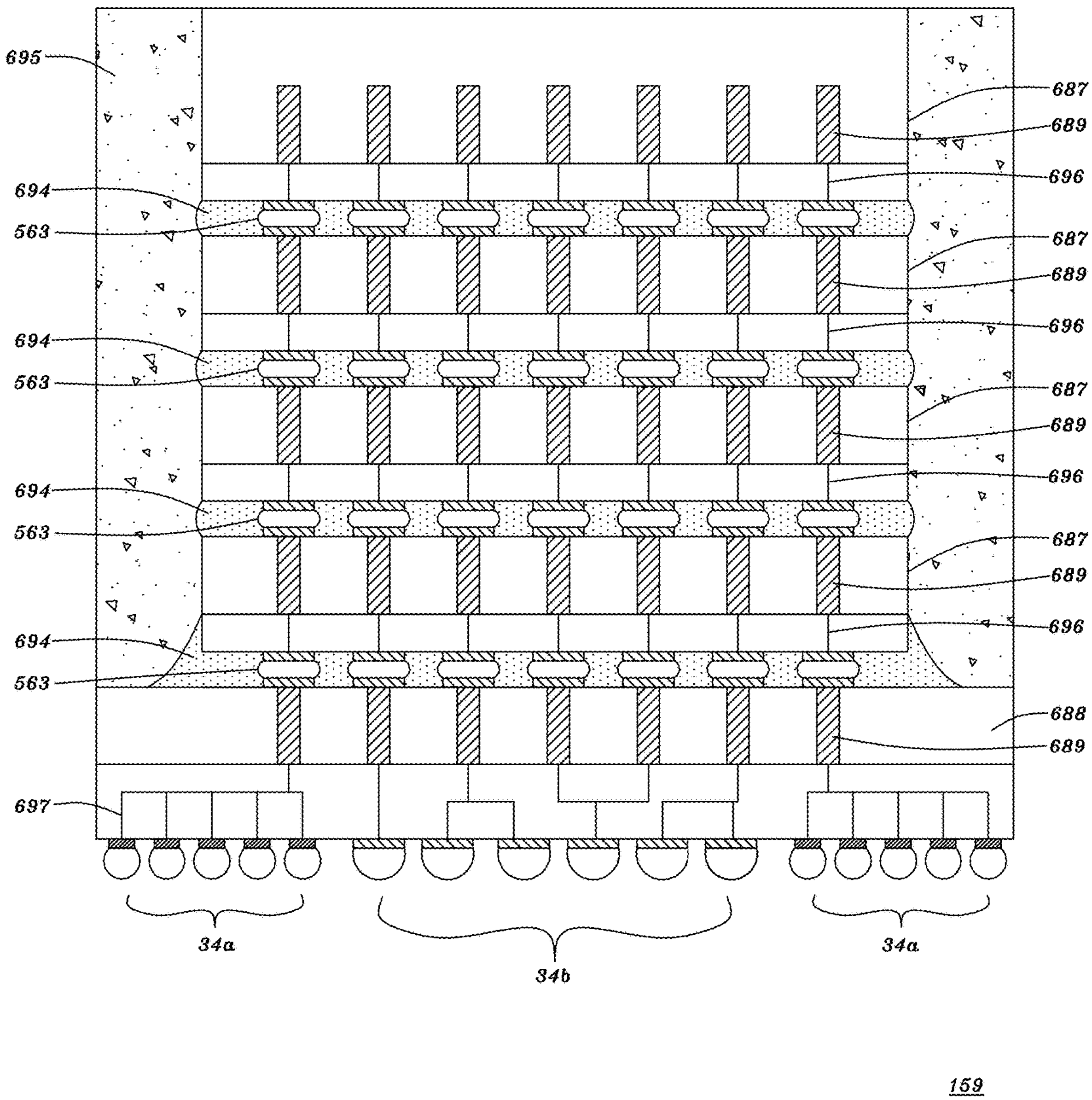
FIG. 22 is a schematically cross-sectional view showing a memory module in accordance with an embodiment of the present application.

Alternatively, each of the NVM IC chips 250 in the first or second type of standard commodity logic drive as seen in FIGS. 11A and 12A or in FIGS. 11B and 12B may be replaced with an NVM module to perform the same function, and/or each of the HBM IC chips 250 in the second type of standard commodity logic drive as seen in FIGS. 11B and 12B may be replaced with a DRAM module or a SRAM module to perform the same function. FIG. 22 is a schematically cross-sectional view showing a memory module in accordance with an embodiment of the present application. Referring to FIG. 22, a memory module 159 may include (1) multiple memory chips 687, such as NVM IC chips for the NVM module. DRAM IC chips for the DRAM module or SRAM IC chips for the SRAM module, vertically stacked together, (2) a control chip 688 under the memory chips 687, (3) multiple bonded contacts 563 between neighboring two of the memory chips 687 and between the bottommost one of the memory chips 687 and the control chip 688, and (4) multiple micro-pillars or micro-bumps 34 on a bottom surface of the control chip 688.

Referring to FIG. 22, each of the memory chips 687 may include multiple through silicon vias (TSV) 689, made of copper, therein each aligned with and connected to one of the bonded contacts 563 on a bottom surface of said each of the memory chips 687. The through silicon vias 689 in the memory chips 687, which are aligned in a vertical direction, may couple to each other or one another through the bonded contacts 563 therebetween aligned in the vertical direction and with the through silicon vias 689 therein in the vertical direction. Each of the memory chips 687 may include multiple interconnects 696 each provided by the interconnection metal layers 6 of its first interconnection scheme for a chip (FISC) 20 and/or the interconnection metal layers 27 of its second interconnection scheme for a chip (SISC) 29 to connect one or more of its through silicon vias 689 to one or more of the bonded contacts 563 at its bottom surface. An underfill 694, e.g., a polymer, may be provided between each neighboring two of the memory chips 687 and between the bottommost one of the memory chips 687 and the control chip 688. A molding compound 695. e.g. a polymer, may be formed around the memory chips 687 and over the control chip 688, wherein the topmost one of the memory chips 687 may have a top surface coplanar with a top surface of the molding compound 695.

Referring to FIG. 22, the control chip 688 may be configured to control data access for the memory chips 687. The control chip 688 may include multiple through silicon vias (TSV) 689, made of copper, therein each connected to one or more of the micro-pillars or micro-bumps 34 on a bottom surface of the control chip 688. The specification of the micro-pillars or micro-bumps 34 and the process for forming the same may be referred to those as illustrated in FIG. 16, that is, the control chip 688 may provide the micro-pillars or micro-bumps 34 on its bottom surface, like those formed on the bottom surfaces of the semiconductor chips 100 as seen in FIGS. 19A and 19B, to be bonded to the micro-pillars or micro-bumps 35 on a top surface of the interconnection substrate (IS) 684 so as to form the bonded contacts 563 between the control chip 688 and the interconnection substrate (IS) 684. The through silicon vias 689 in the control chip 688 may couple to the interconnection substrate (IS) 684 through the bonded contacts 563 each aligned with one of the through silicon vias 689 therein in a vertical direction. The control chip 688 may include multiple interconnects 697 each provided by the interconnection metal layers 6 of its first interconnection scheme for a chip (FISC) 20 and/or the interconnection metal layers 27 of its second interconnection scheme for a chip (SISC) 29 to connect one or more of its through silicon vias 689 to one or more of the micro-pillars or micro-bumps 34 at its bottom surface.

In another aspect, referring to FIGS. 19A-19F, the memory module 159 as seen in FIG. 22 may be provided for the NVM module to replace one of the NVM IC chips 250 for the first or second type of standard commodity logic drives 300 as seen in FIGS. 11A and 12A or in FIGS. 11B and 12B and to be packaged with the semiconductor chips 100 as above mentioned into the first or second type of standard commodity logic drive 300. Further, the memory module 159 as seen in FIG. 22 may be provided for the SRAM module or DRAM module to replace one of the HBM IC chips 251 for the second type of standard commodity logic drives 300 as seen in FIGS. 11B and 12B and to be packaged with the semiconductor chips 100 as above mentioned into the second type of standard commodity logic drive 300. For more elaboration, the micro-pillars or micro-bumps 34 of the memory module 159 may be divided into (1) the first group 34*a* of HDB to be bonded to the micro-bumps or micro-pads 35*a* in the first group of HDP of the interconnection substrate (IS) 684 and (2) the second group 34*b* of LDB to be bonded to the micro-bumps or micro-pads 35*b* in the second group of LDP of the interconnection substrate (IS) 684, as illustrated in FIGS. 19A and 19B. Next, the underfill 564 may be further filled into a gap between the memory module 159 and the interconnection substrate (IS) 684, as illustrated in FIG. 19B. Next, the polymer layer 565 may be applied further to fill a gap between the memory module 159 and each of the semiconductor chips 100 neighboring the memory module 159 and further cover the top surface of the memory module 159, i.e., the top surface of the molding compound 695 of the memory module 159 and the top surface of the topmost one of the memory chips 687 of the memory module 159, as illustrated in FIG. 19B. Next, the chemical mechanical polishing (CMP), polishing or grinding process may be applied to further remove a top portion of the memory module 159 to planarize the top surface of each of the through package vias (TPV) 582, the top surface of the polymer layer 565, the backside of each of the semiconductor chips 100 and the top surface of the memory module 159, as illustrated in FIG. 19C. Thereby, the top surface of the memory module 159 may be exposed. The subsequent steps are similar to the steps as illustrated in FIGS. 19D-19F so as to form multiple individual chip packages 300 as seen in FIG. 19F.

Thereby: referring to FIG. 19F, for the first or second type of standard commodity logic drive 300 as seen in FIGS. 11A and 12A or in FIGS. 11B and 12B. (1) the memory module 159 may be provided for the NVM module. SRAM module or DRAM module to couple to one of its standard commodity FPGA IC chips 200 through the metal bridging interconnects 693 of one of the fine-line interconnection bridges (FIB) 690 of its interconnection substrate (IS) 684. (2) the memory module 159 may be provided for the NVM module. SRAM module or DRAM module to couple to one of its GPU chips 269*a* through the metal bridging interconnects 693 of one of the fine-line interconnection bridges (FIB) 690 of its interconnection substrate (IS) 684, and (3) the memory module 159 may be provided for the NVM module. SRAM module or DRAM module to couple to its CPU chip 269*b* through the metal bridging interconnects 693 of one of the fine-line interconnection bridges (FIB) 690 of its interconnection substrate (IS) 684.

Interconnection for Logic Drive with Interconnection Substrate and Backside Interconnection Scheme for Logic Drive (BISD)

Figure 23A:
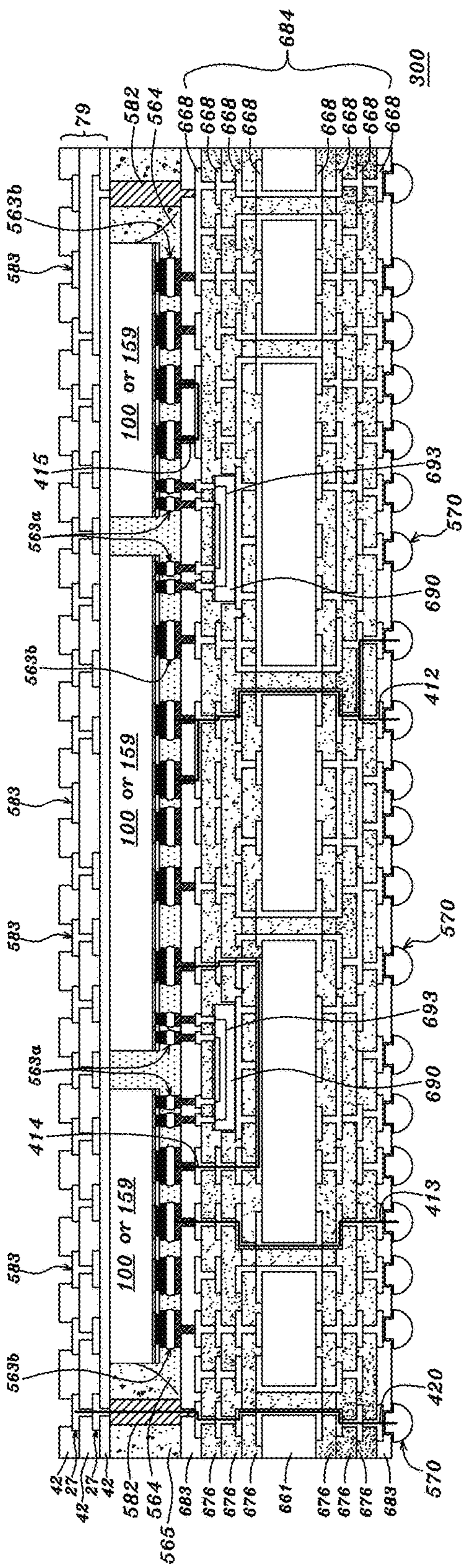
FIG. 23E is a top view of FIGS. 23A-23D, showing a layout of metal pads of a standard commodity logic drive in accordance with an embodiment of the present application.
Figure 23B:
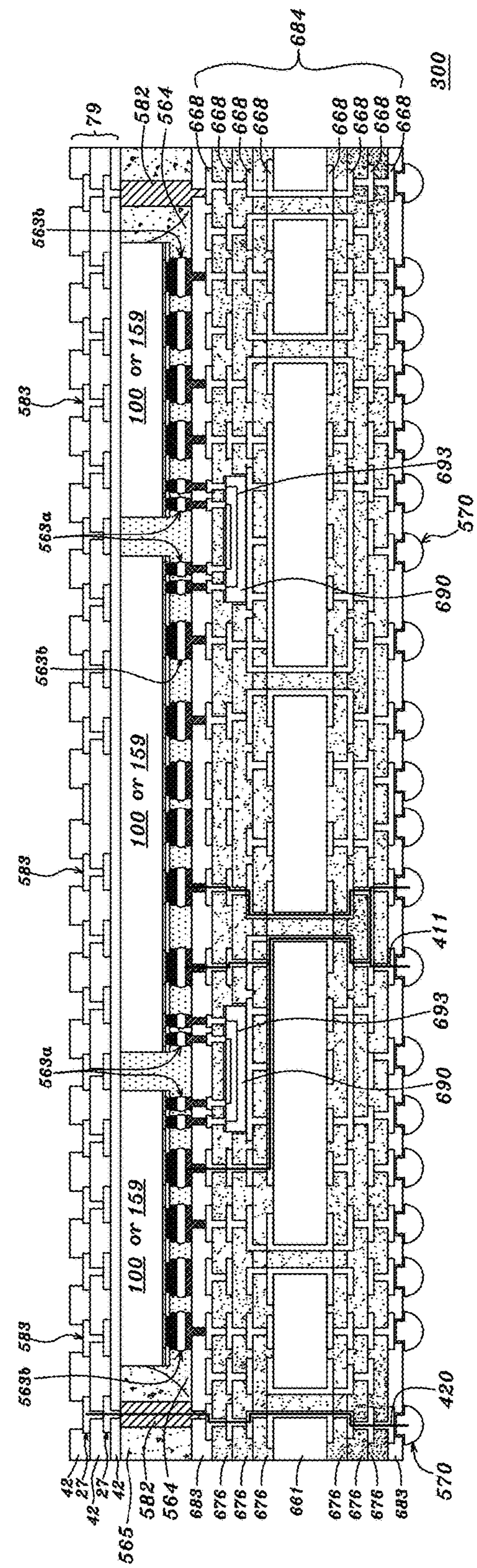

FIGS. 23A-23D are cross-sectional views showing various interconnection nets in a standard commodity logic drive in accordance with an embodiment of the present application. Referring to FIG. 23B, the interconnection metal layers 668 of the interconnection substrate (IS) 684 may connect one or more of the metal pillars or bumps 570 to one of the semiconductor chips 100 and memory modules 159 and connect one of the semiconductor chips 100 and memory modules 159 to another of the semiconductor chips 100 and memory modules 159. For a first case, the interconnection metal layers 668 of the interconnection substrate (IS) 684 may compose a first interconnection net 411 connecting multiple of the metal pillars or bumps 570 to each other or one another and connecting multiple of the semiconductor chips 100 and/or memory modules 159 to each other or one another. Said multiple of the metal pillars or bumps 570 and said multiple of the semiconductor chips 100 and/or memory modules 159 may be connected together by the first interconnection net 411. The first interconnection net 411 may be a signal bus for delivering signals or a power or ground plane or bus for delivering power or ground supply: Referring to FIG. 23A, for a second case, the interconnection metal layers 668 of the interconnection substrate (IS) 684 may compose a second interconnection net 412 connecting multiple of the metal pillars or bumps 570 to each other or one another and connecting multiple of the low-density bonded contacts 563*b* between one of the semiconductor chips 100 and memory modules 159 and the interconnection substrate (IS) 684 to each other or one another. Said multiple of the metal pillars or bumps 570 and said multiple of the low-density bonded contacts 563*b* may be connected together by the second interconnection net 412. The second interconnection net 412 may be a signal bus for delivering signals or a power or ground plane or bus for delivering power or ground supply.

Referring to FIG. 23A, for a third case, the interconnection metal layers 668 of the interconnection substrate (IS) 684 may compose a third interconnection net 413 connecting one of the metal pillars or bumps 570 to one of the low-density bonded contacts 563*b*. The third interconnection net 413 may be a signal bus or trace for signal transmission or a power or ground plane or bus for delivering power or ground supply.

Referring to FIG. 23A, for a fourth case, the interconnection metal layers 668 of the interconnection substrate (IS) 684 may compose a fourth interconnection net 414 not connecting to any of the metal pillars or bumps 570 and metal pads 583 of the standard commodity logic drive 300 but connecting multiple of the semiconductor chips 100 and/or memory modules 159 to each other or one another. The fourth interconnection net 414 may be one of the programmable interconnects 361 of the inter-chip interconnects 371 for signal transmission.

Figure 23C:
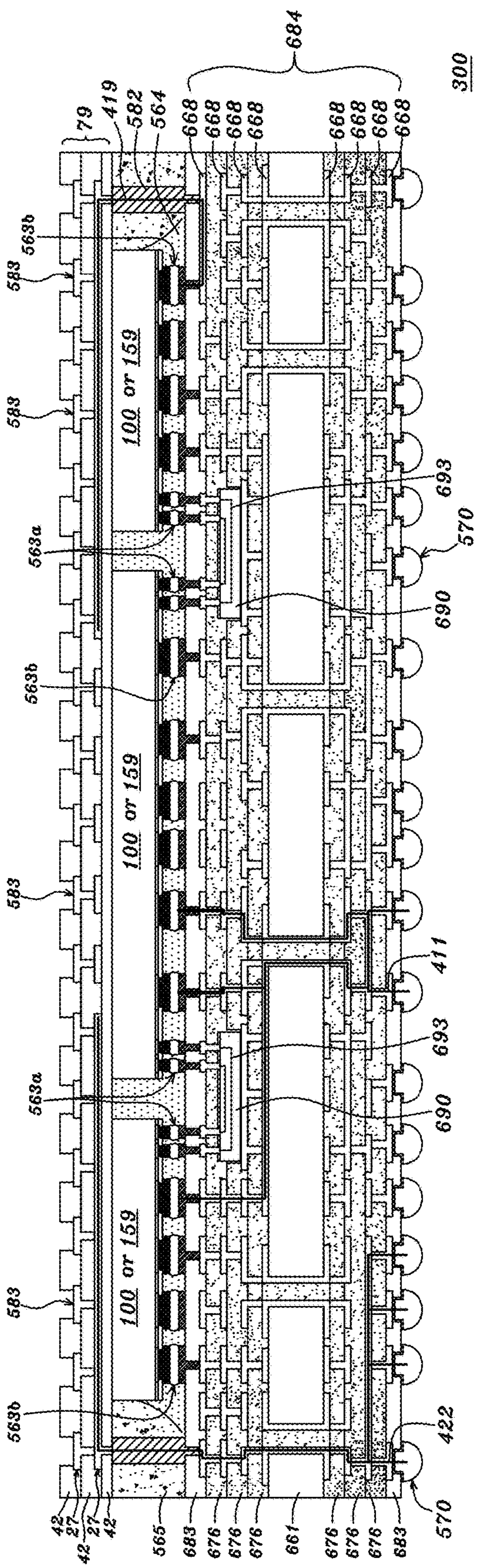
Figure 23D:
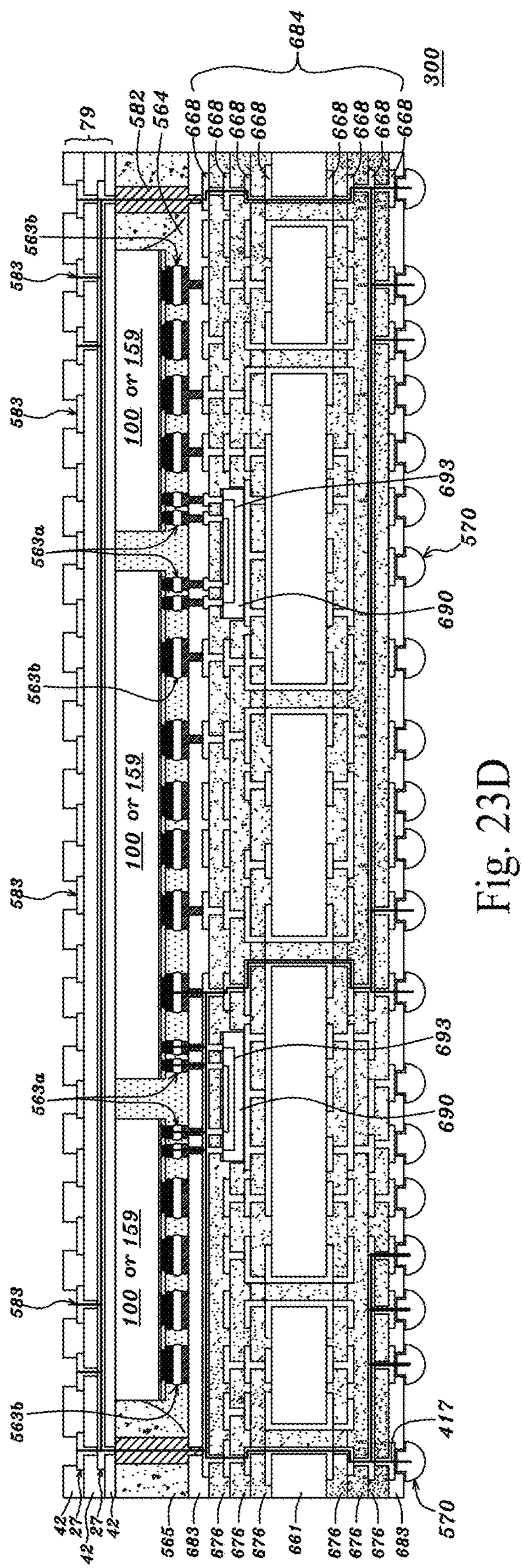

Referring to FIG. 23A, for a fifth case, the interconnection metal layers 668 of the interconnection substrate (IS) 684 may compose a fifth interconnection net 415 not connecting to any of the metal pillars or bumps 570 and metal pads 583 of the standard commodity logic drive 300 but connecting multiple of the low-density bonded contacts 563*b* between one of the semiconductor chips 100 and memory modules 159 and the interconnection substrate (IS) 684 to each other or one another. The fifth interconnection net 415 may be a signal bus or trace for signal transmission or a power or ground plane or bus for delivering power or ground supply:

Referring to FIG. 23D, for a sixth case, the interconnection metal layers 668 of the interconnection substrate (IS) 684, the interconnection metal layers 27 of the backside interconnection scheme for a logic driver (BISD) 79 and the through package vias (TPVs) 582 may compose a seventh interconnection net 417 connecting multiple of the metal pillars or bumps 570 to each other or one another, connecting multiple of the semiconductor chips 100 and/or memory modules 159 to each other or one another, connecting multiple of the metal pads 583 to each other or one another and connecting one or more of the first metal pads 691 of one of the fine-line interconnection bridges (FIB) 690 to one or more of the second metal pads 692 of said one of the fine-line interconnection bridges 690. Said multiple of the metal pillars or bumps 570, said multiple of the semiconductor chips 100 and/or memory modules 159, said multiple of the metal pads 583 and said one or more of the first and second metal pads 691 and 692 of said one of the fine-line interconnection bridges (FIB) 690 may be connected together by the seventh interconnection net 417. The seventh interconnection net 417 may be a signal bus for delivering signals or a power or ground plane or bus for delivering power or ground supply:

Referring to FIGS. 23B and 23D, the interconnection metal layers 27 of the backside interconnection scheme for a logic driver (BISD) 79 may be connected to the interconnection metal layers 668 of the interconnection substrate (IS) 684 through the through package vias (TPVs) 582. For example, each of the metal pads 583 of the backside interconnection scheme for a logic driver (BISD) 79 in a first group may be connected to one or more of the semiconductor chips 100 and/or memory modules 159 through the interconnection metal layers 27 of the backside interconnection scheme for a logic driver (BISD) 79, one or more of the through, in sequence, package vias (TPVs) 582 and one or more of the interconnection metal layers 668 of the interconnection substrate (IS) 684, as provided by the seventh interconnection net 417, wherein multiple of the metal pads 583 in the first group may be connected to each other or one another through the interconnection metal layers 27 of the backside interconnection scheme for a logic driver (BISD) 79 and to one or more of the metal pillars or bumps 570 through, in sequence, the interconnection metal layers 27 of the backside interconnection scheme for a logic driver (BISD) 79, one or more of the through package vias (TPVs) 582 and the interconnection metal layers 668 of the interconnection substrate (IS) 684. Alternatively, said multiple of the metal pads 583 in the first group may be divided into a first subset of one or ones over a backside of one of the semiconductor chips 100 and memory modules 159 and a second subset of one or ones over a backside of another of the semiconductor chips 100 and memory modules 159, as provided by the first or seventh interconnection net 417. Alternatively, one or multiple of the metal pads 583 in the first group may not be connected to any of the metal pillars or bumps 570 of the standard commodity logic drive 300, as provided by a sixth interconnection net 419 in FIG. 23C. Multiple of the metal pads 583 in the first group may be connected to each other or one another through the interconnection metal layers 27 of the backside interconnection scheme for a logic driver (BISD) 79 and to one or more of the semiconductor chips 100 and/or memory modules 159 through, in sequence, the interconnection metal layers 27 of the backside interconnection scheme for a logic driver (BISD) 79, one or more of the TPVs 582 and one or more of the interconnection metal layers 668 of the interconnection substrate (IS) 684, wherein said multiple of the metal pads 583 in the first group may have some over said one or more of the semiconductor chips 100 and/or memory modules 159, as provided by the sixth interconnection net 419.

Referring to FIGS. 23A and 23B, each of the metal pads 583 of the backside interconnection scheme for a logic driver (BISD) 79 in a second group may not be connected to any of the semiconductor chips 100 and memory modules 159 of the standard commodity logic drive 300 but connected to one or more of the metal pillars or bumps 570 through, in sequence, the interconnection metal layers 27 of the backside interconnection scheme for a logic driver (BISD) 79, one or more of the through package vias (TPVs) 582 and the interconnection metal layers 668 of the interconnection substrate (IS) 684, as provided by an eighth interconnection net 420 in FIG. 23A or 23B or a ninth interconnection net 422 in FIG. 23C. Alternatively, multiple of the metal pads 583 of the backside interconnection scheme for a logic driver (BISD) 79 in the second group may not be connected to any of the semiconductor chips 100 and memory modules 159 of the standard commodity logic drive 300 but connected to each other or one another through the interconnection metal layers 27 of the backside interconnection scheme for a logic driver (BISD) 79 and to one or more of the metal pillars or bumps 570 through, in sequence, the interconnection metal layers 27 of the backside interconnection scheme for a logic driver (BISD) 79, one or more of the through package vias (TPVs) 582 and the interconnection metal layers 668 of the interconnection substrate (IS) 684, wherein said multiple of the metal pads 583 in the second group may be divided into a first subset of one or ones over a backside of one of the semiconductor chips 100 and memory modules 159 and a second subset of one or ones over a backside of another of the semiconductor chips 100 and memory modules 159, as provided by the ninth interconnection net 422 in FIG. 23C.

Figure 23E:
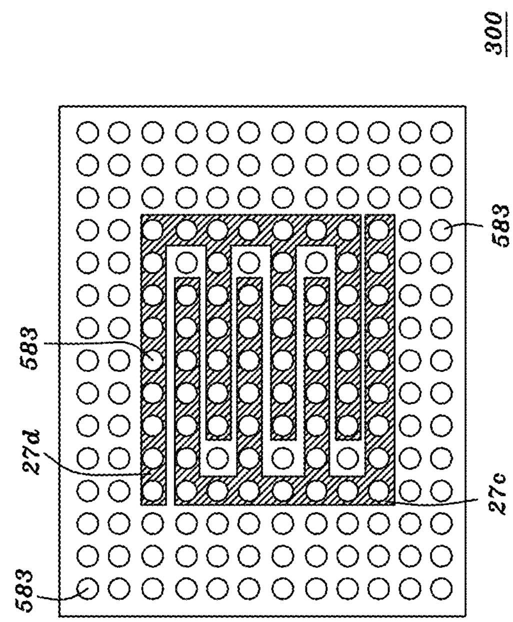

Referring to FIG. 23A-23D, one of the interconnection metal layers 27 in the backside interconnection scheme for a logic driver (BISD) 79 may include a power plane 27*c* and ground plane 27*d* for a power supply as shown in FIG. 23E. FIG. 23E is a top view of FIGS. 23A-23D, showing a layout of metal pads of a standard commodity logic drive in accordance with an embodiment of the present application. Referring to FIG. 23E, the metal pads 583 may be layout in an array at a backside of the standard commodity logic drive 300. A third group of metal pads 583 may be vertically over the power plane 27*c* of the backside interconnection scheme for a logic driver (BISD) 79 and couple to the power plane 27*c*. A fourth group of metal pads 583 may be vertically over the ground plane 27*d* of the backside interconnection scheme for a logic driver (BISD) 79 and couple to the ground plane 27*d*. A fifth group of metal pads 583 is arranged in an array in a central region of a backside surface of the standard commodity logic drive 300, and a sixth group of the metal pads 583 may be arranged in an array in a peripheral region, surrounding the central region, of the backside surface of the standard commodity logic drive 300. More than 90% or 80% of the metal pads 583 in the fifth group may be used for power supply or ground reference. More than 50% or 60% of the metal pads 583 in the sixth group may be used for signal transmission. The metal pads 583 in the sixth group may be arranged in one or more rings, such as 1 2, 3, 4, 5 or 6 rings, along the edges of the backside surface of the standard commodity logic drive 300. The minimum pitch of the metal pads 583 in the sixth group may be smaller than that of the metal pads 583 in the fifth group.

Alternatively, referring to FIGS. 23A-23D, one of the interconnection metal layers 27 of the backside interconnection scheme for a logic driver (BISD) 79, such as the topmost one, may include a thermal plane for heat dispassion as provided by the ninth interconnection net 422, and the ninth interconnection net 422 may include one or more of the through package vias (TPVs) 582 for thermal vias formed vertical under the thermal plane for heat dispassion.

Referring to FIGS. 23A-23B, for each of the standard commodity logic drives 300, one of its semiconductor chips 100 may be the FPGA IC chip 200 as illustrated in FIG. 8A-8B or the DPIIC chip 410 as illustrated in FIG. 9, including multiple configurable switches, e.g., pass/no-pass switches 258 as illustrated in FIGS. 2A-2C or cross-point switches 379 as illustrated in FIG. 3A, 3B or 7, each configured to control connection between two of the programmable interconnects 361 of said one of its semiconductor chips 100. Thereby, said each of the configurable switches may couple to one of its high-density and low-density bonded contacts 563*a* and 563*b* through one of said two of the programmable interconnects 361 to program said one of its high-density and low-density bonded contacts 563*a* and 563*b*, and thus said one of its high-density and low-density bonded contacts 563*a* and 563*b* is programmable. Alternatively, said each of the configurable switches may couple to one of its metal bumps or pillars 570 through one of said two of the programmable interconnects 361 to program said one of its metal bumps or pillars 570, and thus said one of its metal bumps or pillars 570 is programmable. Alternatively, said each of the configurable switches may couple to one of its through package vias (TPVs) 582 through one of said two of the programmable interconnects 361 to program said one of its through package vias (TPVs) 582, and thus said one of its through package vias (TPVs) 582 is programmable. Alternatively; said each of the configurable switches may couple to one of its metal pads 583 through one of said two of the programmable interconnects 361 to program said one of its metal pads 583, and thus said one of its metal pads 583 is programmable.

Package-on-Package (POP) Assembly

Figure 24A:
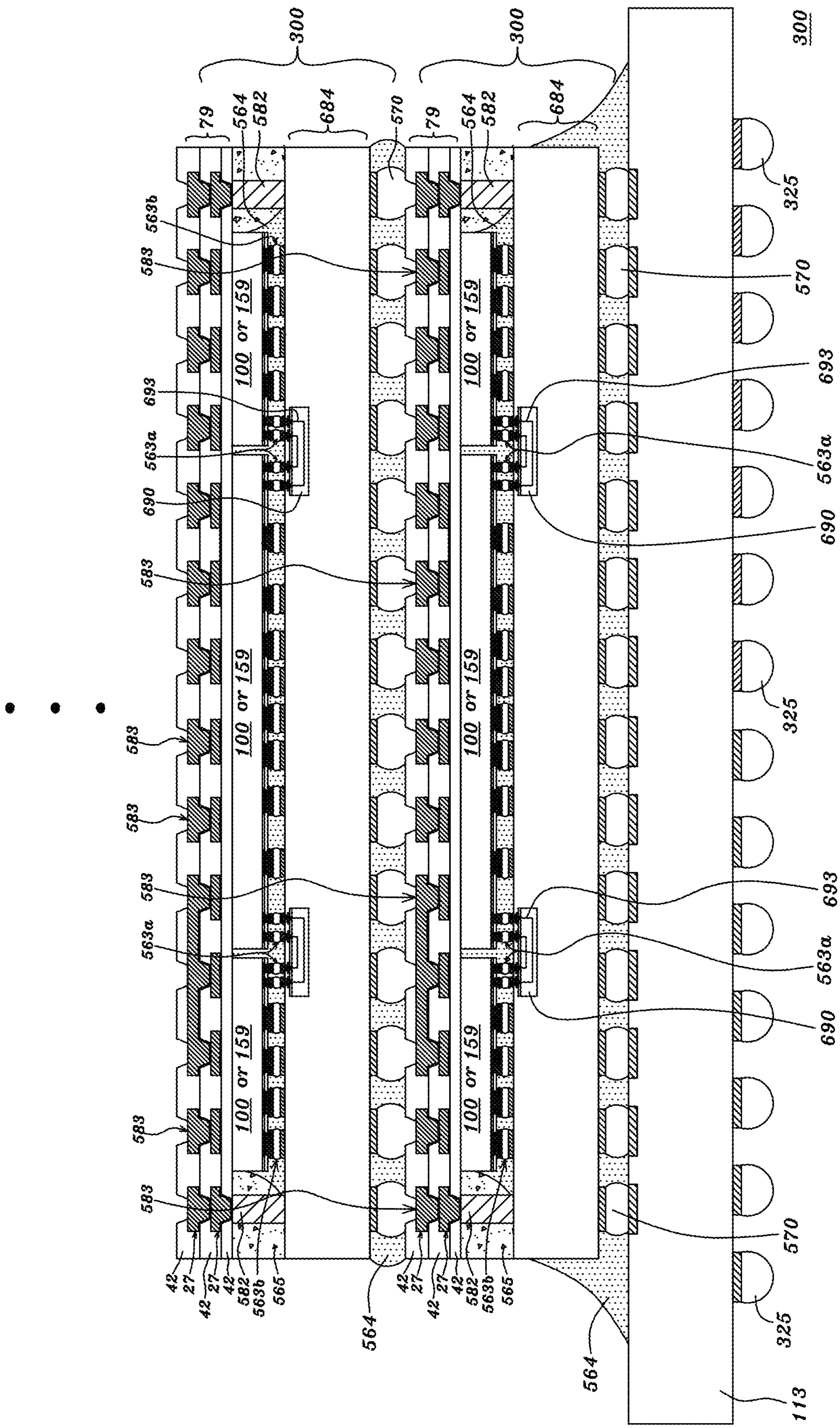
FIG. 24A is a schematically cross-sectional view showing a process for forming a package-on-package (POP) assembly for multiple standard commodity logic drives in accordance with an embodiment of the present application.

FIG. 24A is a schematically cross-sectional view showing a process for forming a package-on-package (POP) assembly for multiple standard commodity logic drives in accordance with an embodiment of the present application. Multiple standard commodity logic drives 300 as illustrated in FIG. 19F each having one or more of the interconnection nets 411, 412, 413, 414, 415, 417, 419, 420 and 422 as illustrated in FIGS. 23A-23D may be provided to be stacked together to form a package-on-package (POP) assembly 311 as seen in FIG. 24A.

Referring to FIG. 24A, a circuit carrier substrate may be first provided. Next, the bottommost one of the standard commodity logic drives 300 may have its metal bumps or pillars 570 to be bonded to the circuit carrier substrate. Next, an underfill 564 may be filled into a gap between the bottommost one of the standard commodity logic drives 300 and the circuit carrier substrate to enclose the metal bumps or pillars 570 of the bottommost one of the standard commodity logic drives 300.

Next, referring to FIG. 24A, in a first step, an upper one of the standard commodity logic drives 300 may have its metal bumps or pillars 570 to be bonded respectively to the metal pads 583 of a lower one of the standard commodity logic drives 300. Next, in a second step, an underfill 564 may be filled into a gap between the upper and lower ones of the standard commodity logic drives 300 to enclose the metal bumps or pillars 570 of the upper one of the standard commodity logic drives 300.

Next, referring to FIG. 24A, the above first and second steps may be alternately repeated multiple times to stack, one by one, multiple of the standard commodity logic drives 300 having the number greater than or equal to two, such as four or eight. For a case, the standard commodity logic drives 300 stacked as seen in FIG. 24A may be the same.

Next, referring to FIG. 24A, multiple solder balls 325 may planted on a bottom surface of the circuit carrier substrate. Next, the circuit carrier structure may be separated, cut or diced into multiple individual substrate units 113, such as printed circuit boards (PCBs), ball-grid-array (BGA) substrates, flexible circuit films or tapes, or ceramic circuit substrates, by a laser cutting process or by a mechanical cutting process.

Figure 24B:
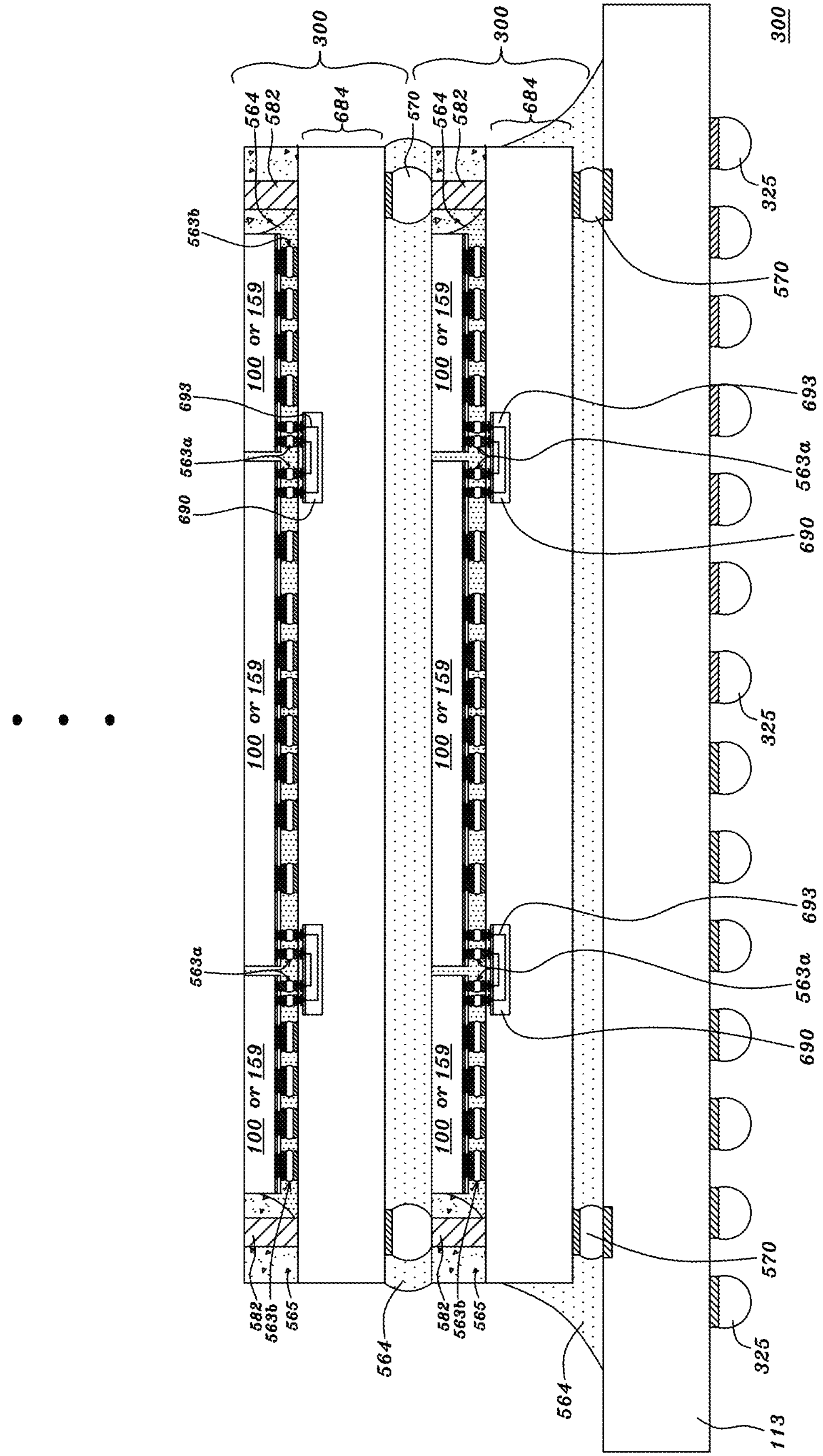
FIG. 24B is a schematically cross-sectional view showing a process for forming a package-on-package (POP) assembly for multiple standard commodity logic drives in accordance with another embodiment of the present application.

Alternatively, FIG. 24B is a schematically cross-sectional view showing a process for forming a package-on-package (POP) assembly for multiple standard commodity logic drives in accordance with another embodiment of the present application. For an element indicated by the same reference number shown in FIGS. 24A and 24B, the specification of the element as seen in FIG. 24B may be referred to that of the element as illustrated in FIG. 24A. The difference between the package-on-package (POP) assemblies 311 as seen in FIGS. 24A and 24B is that each of the standard commodity logic drives 300 of the package-on-package (POP) assembly 311 as seen in FIG. 24B is provided without the backside interconnection scheme for a logic drive (BISD) 79. For the package-on-package (POP) assembly 311 as seen in FIG. 24B, an upper one of its standard commodity logic drives 300 may have the metal bumps or pillars 570 bonded respectively to the through package vias (TPVs) 582 of a lower one of its standard commodity logic drives 300 or bonded respectively to its substrate unit 113.

Interconnection for Package-on-Package (POP) Assembly

Figure 25A:
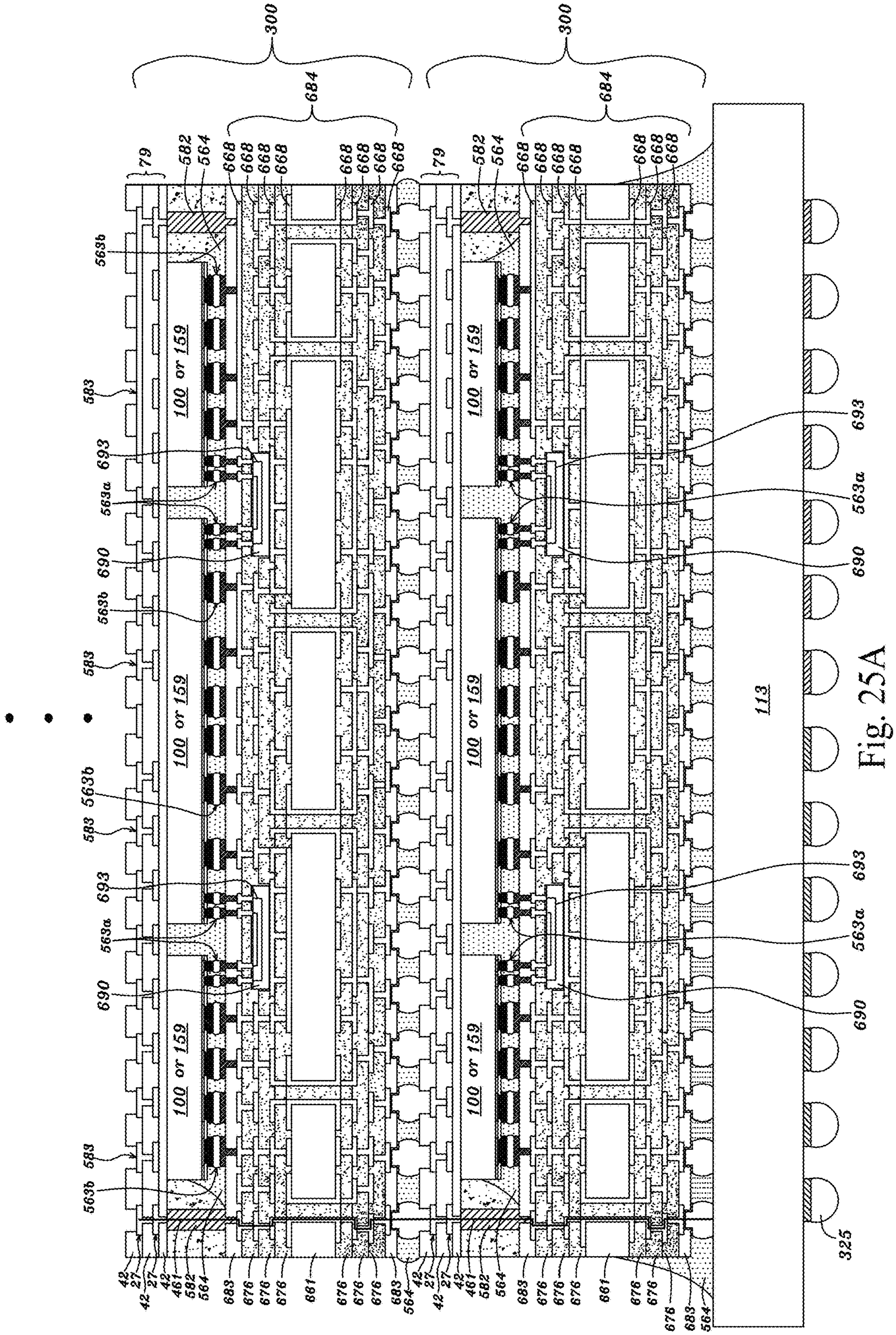
FIGS. 25A-25C are cross-sectional views showing various inter-drive interconnects in a package-on-package (POP) assembly in accordance with an embodiment of the present application.
Figure 25B:
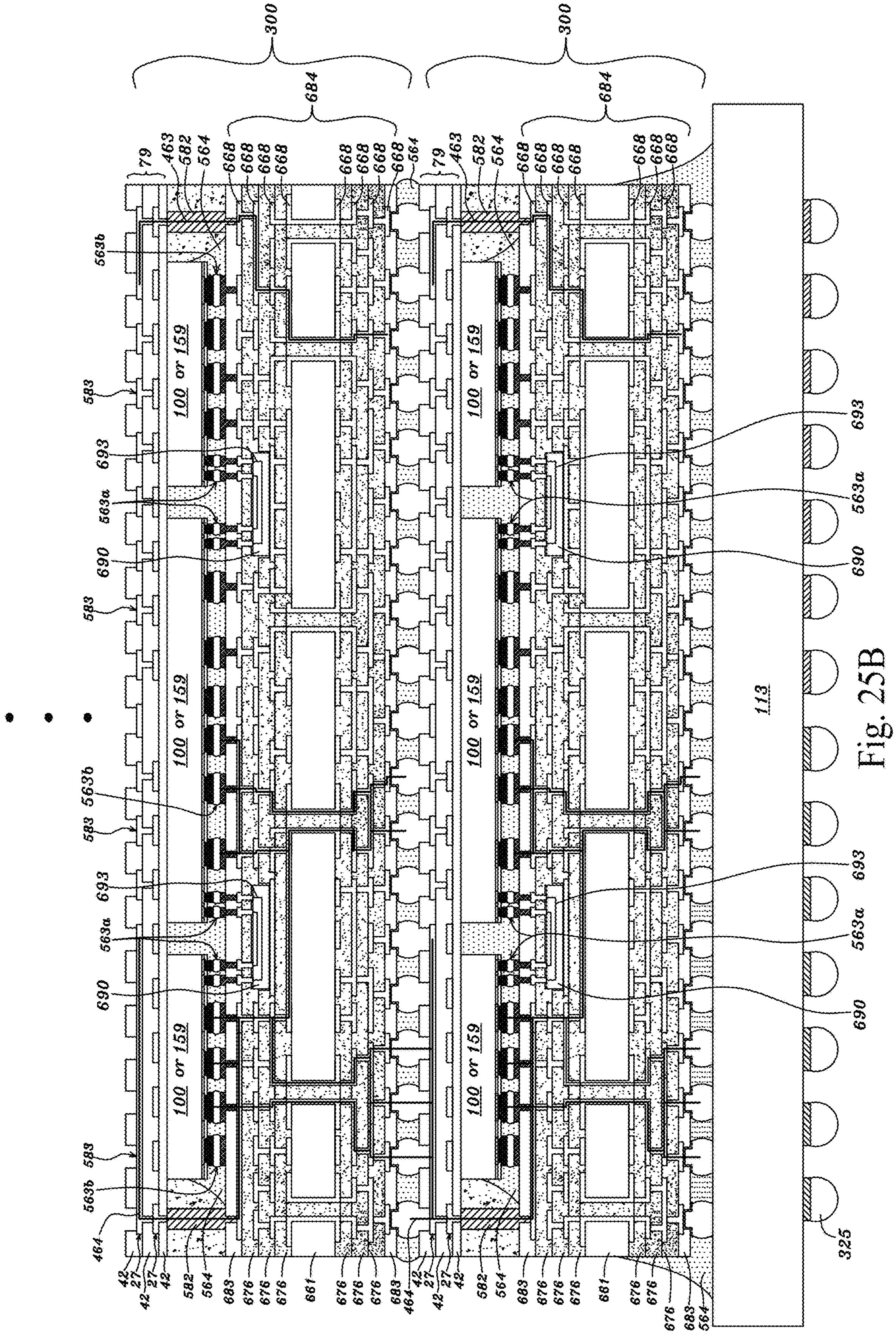
Figure 25C:
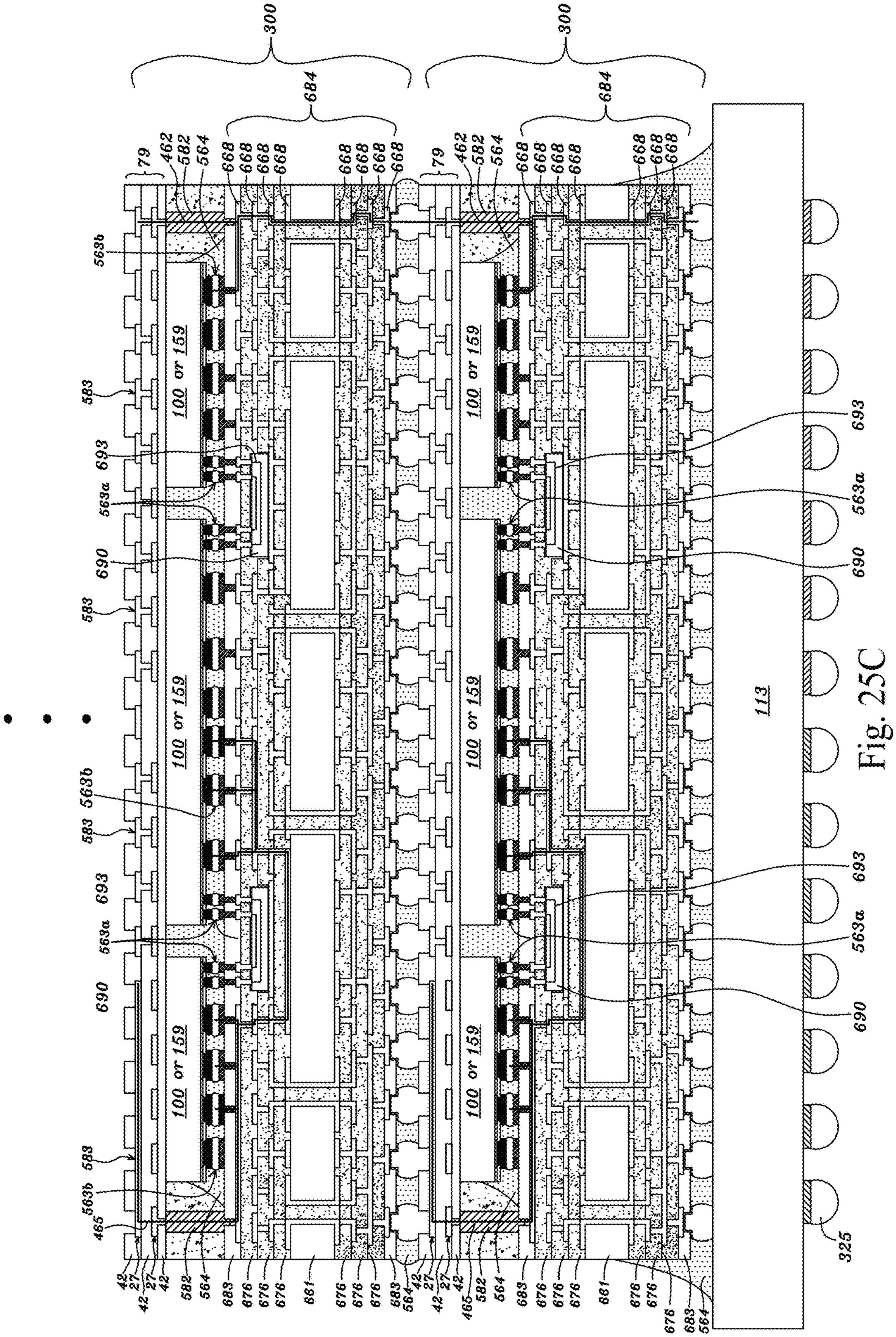

FIGS. 25A-25C are cross-sectional views showing various inter-drive interconnects in a package-on-package (POP) assembly in accordance with an embodiment of the present application. Referring to FIG. 25A, the package-on-package (POP) assembly 311 may be provided with a first inter-drive interconnect 461 composed of a twelfth interconnect net of each of its standard commodity logic drives 300, including, from top to bottom: (i) one of the metal pads 583 of the backside interconnection scheme for a logic drive (BISD) 79 of said each of its standard commodity logic drives 300. (ii) a stacked portion of the interconnection metal layers 27 of the backside interconnection scheme for a logic drive (BISD) 79 of said each of its standard commodity logic drives 300. (iii) one of the through package vias (TPVs) 582 of said each of its standard commodity logic drives 300. (iv) a stacked portion of the interconnection metal layers 668 of the interconnection substrate (IS) 684 of said each of its standard commodity logic drives 300, and (v) one of the metal pillars or bumps 570 of said each of its standard commodity logic drives 300, coupling with one another. For the package-on-package (POP) assembly 311, the twelfth interconnect nets of its standard commodity logic drives 300 may couple to each other or one another to form its first inter-drive interconnect 461 not coupling to any of its semiconductor chips 100 and memory modules 159. Alternatively, referring to FIG. 25C, the package-on-package (POP) assembly 311 may be provided with a second inter-drive interconnect 462 like the first inter-drive interconnect 461, but its second inter-drive interconnect 462 may connect or couple to one or more of the semiconductor chips 100 and/or memory modules 159 of each of its standard commodity logic drives 300 through the interconnection metal layers 668 of the interconnection substrate (IS) 684 of said each of its standard commodity logic drives 300. Alternatively, referring to FIG. 25B, the package-on-package (POP) assembly 311 may be provided with a third inter-drive interconnect 463 like the first inter-drive interconnect 461, but the metal pillars or bump 570 of its third inter-drive interconnect 463 may not be aligned with the through package via 582 of its third inter-drive interconnect 463 but vertically under one of its semiconductor chips 100 and/or memory modules 159.

Alternatively: referring to FIG. 25B, the package-on-package (POP) assembly 311 may be provided with a fourth inter-drive interconnect 464 composed of a thirteenth interconnect net of each of its standard commodity logic drives 300, including, from top to bottom: (i) one or more of the metal pads 583 of the backside interconnection scheme for a logic drive (BISD) 79 of said each of its standard commodity logic drives 300 vertically over one or more of the semiconductor chips 100 and/or memory modules 159 of said each of its standard commodity logic drives 300. (ii) a first horizontally-distributed portion of the interconnection metal layers 27 of the backside interconnection scheme for a logic drive (BISD) 79 of said each of its standard commodity logic drives 300. (iii) one of the through package vias (TPVs) 582 of said each of its standard commodity logic drives 300 coupling to said one or more of the metal pads 583 through the first horizontally-distributed portion. (iv) a second horizontally-distributed portion of the interconnection metal layers 668 of the interconnection substrate (IS) 684 of said each of its standard commodity logic drives 300 coupling said one of the through package vias (TPVs) 582 to said one or more of the semiconductor chips 100 and/or memory modules 159, and (v) one or more metal pillars or bumps 570 vertically under said one or more of the semiconductor chips 100 and/or memory modules 159 coupling to said one or more of the semiconductor chips 100 and/or memory modules 159 through the second horizontally-distributed portion. Alternatively, referring to FIG. 25C, the package-on-package (POP) assembly 311 may be provided with a fifth inter-drive interconnect 465 like the fourth inter-drive interconnect 464, but the fifth inter-drive interconnect 465 is not composed of any of the metal pillar or bumps 570 of said each of its standard commodity logic drives 300, that is, the second horizontally-distributed portion of the fifth inter-drive interconnect 465 does not couple said one or more of the semiconductor chips 100 and/or memory modules 159 to any of the metal pillar or bumps 570 of said each of its standard commodity logic drives 300.

Immersive IC Interconnection Environment (IIIE)

Referring to FIGS. 25A-25C, the standard commodity logic drives 300 may be stacked to form a super-rich interconnection scheme or environment, wherein their semiconductor chips 100 provided for the standard commodity FPGA IC chips 200 having the programmable logic blocks (LB) 201 as illustrated in FIG. 6A-6D and the cross-point switches 379 as illustrated in FIGS. 3A, 3B and 7, may immerse in the super-rich interconnection scheme or environment, i.e., programmable 3D immersive IC interconnection environment (IIIE). For one of the standard commodity FPGA IC chips 200 in one of the standard commodity logic drives 300. (1) the interconnection metal layers 6 and/or 27 of its first interconnection scheme for a chip (FISC) 20 and/or second interconnection scheme for a chip SISC 29, the high-density and low-density bonded contacts 563*a* and 563*b* between said one of the standard commodity FPGA IC chips 200 and the interconnection substrate (IS) 684 of said one of the standard commodity logic drives 300, the interconnection metal layers 668 of the interconnection substrate (IS) 684 of said one of the standard commodity logic drives 300, the interconnection metal layers 6 and/or 27 of the first and/or second interconnection schemes for an interconnection bridge (FISIB) 560 and (SISIB) 588 of one of the interconnection bridges (FIB) 690 of the interconnection substrate (IS) 684 of said each of its standard commodity logic drives 300 and the metal pillars or bumps 570 of said one of the standard commodity logic drives 300 are provided under the programmable logic blocks (LB) 201 and cross-point switches 379 of said one of the standard commodity FPGA IC chips 200; (2) the interconnection metal layers 27 of the backside interconnection scheme for a logic device (BISD) 79 of said one of the standard commodity logic drives 300 and the metal pads 583 of the backside interconnection scheme for a logic device (BISD) 79 of said one of the logic drives 300 are provided over the programmable logic blocks (LB) 201 and cross-point switches 379 of said one of the standard commodity FPGA IC chips 200; and (3) the through package vias (TPVs) 582 of said one of the standard commodity logic drives 300 are provided surrounding the programmable logic blocks (LB) 201 and cross-point switches 379 of said one of the standard commodity FPGA IC chips 200. Thus, the programmable 3D IIIE provides the super-rich interconnection scheme or environment, comprising the first interconnection scheme for a chip (FISC) 20 and/or second interconnection scheme for a chip (SISC) 29 of each of the semiconductor chips 100 provided for the standard commodity FPGA IC chips 200 and DPIIC chips 410 of each of its the standard commodity logic drives 300, the high-density and low-density bonded contacts 563*a* and 563*b* between said each of the semiconductor chips 100 and one of the interconnection substrate (IS) 684 of said each of its the standard commodity logic drives 300, the interconnection metal layers 668 of said one of the interconnection substrate (IS) 684 of said each of its the standard commodity logic drives 300, the interconnection metal layers 6 and/or 27 of the first and/or second interconnection schemes for an interconnection bridge (FISIB) 560 and (SISIB) 588 of one of the interconnection bridges (FIB) 690 of the interconnection substrate (IS) 684 of said each of its standard commodity logic drives 300, the interconnection metal layers 27 of the backside interconnection scheme for a logic device (BISD) 79 of said each of the standard commodity logic drives 300, the through package vias (TPVs) 582 of said each of the standard commodity logic drives 300 and the metal pillars or bumps 570 of said each of the standard commodity logic drives 300, for constructing an interconnection scheme or system in three dimensions (3D). For the programmable 3D immersive IC interconnection environment (IIIE), its interconnection scheme or system in a horizontal direction may be programmed by the cross-point switches 379 of each of the standard commodity FPGA IC chips 200 and DPIIC chips 410 of its standard commodity logic drives 300. Also, its interconnection scheme or system in a vertical direction may be programmed by the cross-point switches 379 of each of the standard commodity FPGA IC chips 200 and DPIIC chips 410 of its standard commodity logic drives 300.

Figure 26A:
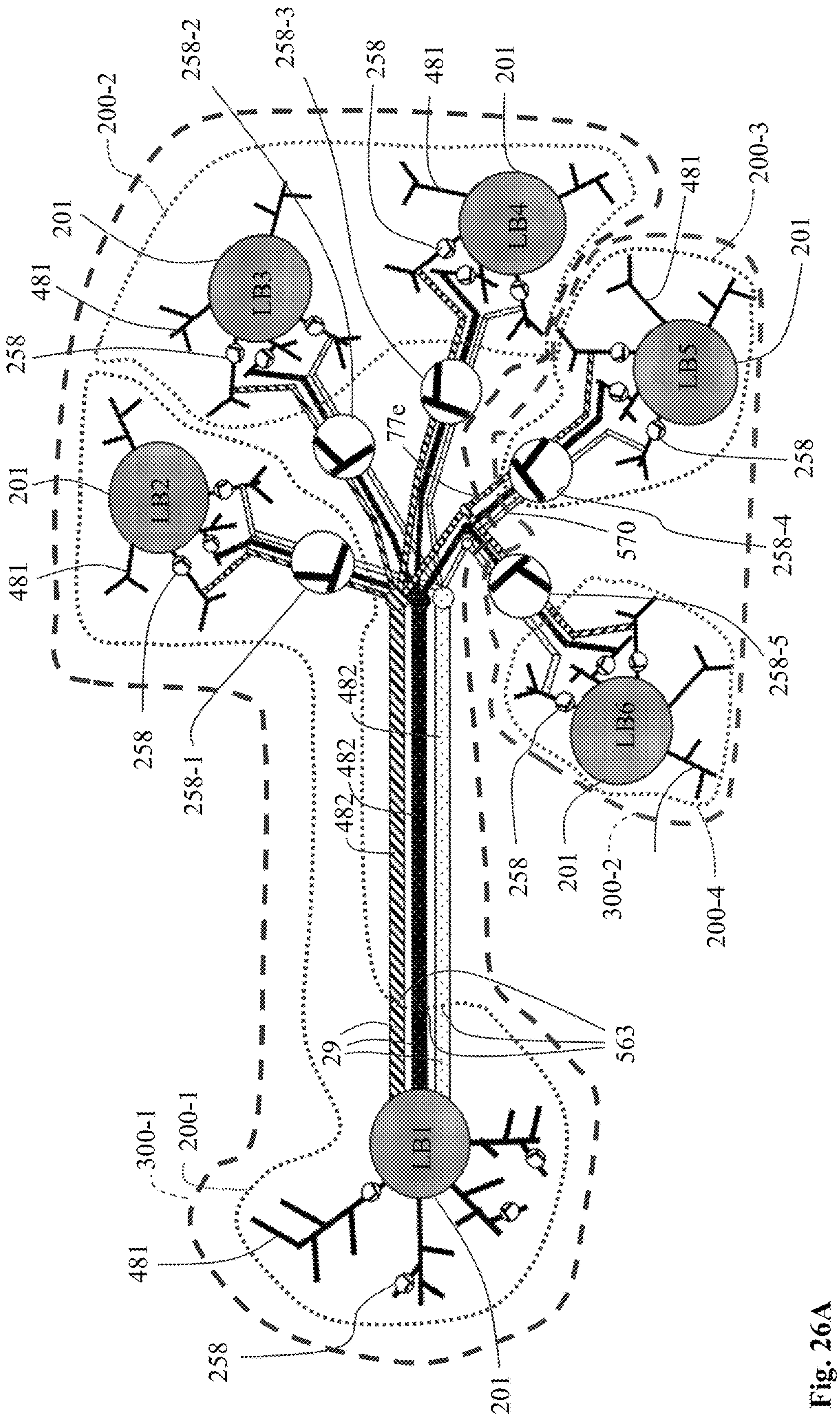
FIGS. 26A and 26B are conceptual views showing interconnection between multiple programmable logic blocks in view of an aspect of human's nerve system in accordance with an embodiment of the present application.
Figure 26B:
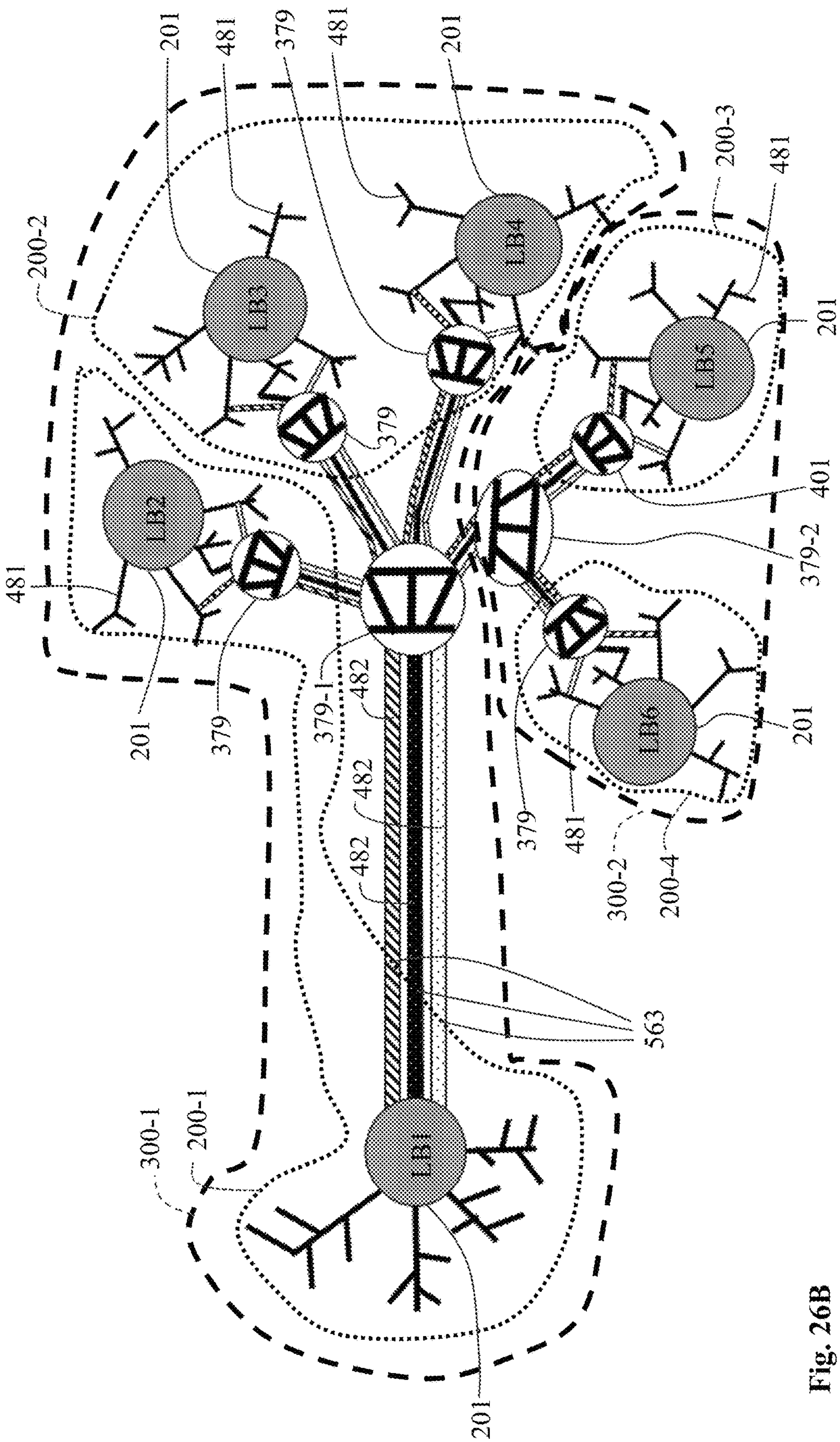

FIGS. 26A and 26B are conceptual views showing interconnection between multiple programmable logic blocks in view of an aspect of human's nerve system in accordance with an embodiment of the present application. For an element indicated by the same reference number shown in FIGS. 26A and 26B and in above-illustrated figures, the specification of the element as seen in FIGS. 26A and 26B may be referred to that of the element as above illustrated in the figures. Referring to FIG. 26A, the programmable 3D IIIE is similar or analogous to a human brain. For the programmable 3D immersive IC interconnection environment (IIIE), the programmable logic blocks (LB) 201 of each of its standard commodity FPGA IC chips 200 as seen in FIG. 6A-6D are similar or analogous to neurons or nerve cells: the interconnection metal layers 6 and/or 27 of the first and/or second interconnection schemes for a chip (FISC) 20 and/or (SISC) 29 of each of its standard commodity FPGA IC chips 200 are similar or analogous to the dendrites connecting to the neurons or nerve cells 201. The small receivers 375 and drivers 374 of the small I/O circuits 203 of each of its standard commodity FPGA IC chips 200 for the inputs and outputs of the programmable logic blocks (LB) 201 of said each of its standard commodity FPGA IC chips 200 are similar or analogous respectively to post-synaptic and pre-synaptic cells at ends of the dendrites. For a short distance between two of the adjacent programmable logic blocks (LB) 201 of each of the standard commodity FPGA IC chips 200, the interconnection metal layers 6 and/or 27 of the first and/or second interconnection schemes for a chip (FISC) 20 and/or (SISC) 29 of said each of its standard commodity FPGA IC chips 200 may construct a first set of programmable interconnects 361 coupling said two of the adjacent programmable logic blocks (LB) 201, like an axon 482 connecting from one of the adjacent neurons or nerve cells 201 to another of the adjacent neurons or nerve cells 201. In the programmable 3D immersive IC interconnection environment (IIIE), for a long distance between two of the remote programmable logic blocks (LB) 201 of two of the standard commodity FPGA IC chips 200 of each of its standard commodity logic drives 300, the high-density and low-density bonded contacts 563*a* and 563*b* between each of the two of the standard commodity FPGA IC chips 200 of said each of its standard commodity logic drives 300 and the interconnection substrate (IS) 684 of said each of its standard commodity logic drives 300, the interconnection metal layers 668 of the interconnection substrate (IS) 684 of said each of its standard commodity logic drives 300, the interconnection metal layers 6 and/or 27 of the first and/or second interconnection schemes for an interconnection bridge (FISIB) 560 and (SISIB) 588 of one of the interconnection bridges (FIB) 690 of the interconnection substrate (IS) 684 of said each of its standard commodity logic drives 300, the interconnection metal layers 27 of the backside interconnection scheme for a logic drive (BISD) 79 of said each of its standard commodity logic drives 300 and the through package vias (TPVs) 582 of said each of its standard commodity logic drives 300 may construct a second set of programmable interconnects 361 connecting said two of the remote programmable logic blocks (LB) 201, like an axon 482 connecting from one of the remote neurons or nerve cells 201 to another of the remote neurons or nerve cells 201. The high-density and low-density bonded contacts 563*a* and 563*b* between said each of the two of the standard commodity FPGA IC chips 200 and the interconnection substrate (IS) 684 of said each of its standard commodity logic drives 300 may be programmed by the memory cells 362 of said each of the two of the standard commodity FPGA IC chips 200.

For more elaboration, referring to FIG. 26A, for a first one 300-1 of the standard commodity logic drives 300 of the programmable 3D immersive IC interconnection environment (IIIE), a first one 200-1 of its standard commodity FPGA IC chips 200 may include (1) first and second ones LB1 and LB2 of the programmable logic blocks (LB) 201 as illustrated in FIGS. 6A-6D like the neurons. (2) the first and/or second interconnection scheme for a chip (FISC) 20 and/or (SISC) 29 like dendrites 481 coupling to the first and second ones LB1 and LB2 of the programmable logic blocks (LB) 201 and (3) the cross-point switches 379 as illustrated in FIGS. 3A, 3B and 7 programmed for connection of the first and/or second interconnection scheme for a chip (FISC) 20 and/or (SISC) 29 of the first one 200-1 of its standard commodity FPGA IC chips 200 to the first and second ones LB1 and LB2 of the programmable logic blocks (LB) 201. A second one 200-2 of its standard commodity FPGA IC chips 200 may include (1) third and fourth ones LB3 and LB4 of the programmable logic blocks (LB) 201 like the neurons, (2) the first and/or second interconnection scheme for a chip (FISC) 20 and/or (SISC) 29 like dendrites 481 coupling to the third and fourth ones LB3 and LB4 of the programmable logic blocks (LB) 201 and (3) the cross-point switches 379 programmed for connection of the first and/or second interconnection scheme for a chip (FISC) 20 and/or (SISC) 29 of the second one 200-2 of its standard commodity FPGA IC chips 200 to the third and fourth ones LB3 and LB4 of the programmable logic blocks (LB) 201.

Referring to FIG. 26A, for a second one 300-2 of the standard commodity logic drives 300 of the programmable 3D immersive IC interconnection environment (IIIE), a third one 200-3 of its standard commodity FPGA IC chips 200 may include a fifth one LB5 of the programmable logic blocks (LB) 201 like the neurons, (2) the first and/or second interconnection scheme for a chip (FISC) 20 and/or (SISC) 29 like dendrites 481 coupling to the fifth one LB5 of the programmable logic blocks (LB) 201 and (3) the cross-point switches 379 programmed for connection of the first and/or second interconnection scheme for a chip (FISC) 20 and/or (SISC) 29 of the third one 200-3 of its standard commodity FPGA IC chips 200 to the fifth one LB5 of the programmable logic blocks (LB) 201. A fourth one 200-4 of its standard commodity FPGA IC chips 200 may include (1) a sixth one LB6 of the programmable logic blocks (LB) 201 like the neurons. (2) the first and/or second interconnection scheme for a chip (FISC) 20 and/or (SISC) 29 like dendrites 481 coupling to the sixth one LB6 of the programmable logic blocks (LB) 201 and (3) the cross-point switches 379 programmed for connection of the first and/or second interconnection scheme for a chip (FISC) 20 and/or (SISC) 29 of the fourth one 200-4 of its standard commodity FPGA IC chips 200 to the sixth one LB6 of the programmable logic blocks (LB) 201.

Referring to FIG. 26A, for the programmable 3D immersive IC interconnection environment (IIIE), (1) a first portion, which is provided by the interconnection metal layers 6 and 27 of the first and/or second interconnection scheme for a chip (FISC) 20 and/or (SISC) 29 of the first one 200-1 of its standard commodity FPGA IC chips 200, extending from the first one LB1 of the programmable logic blocks (LB) 201 of the first onc 200-1 of its standard commodity FPGA IC chips 200. (2) one of its high-density and low-density bonded contacts 563*a* and 563*b* between the first one 200-1 of its standard commodity FPGA IC chips 200 and the interconnection substrate (IS) 684 of the first one 300-1 of its standard commodity logic drives 300, extending from the first signal path. (3) a second signal path, which is provided by the interconnection metal layers 668 of the interconnection substrate (IS) 684 of the first one 300-1 of its standard commodity logic drives 300 and/or the interconnection metal layers 6 and/or 27 of the first and/or second interconnection schemes for an interconnection bridge (FISIB) 560 and (SISIB) 588 of one of the interconnection bridges (FIB) 690 of the interconnection substrate (IS) 684 of the first one 300-1 of its standard commodity logic drives 300, extending from said one of its high-density and low-density bonded contacts 563*a* and 563*b*. (4) another of its high-density and low-density bonded contacts 563*a* and 563*b* between the first one 200-1 of its standard commodity FPGA IC chips 200 and the interconnection substrate (IS) 684 of the first one 300-1 of its standard commodity logic drives 300, extending from the second signal path, and (5) a third signal path, which is provided by the interconnection metal layers 6 and/or 27 of the first and/or second interconnection schemes for a chip (FISC) 20 and/or (SISC) 29 of the first one 200-1 of its standard commodity FPGA IC chips 200, extending from said another of the high-density and low-density bonded contacts 563*a* and 563*b* to the second one LB2 of the programmable logic blocks (LB) 201 may compose a third set of programmable interconnects 361, like an axon 482. Alternatively, the third set of programmable interconnects 361 may be programmed to couple the first one LB1 of the programmable logic blocks (LB) 201 to one or more of the second through sixth ones LB2, LB3, LB4, LB5 and LB6 of the programmable logic blocks (LB) 201 according to switching of first through fifth ones 258-1 through 258-5 of the pass/no-pass switches 258 set on the third sct of programmable interconnects 361. The first one 258-1 of the pass/no-pass switches 258 may be arranged in the first one 200-1 of the standard commodity FPGA IC chips 200. The second and third ones 258-2 and 258-3 of the pass/no-pass switches 258 may be arranged in one of the DPIIC chips 410 in the first one 300-1 of the standard commodity logic drives 300. The fourth one 258-4 of the pass/no-pass switches 258 may be arranged in the third one 200-3 of the standard commodity FPGA IC chips 200. The fifth one 258-5 of the pass/no-pass switches 258 may be arranged in one of the DPIIC chips 410 in the second one 300-2 of the standard commodity logic drives 300. The second one 300-2 of the standard commodity logic drives 300 may have the metal bumps or pillars 570 coupling to the metal pads 583 of the first one 300-1 of the standard commodity logic drives 300.

Alternatively, referring to FIG. 26B, for the programmable 3D immersive IC interconnection environment (IIIE), its third set of programmable interconnects 361 may be considered as a scheme or structure of a tree including (i) a trunk or stem connecting to the first one LB1 of its programmable logic blocks (LB) 201. (ii) multiple branches branching from the trunk or stem for connecting the trunk or stem to one or more of the second and sixth ones LB2-LB6 of its programmable logic blocks (LB) 201. (iii) a first onc 379-1 of its cross-point switches 379 set between the trunk or stem and each of the branches for switching the connection between the trunk or stem and one of the branches. (iv) multiple sub-branches branching from one of the branches for connecting said one of the branches to one or more of the fifth and sixth ones LB5 and LB6 of its programmable logic blocks (LB) 201, and (v) a second one 379-2 of its cross-point switches 379 set between said one of the branches and each of the sub-branches for switching the connection between said one of the branches and one or more of the sub-branches. The first one 379-1 of its cross-point switches 379 may be provided by one of the DPIIC chips 410 of the first one 300-1 of its standard commodity logic drives 300, and the second one 379-2 of its cross-point switches 379 may be provided by one of the DPIIC chips 410 of the second one 300-2 of its standard commodity logic drives 300.

Referring to FIG. 26B, for the programmable 3D immersive IC interconnection environment (IIIE), a fourth set of programmable interconnects 361 like dendrites 481 may include (i) a stem connecting to one of the first through sixth ones LB1-LB6 of its programmable logic blocks (LB) 201. (ii) multiple branches branching from the stem. (iii) a cross-point switch 379 set between the stem and each of the branches for switching the connection between the stem and the branches. Each of the programmable logic blocks (LB) 201 of one of its standard commodity FPGA IC chips 200-1 through 200-4 may couple to multiple of the fourth set of programmable interconnects 361 like dendrites 481 composed of the interconnection metal layers 6 and/or 27 of the first and/or second interconnection schemes for a chip (FISC) 20 and/or (SISC) 29 of said one of the standard commodity FPGA IC chips 200-1 through 200-4. Each of the programmable logic blocks (LB) 201 may couple to a distal terminal of the first or second set of programmable interconnects 361 like an axon 482 through the fourth set of programmable interconnects 361 like dendrites 481 extending from said each of the programmable logic blocks (LB) 201.

Referring to FIGS. 26A and 26B, each of the standard commodity logic drives 300-1 and 300-2 may provide a reconfigurable plastic, clastic and/or integral (granular) architecture for system/machine computing or processing using integral (granular) and alterable memory units and logic units in each of the programmable logic blocks (LB) 201, in addition to the sequential, parallel, pipelined or Von Neumann computing or processing system architecture and/or algorithm. Each of the standard commodity logic devices 300-1 and 300-2 with plasticity, elasticity and integrality (granularity) may include integral, granular and alterable memory units and logic units to alter or reconfigure logic functions and/or computing (or processing) architecture (or algorithm) and/or memories (data or information) in the memory units. The properties of the plasticity: elasticity and integrality (granularity) of the standard commodity logic drive 300-1 or 300-2 is similar or analogous to that of a human brain. The brain or nerves have plasticity, elasticity and integrality (granularity). Many aspects of brain or nerves can be altered (or are "plastic" or "clastic") and reconfigured through adulthood. The standard commodity logic drives 300-1 and 300-2, or standard commodity FPGA IC chips 200-1, 200-2, 200-3 and 200-4, described and specified above provide capabilities to alter or reconfigure the logic functions and/or computing (or processing) architecture (or algorithm) for a given fixed hardware by reconfiguring the programming codes stored in the memory cells 362 in the FPGA IC chips 200 as seen in FIGS. 8A and 8B for the cross-point switches 379 or pass/no-pass switches 258 as seen in FIGS. 2A-2C. 3A, 3B and 7 and programming codes or resulting values or data stored in the memory cells 490 in the FPGA IC chips 200 as seen in FIGS. 8A and 8B for the look-up tables 210 as seen in FIGS. 6A-6D).

Referring to FIGS. 26A-26D, for each of the standard commodity logic drives 300-1 and 300-2, the data or information stored in the memory cells 490 and 362, i.e., configuration programming memory (CPM) cells, of its FPGA IC chips 200 as illustrated in FIGS. 8A and 8B and in the memory cells 362, i.e., configuration programming memory (CPM) cells, of the DPIIC chips 410 as illustrated in FIG. 9 may be used for altering or reconfiguring logic functions and/or computing/processing architecture (or algorithm). The data or information stored in data information memory (DIM) cells of the HBM IC chips 251 as illustrated in FIGS. 11B and 12B may be used for storing data or information input to or output from the logic functions and/or computing/processing architecture (or algorithm).

Figure 26C:
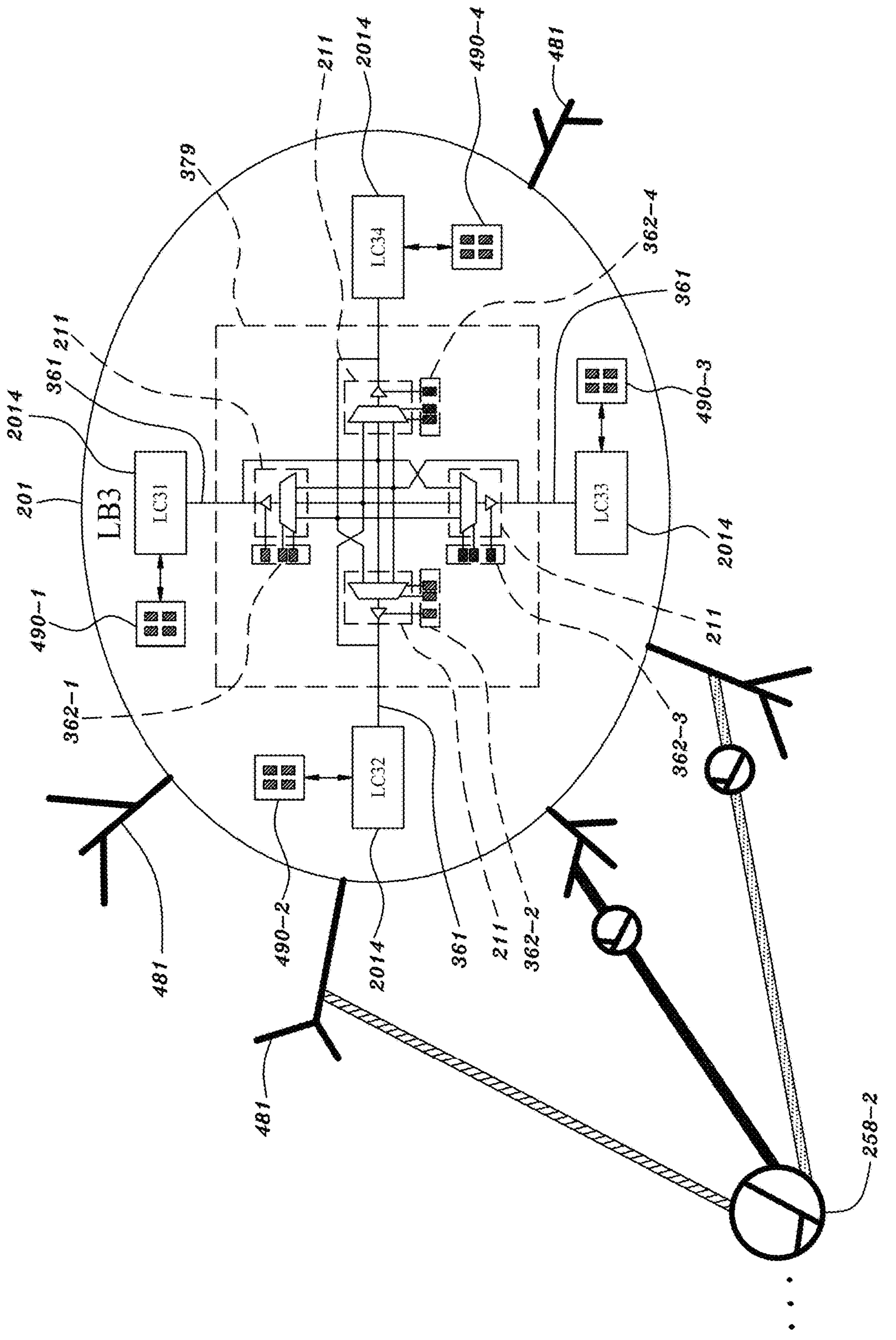
FIG. 26C is a schematic diagram for a reconfigurable plastic, elastic and/or integral architecture in accordance with an embodiment of the present application.

For example. FIG. 26C is a schematic diagram for a reconfigurable plastic, clastic and/or integral architecture in accordance with an embodiment of the present application. Referring to FIG. 26C, the third one LB3 of the programmable logic blocks (LB) 201 may include four programmable logic cells (LC) 2014, i.e., LC31, LC32, LC33 and LC34, as illustrated in FIG. 6A, a cross-point switch 379 as illustrated in FIG. 7 and eight sets of configuration programming memory (CPM) cells 362-1, 362-2, 362-3, 362-4, 490-1, 490-2, 490-3 and 490-4 as illustrated in FIGS. 6A and 7. The cross-point switch 379 may be referred to one as illustrated in FIG. 7. For an element indicated by the same reference number shown in FIGS. 26C and 7, the specification of the element as seen in FIG. 26C may be referred to that of the element as illustrated in FIG. 7. The four programmable interconnects 361 at four ends of the cross-point switch 379 may couple to the four programmable logic cells LC31, LC32, LC33 and LC34 respectively. Each of the programmable logic cells LC31, LC32, LC33 and LC34 may have the same architecture as the programmable logic cell (LC) 2014 illustrated in FIG. 6A with its output Dout or one of its inputs A0 and A1 coupling to one of the four programmable interconnects 361 at the four ends of the cross-point switch 379. Each of the programmable logic cells LC31, LC32, LC33 and LC34 may couple to one of the four sets of configuration programming memory (CPM) cells 490-1, 490-2, 490-3 and 490-4 for storing resulting values or data or programming codes for its look-up table 210 for an event. Thereby, the logic functions and/or computing/processing architecture (or algorithm) of the third one LB3 of the programmable logic blocks (LB) 201 may be altered or reconfigured when the configuration programming memory (CPM) data stored in any of the four sets of configuration programming memory (CPM) cells 490-1, 490-2, 490-3 and 490-4 of the third one LB3 of the programmable logic blocks (LB) 201 are altered or reconfigured.

Evolution and Reconfiguration for Logic Drive

Figure 27:
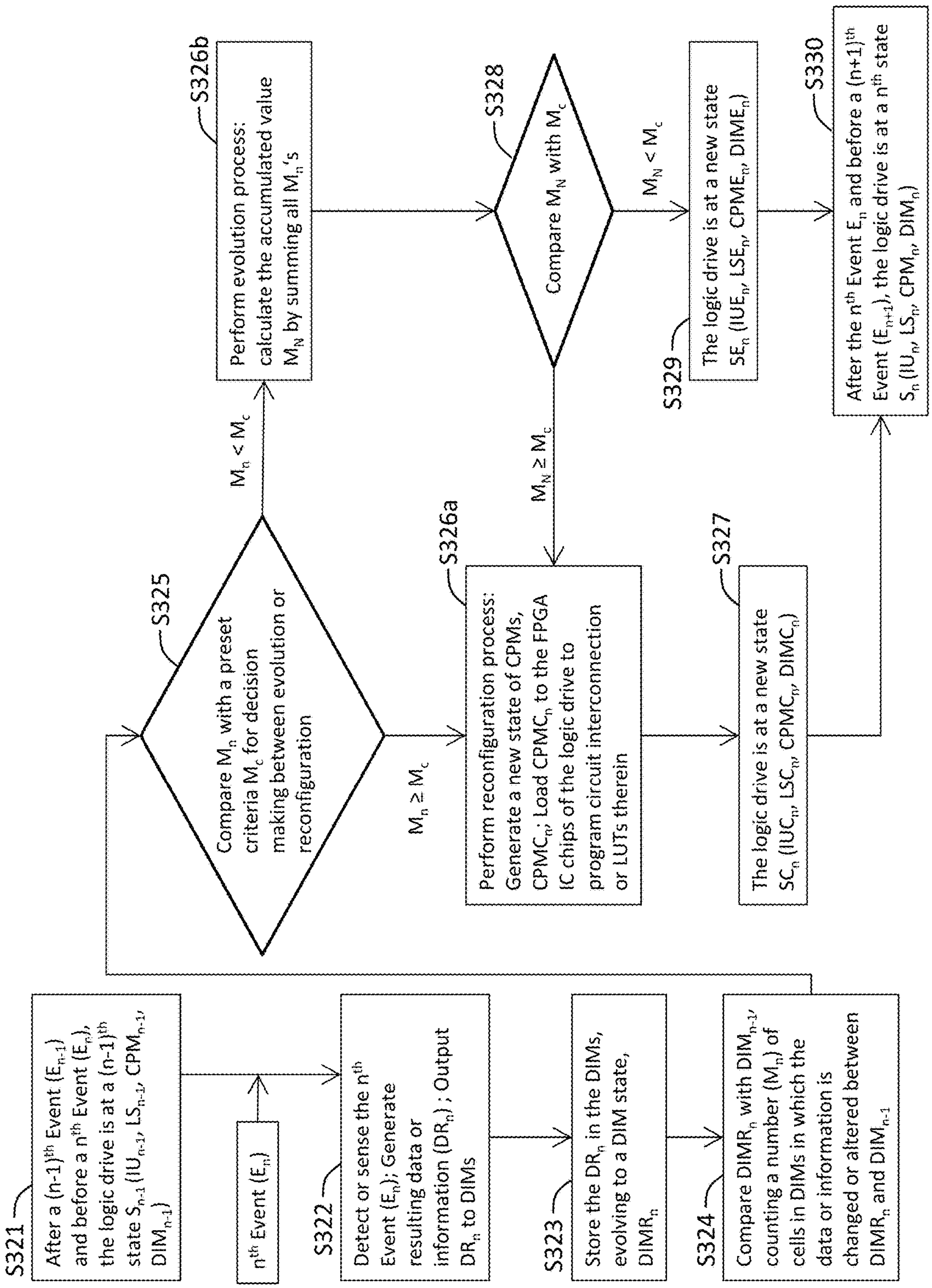
FIG. 27 is a block diagram illustrating an algorithm or flowchart for evolution and reconfiguration for a commodity standard logic drive in accordance with an embodiment of the present application.

FIG. 27 is a block diagram illustrating an algorithm or flowchart for evolution and reconfiguration for a commodity standard logic drive in accordance with an embodiment of the present application. Referring to FIG. 27, a state (S) of the standard commodity logic drive 300 comprises an integral unit (IU), a logic state (LS), a CPM state and a DIM state, and can be described as S (IU, LS, CPM, DIM). The evolution or reconfiguration of the state of the standard commodity logic drive 300 is performed as follows:

In a step S321, after a $(n-1)^{th}$ Event ($E_{n-1}$) and before a $n^{th}$ Event ($E_n$), the standard commodity logic drive 300 is at a $(n-1)^{th}$ state Sn−1 ($IU_{n-1}$, $LS_{n-1}$, $CPM_{n-1}$, $DIM_{n-1}$), wherein n is a positive integer, i.e., 1, 2, 3, . . . , or N.

In a step S322, when the standard commodity logic drive 300, or a machine, system or device external of the standard commodity logic drive 300, is subject to the $n^{th}$ Event ($E_n$), it detects or senses the $n^{th}$ Event ($E_n$) and generate a $n^{th}$ signal ($F_n$): the detected or sensed signal ($F_n$) is input to the standard commodity logic drive 300. The standard commodity FPGA IC chips 200 of the standard commodity logic drive 300 perform processing and computing based on the $n^{th}$ signal ($F_n$), generate anth resulting data or information ($DR_n$) and output the $n^{th}$ resulting data or information ($DR_n$) to be stored in the data information memory (DIM) cells, such as in the HBM IC chips 251, of the standard commodity logic drive 300.

In a step S323, the data information memory (DIM) cells store the $n^{th}$ resulting data or information ($DR_n$) and are evolved to a data infirmary memory (DIM) state for the $n^{th}$ resulting data or information ($DR_n$), i.e., $DIMR_n$.

In a step S324, the standard commodity FPGA IC chips 200, or other control, processing or computing IC chips, such as dedicated control and I/O chips 260 and/or 265, GPU chips 269*a* and/or CPU chips 269*b* as seen in FIGS. 11A and 12A or in FIGS. 11B and 12B, of the standard commodity logic drive 300 may perform comparison between the $n^{th}$ resulting data or information ($DR_n$) for $DIMR_n$ and the $(n-1)^{th}$ resulting data or information ($DR_{n-1}$) for data information memory cells, i.e., $DIM_{n-1}$, by detecting the changes between them, for example, and then may count a number ($M_n$) of the data information memory (DIM) cells in which the data information memory (DIM) is changed or altered between $DIMR_n$ and $DIM_{n-1}$.

In a step S325, the standard commodity FPGA IC chips 200 or the other control, processing or computing IC chips of the standard commodity logic drive 300 compare the number ($M_n$) to preset criteria (Mc) for decision making between evolution or reconfiguration of the standard commodity logic drive 300.

Referring to FIG. 27, if the number ($M_n$) is equal to or larger than the preset criteria ($M_c$), the event $E_n$ is a grand event, and a step S326*a* continues for the reconfiguration route. If the bumber ($M_n$) is smaller than the preset criteria ($M_c$), the event $E_n$ is not a grand event, and a step S326*b* continues for the evolution route.

In the step 326*a*, the standard commodity logic drive 300 may perform the reconfiguration process to generate a new state of configuration programming memory (CPMs) (data or information), i.e., $CPMC_n$. For example, based on the $n^{th}$ resulting data or information ($DR_n$) for $DIMR_n$, new truth tables may be generated and then may be transformed into the new state of configuration programming memory ($CPMC_n$). The configuration programming memory ($CPMC_n$) (data or information) is loaded to the standard commodity FPGA IC chips 200 of the standard commodity logic drive 300 to program the programmable interconnects 361 as illustrated in FIGS. 2A-2C. 3A, 3B and 7 and/or look-up tables 210 (LUTs) as illustrated in FIG. 6A therein. After the reconfiguration, in a step S327, the standard commodity logic drive 300 is at a new state $SC_n$ ($IUC_n$, $LSC_n$, $CPMC_n$, $DIMC_n$), comprising the new states of $IUC_n$, $LSC_n$, $CPMC_n$, and $DIMC_n$. The new state $SC_n$ ($IUC_n$, $LSC_n$, $CPMC_n$, $DIMC_n$) will be defined, in a step S330, as a final state $S_n$ ($IU_n$, $LS_n$, $CPM_n$, $DIM_n$) of the standard commodity logic drive 300 after the grand event $E_n$.

In the step S326*b*, the standard commodity logic drive 300 may perform the evolution process. The standard commodity FPGA IC chips 200, or the other control, processing or computing IC chips of the standard commodity logic drive 300, may calculate the accumulated value ($M_N$) by summing all of the numbers ($M_n$'s), wherein n is: (A) from 1 to n if no grand event happened: or (B) from (R+1) to n if a last grand event happened at the $R^{th}$ event ER, wherein R is a positive integer. In a step S328, the standard commodity FPGA IC chips 200, or the other control, processing or computing IC chips, of the standard commodity logic drive 300 may compare the number My to Me. If the number My is equal to or larger than the preset criteria $M_c$, the reconfiguration process in the step S326*a* as described and specified above continues. If the number $M_N$ is smaller than the preset criteria Me, a step S329 for evolution continues. In the step S329, the standard commodity logic drive 300 is at an evolution state $SE_n$ ($IUE_n$, $LSE_n$, $CPME_n$, $DIME_n$), wherein the states of LS and CPM do not change from those after the event $E_{n-1}$, that means, $LE_n$ is the same as $LS_{n-1}$, $CPME_n$ is the same as $CPM_{n-1}$; while $DIME_n$ is $DIMR_n$. The evolution state $SE_n$ ($IUE_n$, $LSE_n$, $CPME_n$, $DIME_n$) may be defined, in the step S330, as a final state $S_n$ ($IU_n$, $LS_n$, $CPM_n$, $DIM_n$) of the logic drive after the evolution event $E_n$.

Referring to FIG. 27, the steps S321 through S330 may be repeated for the $(n+1)^{th}$ Event $E_{n+1}$.

The reconfiguration in the step S326*a* of generating the new states of $IUC_n$, $DIMC_n$ comprises (i) Reorganization of the integral unit (IU) and/or (ii) condense or concise processes as follows:

I. Reorganization of the integral unit (IU):

The FPGA IC chip 200 may perform the reconfiguration by reorganizing the integral units (IU) in an integral unit (IU) state. Each integral unit (IU) state may comprise several integral units (IU). Each integral unit (IU) is related to a certain logic function and may comprise several CPMs and DIMs. The reorganization may change (1) the number of integral units (IU) in the integral unit (IU) state. (2) the number and content (the data or information therein) in CPM and DIM in each of the integral units (IU). The reconfiguration may further comprise (1) relocating original CPM or DIM data in different locations or addresses, or (2) storing new CPM or DIM data in some locations or addresses originally storing original CPM or DIM data or in new locations or addresses. If data in CPM or DIM are identical or similar, they may be removed from CPM or DIM memory cells after reconfiguration and may be stored in remote storage memory cells in devices external of the logic drive 300 (and/or stored in NAND flash memory cells of the NVM IC chips 250 in the logic drive 300 as seen in FIGS. 11A and 12A or in FIGS. 11B and 12B).

Criteria are established for the identical or similar cells in CPM or DIM: (1) A machine/system external of the logic drive 300 (and/or the FPGA IC chips 200 or other control, processing or computing IC chips of the logic drive 300, such as dedicated control and I/O chips 260 and/or 265. GPU chips 269*a* and/or CPU chips 269*b* as seen in FIGS. 11A and 12A or in FIGS. 11B and 12B) checks the $DIM_n$ to find identical memories, and then keeping only one memory of all identical memories in the CPM or DIM of SRAM or DRAM cells in the HBM IC chips 251 in the logic drive 300 and NAND flash memory cells in the NVM IC chips 250 in the logic drive 300, removing all other identical memories from CPM or DIM memory cells after reconfiguration, wherein the identical memories may be stored in remote storage memory cells in devices external of the logic drive (and/or stored in NAND flash memory cells of the NVM IC chips 250 in the logic drive 300); and/or (2) A machine/system external of the logic drive 300 (and/or the FPGA IC chips 200 or other control, processing or computing IC chips of the logic drive 300, such as dedicated control chip 260. GPU chips 269*a* and/or CPU chips 269*b* as seen in FIGS. 11A and 12A or in FIGS. 11B and 12B) checks the DIM, to find similar memories (similarity within a given percentage x %, for example, is equal to or smaller than 2%, 3%. 5% or 10% in difference), and keeping only one or two memories of all similar memories in the CPM or DIM of SRAM or DRAM cells in the HBM IC chips 251 in the logic drive 300 and NAND flash memory cells in the NVM IC chips 250 in the logic drive 300, removing all other similar memories from CPM or DIM memory cells after reconfiguration, wherein the similar memories may be stored in remote storage memory cells in devices external of the logic drive 300 (and/or stored in NAND flash memory cells of the NVM IC chips 250 in the logic drive): alternatively, a representative memory (data or information) of all similar memories may be generated and kept in the CPM or DIM of SRAM or DRAM cells in the HBM IC chips 251 in the logic drive 300 and NAND flash memory cells in the NVM IC chips 250 in the logic drive 300, removing all other similar memories from CPM or DIM memory cells after reconfiguration, wherein the similar memories may be stored in remote storage memory cells in devices external of the logic drive 300 (and/or stored in NAND flash memory cells of the NVM IC chips 250 in the logic drive 300).

II. Learning Processes:

The logic drive 300 may further provide capability of a learning process. Based on $S_n$ ($IU_n$, $LS_n$, $CPM_n$, $DIM_n$), performing an algorithm to select or screen (memorize) useful, significant and important integral units IUs, logic states LSs, CPMs and DIMs, and forget non-useful, non-significant or non-important integral units IUs, logic states LSs, CPMs or DIMs by storing the useful, significant and important integral units IUs, logic states LSs, CPMs and DIMs in the CPM or DIM of SRAM or DRAM cells in the HBM IC chips 251 in the logic drive 300 and NAND flash memory cells in NVM IC chips 250 in the logic drive 300, removing all other identical memories from CPM or DIM memory cells after reconfiguration, wherein the identical memories may be stored in remote storage memory cells in devices external of the logic drive 300 (and/or stored in NAND flash memory cells of the NVM IC chips 250 in the logic drive 300). The selection or screening algorithm may be based on a given statistical method, for example, based on the frequency of use of integral units IUs, logic states LSs, CPMs and or DIMs in the previous n events. For example, if a logic function of a logic gate is not used frequently, the logic gate may be used for another different function. Another example, the Bayesian inference may be used for generating a new state of the logic drive after learning $SL_n$ ($IUL_n$, $LSL_n$, $CPML_n$, $DIML_n$).

FIG. 28 shows two tables illustrating reconfiguration for a commodity standard logic drive in accordance with an embodiment of the present application. For a configuration programming memory state $CPM_{(i,j,k)}$, the subscript of "i" means a set "i" of configuration programming memory; and the subscripts of "j" and "k" mean an address "j" for storing data "k" for configuration programming memory. For a data information memory state $DIM_{(a,b,c)}$, the subscript of "a" means a set "a" of data information memory, and the subscripts of "b" and "c" mean an address "b" for storing data "c" for data information memory. Referring to FIG. 28, before reconfiguration, the standard commodity logic drive 300 may include three integral units $IU_{(n-1)a}$, $IU_{(n-1)b}$ and $IU_{(n-1)c}$ in the event $E_{(n-1)}$, wherein the integral unit $IU_{(n-1)n}$ may perform a logic state $LS_{(n-1)n}$ based on a configuration programming memory state $CPM_{(a,1,1)}$ and store data information memory states $DIM_{(a,1,1')}$ and $DIM_{(a,2,2')}$, the integral unit $IU_{(n-1)b}$ may perform a logic state $L_{(n-1)b}$ based on configuration programming memory states $CPM_{(b,2,2)}$ and $CPM_{(b,3,3)}$ and store data information memory states $DIM_{(b,3,3')}$ and $DIM_{(b,4,4')}$ and the integral unit $IU_{(n-1)c}$ may perform a logic state $LS_{(n-1)c}$ based on a configuration programming memory state $CPM_{(c,4,4)}$ and store data information memory states $DIM_{(c,5,5')}$, $DIM_{(c,6,6')}$ and $DIM_{(c,7,6')}$. During reconfiguration, the standard commodity logic drive 300 may include four integral units $IUC_{ne}$, $IUC_{nf}$, $IUC_{ng}$ and $IUC_{nh}$ in the event $E_n$, wherein the integral unit $IUC_{ne}$ may perform a logic state $LSC_{ne}$ based on a configuration programming memory state $CPMC_{(e,1,1)}$ and store data information memory states $DIMC_{(e,1,1')}$ and $DIMC_{(e,2,2')}$, the integral unit $IUC_{nf}$ may perform a logic state $LSC_{nf}$ based on configuration programming memory states $CPMC_{(r,2,4)}$ and $CPMC_{(f,3,5)}$ and store data information memory states $DIMC_{(f,3,8')}$, $DIMC_{(f,4,9')}$ and $DIMC_{(f,5,10')}$, the integral unit $IUC_{ng}$ may perform a logic state $LSC_{ng}$ based on configuration programming memory states $CPMC_{(g,4,2)}$ and $CPMC_{(g,5,5)}$ and store data information memory states $DIMC_{(g,6,11')}$ and $DIMC_{(g,8,5')}$, and the integral unit $IUC_{nh}$ may perform a logic state $LSC_{nh}$ based on a configuration programming memory state $CPMC_{(h,6,6)}$ and store data information memory states $DIMC_{(h,7,7)}$ and $DIMC_{(h,9,6')}$.

In comparison between the states before reconfiguration and during reconfiguration, the CPM data "4" originally stored in the CPM address "4" is kept to be stored in the CPM address "2" during reconfiguration: the CPM data "2" originally stored in the CPM address "2" is kept to be stored in the CPM address "4" during reconfiguration: the CPM data "3" is different from the CPM data "2" by less than 5% in difference and is removed from the CPM cells during reconfiguration and may be stored in remote storage memory cells in devices external of the logic drive 100 and/or stored in NAND flash memory cells of the NVM IC chips 250 in the logic drive 300 as seen in FIGS. 11A and 12A or in FIGS. 11B and 12B. The DIM data "5" originally stored in the DIM address "5" is kept during reconfiguration to be stored in the DIM address "8"; the DIM data "6" originally stored in both DIM addresses "6" and "7" is kept during reconfiguration with only one copy to be stored in the DIM address "9": the DIM data "3" and "4" are removed from the DIM cells during reconfiguration and may be stored in remote storage memory cells in devices external of the logic drive 300 and/or stored in NAND flash memory cells of the NVM IC chips 250 in the logic drive 300; the DIM addresses "3". "4", "5", "and" store new DIM data "8", "9", "10", "1" and "7" respectively, during reconfiguration: new DIM addresses "8" and "9" store original DIM data "5" and "6" respectively, during reconfiguration.

An example of plasticity, elasticity and integrality is taken using the programmable logic block LB3, as illustrated in FIGS. 26A-26C, as GPS (Global Positioning System) functions, as below:

The programmable logic block LB3 is, for example, functioning as GPS, remembering routes and enabling to drive to various locations. A driver and/or machine/system was planning to drive from San Francisco to San Jose, and the programmable logic block LB3 may functions as:

(1) In a first event E1, the driver and/or machine/system looked up a map and found two Freeways 101 and 280 to get to San Jose from San Francisco. The machine/system used the programmable logic cells LC31 and LC32 for computing and processing the first event E1 and memorized a first logic configuration LS1 for the first event E1 and the related data, information or outcomes of the first event E1. That was: the machine/system (a) formulated the programmable logic cells LC31 and LC32 at the first logic configuration LS1 based on a first set of configuration-programming-memory data CPM1 in the CPM cells 362-1, 362-2, 362-3, 362-4, 490-1 and 490-2 of the programmable logic block LB3 and (b) stored a first set of data-information-memory data DIM1 in the HBM IC chips 251 in the standard commodity logic drive 300-1. The integral state of GPS functions in the programmable logic block LB3 after the first event E1 may be defined as SILB3 relating to the first logic configuration LS1 for E1, CPM1 and DIM1.

(2) In a second event E2, the driver and/or machine/system decided to take Freeway 101 to get to San Jose from San Francisco. The machine/system used the programmable logic blocks LB31 and LB33 for computing and processing the second event E2 and memorized a second logic configuration LS2 for the second event E2 and the related data, information or outcomes of the second event E2. That was: the machine/system (a) formulated the programmable logic blocks LB31 and LB33 at the second logic configuration LS2 based on a second set of configuration-programming-memory data CPM2 in the configuration programming memory (CPM) cells 362-1, 362-2, 362-3, 362-4, 490-1 and 490-3 of the logic section LS3 and/or the first set of data memories DMI and (b) stored a second set of data-information-memory data DIM2 in the HBM IC chips 251 in the standard commodity logic drive 300-1. The integral state of GPS functions in the logic section LS3 after the second event E2 may be defined as S2LS3 relating to the second logic configuration LS2 for E2. CPM2 and DIM2. The second set of data-information-memory data DIM2 may include newly added information relating to the second event E2 and the data and information reorganized based on DIM1, and thereby keeps useful and important information of the first event E1.

(3) In a third event E3, the driver and/or machine/system drove from San Francisco to San Jose through Freeway 101. The machine/system used the programmable logic cells LC31, LC32 and LC33 for computing and processing the third event E3 and memorized a third logic configuration LS3 for the third event E3 and the related data, information or outcomes of the third event E3. That was: the machine/system (a) formulated the programmable logic cells LC31, LC32 and LC33 at the third logic configuration LS3 based on a third set of configuration-programming-memory data CPM3 in the configuration programming memory (CPM) cells 362-1, 362-2, 362-3, 362-4, 490-1, 490-2 and 490-3 of the programmable logic block LB3 and/or the second set of data-information-memory data DIM2 and (b) stored a third set of data-information-memory data DIM3 in the HBM IC chips 251 in the standard commodity logic drive 300-1. The integral state of GPS functions in the programmable logic block LB3 after the third event E3 may be defined as S3LB3 relating to the third logic configuration LS3 for E3. CPM3 and DIM3. The third set of data-information-memory data DIM3 may include newly added information relating to the third event E3 and the data and information reorganized based on DIM1 and DIM2, and thereby keeps useful and important information of the first and second events E1 and E2.

(4) In a fourth event E4 after two months of the third event E3, the driver and/or machine/system drove from San Francisco to San Jose through Freeway 280. The machine/system used the programmable logic cells LC31, LC32, LC33 and LC34 for computing and processing the fourth event E4 and memorized a fourth logic configuration LS4 for the fourth event E4 and the related data, information or outcomes of the fourth event E4. That was: the machine/system (a) formulated the programmable logic cells LC31, LC32, LC33 and LC34 at the fourth logic configuration LS4 based on a fourth set of configuration-programming-memory data CPM4 in the configuration programming memory (CPM) cells 362-1, 362-2, 362-3, 362-4, 490-1, 490-2, 490-3 and 490-4 of the programmable logic block LB3 and/or the third set of data-information-memory data DIM3 and (b) stored a fourth set of data-information-memory data DIM4 in the HBM IC chips 251 in the standard commodity logic drive 300-1. The integral state of GPS functions in the programmable logic block LB3 after the fourth event E4 may be defined as S4LB3 relating to the fourth logic configuration LS4 for E4, CPM4 and DIM4. The fourth set of data-information-memory data DIM4 may include newly added information relating to the fourth event E4 and the data and information reorganized based on DIM1, DIM2 and DIM3, and thereby keeps useful and important information of the first, second and third events E1, E2 and E3.

(5) In a fifth event E5 after one week of the fourth event E4, the driver and/or machine/system drove from San Francisco to Cupertino through Freeway 280. Cupertino was in the middle way of the route in the fourth event E4. The machine/system used the programmable logic cells LC31, LC32, LC33 and LC34 at the fourth logic configuration LS4 for computing and processing the fifth event E5 and memorized the fourth logic configuration LS4 for the fifth event E5 and the related data, information or outcomes of the fifth event E5. That was: the machine/system (a) formulated the programmable logic cells LC31, LC32. LC33 and LC34 at the fourth logic configuration LS4 based on the fourth set of configuration-programming-memory data (CPM4) in the configuration programming memory (CPM) cells 362-1, 362-2, 362-3, 362-4, 490-1, 490-2, 490-3 and 490-4 of the programmable logic block LB3 and/or the fourth set of data-information-memory data DIM4 and (b) stored a fifth set of data-information-memory data DIM5 in the HBM IC chips 251 in the standard commodity logic drive 300-1. The integral state of GPS functions in the programmable logic block LB3 after the fifth event E5 may be defined as S5LB3 relating to the fourth logic configuration LS4 for E5. CPM4 and DIM5. The fifth set of data-information-memory data DIM5 may include newly added information relating to the fifth event E5 and the data and information reorganized based on DIM1-DIM4, and thereby keeps useful and important information of the first through fourth events E1-E4.

(6) In a sixth event E6 after six months of the fifth event E5, the driver and/or machine/system was planning to drive from San Francisco to Los Angeles. The driver and/or machine/system looked up a map and found two Freeways 101 and 5 to get to Los Angeles from San Francisco. The machine/system used the programmable logic cell LC31 of the programmable logic block LB3 and the programmable logic cell LC41 of the programmable logic block LB4 for computing and processing the sixth event E6 and memorized a sixth logic configuration LS6 for the sixth event E6 and the related data, information or outcomes of the sixth event E6. The programmable logic block LB4 may have the same architecture as the programmable logic block LB3 illustrated in FIG. 26C, but the four programmable logic cells LC31, LC32, LC33 and LC34 in the programmable logic block LB3 are renumbered as LC41, LC42, LC43 and LC44 in the programmable logic block LB4 respectively. That was: the machine/system (a) formulated the programmable logic cells LC31 and LC41 at the sixth logic configuration LS6 based on a sixth set of configuration-programming-memory data CPM6 in the configuration programming memory (CPM) cells 362-1, 362-2, 362-3, 362-4 and 490-1 of the programmable logic block LB3 and those of the programmable logic block LB4 and/or the fifth set of data-information-memory data DIM5 and (b) stored a sixth set of data-information-memory data DIM6 in the HBM IC chips 251 in the standard commodity logic drive 300-1. The integral state of GPS functions in the programmable logic blocks LB3 and LB4 after the sixth event E6 may be defined as S6LB3&4 relating to the sixth logic configuration LS6 for E6. CPM6 and DIM6. The sixth set of data-information-memory data DIM6 may include newly added information relating to the sixth event E6 and the data and information reorganized based on DIM1-DIM5, and thereby keeps useful and important information of the first through fifth events E1-E5.

(7) In a seventh event E7, the driver and/or machine/system decided to take Freeway 5 to get to Los Angeles from San Francisco. The machine/system used the programmable logic blocks LB31 and LB33 at the second logic configuration LS2 and/or the sixth set of data-information-memory data DIM6 for computing and processing the seventh event E7 and memorized the second logic configuration LS2 for the seventh event E7 and the related data, information or outcomes of the seventh event E7. That was: the machine/system (a) used the sixth set of data-information-memory data DIM6 for logic processing with the programmable logic cells LC31 and LC33 at the second logic configuration LS2 based on the second set of configuration-programming-memory data CPM2 in the configuration programming memory (CPM) cells 362-1, 362-2, 362-3, 362-4, 490-1 and 490-3 of the programmable logic block LB3 and (b) stored a seventh set of data-information-memory data DIM7 in the HBM IC chips 251 in the standard commodity logic drive 300-1. The integral state of GPS functions in the programmable logic block LB3 after the seventh event E7 may be defined as S7LB3 relating to the second logic configuration LS2 for E7. CPM2 and DIM7. The seventh set of data-information-memory data DIM7 may include newly added information relating to the seventh event E7 and the data and information reorganized based on DIM1-DIM6, and thereby keeps useful and important information of the first through sixth events E1-E6.

Figure 26D:
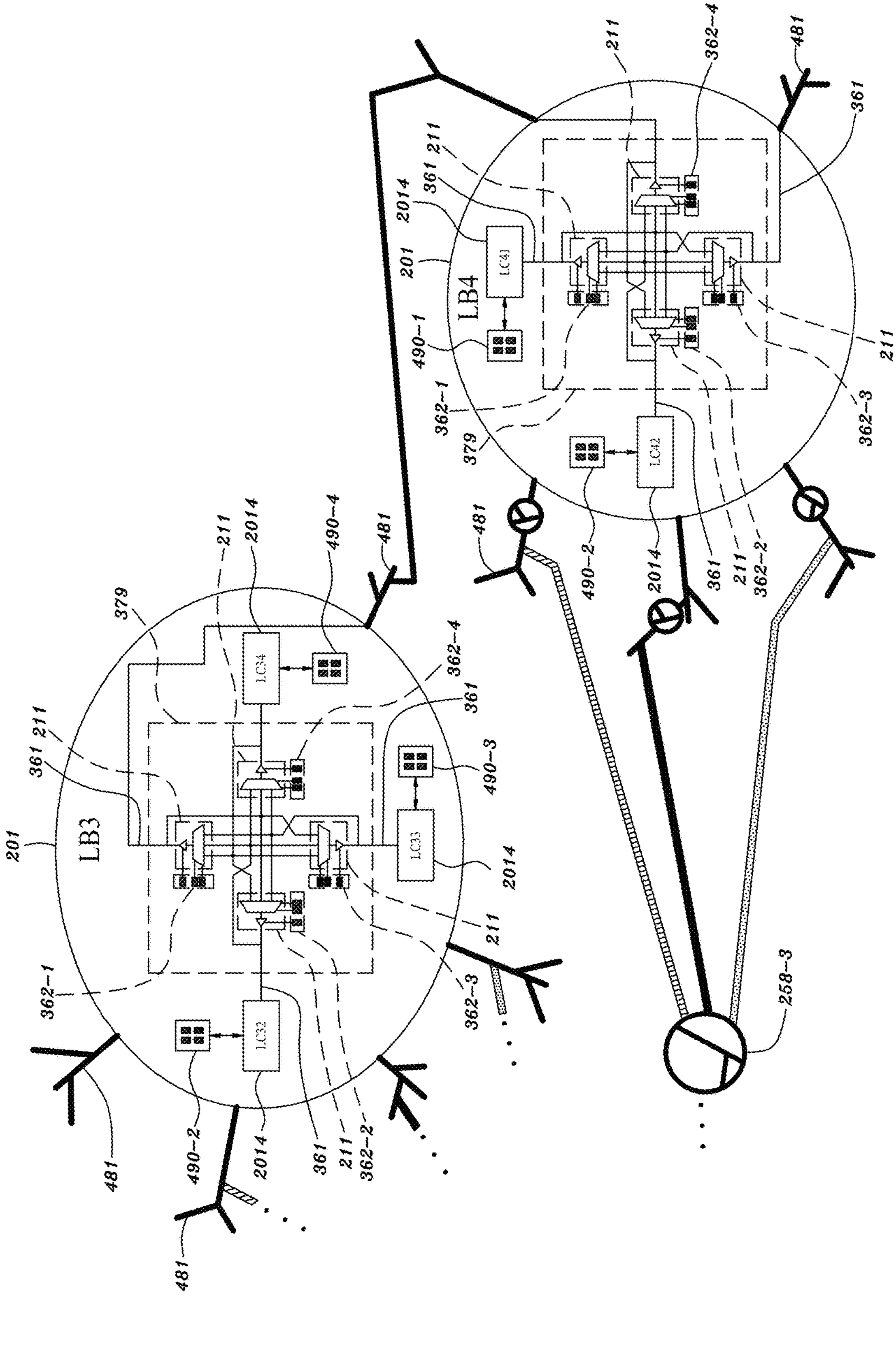
FIG. 26D is a schematic diagram for a reconfigurable plastic, elastic and/or integral architecture for the eighth event E8 in accordance with an embodiment of the present application.

(8) In an eighth event E8 after two weeks of the seventh event E7, the driver and/or machine/system drove from San Francisco to Los Angeles through Freeway 5. The machine/system used the programmable logic cells LC32, LC33 and LC34 of the programmable logic block LB3 and the programmable logic cells LC41 and LC42 of the programmable logic block LB4 for computing and processing the eighth event E8 and memorized an eighth logic configuration LS8 of the eighth event E8 and the related data, information or outcomes of the eighth event E8. The machine/system used the programmable logic cells LC32, LC33 and LC34 of the programmable logic block LB3 and the programmable logic cells LC41 and LC42 of the programmable logic block LB4 for computing and processing the eighth event E8 and memorized the eighth logic configuration LS8 for the eighth event E8 and the related data, information or outcomes of the eighth event E8. The programmable logic block LB4 may have the same architecture as the programmable logic block LB3 illustrated in FIG. 26C, but the four programmable logic cells LC31, LC32, LC33 and LC34 in the programmable logic block LB3 are renumbered as LC41, LC42, LC43 and LC44 in the programmable logic block LB4 respectively. FIG. 26D is a schematic diagram for a reconfigurable plastic, clastic and/or integral architecture for the eighth event E8 in accordance with an embodiment of the present application. Referring to FIGS. 26A-26D, the cross-point switch 379 of the programmable logic block LB3 may have its top terminal switched not to couple to the programmable logic cell LC31 (not shown in FIG. 26D but shown in FIG. 26C) but to a first portion of the FISC 20 and SISC 29 of the second semiconductor chip 200-2, like one of the dendrites 481 of the neurons for the programmable logic block LB3. The cross-point switch 379 of the programmable logic block LB4 may have its right terminal switched not to couple to the programmable logic cell LC44 (not shown) but to a second portion of the FISC 20 and SISC 29 of the second semiconductor chip 200-2, like one of the dendrites 481 of the neurons for the programmable logic block LB4, connecting to the first portion of the FISC 20 and SISC 29 of the second semiconductor chip 200-2 through a third portion of the FISC 20 and SISC 29 of the second semiconductor chip 200-2. The cross-point switch 379 of the programmable logic block LB4 may have its bottom terminal switched not to couple to the programmable logic cell LC43 (now shown) but to a fourth portion of the FISC 20 and SISC 29 of the second semiconductor chip 200-2, like one of the dendrites 481 of the neurons for the programmable logic block LB4. That was; the machine/system (a) formulated the programmable logic cells LC32, LC33, LC34, LC41 and LC42 at the eighth logic configuration LS8 based on an eighth set of configuration-programming-memory data CPM8 in the configuration programming memory (CPM) cells 362-1, 362-2, 362-3, 362-4, 490-1, 490-2 and 490-3 of the programmable logic block LB3 and the configuration programming memory (CPM) cells 362-1, 362-2, 362-3, 362-4, 490-1 and 490-2 of the programmable logic block LB4 and/or the seventh set of data-information-memory data DIM7 and (b) stored an eighth set of data-information-memory data DIM8 in the HBM IC chips 251 in the standard commodity logic drive 300-1. The integral state of GPS functions in the programmable logic blocks LB3 and LB4 after the eighth event E8 may be defined as S8LB3&4 relating to the eighth logic configuration LS8 for E8. CPM8 and DIM8. The cighth set of data-information-memory data DIM8 may include newly added information relating to the eighth event E8 and the data and information reorganized based on DIM1-DIM7, and thereby keeps useful and important information of the first through seventh events E1-E7.

(9) The event E8 is quite different from the previous first through seventh events E1-E7, and is categorized as a grand event E9, resulting in an integral state S9LB3. In the grand event E9 for grand reconfiguration after the first through eighth events E1-E8, the driver and/or machine/system may reconfigure the first through eighth logic configurations LS1-LS8 into a ninth logic configuration LS9 (1) to formulate the programmable logic cells LC31, LC32, LC33 and LC34 of the programmable logic block LB3 at the ninth logic configuration LS9 based on a ninth set of configuration-programming-memory data CPM9 in the configuration programming memory (CPM) cells 362-1, 362-2, 362-3 and 362-4 of the programmable logic block LB3 and/or the first through eighth sets of data-information-memory data DIM1-DIM8 for the GPS functions for the locations in the California area between San Francisco and Los Angeles and (2) to store a ninth set of data-information-memory data DIM9 in the configuration programming memory (CPM) cells 490-1, 490-2, 490-3 and 490-4 of the programmable logic block LB3.

The machine/system may perform the grand reconfiguration with certain given criteria. The grand reconfiguration is like the human brain reconfiguration after a deep sleep. The grand reconfiguration comprises condense or concise processes and learning processes, mentioned as below:

In the condense or concise processes for reconfiguration of data-information-memory (DIM) data in the event E9, the machine/system may check the eighth set of data-information-memory data DIM8 to find identical data-information-memory data, and keep only one of the identical data memories in the programmable logic block LB3: alternatively, the machine/system may check the eighth set of data-information-memory data DIM8 to find similar data with more than 70%, e.g., between 80% and 99%, of similarity among them, and select only one or two from the similar data as representative data-information-memory (DIM) data for the similar data.

In the condense or concise processes for reconfiguration of configuration-programming-memory (CPM) data in the event E9, the machine/system may check the eighth set of configuration-programming-memory data CPM8 for corresponding logic functions to find identical data for the same or similar logic functions, and keep only one of the identical data in the programmable logic block LB3 for the logic functions: alternatively, the machine/system may check the eighth set of configuration-programming-memory data CPM8 for the same or similar logic functions to find similar date with 70%, e.g., between 80% and 99%, of similarity among them, for the same or similar logic functions and keep only one or two from the similar data for the same or similar logic functions as representative configuration-programming-memory (CPM) data for the similar data for the same or similar logic functions.

In the learning processes in the event E9, an algorithm may be performed to (1) CPM1-CPM4, CPM6 and CPM8 for the logic configurations LS1-LS4, LS6 and LS8 and (2) DIM1-DIM8, for optimizing, e.g., selecting or screening, CPM1-CPM4, CPM6 and CPM8 into useful, significant and important ones as CPM9 and optimizing, e.g., selecting or screening, DIM1-DIM8 into useful, significant and important ones as DIM9. Further, the algorithm may be performed to (1) CPM1-CPM4, CPM6 and CPM8 for the logic configurations LS1-LS4, LS6 and LS8 and (2) DIM1-DIM8 for deleting non-useful, non-significant or non-important ones of the programming memories CPM1-CPM4, CPM6 and CPM8 and deleting non-useful, non-significant or non-important ones of the data memories DIM1-DIM8. The algorithm may be performed based on a statistical method, e.g., the frequency of use of CPM1-CPM4, CPM6 and CPM8 in the events E1-E8 and/or the frequency of use of DIM1-DIM8 in the events E1-E8.

Internet or Network between Data Centers and Users

Figure 29:
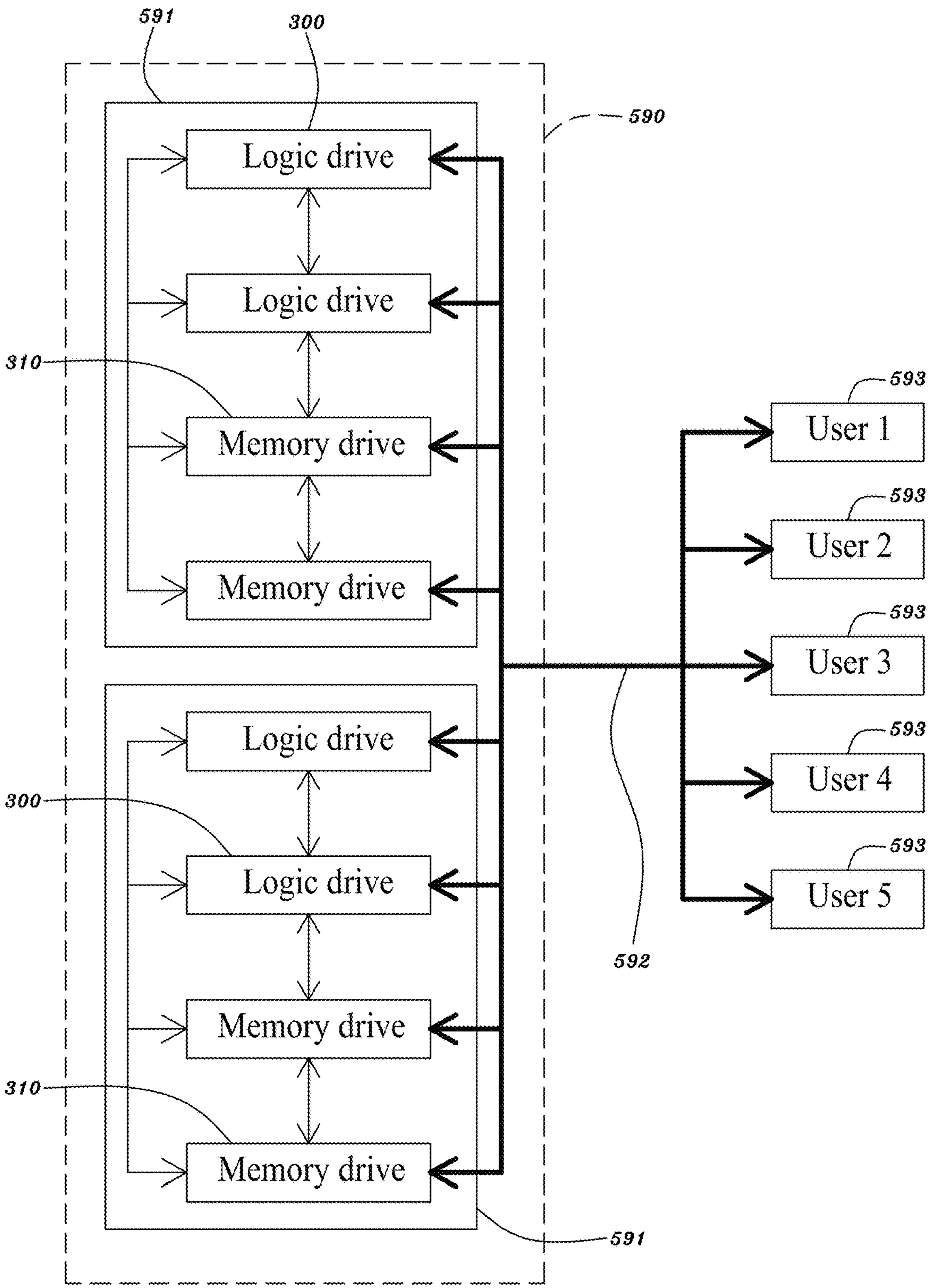
FIG. 29 is a block diagram illustrating networks between multiple data centers and multiple users in accordance with an embodiment of the present application.

FIG. 29 is a block diagram illustrating networks between multiple data centers and multiple users in accordance with an embodiment of the present application. Referring to FIG. 29, in the cloud 590 are multiple data centers 591 connected to each other or one another via the internet or networks 592. In each of the data centers 591 may be a plurality of standard commodity logic drives 300 and/or a plurality of memory drives 310 allowed for one or more of user devices 593, such as computers, smart phones or laptops, to offload and/or accelerate service-oriented functions of all or any combinations of functions of artificial intelligence (AI), machine learning, deep learning, big data, internet of things (IOT), industry computing, virtual reality (VR), augmented reality (AR), car electronics, graphic processing (GP), video streaming, digital signal processing (DSP), micro controlling (MC), and/or central processing (CP) when said one or more of the user devices 593 is connected via the internet or networks to the standard commodity logic drives 300 and/or memory drives 310 in one of the data centers 591 in the cloud 590. In each of the data centers 591, the standard commodity logic drives 300 may couple to each other or one another via local circuits of said each of the data centers 591 and/or the internet or networks 592 and to the memory drives 310 via local circuits of said each of the data centers 591 and/or the internet or networks 592, wherein the memory drives 310 may couple to each other or one another via local circuits of said each of the data centers 591 and/or the internet or networks 592. Accordingly, the standard commodity logic drives 300 and memory drives 310 in the data centers 591 in the cloud 590 may be used as an infrastructure-as-a-service (IaaS) resource for the user devices 593. Similarly, to renting virtual memories (VMs) in a cloud, the field programmable gate arrays (FPGAs), which may be considered as virtual logics (VL), may be rented by users. In a case, each of the standard commodity logic drives 300 in one or more of the data centers 591 may include the FPGA IC chips 200 fabricated using a semiconductor IC process technology node more advanced than 28 nm technology node. A software program may be written on the user devices 593 in a common programing language, such as Java, C++, C#, Scala, Swift, Matlab, Assembly Language, Pascal, Python, Visual Basic, PL/SQL or JavaScript language. The software program may be uploaded by one of the user devices 590 via the internet or networks 592 to the cloud 590 to program the standard commodity logic drives 300 in the data centers 591 or cloud 590. The programmed logic drives 300 in the cloud 590 may be used by said one or another of the user devices 593 for an application via the internet or networks 592.

Embodiment for Multi-chip Package

Figure 30:
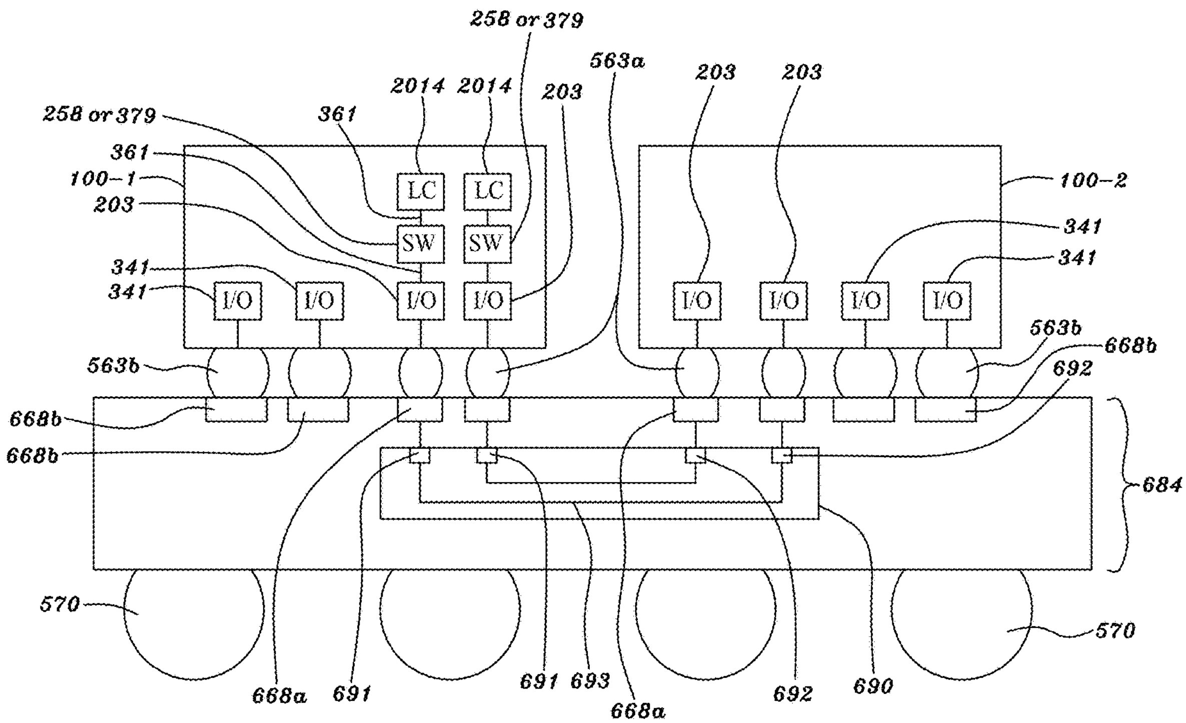
FIG. 30 is a circuit diagram illustrating a multi-chip package in accordance with an embodiment of the present application.
Figure 31:
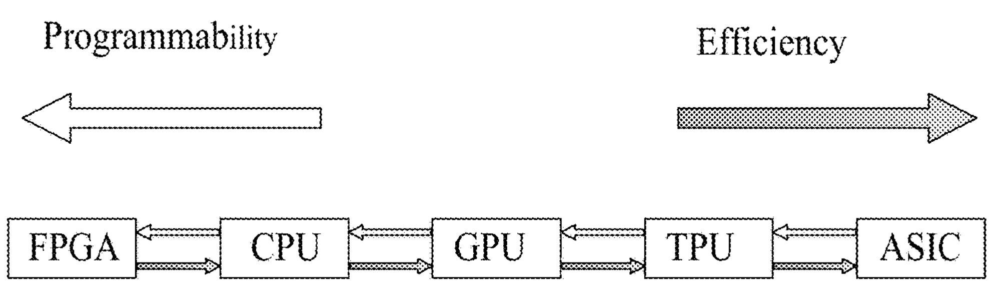
FIG. 31 is a diagram illustrating degree between programmability and efficiency for various semiconductor integrated-circuit (IC) chips.
Figure 32:
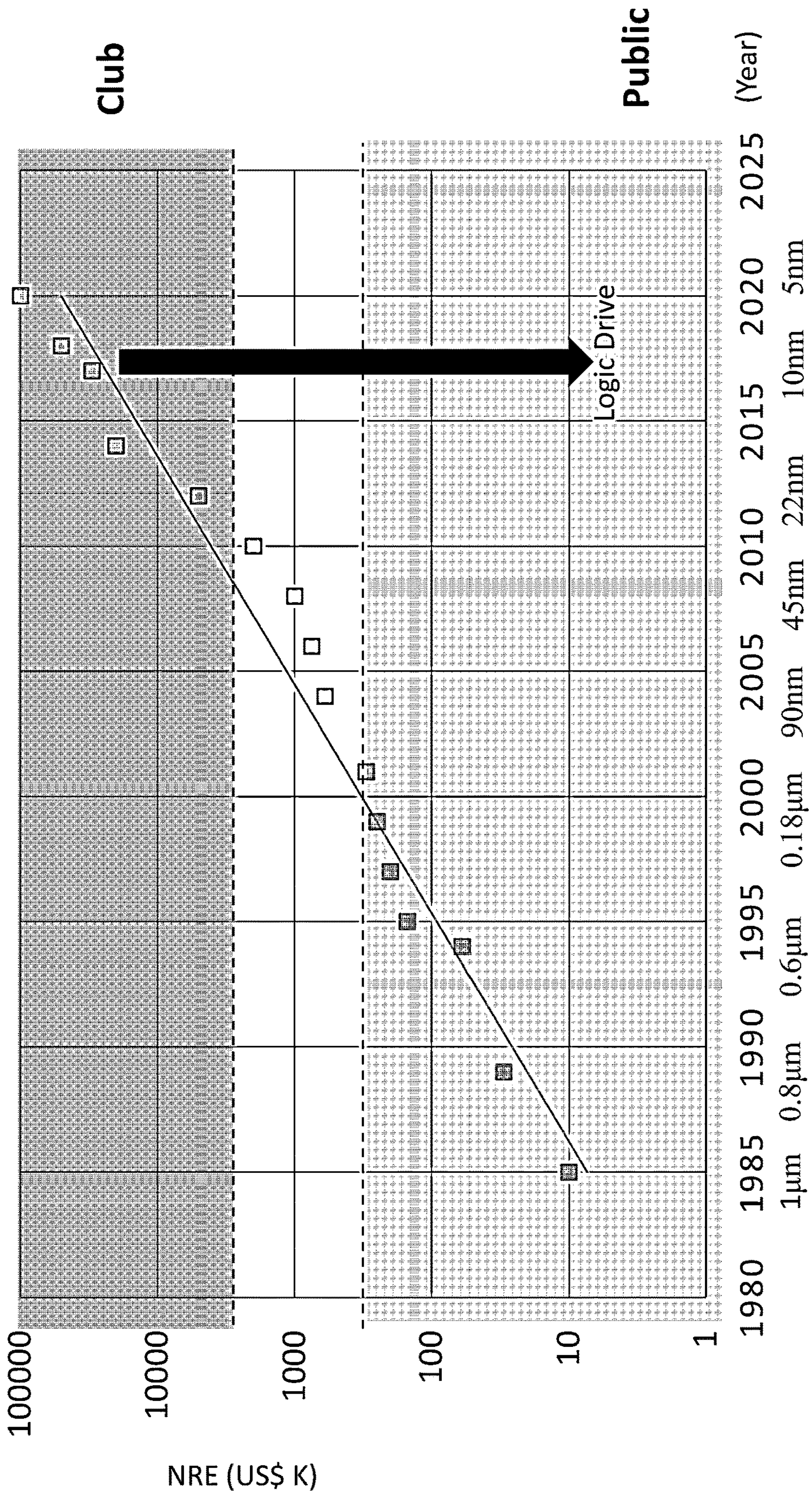
FIG. 32 is a chart showing a trend of relationship between non-recurring engineering (NRE) costs and technology nodes.

FIG. 30 is a circuit diagram illustrating a multi-chip package in accordance with an embodiment of the present application. Referring to FIG. 30, a multi-chip package, such as standard commodity logic drive 300, may include: (1) an interconnection substrate 684 as seen in FIGS. 10 and 18F-18H comprising: (a) a first fine-line interconnection bridge (FIB) 690 as seen in FIG. 17A or 17B embedded in the interconnection substrate 684, wherein the first interconnection bridge 684 comprises a first silicon substrate 552 and a first interconnection scheme, such as FISIB 560, over the first silicon substrate 552, wherein the first interconnection scheme comprises a first interconnection metal layer, e.g., a lower one of the interconnection metal layers 6 of FISIB 560, over the first silicon substrate 552, a second interconnection metal layer, e.g., an upper one of the interconnection metal layers 6 of FISIB 560, over the first interconnection layer, e.g., the lower one of the interconnection metal layers 6 of FISIB 560, and the first silicon substrate 552, and a first insulating dielectric layer 12 over the first silicon substrate 552 and between the first and second interconnection metal layers, e.g., the lower and upper ones of the interconnection metal layers 6 of FISIB 560, wherein the first interconnection metal layer, e.g., the lower one of the interconnection metal layers 6 of FISIB 560, couples to the second interconnection metal layer, e.g., the upper one of the interconnection metal layers 6 of FISIB 560, through an opening in the first insulating dielectric layer 12, wherein the first interconnection metal layer, e.g., the lower one of the interconnection metal layers 6 of FISIB 560, comprises a first metal line having a first copper layer 24 and a first adhesion layer 18 at a bottom and sidewall of the first copper layer 24, wherein the first metal line has a thickness between 0.1 and 2 micrometers, wherein the first insulating dielectric layer 12 comprises silicon; and (b) a second interconnection scheme, e.g., FISIS 698, comprising a third interconnection metal layer, e.g., a lower one of the interconnection metal layers 668 of FISIS 698, a fourth interconnection metal layer 668, e.g., an upper one of the interconnection metal layers 668 of FISIS 698, over the third interconnection layer, e.g., the lower one of the interconnection metal layers 668 of FISIS 698, and the first fine-line interconnection bridge (FIB) 690, and a first polymer layer 676 between the third and fourth interconnection metal layers, e.g., the lower and upper ones of the interconnection metal layers 668 of FISIS 698, wherein the first fine-line interconnection bridge (FIB) 690 is embedded in the second interconnection scheme, e.g., FISIS 698, and has sidewalls surrounded by the first polymer layer 676, wherein the fourth interconnection metal layer, e.g., the upper one of the interconnection metal layers 668 of FISIS 698, couples to the second interconnection metal layer, e.g., the upper one of the interconnection metal layers 6 of FISIB 560, wherein each of the third and fourth interconnection metal layers, e.g., the lower and upper ones of the interconnection metal layers 668 of FISIS 698, has a thickness thicker than that of each of the first and second interconnection metal layers, e.g., the lower and upper ones of the interconnection metal layers 6 of FISIB 560, wherein the fourth interconnection metal layer, e.g., the upper one of the interconnection metal layers 668 of FISIS 698, comprises a first metal pad, e.g., high-density metal pad 668*a*, a second metal pad. e.g., high-density metal pad 668*a*, a third metal pad, e.g., low-density metal pad 668*b*, having a width wider than that of the first metal pad 668*a*, and a fourth metal pad, e.g., low-density metal pad 668*b*, having a width wider than that of the second metal pad 668*a*, wherein the first metal pad 668*a* couples to the second metal pad 668*a* through the second interconnection metal layer, e.g., the upper one of the interconnection metal layers 6 of FISIB 560; (2) a first semiconductor integrated-circuit (IC) chip 100-1 over the interconnection substrate 684 and across over an edge of the first fine-line interconnection bridge (FIB) 690, as seen in FIG. 19F, wherein the first semiconductor integrated-circuit (IC) chip 100-1, such as standard commodity FPGA IC chip 200 as illustrated in FIGS. 8A and 8B, is configured to be programmed to perform a logic operation, such as performed by the programmable logic cell 2014 of the standard commodity FPGA IC chip 200 as illustrated in FIGS. 6A, 8A and 8B, comprising a plurality of first memory cells 490 configured to store a plurality of resulting data of a look-up table (LUT) 210 respectively and a multiplexer 211 comprising a first set of input points for a first input data set for the logic operation and a second set of input points for a second input data set associated with the plurality of resulting data of the look-up table (LUT) 210 stored in the plurality of first memory cells 490, wherein the multiplexer 211 is configured to select, in accordance with the first input data set, an input data from the second input data set as an output data for the logic operation: (3) a second semiconductor integrated-circuit (IC) chip 100-2 over the interconnection substrate 684 and across over an edge of the first fine-line interconnection bridge (FIB) 690, as seen in FIG. 19F: (4) a first metal bump, e.g., high-density bonded contact 563*a*, between the first semiconductor integrated-circuit (IC) chip 100-1 and the interconnection substrate 684, wherein the first metal bump joins the first semiconductor integrated-circuit (IC) chip 100-1 to the first metal pad 668*a*, as seen in FIG. 19F: (5) a second metal bump, e.g., high-density bonded contact 563*a*, between the second semiconductor integrated-circuit (IC) chip 100-2 and the interconnection substrate 684, wherein the second metal bump 563*a* joins the second semiconductor integrated-circuit (IC) chip 100-2 to the second metal pad 668*a*, as seen in FIG. 19F, wherein the first semiconductor integrated-circuit (IC) chip 100-1 comprises a first input/output (I/O) circuit 203 having a driver 374 as seen in FIG. 5B configured to pass data associated with the output data Dout for the logic operation to a receiver 375 of a second input/output (I/O) circuit 203 of the second semiconductor integrated-circuit (IC) chip 100-2 through, in sequence, the first metal bump 563*a*, the first metal pad 688*a*, the second interconnection metal layer, e.g., the upper one of the interconnection metal layers 6 of FISIB 560, the second metal pad 688*a* and the second metal bump 563*a*, or the second input/output (I/O) circuit 203 may have a driver 374 configured to pass data to the first set of input points of the multiplexer 211 for the first input data set for the logic operation through, in sequence, the second metal bump 563*a*, the second metal pad 688*a*, the second interconnection metal layer, e.g., the upper one of the interconnection metal layers 6 of FISIB 560, the first metal pad 688*a*, the first metal bump 563*a* and a receiver 375 of the first input/output (I/O) circuit 203, wherein each of the drivers 374 of the first and second input/output (I/O) circuits 203 has a driving capability between 0.05 and 2 pF, and each of the receivers 375 of the first and second input/output (I/O)

circuits 203 has an input capacitance between 0.05 and 2 pF: (6) a third metal bump, e.g., low-density bonded contact 563*b*, between the first semiconductor integrated-circuit (IC) chip 100-1 and the interconnection substrate 684, wherein the third metal bump 563*b* joins the first semiconductor integrated-circuit (IC) chip 100-1 to the third metal pad 668*b*, wherein the third metal bump 563*b* has a width wider than that of the first metal bump 563*a*, as seen in FIG. 19F; and (7) a fourth metal bump, e.g., low-density bonded contact 563*b*, between the second semiconductor integrated-circuit (IC) chip 100-2 and the interconnection substrate 684, wherein the fourth metal bump 563*b* joins the second semiconductor integrated-circuit (IC) chip 100-2 to the fourth metal pad 668*b*, wherein the fourth metal bump 563*b* has a width wider than that of the second metal bump 563*a*, as seen in FIG. 19F. Alternatively, the second semiconductor integrated-circuit (IC) chip 100-2 may have a third I/O circuit 341 coupling to the fourth metal pad 668*b* through the fourth metal bump 563*b*, wherein the third I/O circuit 341 may comprise a driver 274 having a driving capability greater than 2 pF and a receiver 275 having an input capacitance greater than 2 pF: the first semiconductor integrated-circuit (IC) chip 100-1 may have a fourth I/O circuit 341 coupling to the third metal pad 668*b* through the third metal bump 563*b*, wherein the fourth I/O circuit 341 may comprise a driver 274 having a driving capability greater than 2 pF and a receiver 275 having an input capacitance greater than 2 pF. Besides, the first semiconductor integrated-circuit (IC) chip 100-1 may comprise a second memory cell 362 configured to store a programming code, a configurable switch, e.g., pass/no-pass switch 258 or cross-point switch 379 as illustrated in FIGS. 2A-2C. 3A, 3B and 7, having an input data associated with the programming code stored in the second memory cell 362 and first and second programmable interconnects 361 coupling to the configurable switch 258 or 379, wherein the configurable switch 258 or 379 is configured to control, in accordance with the input data of the configurable switch 258 or 379, connection between the first and second programmable interconnects 361, wherein the configurable switch 258 or 379 is configured to pass data associated with the output data Dout for the logic operation from the first programmable interconnect 361 to the driver 374 of the first input/output (I/O) circuit 203 as seen in FIG. 5B through the second programmable interconnect 361, or the configurable switch 258 or 379 is configured to pass data associated with the data output S_Data_in of the receiver 375 of the first input/output (I/O) circuit 203 from the second programmable interconnect 361 to the first set of input points of the multiplexer 211 for the first input data set for the logic operation through the first programmable interconnect 361.

For a first case, when the second semiconductor integrated-circuit (IC) chip 100-2 is a memory chip, such as HBM IC chip 251 or NVM IC chip 250 as illustrated in FIGS. 11A and 12A or in FIGS. 11B and 12B, the first fine-line interconnection bridge (FIB) 690 may comprise a plurality of metal interconnects 693 configured for a data bus coupling the first semiconductor integrated-circuit (IC) chip 100-1 to the second semiconductor integrated-circuit (IC) chip 100-2, wherein a bitwidth of the data bus between the first and second semiconductor integrated-circuit (IC) chips 100-1 and 100-2 is greater than or equal to 512.

For a second case, when the second semiconductor integrated-circuit (IC) chip 100-2 is a dedicated control and I/O chip 260 or 265 as illustrated in FIGS. 11A and 12A or in FIGS. 11B and 12B, data associated with the output data Dout for the logic operation is configured to be passed from the first input/output (I/O) circuit 203 to the fourth metal pad 668*b* through, in sequence, the first metal bump 563*a*, the first metal pad 668*a*, the second interconnection metal layer, e.g., the upper one of the interconnection metal layers 6 of FISIB 560, the second metal pad 668*a*, the second metal bump 563*a*, the second input/output (I/O) circuit 203, the third input/output (I/O) circuit 341 and the fourth metal bump 563*b*.

For a third case, the second semiconductor integrated-circuit (IC) chip 100-2 may be a GPU chip 269*a* or CPU chip 269*b* as illustrated in FIGS. 11B and 12B.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A multi-chip package comprising:

an interconnection bridge comprising a silicon substrate, an interconnection scheme over the silicon substrate, a first metal contact at a top of the interconnection bridge and coupling to the interconnection scheme and a second metal contact at the top of the interconnection bridge and coupling to the first metal contact through the interconnection scheme, wherein the interconnection scheme comprises a first interconnection metal layer over the silicon substrate, a second interconnection metal layer over the first interconnection metal layer and silicon substrate, and a first insulating dielectric layer over the silicon substrate and between the first and second interconnection metal layers, wherein the first interconnection metal layer comprises a first copper layer and a first adhesion metal layer at a bottom and sidewall of the first copper layer, wherein the second interconnection metal layer comprises a conductive metal layer and a second adhesion metal layer at a bottom of the conductive metal layer but not at a sidewall of the conductive metal layer, wherein each of the first and second metal contacts comprises a second copper layer and a third adhesion metal layer at a bottom of the second copper layer but not at a sidewall of the second copper layer;

a first polymer layer at a same horizontal level as the interconnection bridge, wherein the interconnection bridge is horizontally between a first portion and a second portion of the first polymer layer;

a first integrated-circuit (IC) chip over the first portion of the first polymer layer, across over a first edge of the interconnection bridge and vertically over the first metal contact;

a second integrated-circuit (IC) chip at a same horizontal level as the first integrated-circuit (IC) chip, over the second portion of the first polymer layer, across over a second edge of the interconnection bridge and vertically over the second metal contact, wherein the second integrated-circuit (IC) chip couples to the first integrated-circuit (IC) chip through the interconnection bridge; and a plurality of first metal bumps at a bottom of the multi-chip package, wherein each of the plurality of first metal bumps comprises tin.

2. The multi-chip package of claim 1, wherein the interconnection scheme further comprises a second insulating dielectric layer at the top of the interconnection bridge, wherein the second copper layer of said each of the first and second metal contacts has a first portion in an opening in the second insulating dielectric layer and a second portion over the opening in the second insulating dielectric layer and over a top surface of the second insulating dielectric cover layer, wherein the second portion of the second copper layer protrudes from the top surface of the second insulating dielectric layer.

3. The multi-chip package of claim 2, wherein the third adhesion metal layer of said each of the first and second metal contacts has a third portion and a fourth portion, wherein the third portion is in the opening in the second insulating dielectric layer, on a top surface of the second interconnection metal layer and between the first portion of the second copper layer and the top surface of the second interconnection metal layer, wherein the fourth portion is on the top surface of the second insulating dielectric layer and between the second portion of the second copper layer and the top surface of the second insulating dielectric layer.

4. The multi-chip package of claim 1 further comprising a first vertical metal interconnect vertically in the first polymer layer and a first metal bonding joint between the first integrated-circuit (IC) chip and the first vertical metal interconnect, wherein the first integrated-circuit (IC) chip couples to one of the plurality of first metal bumps through, in sequence, the first metal bonding joint and the first vertical metal interconnect.

5. The multi-chip package of claim 4, wherein the first vertical metal interconnect comprises a third copper layer.

6. The multi-chip package of claim 4 further comprising a second vertical metal interconnect vertically in the first polymer layer and a second metal bonding joint between the second integrated-circuit (IC) chip and the second vertical metal interconnect, wherein the second integrated-circuit (IC) chip couples to one of the plurality of first metal bumps through, in sequence, the second metal bonding joint and the second vertical metal interconnect.

7. The multi-chip package of claim 6, wherein each of the first and second metal bonding joints comprises a third copper layer having a thickness between 1 and 60 micrometers.

8. The multi-chip package of claim 6, wherein the second integrated circuit (IC) chip comprises a second metal bump at a bottom surface thereof, wherein the second metal bonding joint comprises the second metal bump.

9. The multi-chip package of claim 6, wherein each of the first and second metal bonding joints comprises tin.

10. The multi-chip package of claim 4, wherein the first integrated circuit (IC) chip comprises a second metal bump at a bottom surface thereof, wherein the first metal bonding joint comprises the second metal bump.

11. The multi-chip package of claim 1, wherein each of the first and second metal contacts is a metal pillar.

12. The multi-chip package of claim 1 further comprising an underfill having a first portion between the first integrated-circuit (IC) chip and interconnection bridge and a second portion between the second integrated-circuit (IC) chip and interconnection bridge.

13. The multi-chip package of claim 1 further comprising a sealing layer over the first polymer layer, at the same horizontal level as the first and second integrated-circuit (IC) chips and covering a sidewall of each of the first and second integrated-circuit (IC) chips.

14. The multi-chip package of claim 1, wherein the interconnection scheme comprises a plurality of metal interconnects configured for a data bus between the first and second integrated-circuit (IC) chips.

15. The multi-chip package of claim 14, wherein the data bus has a data bit width equal to or greater than 1,024.

16. The multi-chip package of claim 1, wherein the first integrated-circuit (IC) chip comprises a first input/output (I/O) circuit therein coupling to the second integrated-circuit (IC) chip through the interconnection bridge and a second input/output (I/O) circuit therein coupling to an external circuit outside the multi-chip package, wherein the first input/output (I/O) circuit has a driver having a driving capability smaller than that of a driver of the second input/output (I/O) circuit.

17. The multi-chip package of claim 1, wherein the first and second integrated-circuit (IC) chips have common features of layout, locations and total number of input/output (I/O) pads thereof.

18. The multi-chip package of claim 1, wherein the first and second integrated-circuit (IC) chips have a common feature of a power supply voltage thereof.

19. The multi-chip package of claim 1, wherein the first integrated-circuit (IC) chip is a field-programmable-grid-array (FPGA) integrated-circuit (IC) chip and the second integrated-circuit (IC) chip is a control chip of a memory module.

20. The multi-chip package of claim 1, wherein the first integrated-circuit (IC) chip is a graphic-processing-unit (GPU) integrated-circuit (IC) chip and the second integrated-circuit (IC) chip is a control chip of a memory module.

21. The multi-chip package of claim 1, wherein the first integrated-circuit (IC) chip is a logic chip and the second integrated-circuit (IC) chip is a memory chip.

22. The multi-chip package of claim 21, wherein the second integrated-circuit (IC) chip is a dynamic-random-access-memory (DRAM) integrated-circuit (IC) chip.

23. The multi-chip package of claim 21, wherein the second integrated-circuit (IC) chip comprises a static-random-access-memory (SRAM) circuit.

24. The multi-chip package of claim 21, wherein the interconnection scheme comprises a plurality of metal interconnects configured for a data bus between the logic and memory chips, wherein the logic chip couples to the memory chip through the data bus having a data bit width equal to or greater than 512.

25. The multi-chip package of claim 1 further comprising a third integrated-circuit (IC) chip over and bonded to the second integrated-circuit (IC) chip.

26. The multi-chip package of claim 25, wherein each of the first and second integrated-circuit (IC) chips is a logic chip and the third integrated-circuit (IC) chip is a memory chip.

27. The multi-chip package of claim 1 further comprising a first metal bonding joint between the first integrated-circuit (IC) chip and interconnection bridge and a second metal bonding joint between the second integrated-circuit (IC) chip and interconnection bridge, wherein the first metal bonding joint couples the first integrated-circuit (IC) chip to the first metal contact of the interconnection bridge and the second metal bonding joint couples the second integrated-circuit (IC) chip to the second metal contact of the interconnection bridge.

28. The multi-chip package of claim 27, wherein the first integrated circuit (IC) chip comprises a second metal bump at a bottom surface thereof, wherein the second integrated circuit (IC) chip comprises a third metal bump at a bottom surface thereof, wherein the first metal bonding joint comprises the second metal bump and the second metal bonding joint comprises the third metal bump.

29. The multi-chip package of claim 27, wherein each of the first and second metal bonding joints comprises a third copper layer having a thickness between 1 and 60 micrometers.

30. The multi-chip package of claim 27, wherein each of the first and second metal bonding joints comprises tin.

* * * * *